United States Patent
Sorden et al.

(10) Patent No.: US 9,720,555 B2
(45) Date of Patent: Aug. 1, 2017

(54) LOCATION-BASED SERVICES

(71) Applicants: Gary Sorden, Richardson, TX (US);
 Michael Hinsley, Midland, TX (US)

(72) Inventors: Gary Sorden, Richardson, TX (US);
 Michael Hinsley, Midland, TX (US)

(*) Notice: Subject to any disclaimer, the term of this patent is extended or adjusted under 35 U.S.C. 154(b) by 179 days.

(21) Appl. No.: 13/688,011

(22) Filed: Nov. 28, 2012

(65) Prior Publication Data

US 2013/0091452 A1 Apr. 11, 2013

Related U.S. Application Data

(60) Provisional application No. 61/579,735, filed on Dec. 23, 2011, provisional application No. 61/684,415, filed on Aug. 17, 2012.

(51) Int. Cl.
 *G06F 3/048* (2013.01)
 *H04W 4/02* (2009.01)
 *H04W 4/00* (2009.01)

(52) U.S. Cl.
 CPC .............. *G06F 3/048* (2013.01); *H04W 4/02* (2013.01); *H04W 4/008* (2013.01)

(58) Field of Classification Search
 CPC . C04B 40/0633; C04B 28/04; C04B 2103/40; C04B 28/02; C04B 38/10; C04B 2103/0053; C04B 2103/0055; C04B 24/08; C04B 24/2641; C04B 24/2676; C04B 2103/0035; C04B 2103/0046; C04B 2103/0067

USPC ..................................................... 702/11, 12
See application file for complete search history.

(56) References Cited

U.S. PATENT DOCUMENTS

| | | | |
|---|---|---|---|
| 5,444,619 A | 8/1995 | Hoskins | |
| 6,243,483 B1* | 6/2001 | Petrou et al. | 382/103 |
| 6,811,113 B1* | 11/2004 | Silansky | B64B 1/02 244/115 |
| 6,829,570 B1 | 12/2004 | Thambynayagam | |
| 7,606,666 B2 | 10/2009 | Repin | |
| 8,073,665 B2 | 12/2011 | Watters | |
| 8,190,458 B2 | 5/2012 | Back | |
| 8,515,878 B2* | 8/2013 | Radloff et al. | 705/412 |
| 2007/0180131 A1* | 8/2007 | Goldstein et al. | 709/230 |
| 2010/0114493 A1* | 5/2010 | Vestal | 702/9 |
| 2012/0046859 A1* | 2/2012 | Imes et al. | 701/409 |
| 2012/0292026 A1* | 11/2012 | Brooks | 166/270.1 |
| 2012/0322459 A1* | 12/2012 | Jaffri et al. | 455/456.1 |

* cited by examiner

*Primary Examiner* — Di Xiao

(57) ABSTRACT

A system and method for managing location-based information associated with the oil and gas industry. The system, in one embodiment, comprises a computing device connected to a location-based service, wherein the location-based information comprises energy operations data which is associated with a specific geographic location, and wherein the computing device is associated with a graphical map interface. The graphical map interface is configured to display location based information. The graphical map interface can also be configured to display an indication of the frequency of an event. The location based information can be associated with a geofence.

28 Claims, 19 Drawing Sheets

LOCATION-BASED SERVICES

CROSS REFERENCE TO RELATED APPLICATION

This application claims the benefit of provisional U.S. Application No. 61/579,735 entitled "Location-based Services" filed Dec. 23, 2011, and provisional U.S. Application No. 61/684,415 entitled "Location-based Services" filed Aug. 17, 2012, the entirety of both of which are incorporated herein in their entirety.

BACKGROUND OF THE INVENTION

Computing devices have become more feature-oriented and able to provide more flexibly than even some desktop computers. Most computing devices in use today can have features including personal digital assistants, messaging services, video capabilities, cameras, Internet connectivity, voice automated responses, and connectivity to Wi-Fi services, etc. Unlike desktop computers, mobile devices can provide features to users based upon the location of the wireless device.

BRIEF DESCRIPTION OF THE DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION OF THE INVENTION

Several embodiments of Applicants' invention will now be described with reference to the drawings. Unless otherwise noted, like elements will be identified by identical numbers throughout all figures. The invention illustratively disclosed herein suitably may be practiced in the absence of any element which is not specifically disclosed herein.

Embodiments of the inventions disclosed in FIGS. 1-29 may use some or all of the components shown in each figure.

Figure 1:
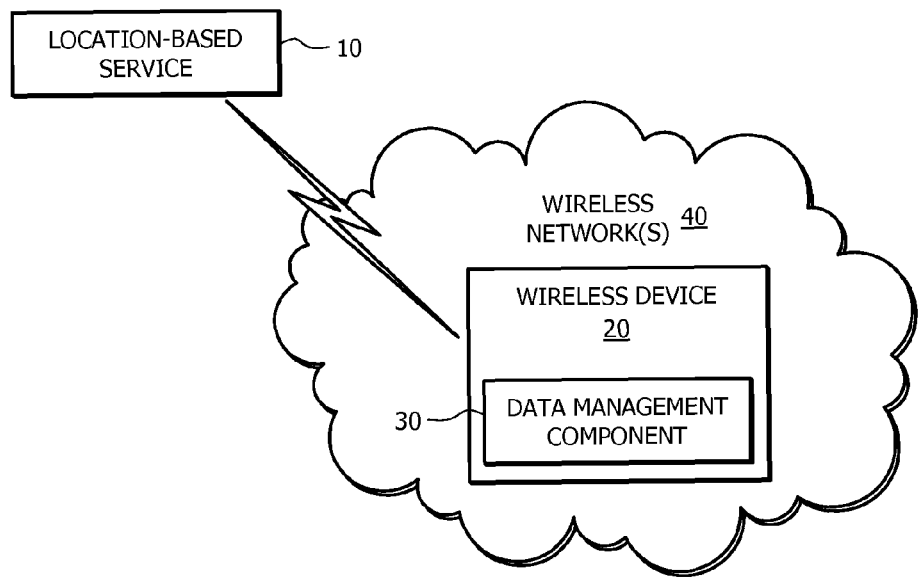
FIG. 1 is a schematic of an embodiment of a system according to at least one embodiment wherein the location-based service is outside of the wireless network.

Referring now to FIG. 1, FIG. 1 is a schematic of a wireless device 20 in one embodiment. As depicted, the dotted circle is the wireless network 40, geofenced area, or a plurality of geofenced areas and/or networks. A wireless network 40 is any type of network that can communicate with a wireless device. The location-based service 10 is outside of the wireless network 40 whereas the data management component 30 resides on the wireless device 20. The wireless device 20 is inside the range of the wireless network 40. A wireless device 20 can comprise any of the following: smart phone, pad computer, tablet computer, laptop, cell phone, key fob, vehicle, boat, or any other device that can operate on or connect to any wireless network 40. In one embodiment, the wireless device 20 is 2.5 G, 3G or 4G compliant. In one embodiment, a wireless device 20 user can receive this location-based information via SMS message, email, phone call, instant message, pop-up, voice simulations, or through any communication over the internet.

The location-based service 10 can comprise any service which provides location-based information. The location-based service 10 is capable of providing various information to the wireless device 20 or data management component 30 including location-based information. In one embodiment, a location-based service 10 can operate on or interface with wireless networks that use such standards as 2G, 2.5G, 3G, 4G, LTE, WiMax, Wi-Fi, GPS, A-GPS, or any other wireless networks or standards. Location-based services 10 can include any combination of a server, web server, vehicle, computing device, sensor, indoor sensor, motion sensor, database, network, scripts, software application, application programming interface, links or other wireless devices (e.g. desktops, laptops, computing pads, cell phones, GPS devices, or any other wireless devices capable of operating within a wireless network 40). Location-based services 10 can also comprise web-based interactions or requests, software application, application programming interface, scripts (e.g. JavaScript, ActionScript, Flash, or other scripting languages), plug-ins, applets, an application for a wireless device 20, or other suitable format for the wireless device 20 to use. Web-based interactions, in one embodiment, can include web requests, URLs, HTML, web queries, and any other communication made over the Internet. In another embodiment, the location-based service 10 can be any combination of an internet-based solution, database provided solution, network-based solution, server-based solution, software application, application programming interface, server, database, computer, applet, script, or HTML. In one embodiment the wireless network 40 can be a Wide Area Network (WAN), a Local Area Network (LAN), personal network on any type of wireless networks including a combination of any wireless networks. The wireless network 40 can also be associated with the Internet which is a certain kind of WAN. These examples are provided for illustrative purposes and should not be deemed limiting.

The location-based service 10 can be a URL, link, website, API, application, or any other type of software that operates on one or more of any of the following network, server, within cloud architecture, database, geofenced locations. In another, embodiment, the location-based service 10 comprises any combination of the following: server, database, computing device, web page, software, application, or wireless device.

In one embodiment the wireless device 20 is capable of registering with a location-based service 10, software application, wireless network 40, mobile payment system 70, geofence 60, or data management component 30. In one embodiment, the wireless device 20 is capable of registering with a location-based service 10 by initiating the location-based service 10. In another embodiment, the wireless device 20 is capable of registering with the location-based service 10 by choice or selection of the location-based service 10. In another embodiment, the wireless device 20 is capable of registering with a mobile payment system 70 either by selection of the user or by the recognition of the of the mobile payment system 70. In another embodiment, a wireless device is capable of registering by using the location-based service 10, software application, wireless network 40, mobile payment system 70, geofence 60, or data management component 30 In another embodiment, the wireless device is capable of registering with a location-based service 10, software application, wireless network 40, mobile payment system 70, geofence 60, or data management component 30 by receiving information from a location-based service 10, software application, wireless network 40, mobile payment system 70, geofence 60, or data management component 30 In one embodiment, wireless devices must be able to interface with location-based services 10 to take advantage of the services. In one embodiment, the wireless device 20 is capable of registering onto a location-based service 10 by opting into such a service. In such an embodiment, the wireless device 20 can be programmed to allow the location-based services 10 access to the wireless device 20. In one embodiment, the user of a wireless device 20 chooses to allow the wireless device 20 to use only certain location-based services 10. In another embodiment, the wireless device 20 is pre-programmed to only allow certain location-based services 10 to operate or interface with the user device. In another example, the user of a wireless device 20 prevents any location-based services 10 from interacting with the wireless device 20 for a given time, but then chooses to allow location-based services 10 to interface with the wireless device 20 for a period of time. In another example, the user can decide to register with a location-based service 10 on a case-by-case basis.

In one embodiment, the wireless device 20 is capable of registering with a location-based service 10 if it can send a web request to a location-based service 10 or website. In another embodiment, the wireless device 20 is capable of registering with a wireless network 40 wherein the wireless device 20 is able to receive location-based data from the wireless network 40 or geofenced area 60.

In yet another embodiment, the wireless device 20 is capable of registering with a first computing device 50 (not depicted). A computing device 50 can comprise an application, server, desktop, laptop, location-based service, wireless device, database, software, a link, or any combination of the same. In one embodiment, the first computing device can be a motion sensor or other device that is capable of providing indoor location-based information to the wireless device 20.

In another embodiment, the wireless device 20 is capable of registering with a location-based service 10 or wireless network 40 when it shares its position with the service or network. In another embodiment, the wireless device 20 can receive location-based information through the wireless network 40, and the wireless device 20 can provide its location to the wireless network 40. In another embodiment, the wireless device 20 can send location-based information over a wireless network 40. In another embodiment, the wireless device 20 can access the location of other wireless devices by sending a request over the wireless network 40, to a location-based service 10, mobile payment system 70, or any other device. In another embodiment, location-based information can be displayed to the user. In another embodiment, the wireless device 20 is operable to store at least some location-based information either through a memory or secure memory. In another embodiment, the wireless device 20 is operable to ascertain its location through various location determination methods In one embodiment, the use of location-based services 10 is only temporary. For example, the wireless device 20 receives a temporary application from a location-based service 10 when the wireless device 20 registers with the location-based service 10. In this example, the application can either remove itself from the wireless device 20 or cease operation when the wireless device 20 left a certain location or wireless network 40. In another example, a wireless device 20 capable of registering with location-based services 10 only needs to be able to connect or register with a location-based service 10 to use the location-based service 10. In another embodiment, once the wireless device 20 has registered onto the location-based service 10, the wireless device 20 can interface with the service. In another embodiment, the location-based service is a an application programming interface.

Location-based services 10 can vary widely and include many different software and hardware features. In one embodiment, the location-based service 10 is located within a specific location. In another embodiment, the location-based service 10 can be located outside of a specific location. A geo-fence can be created which can mark or otherwise identify a specific location or area. In general terms, a geo-fence can comprise a virtual perimeter and/or marking of a physical and/or geographical area. In one embodiment, a geofenced area 60 can also be the wireless network 40 associated with a specific location or grouping of locations (e.g. a mall, school, a county). In one embodiment, a geofence is an electronic perimeter or marking that is associated with a physical location. In general, geofences can be used to mark or identify an area or a location in order to retrieve, model, simulate, search, or identify information within the geofence area or location. The advantage of using of geofence is to identify, model, associate, or search for information that is localized or in near proximity to the geofenced location or area. Geofencing can be used to track assets, to create localized advertisements associated with the geofence, search for information, computing devices, or assets within the geofenced area, emergency services, or any other task associated with a geofenced location or area. For example, a geo-fence can be created for a school, a mall, specific stores, routes on streets or maps, oil and gas wells, oil and gas field location(s), pipelines, resorts, shopping areas, a business or businesses, classrooms, meeting rooms, geographic locations, restaurants, or any other physical location. In one embodiment, several businesses, schools, or other specific locations can be grouped into one or many geofenced areas for the wireless device 20 to interact with and/or store.

In another embodiment, a geo-fence can encompass or be associated with a route that a car regularly takes. In this embodiment and in one non-limiting example, if a user commutes to work, the geofenced area 60 is the user's commuting route. Still in this embodiment, the geofenced area 60 (e.g. the commute) is defined by a user of the wireless device 20, wireless network 40, and/or location-based service 10. In this embodiment the wireless device 20 receives location information that includes, but is not limited to the following information: traffic reports, accident reports, location of businesses within the geofenced area 60, weather reports, traffic light information, location of municipalities (e.g. bus routes, bus stops, hospitals, police stations, fire department stations, parks, and charities) within the geofenced location. These examples are provided for illustrative purposes and should not be deemed limiting.

In yet another embodiment, the geofenced location encompasses a resort. In this non-limiting example, the wireless device 20 once associated with the geofenced resort can receive location information associated with the resort that can include information such as restroom locations, dining locations, restaurant locations, night clubs, location of rides, location of ski slopes, location of any physical location in the geofenced resort, marketing information, advertisements, emergency information, whether certain attractions (ski slopes, rides, restaurants, and any other locations that resort visitors can visit) are crowded, the size of lines for certain attractions, wait times for certain restaurants, and any other information associated with the resort that users can find helpful These examples are provided for illustrative purposes and should not be deemed limiting.

In yet another embodiment, certain locations can be geofenced and associated with each other. For purposes of this embodiment, the locations can be individually geofenced or collectively geofenced (e.g. associated with each other). For example, one non-limiting example includes school campuses, buildings, or locations which are be geofenced and can share certain location information from a campus, university, building, or any other school locations. In this embodiment, any combination of certain students, administrators, teachers, or professors can provide location based information to the geofenced locations via computing devices, servers, databases, software applications, wireless devices or any combination thereof. Within this embodiment, four English classes can share information about each of the four English classes with the other classes regardless of whether they are in the same physical location. These examples are provided for illustrative purposes and should not be deemed limiting.

In yet another embodiment the associated geofenced locations (e.g. buildings on a campus) can be located in a similar general location (e.g., the entire campus). The geofenced locations then can provide location-based information to the wireless devices that are associated with the geofenced locations. In this embodiment, the wireless device 20 can also request certain location-based information associated with the general location or geofenced locations. In another embodiment, a wireless device 20 uses a software application that provides location-based information to the user about the campus such as the location of certain buildings, alerts, emergency messages or people on campus. In yet another embodiment, the geofence can be created manually or automatically. In yet another embodiment the geofence can be adaptive, contextually aware, and/or predictive. Although some of the non-limiting embodiments are discussed in terms of a school campus the embodiments can be equally applied to a business or businesses.

A wireless network 40 can be incorporated into or associated with a location-based service 10 as long as the wireless device 20 is able to use the wireless network 40. However, in one embodiment, a location-based service 10 can also be independent or unassociated with a wireless-based network. Further, in some embodiments a location-based service 10 can also use one or more databases to store location-based information. These databases can be remote in a particular embodiment or located within the specific location in another embodiment. In addition, the wireless device 20 can also store location-based information. In another embodiment, the location based service through a server accesses a database that stores certain location-based information.

Location-based services 10 can also provide information related to polls. A poll, as used herein, refers to data which has been provided by a voting population or from computing devices that send information without user interaction. These polls can relate to a variety of data including, for example, the best menu items at a restaurant in a defined location, such as a geofenced area 60, or the answer to questions either in a game, classroom, game format, or quiz format. As such, in another embodiment, the wireless device 20 can vote or send in a response to these type of polls when registered with the location-based service 10. Additionally, in another embodiment, the wireless device 20 can request if any polls exist within a certain location or the location-based service 10 can automatically provide this information to a registered wireless device 20. In another embodiment, the location-based service 10 provides adaptive location-based information. In another embodiment, this adaptive location-based information can be manipulated or searched by a wireless device 20. In another embodiment, the adaptive location-based information received by the wireless device 20 is updated based upon a pre-determined time interval. The adaptive information can be time-sensitive, location-specific, additional information sent to a wireless device 20, emergency information, inventory information, updateable information, or additional information associated with a certain location, or requests by a user.

In one embodiment, the wireless device 20 utilizes a data management component 30 to store, manage, and/or modify location-based information. A data management component, as used herein, refers to any device which stores, filters, manipulates, formats, prepares, convert and/or manages location-based information, oilfield data, profile information, or payment information. In one embodiment, a data management component 30 resides on the wireless device 20 itself. However, in yet another embodiment a data management component 30 comprises a combination of any of the following: wireless device 20, computing device, software application, application programming interface, server, database, cell tower, non-wireless device 20, or in a cloud computer architecture, etc.

In one embodiment, the data management component 30 is used to store temporary and/or permanent information. In one non-limiting example, the data management component 30 stores data related to location-based services 10 and/or geofenced locations. The data management component 30, in yet another embodiment, also serves as a cache, to store cookies from an Internet site, or other temporary information associated with a location-based service 10 and/or geofenced location. In yet another embodiment, the data management component 30 is associated with the location-based service 10 or geofenced location itself to help manage the number of users using the location-based service 10, data requests from the users associated with the location-based service 10 or geofenced location, inventory, advertisements, sales prices, revenue figures, discount percentages, storing data from a plurality of users, and calculating distances of potential physical items associated with a location-based service 10 and/or geofenced area 60 with the location of the user's wireless device 20. The data management component 30, in another embodiment, serves as a manager of real-time data or updateable data associated with the geofenced location or location-based service 10.

In another embodiment, a data management component 30 is associated with a geofenced location to manage data associated with the geofenced area 60. As used herein, the term manage means to perform an operation on, format, or otherwise store data. In another embodiment, a geofenced location is otherwise associated with a data management component 30 that is not located within the geofenced location but the geofenced location can use the data management component 30 to manage data associated with the geofenced area. In yet another embodiment, the data management component comprises a software application that is operatively connect with and populated by a location-based service where the population includes at least messages, information from local merchants in a selected or given area, information from local vendors in a selected or given area, or any other location-based information.

The data management component 30 can comprise any scripting language (JavaScript, ActionScript, etc.), HTML, XML, API, Java, C, C#, C++, servlets, applets, an application, database queries, data requests, or any other programming technology. Similarly, the data management component 30 can comprise of one or more of the following: computing device, wireless device 20, server, network, location based service, geofenced location, database, or any type of software.

In one embodiment, the data management component 30 can be associated with any type of message protocol that allows location information to be received by a wireless device 20, computing device, location-based service 10, and/or geofenced location. Similarly, the data management component 30 can also be configured to receive information on behalf of a wireless device 20, computing device, location-based service 10 and/or geofenced location. In one embodiment, the data management component 30 can be able to operate with IEEE 802.x, 802.11, et seq., 802.16, et seq., IPv4, IPv6, Internet Protocol only communications channels, IPsec, Secure Sockets Layer, Transport Layer Security, Secure Shell, OFDM, OFDMA in an uplink or downlink, SC-FDMA, hybrid OFDMA and SC-FDMA, CDMA, self organized network methodologies, SU-MIMO, MIMO, frequency domain equalization schemes, and any other communication protocol that supports location-based services 10 or location information. In another embodiment, the data management component 30 can provide location information to user in response to a voice command from the user.

In one embodiment, the wireless device 20 comprises a graphical map interface. A graphical map interface comprises any interface which provides a map display to the user. In one embodiment, the graphical map interface is the layout of a store. In another embodiment, the graphical map interface displays a map showing the wireless device's location in comparison to the physical location of location information on the map interface. In another embodiment, the graphical map interface is configured to display any location-based information or energy operations data on a map-like interface from any physical location. In another embodiment, the graphical map interface displays a map associated with a certain physical location, and the graphical map interface can also display additional information associated with the physical location. In another embodiment, the graphical map interface is a map. In yet another embodiment, the graphical map interface dynamically displays the location of the wireless device 20 on the map as the wireless device 20 moves to a different location. In another embodiment the graphical map interface displays updated information regarding the position of the wireless device 20 from a motion sensor and/or accelerometer.

Figure 2:
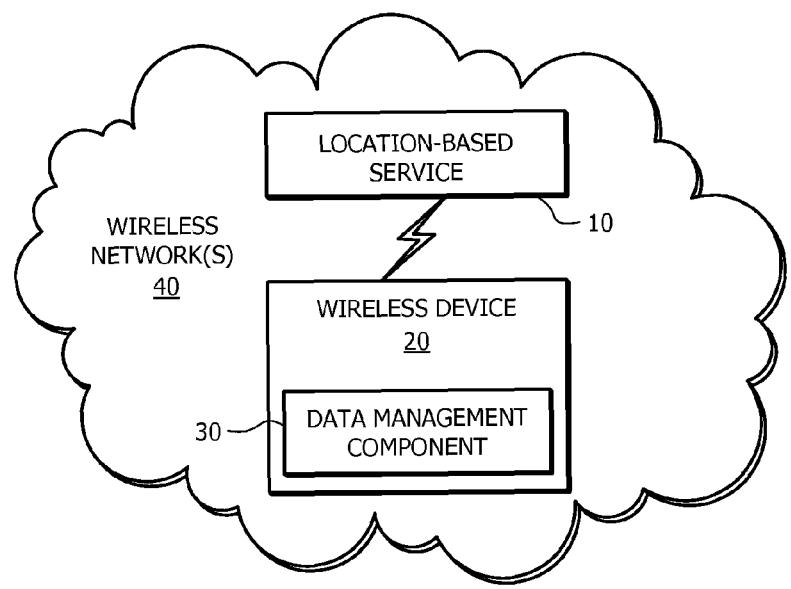
FIG. 2 is a schematic of an embodiment of a system according to at least one embodiment wherein said location-based service is within the wireless network.

There are several possible combinations of locations between the wireless device 20, the data management 30, the location-based service 10, and the wireless network 40. FIGS. 1-10 depict some of the various possible combinations. For example, FIG. 2 is a schematic of a wireless device in one embodiment wherein the wireless device and the location-based service is located within the wireless network. In this embodiment, the data management component 30 resides on the wireless device 2 which is inside the range of the wireless network 40.

Figure 3:
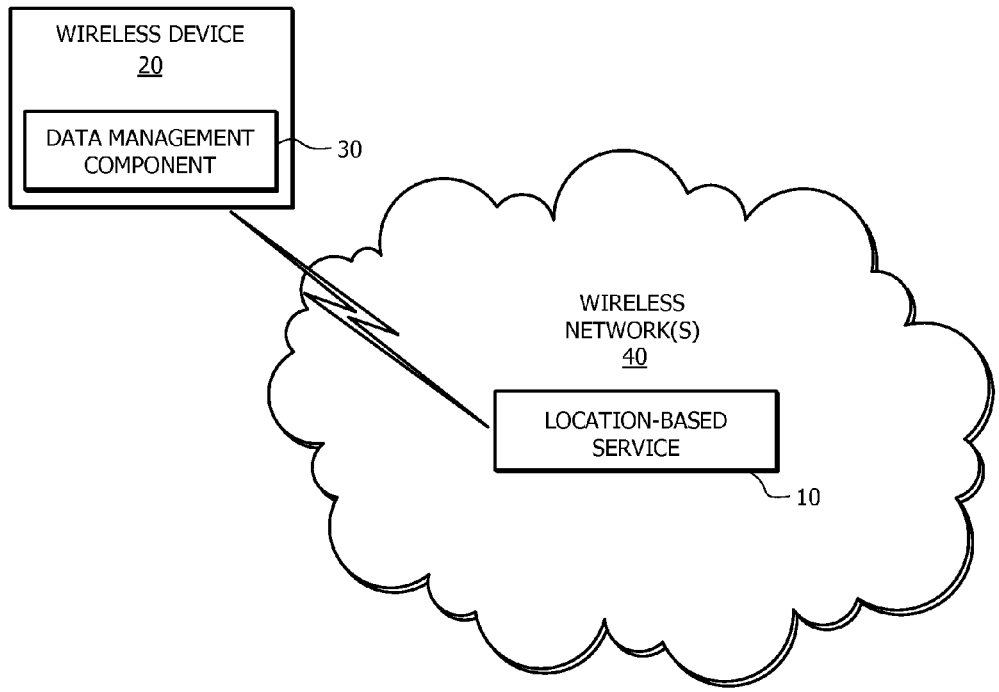
FIG. 3 is a schematic of an embodiment of a system according to at least one embodiment wherein the wireless device is not within the wireless network.

Another example is FIG. 3 which a schematic of a wireless device in one embodiment wherein the wireless device and the data management component are located outside of the wireless network. As depicted, the wireless device 20 is associated with a data management component 30 and is outside the wireless network or plurality of networks 40. In one embodiment a wireless network 40 is also a geofenced area 60. The location-based service is within the wireless network 40, plurality of networks, of geofenced area (not shown).

Figure 4:
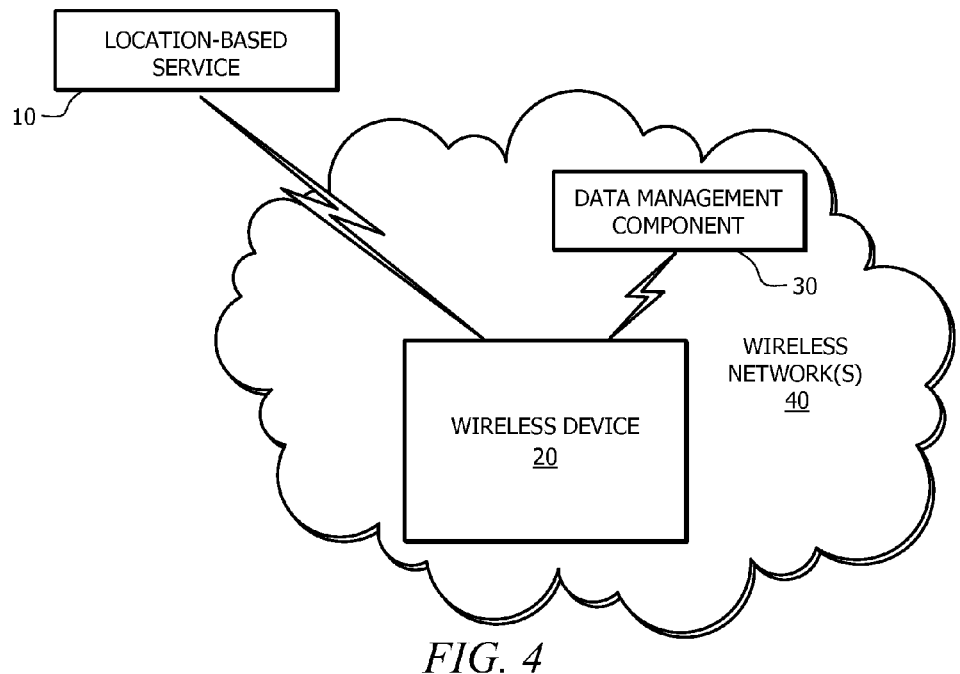
FIG. 4 is a schematic of an embodiment of a system according to at least one embodiment wherein the data management component resides within the wireless network but not within the wireless device

In FIG. 4, FIG. 4 is a schematic of an embodiment of a system according to at least one embodiment wherein the data management component resides within the wireless network but not within the wireless device. In one embodiment, a data management component is a very powerful tool that is used by a location-based service to gather, format, group, or provide location-based information to other computing devices. In this embodiment, the data management component can be a combination of hardware or software used to modify and store location-based information. One of the potential benefits of the data management component used by or within a location-based service 10 is that the location-based information is formatted converted, or grouped based upon the location of a computing device which allows for less processing on the computing device of the location-based information.

Figure 5:
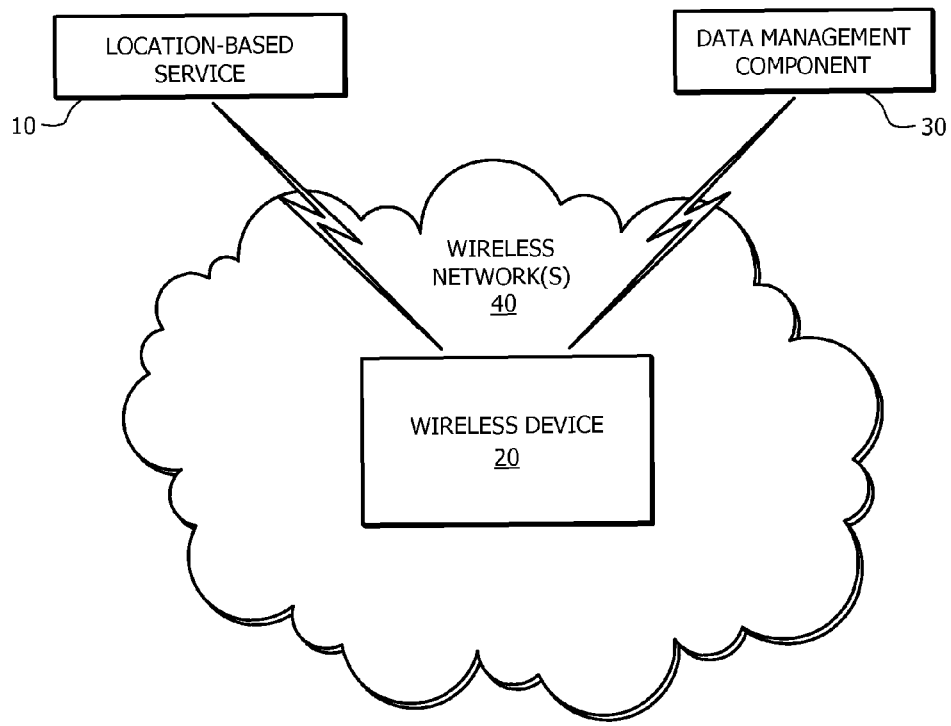
FIG. 5 is a schematic of an embodiment of a system according to at least one embodiment wherein the location-based service and the data management component are outside of the wireless network.

FIG. 5 is a schematic of an embodiment of a system according to at least one embodiment wherein the location-based service and the data management component are outside of the wireless network. The data management component 30 is outside of the wireless network 40, plurality of wireless networks, or geofenced area 60 but is associated or operatively connected with the wireless device 20.

Figure 6:
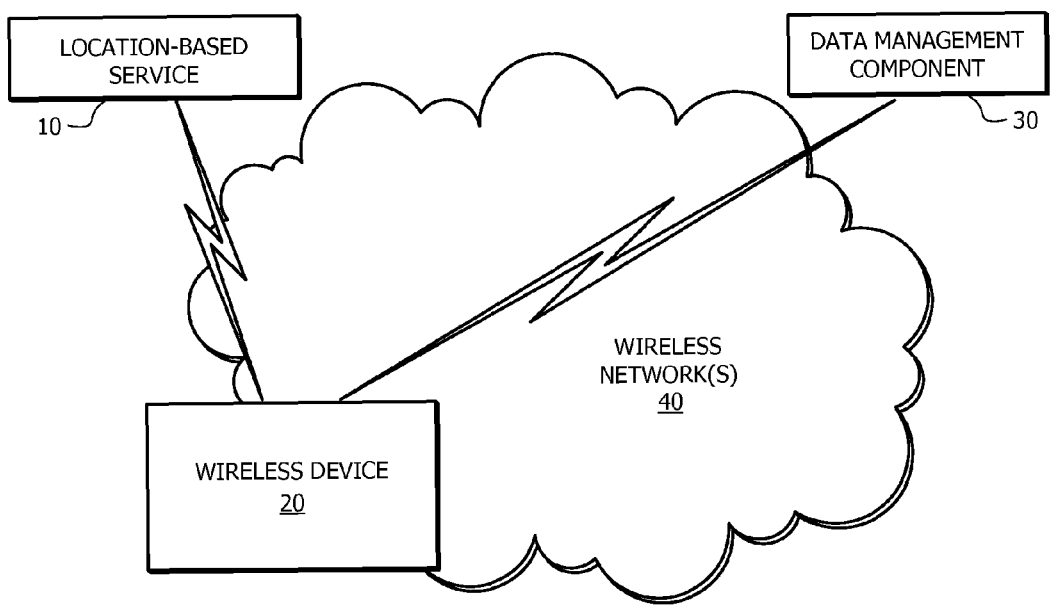
FIG. 6 is a schematic of an embodiment of a system according to at least one embodiment wherein the wireless device is within near proximity of the range of the wireless network.

FIG. 6 is a schematic of an embodiment of a system according to at least one embodiment wherein the wireless device is within near proximity of the range of the wireless network. As depicted, the location-based service 10 is outside the wireless network 40, plurality of wireless networks, or geofenced area 60 and is associated with a wireless device 20 that is in near proximity with the wireless network 40, plurality of wireless networks, or geofenced area 60. The data management component 30 is outside of the wireless network 40, plurality of wireless networks, or geofenced area 60 but is associated or operatively connected with the wireless device. In other embodiments, however, the data management component 30 and/or the location-based service 10 are located inside the wireless network 40. In one embodiment, the wireless device 20 upon being in near proximity with the wireless network 40, plurality of wireless networks, or geofenced area 60 can receive either an alert, a notification, or location-based information from either a wireless network 40, plurality of wireless networks, geofenced area 60, data management component 30, or location-based service 10.

Figure 7:
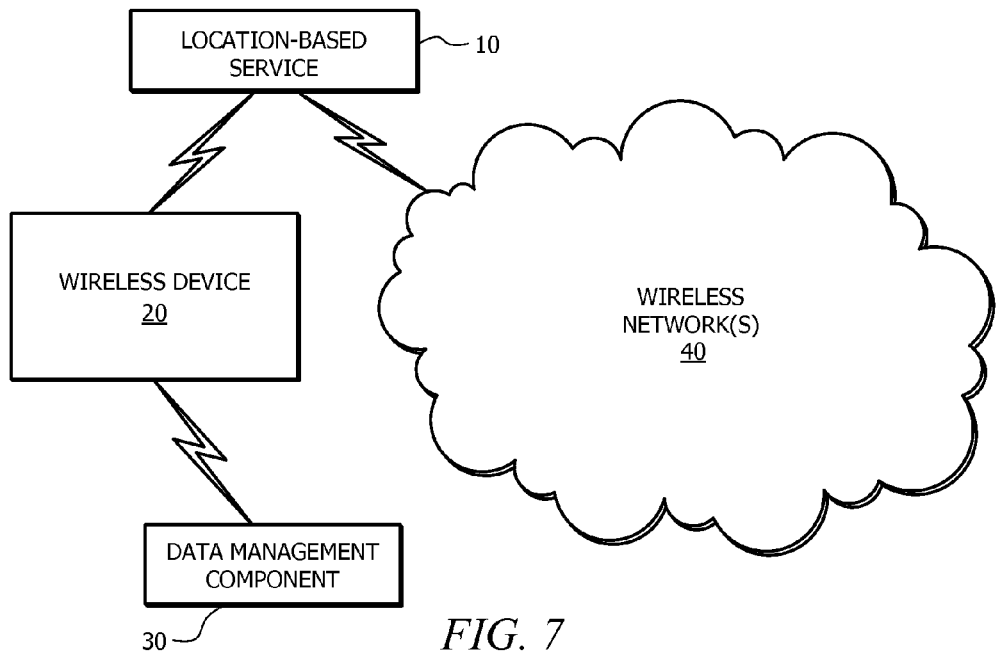
FIG. 7 is a schematic of an embodiment of a system according to at least one embodiment wherein said wireless is outside of the wireless network.

FIG. 7 is a schematic of an embodiment of a system according to at least one embodiment wherein the wireless device, the location-based service, and the data management component are outside of the wireless network.

Figure 8:
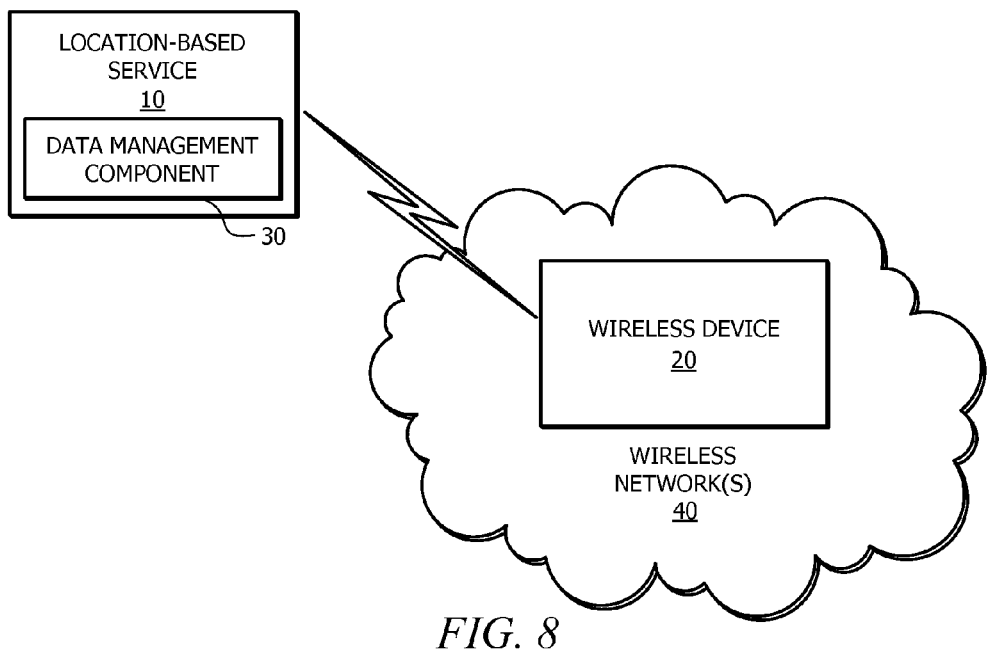
FIG. 8 is a schematic of an embodiment of a system according to at least one embodiment wherein said wireless device is within the location-based service and data management component are outside of the wireless network.

FIG. 8 is a schematic of an embodiment of a system according to at least one embodiment wherein said wireless device is within the location-based service and data management component are outside of the wireless network. As depicted, the data management component 30 is part of the location-based service 10.

Figure 9:
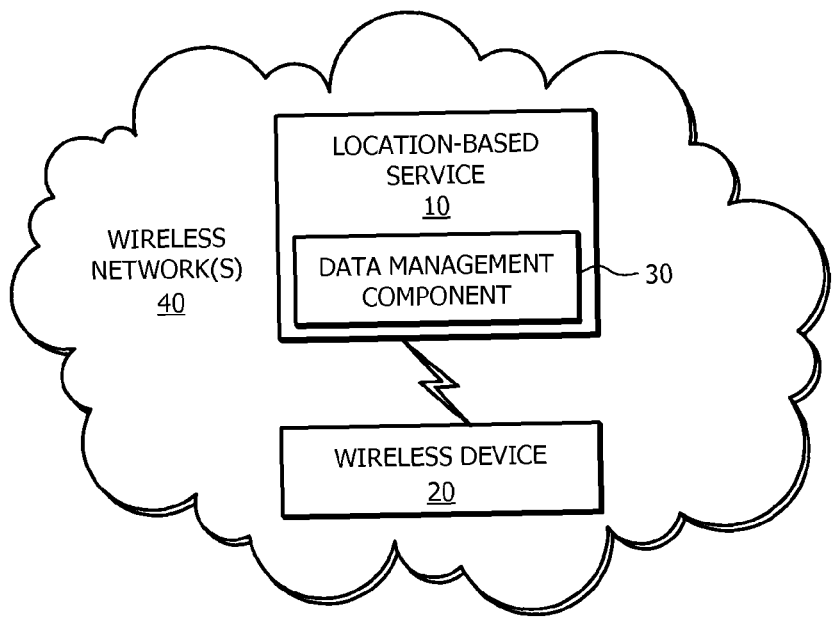
FIG. 9 is a schematic of an embodiment of a system according to at least one embodiment wherein the data management component is part of the location-based service.

Now referring to FIG. 9, FIG. 9 is a schematic of an embodiment of a system according to at least one embodiment wherein the data management component is part of the location-based service. This embodiment contemplates that the location-based service 10, data management component 30, and wireless device associated with each other through a WAN, LAN, or combination of both.

Figure 10:
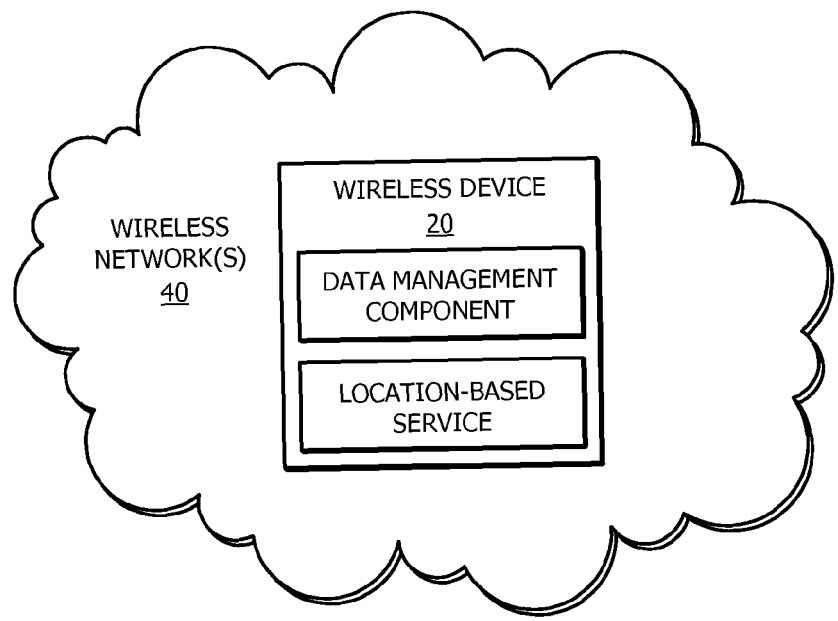
FIG. 10 is a schematic of an embodiment of a system according to at least one embodiment wherein the location-based service is associated with the wireless device.

Referring now to FIG. 10, FIG. 10 is a schematic of an embodiment of a system according to at least one embodiment wherein the location-based service is associated with the wireless device. The wireless device 20 is associated with a data management component 30 and a location-based service 10 that is configured to operate on the wireless device 20. The wireless device is configured to receive data through the wireless network 40 by associating with a wireless access point, or other access that allows the wireless device to connect to a wireless network, geofenced area 60, or plurality of each.

FIGS. 1-10 illustrate examples of the relative locations of the wireless device 20, data management component 30, and the location-based service 10. These examples are for illustrative purposes only and should not be deemed limiting.

Figure 11:
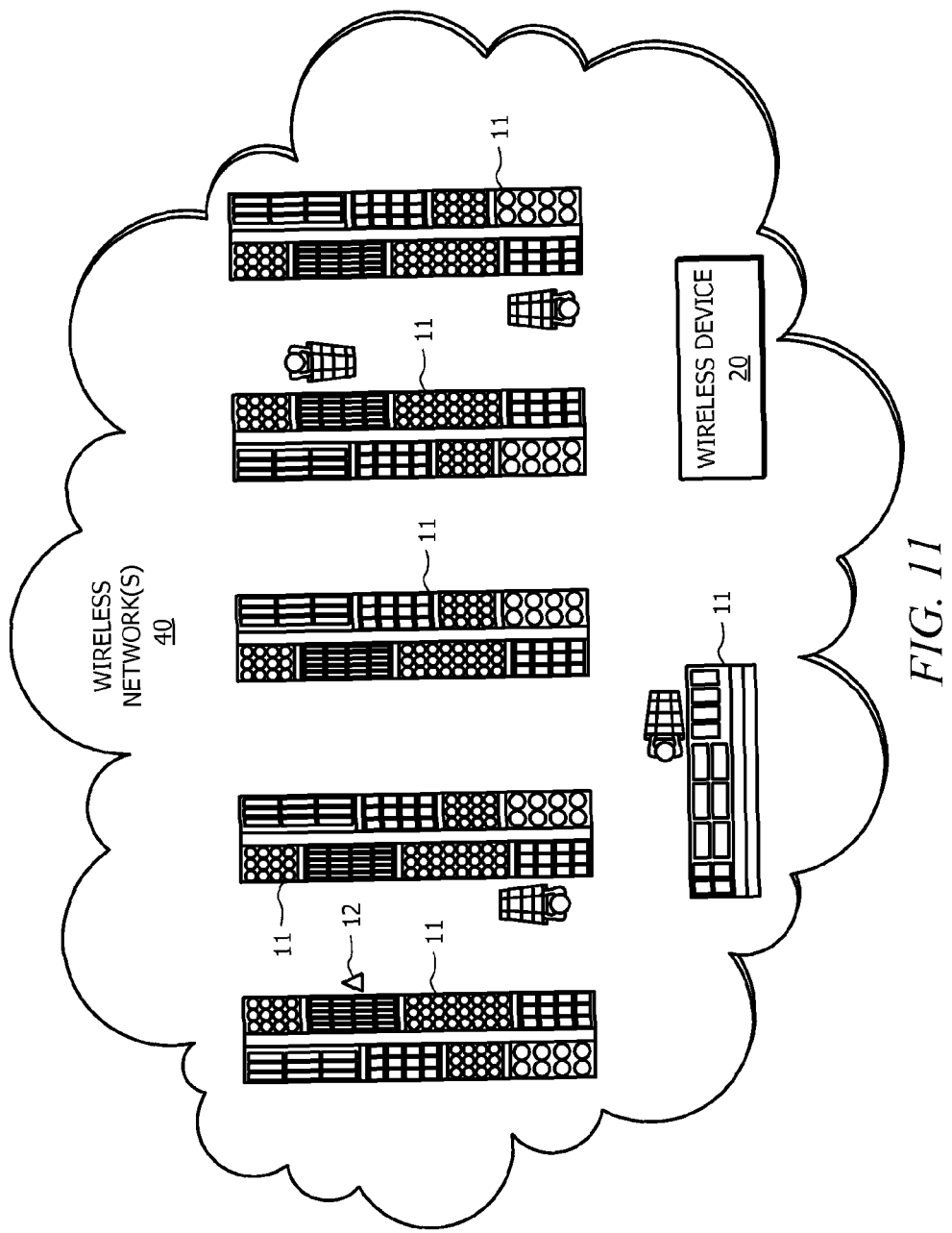
FIG. 11 is a schematic of an embodiment of a system according to at least one embodiment.
Figure 12:
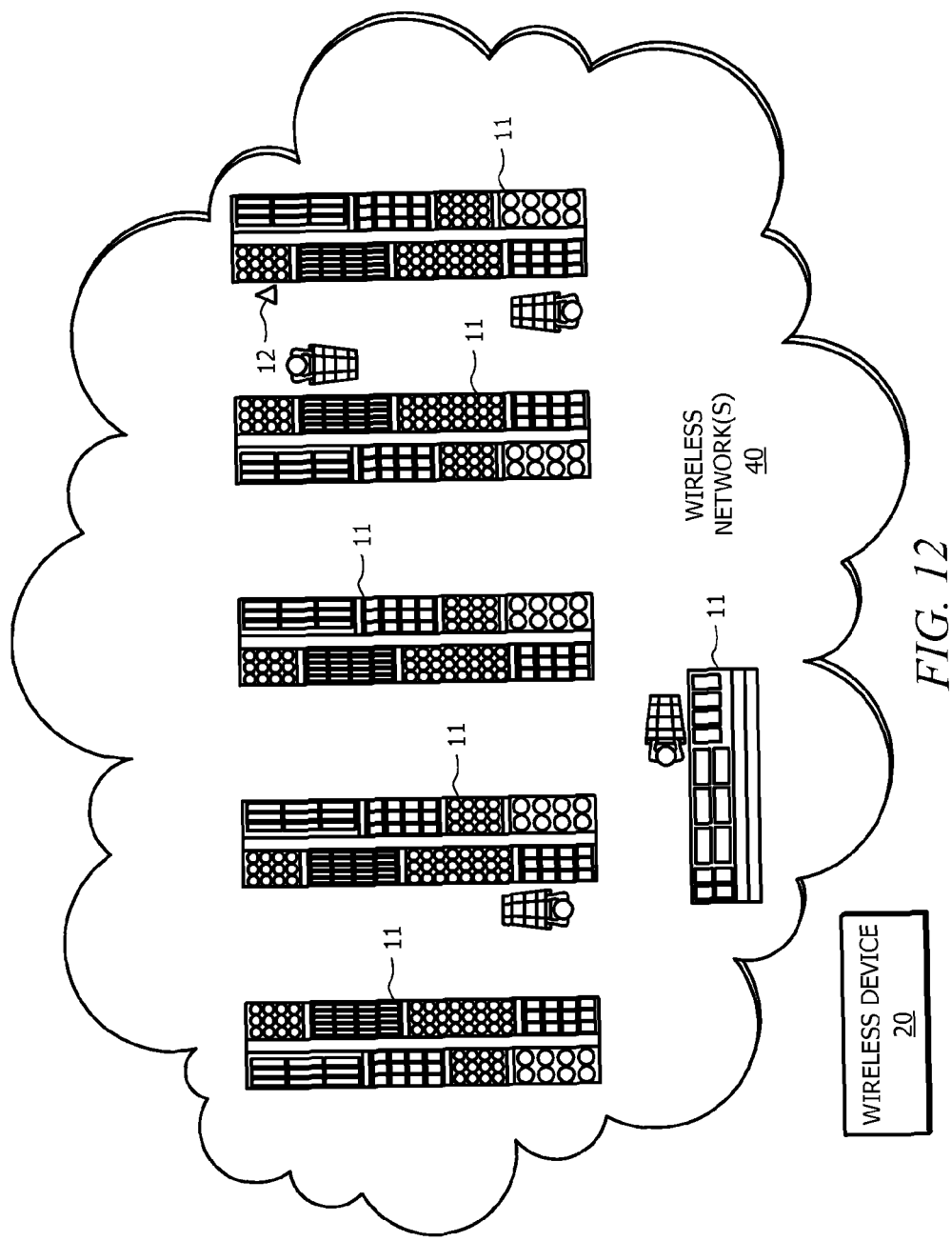
FIG. 12 is a schematic of an embodiment of a system according to at least one embodiment.

Turning now to FIGS. 11 and 12, which describe one of many methods to display certain location-based information on a wireless device. FIGS. 11 and 12 are examples of graphical map interfaces. In FIG. 11, the wireless device 20 is located within the wireless network 40, and the store comprises aisles 11, and the triangle represents the location of an item 12. A user can utilize the display on the wireless device 20 to retrieve an item 12, for example.

In FIG. 12, the wireless device 20 is located outside of the wireless network and can view the location of the item 12 on either a graphical user interface, graphical mapping interface, or other wireless device interface. In one embodiment the graphical map interface shows the location of the wireless device 20 (as shown), but in other embodiments the location of the wireless device 20 is not shown.

Figure 13:
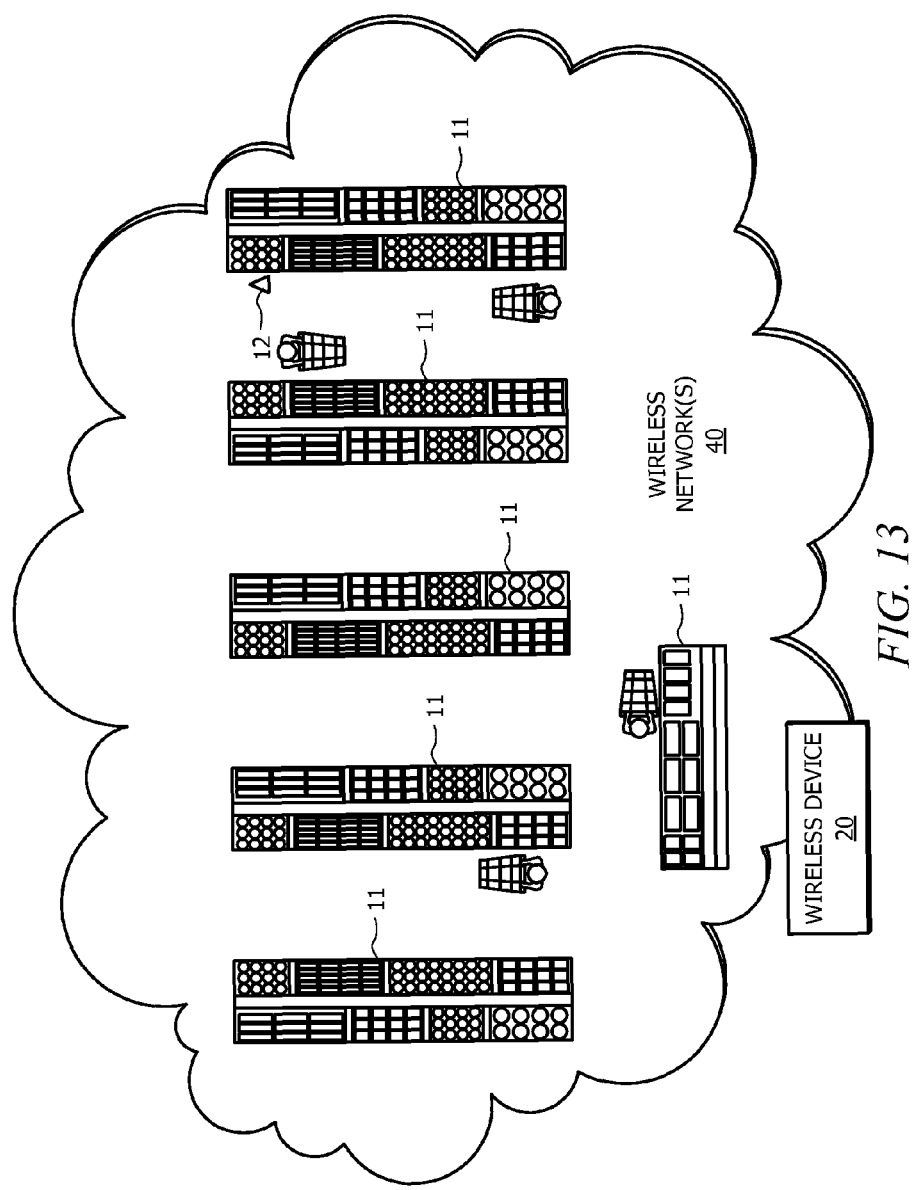
FIG. 13 is a schematic of an embodiment of a system according to at least one embodiment wherein the wireless device is in near proximity with the wireless network.

FIG. 13 represents another embodiment, wherein the wireless device is in near proximity with the wireless network and can locate or view an item 12 on an interface. FIGS. 11-13 are meant for illustrative purposes only and other interfaces can be used to incorporate the embodiments disclosures herein.

Now the operation of receiving location-based services 10, in one embodiment, will be discussed. In one embodiment, the wireless device 20 is recognized by a location-based service 10 to be within a certain location to which location-based information exists. In one embodiment, the wireless device 20 is recognized by the wireless device when the wireless device is able to receive information from the wireless network 40, location-based service 10, or mobile payment system 70, or any other component. In another embodiment, the wireless device is recognized by registering with a service or system. In another embodiment, the wireless device through a unique identifier is recognized by a location-based service. The wireless device 20 having registered with the location-based service 10 (either at the time of entering the location or before entering the location) is identified as a device within a wireless network 40 capable of receiving information associated with the specific location. In this embodiment, the user of the wireless device 20 then searches or queries the location-based service 10 for particular information and/or data associated with a location or a number of locations. In another embodiment, the wireless device 20 is pre-registered or configured to allow the use of the location-based service 10 and information or data associated with the location-based service 10. In addition and in this embodiment, location-based information is sent or is otherwise available to the wireless device 20 automatically. In one embodiment the wireless device 20 is within the location, while in other embodiments the wireless device 20 is in near proximity to the location, while in still other embodiments the wireless device 20 is not near the location at all. This embodiment thus contemplates a wireless device's flexibility in receiving information from a specific location whether the device is close to the defined location or not. In another embodiment the location-based service accesses a database that stores indoor location-based information or outdoor location-based information.

For example, a wireless device 20 user is in San Francisco, Calif. on a business trip but wants to receive location information from a mall, school, or any other location in Tyler, Tex. The location service 10, in this embodiment, is capable of providing such information to the user. This embodiment then allows the user in San Francisco to receive information related to the mall in Tyler, Tex. or know when his children were leaving school if the school was a geofenced area 60. It should be noted that this example is for illustrative purposes only and is not limiting. In another embodiment, a computing device or wireless device is associated with a geofenced area comprising energy operations data. In this embodiment, the user of the computing device or wireless device is configured to receive information that is associated with the geofenced area comprising energy operations data. Further in this embodiment, the user is able to analyze both for applying economic decision analysis and production decision analysis techniques on the energy operations data within the geofenced area. In another embodiment, economic and production decision analysis techniques are methods used to analyze how certain factors may impact the production or economic factors associated with an oil well, gas well, or pipeline. In another embodiment, the economic decision analysis and production decision analysis techniques performed using at least some energy operations data are used to predict or forecast future events associated with a drilling operation, geofenced area, or adaptive drilling profile. In another embodiment, a message is sent to a computing device or wireless device when a predefined event occurs within the geofenced area. For example and in an embodiment where the geofence is associated with energy operations data related to drilling operations, if the oil well is out of service or oil production stops for some reason, a message is sent to the computing device or wireless alerting the user of this event. In another embodiment, a user associated with a geofenced area can receive a message when a friend, asset, or event occurs within the geofenced area. In another embodiment, a user have predefined a geofenced area is capable of receiving information associated with the geofenced area. In another embodiment, a user can search for responsive energy operations data associated with a geofenced area. In another embodiment, a geofenced area can be an electronic designation associated with a given location wherein the user can request or receive information associated with the geofence area. For example, a user may define a geofenced area for her favorite apparel store. In this embodiment, the user is able to receive updates, advertisements, or other information associated with the geofenced area no matter where the user is located. In another embodiment, a geofenced area can be a resort. In this embodiment, the resort can send out announcements, emergency information, weather information, advertisements or other information associated with the resort to the user.

While in some embodiments the location-based services 10 only provides location-based information when the wireless device 20 is in near-proximity or within the specific location of interest, in one embodiment, the wireless device 20 uses or receives any type of location-based information provided by a location-based service 10. In another embodiment, the location-based service 10 is only temporarily available to the wireless device 20 when the wireless device 20 is either in near-proximity to a certain location or within the location. In this embodiment, the location-based service 10 or application can remove itself automatically or be pre-programmed to remove itself from the wireless device 20 after the wireless device 20 left the location. For example in one embodiment, the user upon entering a location where a location-based service is operable can use the location-based service while within or in near proximity to the location, but when the user leaves the application or location-based service can remove itself from the wireless device 20. In this embodiment, the user will avoid having a gluttony of icons on the wireless device that represent services or applications associated with a certain location. In another embodiment, the script or application is only interpreted or executed when the wireless device 20 in near-proximity to a certain location.

Figure 14:
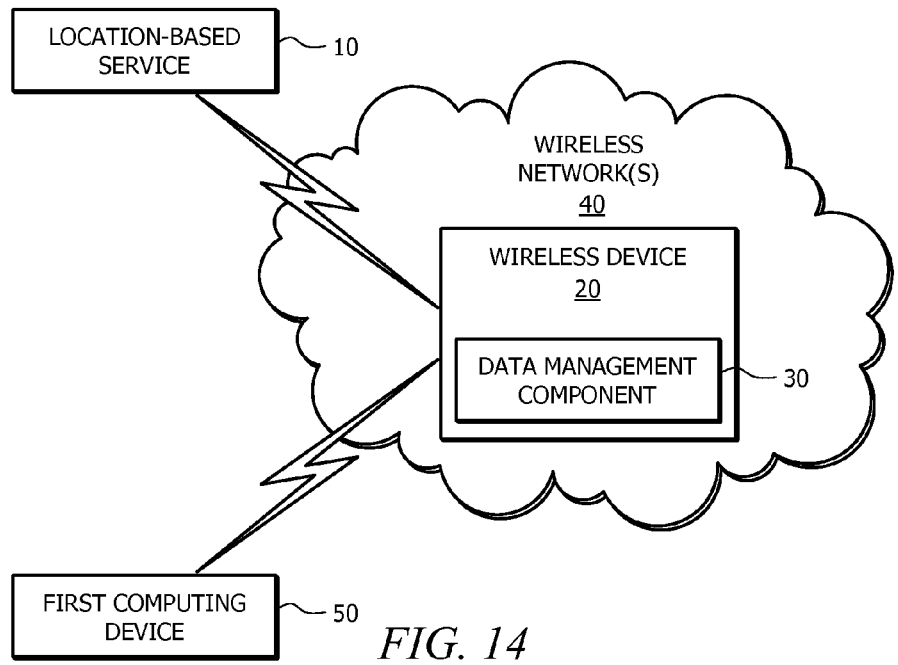
FIG. 14 is a schematic of an embodiment of a system according to at least one embodiment comprising a first computing device.

Now referring to FIG. 14, FIG. 14 is a schematic of an embodiment of a system according to at least one embodiment comprising a first computing device. As depicted, the first computing device 50 is not within the wireless network, geo-fended area, or a plurality of geofenced areas and/or networks. The first computing device 50 can provide location-based information to the wireless device 20 or data management component 30.

Figure 15:
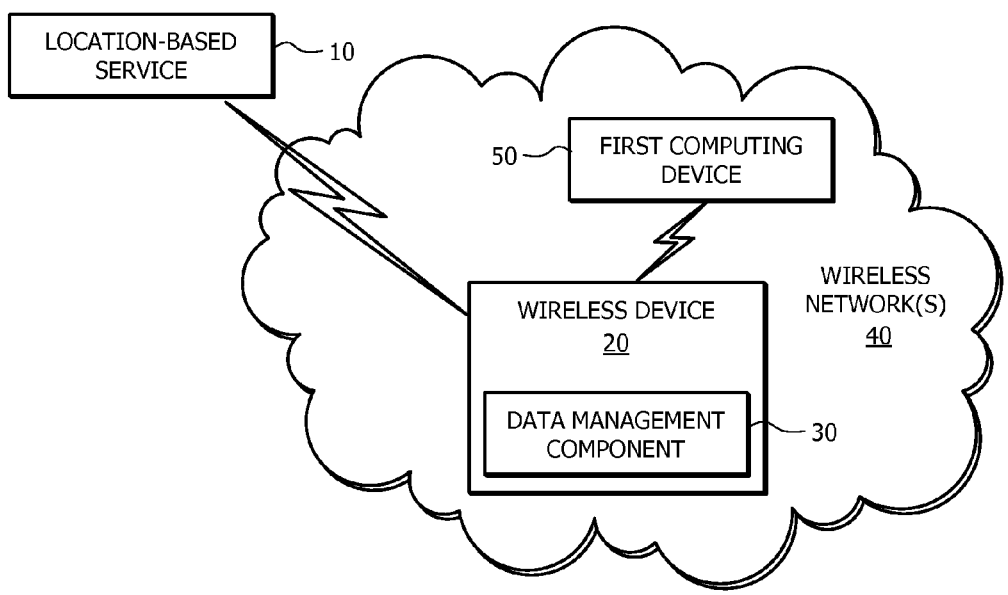
FIG. 15 is a schematic of an embodiment of a system according to at least one embodiment.
Figure 16:
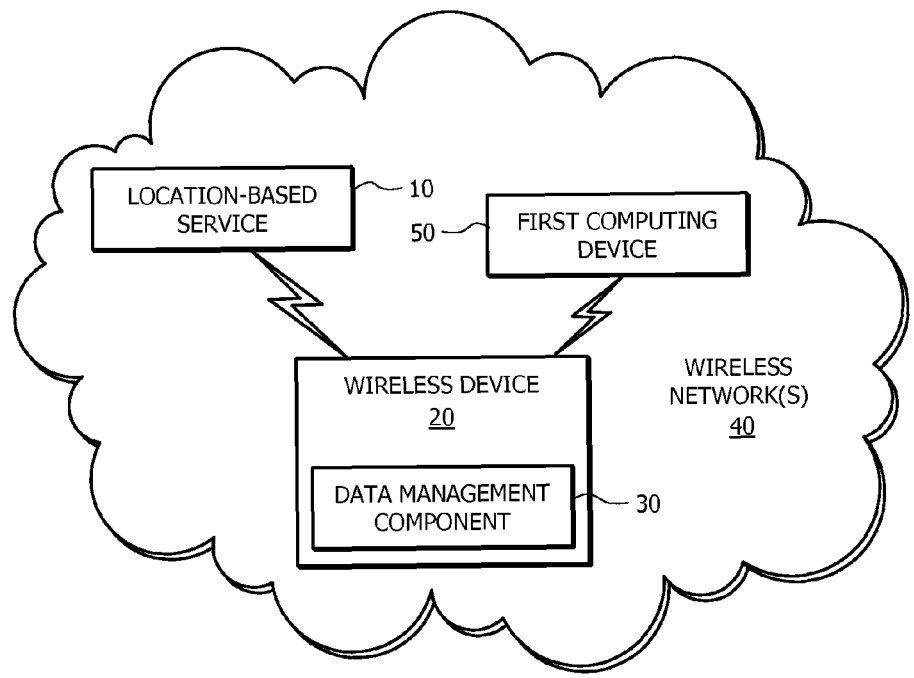
FIG. 16 is a schematic of an embodiment of a system according to at least one embodiment wherein all of the components are located within the store-based system.
Figure 17:
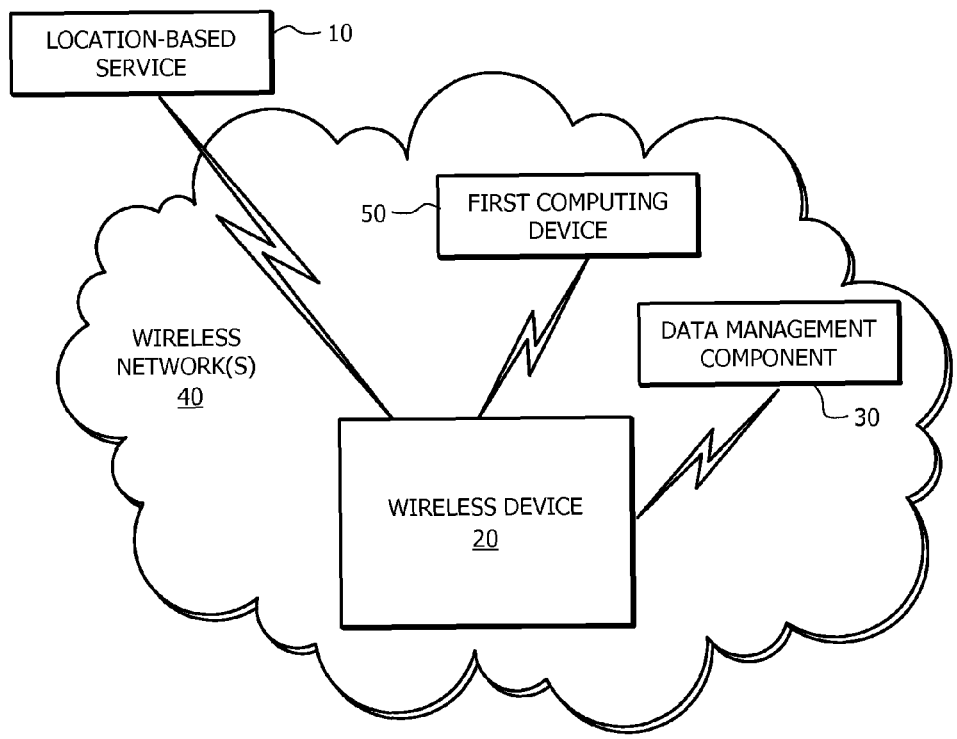
FIG. 17 is a schematic of an embodiment of a system according to at least one embodiment wherein the data management component does not at least partially reside on the wireless device but remains within the range of the wireless network.

FIGS. 15 and 16 are embodiments wherein the wireless device 20 is located within a wireless network, geofenced area, or a plurality of geofenced areas and/or networks. The location-based service 10 is outside of the wireless network 40 in FIG. 15 and inside of the wireless network 40 in FIG. 16. The data management component 30 resides on the wireless device 20. The wireless device 20 is inside the range of the wireless network. The first computing device 50 is within the wireless network, geo-fended area, or a plurality of geofenced areas and/or networks. FIG. 16 is a schematic of an embodiment of a system according to at least one embodiment wherein all of the components are located within the store-based system. FIG. 17 is a schematic of an embodiment of a system according to at least one embodiment wherein the data management component does not at least partially reside on the wireless device but remains within the range of the wireless network.

Figure 18:
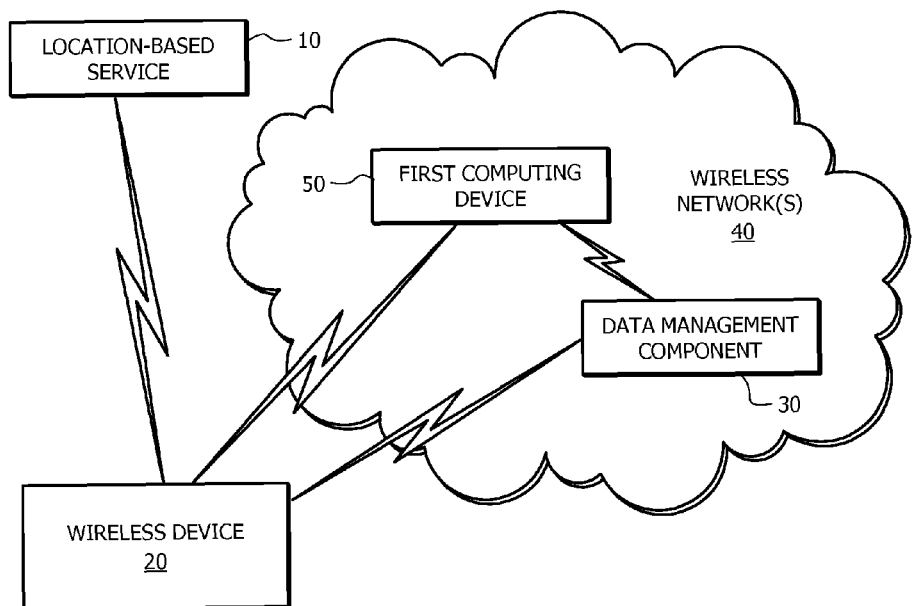
FIG. 18 is a schematic of an embodiment of a system according to at least one embodiment wherein the first computing device is within the wireless network.

FIG. 18 is a schematic of an embodiment of a system accordingly to at least one embodiment wherein the first computing device is within the wireless network. As depicted, the location-based service 10 is outside of the wireless network 40. The data management component 30 resides within the range of the wireless network 40, geofenced area, or a plurality of geofenced areas and/or networks. In one embodiment, the data management component 30 communicates with the first computing device 50. Further, the wireless device 20 is inside the range of the wireless network. The first computing device 50 is within the wireless network, geo-fenced area, or a plurality of geofenced areas and/or networks. In one embodiment, the wireless device 20 is located outside the wireless network 40, geofenced area 60, or a plurality of geofenced areas and/or networks but be associated with the location-based service, which is also outside of the wireless network 40, geofenced area 60, or a plurality of geofenced areas and/or networks, and wherein the wireless device 20 can receive location-based information from the location-based service 10, first computing device 50, or data management component 30.

Figure 19:
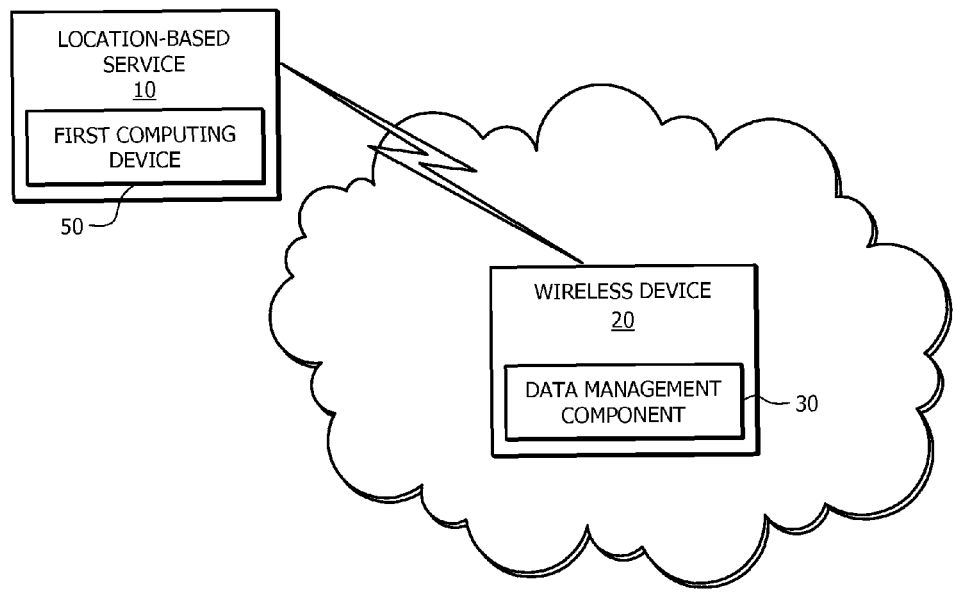
FIG. 19 is a schematic of an embodiment of a system accordingly to at least one embodiment wherein the first computing device is located outside of the wireless network.

FIG. 19 is a schematic of an embodiment of a system accordingly to at least one embodiment wherein the first computing device is located outside of the wireless network. As depicted, the location-based service is outside of the wireless network 40, and the wireless device 20 is inside the range of the wireless network. The data management component 30 resides on the wireless device 20 or is associated with the wireless device 20 and within the range of the wireless network, geo-fended area, or a plurality of geofenced areas and/or networks. The first computing device 50 is associated with the location-based service 10.

Figure 20:
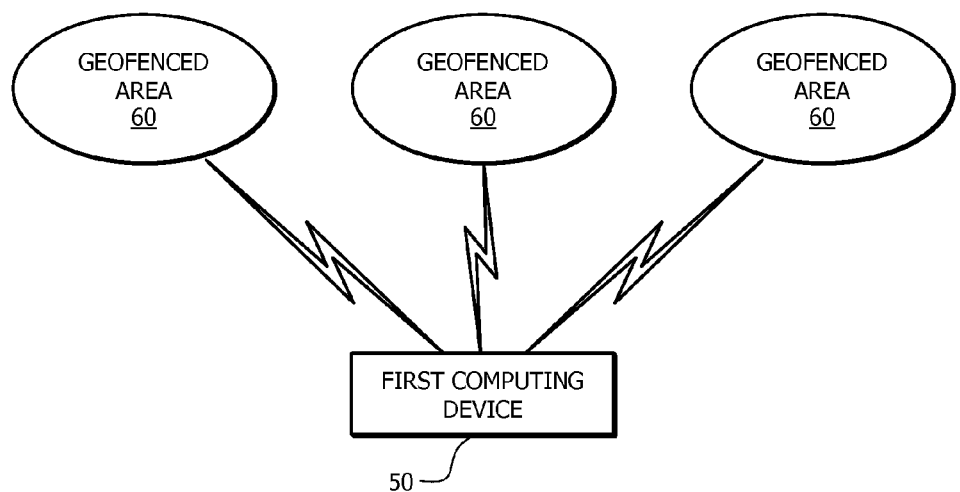
FIG. 20 is a schematic of an embodiment of a system according to at least one embodiment comprising a geofenced area and a computing device.
Figure 21:
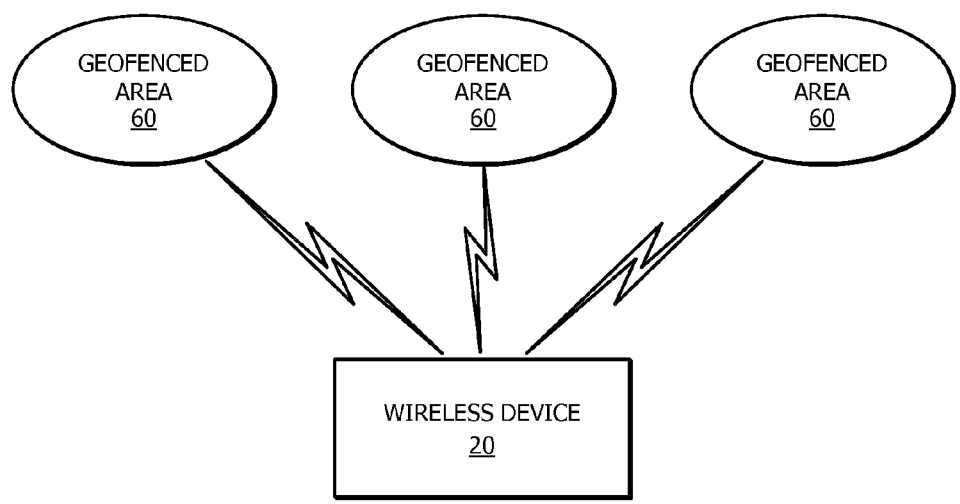
FIG. 21 is a schematic of an embodiment of a system according to at least one embodiment comprising a geofenced area and a wireless device.
Figure 22:
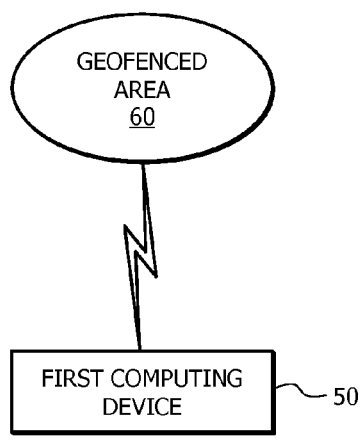
FIG. 22 is a schematic of an embodiment of a system according to at least one embodiment wherein only one geofenced area is associated with a first computing device.
Figure 23:
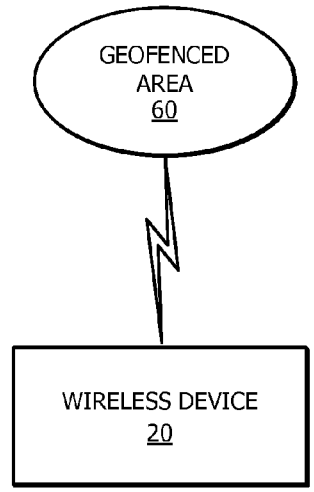
FIG. 23 is a schematic of an embodiment of a system according to at least one embodiment wherein only one geofenced area is associated with a wireless device.

FIG. 20 is a schematic of an embodiment of a system according to at least one embodiment comprising a geofenced area and a computing device. In one embodiment, and as depicted, the oval represents a geofenced area 60. As depicted there are several geofenced areas 60 but this quantity should not be deemed limiting as a single amount of geofenced areas can be utilized. FIG. 21 is a schematic of an embodiment of a system according to at least one embodiment comprising a geofenced area and a wireless device. As depicted, the wireless device 20 is associated or operatively connected to a geofenced area 60. FIG. 22 is a schematic of an embodiment of a system according to at least one embodiment wherein only one geofenced area is associated with a first computing device. FIG. 23 is a schematic of an embodiment of a system according to at least one embodiment wherein only one geofenced area is associated with a wireless device.

A wireless device 20 must merely be associated with a location-based service 10 to take advantage of the location-based service 10. In one embodiment, the wireless device 20 is associated with a location-based service 10 if it is able to receive location information from the location-based service 10. In another embodiment, the wireless device 20 is associated with the location-based service 10 if it is in near proximity or within a certain location. Still in an additional embodiment, the wireless device 20 is associated with a location-based service 10 no matter where the wireless device 20 is physically located (e.g. anywhere in the world). In another embodiment, the wireless device 20 is associated with a location-based service 10 if it can receive any information from the location-based service 10.

As previously discussed, in one embodiment geo-fencing is utilized. A geo-fence can either be created dynamically or be associated with a physical object in a static manner. In one embodiment, when a user of the wireless device 20 or a computing device enters an area that is geofenced the wireless device 20 will receive a notification (SMS text, MMS text, voice response, email, or any other type of notification) that is has entered a certain location. The notification can include information related to whether the user wants to opt-in to a location-based service 10, register with a location, receive information about the location that is geofenced, or information about other wireless device 20 users within the geofenced locations. In another embodiment, wireless device 20 or computing device users create their own geofenced areas. Within this embodiment, users are able to assign or control certain attributes of the geofenced location, including whether certain people can join the geofenced area 60, what information is displayed to the members of the geofenced area 60, and whether the members can view the information after leaving the geofenced area 60. For example, within a high school a wireless device 20 user can assign a group of lockers as a geo-fence called "lockers." In this example, the wireless device 20 user decides that the only members of the "lockers" geo-fence are the students assigned those lockers and the device user also decides what information, games, polls, symbols, insignia, or any other data that is associated with "lockers" geo-fence. In another embodiment, a location-based service can create a class schedule, assignments, enrollment information, accounting information, grades, documents and other traditional school items upon request by a user and return at least some of this information to a user via an intranet or the Internet. In this embodiment, the location-based server can search for these items based upon a geofence. In another embodiment, the location-based service is programmed to model unique location-based information based upon the adaptive profile of the user and provide the user with customized data upon request. In another embodiment, a user of a computing device or wireless device 20 can define or select a geofenced area 60 or multiple geofenced areas. In one embodiment, the geofenced areas are displayed on a graphical map interface on the computing device or wireless device 20. The user can select one or more geofenced areas displayed on the mapping interface and request additional information from the selected geofenced areas. The additional information can include any location information as well functionality associated with location information. In another embodiment, upon selection of a certain geofenced area 60 from the mapping interface, the computing device or wireless device 20 is operable to receive either additional location information, a link to additional location information, or functions associated with the location information or both. In yet another embodiment, the computing device or wireless device 20 is operable to receive updated location based information associated with a given geofenced location. In yet another embodiment, inside a certain geofenced area 60, a user tags certain points or creates certain boundaries that can provide an update when an individual, vehicle, or other wireless device 20 passes through the point or boundary within the geofenced area 60. For example, in a shopping area, a user can tag a certain location and share it with her friends and by doing so the friends could then meet at the tagged location. In another embodiment, the a wireless device 20 that is a vehicle can mark a location within a geofenced location that may be a restroom, business, or other location that the user of the vehicle wants to remember or receive location-based information from. In another embodiment, the wireless device 20, can be a vehicle and the wireless device can use the current traffic conditions as a parameter for calculating a certain route to a location. In another embodiment, the user can tag or otherwise identify a location within a geofence or wireless network 40 and associate content (text, photographs, video, or messages) with the tagged location. For example, a user may tag a restaurant and associate photograph with the location. In this embodiment, the user can choose to share this location or location with the photograph to other wireless users. In this embodiment, the user can also save the location or location with the photograph as favorite location on the wireless device 20 or with the location-based service 10. In another embodiment, a type of location-based video game can be played where physical locations within a wireless network or geofenced area/location have certain predetermined or user-determined attributes and are associated with a location-based video game that involves the geofenced area/location.

In addition, users of geofenced areas can select the permissions and rights associated with the geofenced location. For example, a user selects certain permissions that provide certain information associated with the user to be provided to other users in a geofenced location but not all information or data associated with a user to other users in a geofenced location. The ability to set certain permissions either automatically or dynamically by the user helps manage the user's geo-fence preferences. Thus, in this embodiment, a computing device or wireless device 20 itself can be configured to handle permissions and other issues related to geofenced locations automatically or dynamically without having the user's input. Conversely, in another embodiment, wireless device 20 users can also manually change the permissions and other rights associated with a geofenced location manually. In yet another embodiment, the wireless device 20 can update information it provides to a geofenced location without user input.

Similarly, in another embodiment, owners of business can set up geo-fences around a physical store or location (one or more geo-fences if necessary). Thus, in this embodiment, owners can manage the content to be displayed to users that subscribe, register, and/or enter the geofenced store location. As a result, in this embodiment, the business can provide marketing or sales advertisement to members of the geofenced area 60, games associated with the business location, a list of users at the store, a list of the inventory physically located in the store, polls for the users to take, users can also purchase items in the geofenced stores through their wireless devices, can comment on certain merchandise, can post pictures, video, and/or other media to the geofenced location. In another embodiment, users that are associated with geofenced areas (keeping in mind the users can be thousands of miles away, in near-proximity of the geofenced location, or within the geofenced location) can purchase items from the geofenced location. Similarly, in another embodiment, a business can market to members of geofenced areas whether the users are at the geofenced location or not.

In another embodiment, a geofenced location is searchable by users. For example in an embodiment, if the geofenced location is a grocery store and the wireless device 20 user is looking for cream of mushroom soup, the user upon registering with a location-based service 10, wireless network 40, and/or with the particular geofenced location searches the grocery store for cream of mushroom soup on the wireless device 20. In the present embodiment, the geofenced location or wireless network 40, either by itself of through a location-based service 10, performs a search and then returns the search results to the wireless device 20. The search results (e.g. the location of the cream of mushroom soup) can then be presented the user in a number of various formats. By way of example only and without limitation, the user can be presented with the search results by presenting to the user a map of the store with an icon showing the location of the item searched for with an icon; the search results can also be displayed on a map in 3D, through a voice-activated response system, graphical map interface, or the information can be sent to the user via a notification, message, email, video, voice response, or any other method associated with a wireless device 20.

Figure 24:
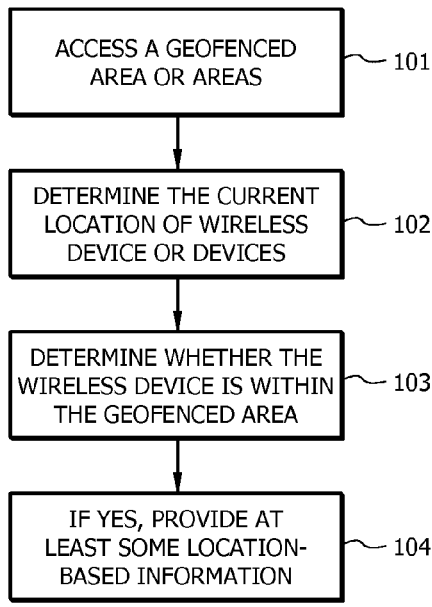
FIG. 24 depicts one embodiment of obtaining location-based information.
Figure 25:
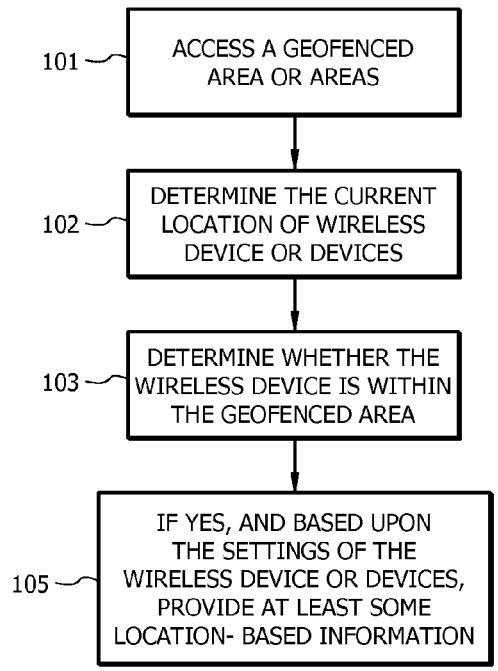
FIG. 25 depicts one embodiment of obtaining location-based information wherein the wireless device has settings.

FIG. 24 depicts one embodiment of obtaining location-based information. FIG. 24 represents a method of using location-based information that includes gaining access to a geofenced area or areas 101, once access is gained determining the current location of a wireless device or wireless devices 102, determining whether the wireless device or devices is within the geofenced area 103 and if so, providing at least some location-based information 104. In this embodiment as well as in other embodiments including FIGS. 25 and 26, the method can be performed by any combination of the following: location-based service 10, wireless device 20, data management component 30, first computing device 50, a server, a database, a wireless network, or a base station. In one embodiment, a wireless device 20 can obtain access to a geofenced area or areas by registering or simply using a server or application that allows for access to location-based information. The service or application can determine the location of the wireless device using at least one or a combination of location-determination methods. Alternatively, the wireless device is capable of determining its location using at least one or more location-determination techniques or using a motion sensor. In an embodiment, once the location of the wireless device is determined, a decision can be made on whether the wireless device 20 is within a geofence area. Upon making a decision of whether the wireless device 20, a wireless device is capable of receiving location-based information that is directly associated with a location or geofenced area. This method is useful to the extent that wireless device 20 can receive information associated with its location that may be more relevant to the user of the wireless device 20. In another embodiment, a geofence or geofences is associated with an online campus where the geofence is associated with specific programs or classes that relate to a certain topic, degree program, or class management associated with a group of people. FIG. 25 depicts one embodiment of obtaining location-based information wherein the wireless device has settings. As shown in FIG. 25, if the wireless device is within the geofenced area, then according or based upon the settings of the wireless device, then at least some location-based information is provided to the wireless device 105. For example, in one embodiment the wireless device 20 comprises settings set such that location-based information is turned off to conserve battery life. In such an embodiment, location-based information would not be provided to the wireless device 20.

Figure 26:
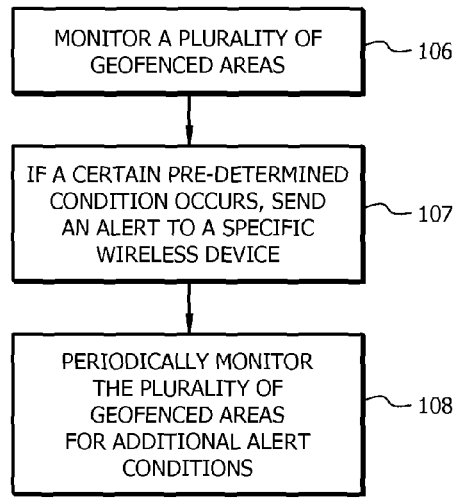
FIG. 26 depicts a plurality of geofenced areas in one embodiment.

Referring to FIG. 26, depicts one embodiment of obtaining location-based information wherein a plurality of geofenced areas are monitored. As depicted, this embodiment comprises monitoring a plurality of geofenced areas 106, and if a certain pre-determined condition is met or occurs sending an alert to a specific wireless device 107 and periodically monitor the plurality of geofenced areas for additional alert conditions that can be met 108. For example, a geofenced location can have electronic borders that have certain permissions or security settings associated with it. One example includes a bank having a secure wireless intranet in which the geo-fence marks the physical boundaries of the secure wireless network 40 such that the physical layout of the bank makes up the geofenced area 60. In yet another embodiment, the geofenced area 60 is based upon certain wireless devices identification either on a network, through the SSID, MAC address, user ID, MAC-48 identifier, EUI-48, EUI-64, IP authentication headers, encapsulating security payloads, security associations using ISAKMP, IPSec using the Security Parameter Index, or any other authentication method or any other identifying method used with wireless devices, which provides certain encryption techniques to wireless device 20 users on the geofenced location. Accordingly, a wireless device 20 user can enter the geofenced location and become a secure user of the geofenced locations intranet or network. In yet another embodiment, the user of the wireless device 20 can use a mobile payment system to purchase items within a certain wireless network 40, location, or geofenced area 60.

In yet another embodiment, geo-fencing is used to identify when a person, item, or any other tangible item either enters or leaves a certain geofenced location. In this embodiment, the person or item comprises an associated identifier that can be read by the network, location-based service 10, server(s), database(s), and/or wireless device 20 that allows for a user to receive a notification that a person and/or item has either entered or left the geofenced area 60. In another embodiment, the geofenced location can be established by a business, organization, company, wireless user or other entity/person associated with the geofenced location.

Similarly, a system comprising a wireless network 40 or having access to the Internet, and at least one geofenced location and/or a data management component 30, can perform a number of functions associated with the geofenced location such as management of data, storage of data, management of users, capable of sending, receiving or using encryption techniques (e.g. HMAC-SHA1, TripleDES-CBC, DES-based techniques CBC-MAC; OMAC, PMAC, and AES-CBC) for sales occurring within the geofenced location, monitor users' actions, manage inventory associated with the geofenced location, and identify when users leave the geofenced location. In one embodiment, a wireless device 20 or computing device can be associated with a communications link. In yet another embodiment, the communications link can select the encryption technique to be used based upon the characteristics of the communications link, the characteristics of the data to be sent over the communications link, the efficiency of a given encryption technique, or any combination of the foregoing. The system in this embodiment can be any combination of hardware including any of the following: server, database, wireless network 40, location-based service 10, computing device, and/or wireless device 20.

In yet another embodiment, a wireless device 20 is configured to receive location-based information based upon the heading or general direction of the wireless device, wherein the heading or general direction can be ascertained by a directional component residing on the wireless device. A directional component can include, but is not limited to, a microprocessor, circuit, motion sensor, compass component, or any other combination of hardware or software that is capable of ascertaining the directional movement or heading of a wireless device. This heading or general direction information is shared or provided to a location-based service 10, software application, localized terminal, server, database, or computing device. In another embodiment, a location-based service 10 receives heading or directional movement information from a wireless device, and based upon that information provide location-based information to the wireless device based upon the heading or directional movement of the wireless device. In another embodiment, the wireless device 20 executes at least part of a software application that is configured to provide location-based information to the wireless device 20 based upon the heading or directional movement of the wireless device. The wireless device 20 can also be in operative communication with an indoor location-based service that provides indoor location-based information to the wireless device based upon the heading or directional movement of the wireless device. In one embodiment, the wireless device 20 receives advertisements that are based upon the heading or directional movement of the wireless device. In one embodiment, the wireless device 20 ascertains its own heading or directional movement and requests location-based information from either a mobile payment system 70, location-based service 10, wireless network 40, server, database, or other wireless device based upon the heading or movement of the wireless device. In another embodiment, the wireless device 20 is configured to receive or ascertain data regarding its heading or directional movement and filter location-based information based upon the heading or directional movement of the wireless device 20. In another embodiment, the wireless device is operable to communicate with a software application that provides location-based information that is based upon the heading or directional movement of the wireless device 20. In another embodiment, the location-based service 10 is in communication with at least one wireless device and configured to receive heading or directional movement information from the wireless device 20. In one embodiment, a wireless device comprises a NFC-enabled data management component that is configured to initiate a communication using magnetic field induction techniques. In this embodiment, the location-based service 10 is configured to receive a plurality of headings or directional movements from one or more wireless devices and is able to determine trends, graphs, movement analytics, or analysis of the directional movements or headings to provide such information to a server, vendor, wireless device, database, or other entity.

In another embodiment, the location-based service 10 comprising a server and database is configured to receive a plurality of directional movement or heading data from one or more wireless devices through the server and send such information to be stored on the database. In this embodiment, the location-based service 10 is configured to provide reports or data that comprise trends, directional movements, headings, frequency of movements, graphs, time stamped information, directions of movements, or other directional information to another computing device or wireless device 20, which can be used for performing analysis of the data for marketing, business, or other purposes. A location-based service, in one embodiment, is configured to provide directional and movement analytics to a computing device or wireless device. In another embodiment, a location-based service, software application, or server is configured to provide location-based advertisements to a wireless device that is based upon the directional movement of the wireless device. In another embodiment, the wireless device 20 is configured to receive location-based information based upon the location of the wireless device 20 and directional movement of the wireless device 20.

In one embodiment the data management component 30 resides on the wireless device 20, referring now to FIGS. 11-13, and manages location-based information received by the wireless device 20. In this embodiment the data management component 30 serves as the manager of location-based information for the wireless device 20. Still further in another embodiment, the data management component 30 resides on the wireless device 20 and computes distances between the wireless device 20 and other tangible items located in either a location-based service 10 or geofenced area 60. The data management component 30 calculates distances using the location of the wireless (which can be ascertained through a myriad of technologies) and compare it to the location of the physical or tangible item within either a wireless network 40, geofenced area 60 and/or location based service. In another embodiment and referring to FIGS. 11-13, the wireless device is configured to calculate the distance between a physical item and the wireless device and is not associated with a data management component. In another embodiment, the data management component 30 calculates the distance of a tangible item or user by accessing a location-based service 10, tables with the associated location of the item, or other data that can provide the location of a tangible item. Referring again to FIG. 13, the wireless device can be in near proximity to a wireless network, plurality of wireless network, geofenced area 60, or plurality of geofenced areas. In another example, the data management component 30 updates itself dynamically through interactions with various wireless networks, location-based services 10 and/or geofenced locations. In this example, the data management component 30 monitors location-based services 10 and/or geofenced locations for updates on time-sensitive information, updateable information, advertisements, users within such a service or location, inventories, employees, revenues, items for sale, polls, video, photographs, and/or purchases made. In another embodiment, the data management component 30 updates the location information on the wireless device 20 without interaction required by the user. In yet another embodiment the data management component 30 is contextually aware and can receive updated location information as the wireless device 20 moves into certain locations that have either a location-based service 10, wireless network 40, and/or geofenced locations. For example, in one embodiment a wireless device that is capable of receiving or displaying location-based information is associated with a data management component 30. In this embodiment, the data management component is contextually aware because it can analyze, recognize, or even predict its surroundings or future movements of the wireless device by analyze the movement of the wireless device 20. In this embodiment, the data management component can also be contextually aware by using past locations visited by the wireless device 20, favorite locations visited by the wireless device, or positioning data stored by the wireless device to receive location-based information from a service or software application without input by the user. In one embodiment, the data management component 30 becomes contextually aware by recognizing location-based information is available based upon the location of the wireless device 20 and then request or receive location-based information without the user having to manually perform a search for location-based information. An advantage of this invention is that the burden on the user is lessened and the data management component 30 is able to receive, request, modify, calibrate, determine, format, or display location-based information with minimal input from the user. In another embodiment, a data management component is configured to use an adaptive profile to associate energy operations data with a specific area (both above ground or subterranean) that can be used or processed by a user or location-based service to create a certain display based upon the system settings or user input. In another embodiment, a data management component 30 is able to create an adaptive drilling profile associated with a geofenced location that may be provided to the user for further analysis or manipulation via a graphical user interface or mapping interface. In addition, a data management component is also configured to schedule tasks associated with processing information associated with an adaptive profile and where the data management component can determine whether certain functions should be performed using serial techniques, through parallel processing techniques, or both to be more efficiently provide data to a user.

Calculating the distance of a tangible item can be performed by any method compatible with a computing device, wireless device 20, or location-based service 10. One example is through the use of location determination methods which include, but is not limited to, cell of origin, distance, angle, location pattern recognition, or any combination of each. Cell of origin can be used to track the cell that a wireless device 20 is associated with. To improve the accuracy of the cell of origin technique cells can provide a received signal strength indication or use a highest signal strength technique. Another example of calculating the distance is through use of time of arrival methods. Time of arrival can be used to ascertain the time the wireless device 20 sends a signal to a wireless network 40. In one embodiment, the time of arrival uses an equation such as D=c(t) to determine the distance between the wireless device 20 and the receiver, wireless network 40, or base station. In addition time of arrival can be used to implement a tri-lateration or multi-lateration technique. Time of arrival can also be used by a wireless device 20, wireless network 40, location-based service 10, or computing device in two-dimensional as well as three-dimensional planes. In another example, the wireless device 20, wireless network 40, computing device, and/or location-based service 10 use time of arrival to locate the wireless device 20. One possible implementation of time of arrival is represented as $TDOA_{B-A}=|T_B-T_A|=k$. This value of this equation is then used to create a hyperbola with foci, which represents possible locations of the wireless device 20. In one embodiment, multiple base stations are used to calculate time difference of arrival or observed time difference of arrival. Additional hyperbolas can be added for improved performance and one such example is the use of hyperbolic multi-lateration. Lateration can also be accomplished by using received signal strength, which can be measured by the mobile device or location-based service 10, wireless network 40, base station, or a receiver. The time difference of arrival method can also incorporate antenna gains or path loss to solve the distance of the wireless device 20 and location-based service 10, wireless network 40, base station, or a receiver. Received signal strength can also be further implemented by using received-signal strength tri-lateration and multi-lateration for improved location accuracy.

Angle of arrival can also be used to determine location. The angle of arrival can be configured to use the angle of incidence to determine location as well. Multiple cell towers or base stations can calculate the angle of arrival of the signal from the wireless device 20 and use this information to perform tri-angulation after which the data can be converted into latitude and longitude or Cartesian coordinates. Location pattern techniques can also be used to ascertain the location of a wireless device 20. Location pattern techniques can use a RF profile or signature and/or signal propagation characteristics and/or possible received signal strength. Location pattern techniques can also use time of arrival, time difference of arrival, time difference of arrival-based RF signatures as well. Wireless access points can be used on the system side to sample signal strength of the mobile device. Location pattern recognition can also use an array or location vector of received signal strength values, which can be stored in a database. Location pattern techniques can also implement algorithms to find the minimal statistical distance between certain vectors or to Bayesian probability interferences. A system can be configured to comprise one of a wireless network 40, wireless device 20, location-based service 10 or cell tower to implement the above discussed location determination techniques. This system can also include an adaptive profile, data management component 30, server, or database. In particular the system can maintain a list or array of received signal strength values.

Location-based services 10 can also use various C-plane and U-plane solutions or a combination of both. Control plane or C-plan solutions can use a data management component 30 for coordination and scheduling of resources used to support location-based services 10. In one embodiment, the data management component 30 can also calculate the final location, velocity estimate, or estimates of achieved accuracy. In a control plane implementation, the network, location-based service 10, system, or wireless device 20 can also use intra-eNB and inter-eNB handovers. In one embodiment, user plane or U-plane solutions use a location terminal and enabled terminal to ascertain location. A data management component 30 can be used for coordination and to accomplish administrative functions associated with providing location-based services 10 while an additional data management component can be configured to complete the location or positioning function. In another embodiment, a U-plan solution can use the Mobile Location Protocol, Roaming Location Protocol, or User Plane Location Protocol. In both C-plane and U-plane implementations, the system can use several positioning techniques including A-GNSS, GNSS, downlink positioning, E-CID, or a combination of these techniques. In one embodiment, the wireless device 20 can use GNSS or A-GNSS methods to calculate its own location. In another embodiment, U-plane methods and C-plane methods are used together to provide location-based information and/or services to a wireless device. In another embodiment, a data management component 30 can implement U-plane methods and C-plane methods together to provide improved location-based information and/or services. Thus, in one embodiment, a system comprising a base station associated with a data management component 30, a wireless network 40 providing wireless access points to wireless devices, can use C-plane and/or U-plane methods to provide the location to a wireless device 20 through the wireless network 40. In another embodiment, the data management component 30 can use either C-plane or U-plane location methods to determine the location of wireless devices. In this embodiment, the data management component 30 can be associated with a server, base station, or database to perform the function of locating a wireless device 20.

In yet another embodiment, the wireless device 20 is configured to receive indoor location-based information. Indoor location-based information can be determined using RF fingerprinting, triangulation, Bluetooth, cellular signals, or a combination of these and other such methods. In another embodiment, sensors can be used indoors to provide more accurate location-based indoor information. In another embodiment, the wireless device 20 is configured to receive indoor location-based information and display the information on a mapping interface, a text-based interface, or via a voice response. The wireless device 20 can also register with a motion sensor or location-based service that is located indoors and can provide indoor location-based information by either selectively choosing to register, logging in, opting in, authentication of the user with the sensor or service, or accepting a request to receive indoor location-based information. The wireless device 20 can also be associated with a software application that provides indoor location-based information. In another embodiment, a wireless device 20 interfaces with a sensor associated with an indoor location to send and receive location-based information. In one embodiment, a wireless device 20 becomes location aware, which means wireless devices can passively or actively determine their location. In one embodiment, the wireless device 20 can passively determine its location by requiring no user interaction or minimal user interaction. In one embodiment, the wireless device 20 is configure to passively determine its location based upon predetermined user settings or system settings of a location-based service 10, data management component 30, or mobile payment system. The advantage is that by passively determining the location of a wireless device 20 the demand on the resources of the wireless device 20 is reduce or minimized. In another embodiment, the wireless device 20 is located within a retail store or other business and within that business certain items are identified and recognized by a wireless device 20. Alternatively, sensors are located within the retail store or business and the wireless device 20 is configured to receive indoor location-based information from the identified items or sensors that relate to the retail store or business. Thus, the advantage of this embodiment is that the user can use location-based information to learn information about the retail store or business that is related to the location. In another embodiment, the wireless device 20 can send indoor location-based information to a sensor or other device within the retail store or business that can be used by the business or retail store for analytics related to the business, its marketing, its advertisements, its store layout, or staffing needs. This embodiment, thus provides a powerful tool for a business, school, or other establishment to learn more about its patrons, customers, or students. In another embodiment, the sensor, location-based service 10, or data management component 30 located within the store can receive indoor location-based information and provide such information to a location-based service 10, data management component 30, mobile payment system 70, or other device that is not located within the store for use and analytics related to the establishment, store, school, or business. Likewise, in another embodiment wireless networks are configured to be location aware. In another embodiment, a data management component 30 or wireless device 20 filter location-based information based upon user preferences, wireless network 40 settings, or the wireless device 20 history, or other settings that filter the location-based information dynamically.

A graphical user interface can also be associated with the wireless device 20. A graphical user interface can include a map interface, graphical map interface, street level interface, icon, beacon, topographical interface, grid, store, school, oilfield, oil well, text, video, or any information capable of being displayed to a user. In one embodiment the graphical user interface can include a touch screen. In another embodiment, the graphical user interface interfaces with voice commands to display location-based information. In another embodiment, the graphical user interface associated with touch screen functionality provides additional information associated with the location-based information to user based upon the user's interactions and/or selection of certain graphical displays (e.g., an icon, selection via a touch screen, address, map, beacons, applications, or any other graphical display).

In another embodiment the adaptive profile filters certain movie listings, sports scores, stocks, company news, or restaurants based upon the wireless device's location. An adaptive profile, as used herein, refers to a profile which can be adapted by the user or by a location-based service 10, database, server, computing device, other wireless device 20, data management component 30, mobile payment system 70, payment server 90, or localized terminal 80. In another embodiment, an adaptive filter associated with an application also perform these functions. In another embodiment, the adaptive profile is used to tailor the location-based information available to the wireless to the needs of the user. An adaptive profile can be used to apply user preferences selected by the user. An adaptive profile can also be used to determine security settings, the kind of location-information received by the wireless device, filtering a location-based information based upon the age of the wireless device user, and can also include profile information which is provided to a location-based service, wireless network 40, or computing device. In one embodiment, the application is temporary.

In one embodiment, the wireless device 20 comprises an accelerometer and/or motion sensor that is capable of providing location information to a wireless network 40. In this embodiment, the wireless device 20 provides updated location-information to a wireless network 40 based upon the movement of the wireless device 20. In another embodiment, the wireless device can provide updated location-based information to a location-based service based upon the movement of the wireless device. In one embodiment, location measurement units can be used to perform the function of locating the wireless device 20.

In yet another embodiment, the data management component 30 stores location information on a wireless device 20 for use in additional visits to a physical location associated with either a location-based service 10 and/or geofenced location. In this embodiment, the data management component 30 serves as a repository for location information to be stored on the wireless device 20. In this embodiment, the wireless device 20 can pre pre-programmed or programmed by the user to share certain data with a location-based service 10 upon entering or coming within near proximity of a location that the wireless device 20 has previously visited. In another embodiment, the wireless device 20 in association with the data management component 30 uses an adaptive profile to apply either dynamically, automatically, or manually to certain location-based services 10 and/or geofenced locations. For example, in one embodiment, an adaptive profile associated with the user is used for interacting with a location-based service 10, mobile payment system 70, or geofenced location/area. In this embodiment, the adaptive profile can be used to interact with these services or system where preferences or data related to the user is provided automatically or manually. In another embodiment, an advantage for the user of an adaptive profile is that it can be defined or set and then used to interact with certain services or software. In one example, an adaptive profile is used for interacting with a location-based service that displays the user's sports preferences, retail preferences, location preferences, or current location. In this example, the adaptive profile changes based upon user interactions but is also used to limit the amount of data input the user must perform. In another example, an adaptive profile could represent a handle or other public identification such as a username that is used with a location-based service 10. In another embodiment, an adaptive profile is associated with an oil or gas location and includes at least some energy operations data related to the location. In this embodiment, the adaptive profile could then be used and updated as needed based upon events at the oil or gas location. In another embodiment, an oil or gas adaptive profile is defined by a user or location-based service 10. In another embodiment, a location-based service 10 can provide energy operations data by itself or as part of an adaptive drilling profile that is in near proximity to a geographic location. In other words, near proximity means that the energy operations data relates to a general geographic location such as a county, drilling operation, or other location. Near proximity can also include data sets of energy operations data related to geographic locations that are in close relation or even adjacent to one another. In another embodiment, near proximity can include data that is related geographically within a general vicinity. In another embodiment, an oil and gas adaptive profile is used to overlay energy operations data on a graphical user interface. In another embodiment, the adaptive profile can be used in conjunction with other adaptive profiles to be displayed or used by a user of a location-based service. In another embodiment, an adaptive profile can be displayed on a three dimensional or four dimensional display, user interface, or mapping interface. In another embodiment, a location-based service 10 or data management component 30 can create an adaptive profile that is associated with a certain geographical area or location. In another embodiment, the adaptive profile is used with a mobile payment system 70 and is adaptive to the extent it can be modified by the actions of a user or mobile payment system 70. In another embodiment, the adaptive profile can be stored on a payment server that is accessible by a wireless device 20 upon initiating a mobile payment at a specific location. The adaptive profile can include privacy, security, and other settings associated with how much information is provided to a location-based service 10, network, computer, user, and/or geofenced location. The adaptive profile can be generated dynamically by the wireless device 20 or by the data management component 30. In yet another embodiment, the adaptive profile is generated using pre-selected values or tables of pre-selected values, dynamic information or any combinations thereof. In another embodiment, the adaptive profile allows the wireless device 20 to perform, at least in some manner, in a contextually aware manner and the wireless device 20 becomes contextually aware by dynamically updating the device with location information that is received from its surroundings. Security and privacy are two examples of challenges that currently face the location-based or location-aware movement. Through the use, in one embodiment, of a profile, whether adaptive or not, wireless device 20 users can protect their secure information and thereby increase their privacy when using location-based systems, services, and/or geofenced locations.

In another embodiment, the profile is set by the wireless device 20 itself based upon certain security and privacy settings of the user. In this embodiment, the wireless device 20 user selects that he/she will only share basic information with location-based services 10, network, and/or geofenced locations. In another embodiment, the wireless device 20 comprises logic to configure the profile, which can be temporary or permanent, according the user's preferences. Conversely and in another embodiment, the wireless device 20 user can choose to share the maximum amount of the user's information with the location-based service 10, network, and/or geofenced location within the context of the location-based service 10 or wireless network 40. In one embodiment, any profile, whether adaptive or not, used in association with location-based services 10, networks, and or geofenced locations can be modified to limit any amount of data provided from the user to the services, locations, and/or networks. Conversely, in this embodiment, any profile used in association with location-based services 10, network, and or geofenced locations can be modified to limit the amount of data received by the user to the services, locations, and/or networks. In one embodiment, the graphical map display is configured to display multiple adaptive drilling profiles to the user. For example and in one variation of this embodiment, one adaptive drilling profile is associated with mapping data of a given location, one adaptive drilling profile is associated with costs from the given location, and one adaptive drilling profile is associated with production or predicted production of the wells in the given location and all three adaptive profiles can be displayed to the user at the same time.

In one embodiment, the adaptive profile is associated with a payment component that is used for point-of-sale payments, mobile purchasing systems, or mobile payments system payments to certain locations. In this embodiment, the payment component can store, manage, and/or use secure payment authorizations, credit card numbers, payment accounts (e-payments), and/or other payment information associated with a user of a wireless device 20. The payment component can also use encryption as a technique for keeping the payment component private and secure. The payment component can also provide information by using the IPsec protocol. In this embodiment, the IPsec used by the payment component can also use an integrity check value, next header field, or security parameters index to protect payment information.

In yet another embodiment, the data management component 30 resides on a server and/or database or both, and serves as a data manager for all wireless devices that are associated with the a location or locations as part of either a wireless device 20, location-based service 10 or geofenced location. In this embodiment, the location (a business, social, school, oilfield, or any other physical location) decides what information to keep from users as well as what levels of security the location should employ. In this embodiment, the data management component 30 provides data to differing levels of users including members or other preferred users. This embodiment allows the location to data mine certain user information, such as helping the location's marketing efforts, inventory, payment authorizations, revenues, and/or customer service. In yet another embodiment, the location can decide which information it collects from wireless device 20 users in contact with the location-based service 10 and/or geofenced area 60. For example and in this embodiment, the location sets its location profile that include but is not limited to: the information from users to be retained by the location, the security settings of the location-based service 10 and/or geofenced location, the privacy settings of the location-based service 10 and/or geofenced location as its customers privacy settings, the encryptions methods to be used by the location, the secure sales methods to be incorporated on wireless devices visiting the location, advertisements it makes to customers based upon the customer's browsing history, favorites, profile and/or any other user-specific information. In yet another embodiment, a data management component is a powerful tool that can be used to efficiently and effectively manage secure data sets or large data sets to provide to users In yet another embodiment, the data management component 30 stores video associated with the location-based service 10 or geofenced area 60. In this embodiment, the data management component 30 can reside on the wireless device 20, server(s), database(s), network(s), the location-based service 10, and/or any combination of the same. In this embodiment, the user records video associated with a certain location and stores it on the data management component 30 associated with the wireless device 20. In another embodiment, the user can choose to upload the video to the location's data management component 30 if desired, which essentially "tags" or assigns the video to the location.

In yet another embodiment, the data management component 30 stores profile information for the user of the wireless device 20. In another embodiment, the data management component 30 can also store visit history to certain geofenced locations and/or locations on a location-based service 10 for quick access to the data concerning the locations upon the user's next visit. In this embodiment, the wireless device 20 provides the visit history automatically when associated with a location-based service 10, location, or geofenced location or can ask the user for confirmation to send visit history. In another example, the data management component 30 stores browsing history, settings relating to certain locations, as well as the user's preferences for interacting with certain locations that are part of a location-based service 10, network, or geofenced location. In yet another embodiment, data management component 30 resides on the wireless device 20 and includes an adaptive profile to be used by the user to update which information is shared with certain locations, when the information is shared, how much information is shared, how often the information is provided, settings for the security of level regarding any data provided to location-based-services, networks, determines whether the user can purchase items associated with a certain location, determines whether the user is qualified, for example being of a certain age, to purchase products or visit the location., and also can update privacy settings on the wireless device 20. In another embodiment, the data management component 30 operates on a wireless device 20 that has a multi-core processor.

In another embodiment, the data management component 30 provides profile information to a location-based service 10 or geofenced area 60 that includes age, gender, demographic information, interests, games, payment information, time-sensitive information, secure information over a secure connection (one non-limiting example is through the Secure Socket Layer or IPsec protocol) shopping preferences, transaction history, past locations visited, access to user account information using secure protocol or transmission, internet browsing history and/or preferences, other interests, etc. and combinations thereof.

In another embodiment, the adaptive profile provides profile information to a location-based service 10 or geofenced area 60 that can include age, gender, demographic information, interests, games, payment information, time-sensitive information, secure information over a secure connection (one non-limiting example Secure Socket Layer or IPsec protocol) shopping preferences, transaction history, past locations visited, access to user account information using secure protocol or transmission, internet browsing history and/or preferences, other interests, etc., and combinations thereof.

In yet another embodiment, the data management component 30 is associated with modifying, updating, storing, receiving and/or transmitting location-based information. In another embodiment, the data management component 30 is used on a wireless device 20 having a multi-core processor which enables better performance when using location-based systems and/or services compared to a single core processor. In an additional embodiment, the data management component 30 provides information for display on a graphical display or a 3D graphical display for the user. In yet another embodiment, the data management component 30 provides location-based information for transmission to the user using a computerized voice alert system.

In one embodiment, location-based information comprises any information that is associated with a certain location or locations. For example, location information can comprise traffic information, product information, financial information, advertisements, text messages, emails, inventory data, pricing, payment information, security data, frequency-divided messages, information about the address of the location (or other physical attributes), privacy settings, information associated with a web page, information associated with a server, information associated with a wireless device 20, information associated with a database, information associated with a vehicle, and information associated with a social networking service. In another embodiment, location-based information can comprise at least some energy operations data which may include lease information, production information, oceanic oil and gas data, oceanic modeling data, simulation data, oil well characteristics, oil well location, title information associated with a well (gas or oil), oil well owner, economic data, costs, manpower estimates, manpower tracking, oil well lease identification number, survey number, operator name, permits for drilling, permits for other oil and gas operations, well logs, tight sands designations, permitted commercial disposals, operator data, lease data, field name, reservoir identifier, historical operator or lease data, well depth, field depth, elevation, well type, unconventional production data, unconventional oil play data, horizontal drilling data, latitude or longitude data, cumulative production data, production averages, user profile, location profile, adaptive profile, water station locations and information associated with a water station, orphan wells, oil and gas alert. In another embodiment, location-based information can include gaming data, games, polls, votes, video, pictures, photographs, text, and any other information that is associated with a location, and combinations thereof.

In one embodiment, a wireless device 20 is configured to display information associated with oil wells, gas wells, oil and gas pipelines, and/or water stations. This data can be provided to the wireless device via a location-based service 10, software application, applet, first computing device 50, or other wireless device. The information the wireless device 20 is capable of displaying includes location-based information that can comprise, though is not limited to, energy operations data including lease information, production information, oil well characteristics, oil well location, gas well location, title information associated with a well (gas or oil), oil well owner, oil well lease identification number, survey number, operator name, permits for drilling, permits for other oil and gas operations, well logs, tight sands designations, permitted commercial disposals, water station locations and information associated with a water station, orphan wells, oil and gas alerts, any other oil and gas information associated with a drilling operation, an oil or gas well. In another embodiment, an oil well or gas well can comprise a profile for use by a computing device or a wireless device 20 that can include some of the following information energy operations data including lease information, production information, oil well characteristics, oil well location, gas well location, title information associated with a well (gas or oil), oil well owner, oil well lease identification number, survey number, operator name, permits for drilling, permits for other oil and gas operations, well logs, tight sands designations, permitted commercial disposals, water station locations and information associated with a water station, orphan wells, oil and gas alerts, any other oil and gas information associated with an oil or gas well, as well as any other location based information discussed herein and combinations thereof.

In one embodiment, wireless and non-wireless computer devices comprise the ability to search and locate specific location information. For example, in one embodiment, a user searches in a search box or text box information about a physical location, presses enter, and the search engine returns on a graphical user interface the location of certain items searched. In yet another example the user using a text box or search command line types in the street or intersection of streets, or other location identifying information such as address or coordinates, and asks for information specifically around this location. For example, in this embodiment a user can type into the search box an address (e.g., $1^{st}$ St and Main St.) and the search engine returns the physical locations that are within the area of a certain street or intersection of streets. Thus in this embodiment, the physical locations can include location information, locations of restaurants, ATMs, bus stops, ski slopes, oil wells, police stations, veterinaries, parking, banks, hospitals, airports, grocery stores, or any other physical location that is within a certain range of the street or intersection of streets entered. In one embodiment the search can be limited to a specified network or geofenced location. In today's world, you can type or search on an address but the only information that is returned is irrelevant. In one embodiment, it is an unexpected advantage to allow users to search a street or intersections of street and have returned to them by the search engine information that actually relates to the intersection and/or street. In another embodiment, the information requested can be provided by the user device via a computerized voice response. For example, if a user searches for restaurants near the intersection of $1^{st}$ and main street in Tyler, Tex. the wireless device 20 provides the restaurants that are near the intersection. In another embodiment, the wireless device 20 provides results based up a certain radius.

Figure 27:
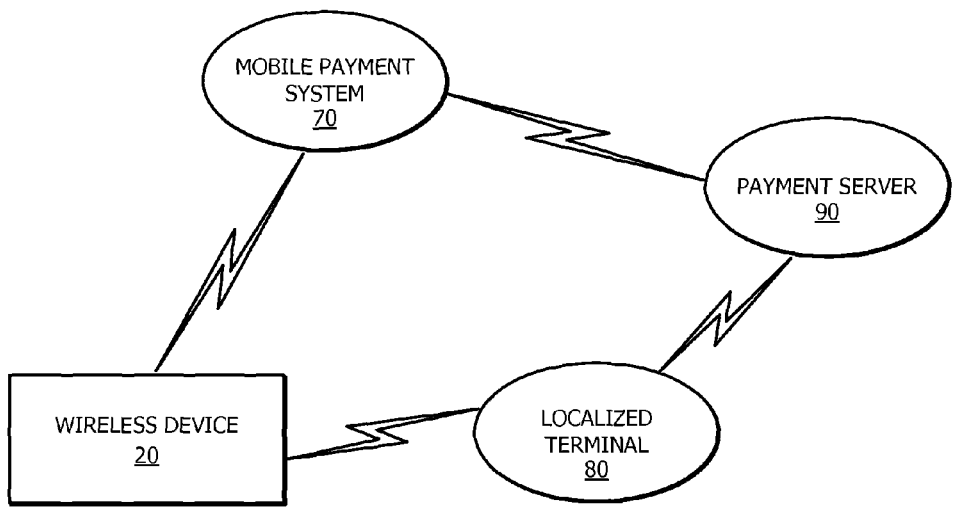
FIG. 27 depicts a payment system in one embodiment.

FIG. 27 depicts a payment system in one embodiment. The mobile payment system 70 can include a contactless payment system, SMS system, near-field communication system, an in-app mobile payment system, mobile payments, direct mobile billing system, or any combination of each kind of system that does not require the use of the magnetic stripe on a typical bank, credit, or gift card. As used herein a contactless payment system is a system which does not require swiping of the use of a magnetic stripe on a credit card or other card.

In one embodiment, the mobile payment system is a near field communication system that is associated with at least a point of sale or localized terminal. As used herein a localized terminal refers to a terminal that is used for a localized sale and includes, but is not limited to, the location at which the sale takes place. An example of a localized terminal includes a retailer, an on-line retailer, cash register, or other system that is used for mobile payments etc. A localized terminal 90 can further comprise a point-of-sale system, near-field operable device, server, database, or any other device that is used to receive or send a request to a wireless device 20 regarding an item for purchase that is within the general vicinity of the wireless device 20.

In this embodiment, the mobile payment system 70 is associated with a location-based service 10 that is associated with a wireless device 20. In this embodiment, the wireless device 20 provides the mobile payment system 70 access to secure memory residing on the wireless device 20 that is separate either through virtual segregation or physical segregation from the other wireless device memory. In this embodiment, the wireless device can register or make contact with a mobile payment system 70 having a localized terminal 80 at a given location. Once the wireless device 20 and localized terminal 80 are in communication with each other, the wireless device 20 or localized terminal 80 then creates a secure connection (one or the other, or both the localized terminal and wireless) through cryptographic techniques including but not limited to: DES-based techniques, SSL, CBC-MAC, OMAC, PMAC, AES-CBC, or SSL with a payment server 90.

In another embodiment the payment server 90 is either located locally in general proximity with the wireless device 20 or out of the generally proximity of the wireless device 20. The wireless device once connected to the localized terminal 80 or payment sever 90 can provide user payment information. As used herein user payment information includes data which is associated with the user. In one embodiment payment information includes, but is not limited to credit card number, expiration date of credit card, security code of credit card, user alias, user name, password, type of credit card, PIN number, location-based authenticated information, GPS information, phone number associated with the credit card, credit card identifier, account balance, credit history, payment history, reward card number, reward card identifier, reward card history, redeemed points associated with a reward card, redeemed tokens associated with a given purchase, reward card expiration, name of user of reward card, frequency of use of reward card, cryptographic techniques associated with the payment information, secure message headers, location-based information, price of item, quantity of item, micropayments, tokens, alerts, authentication methods, and combinations thereof.

Figure 28:
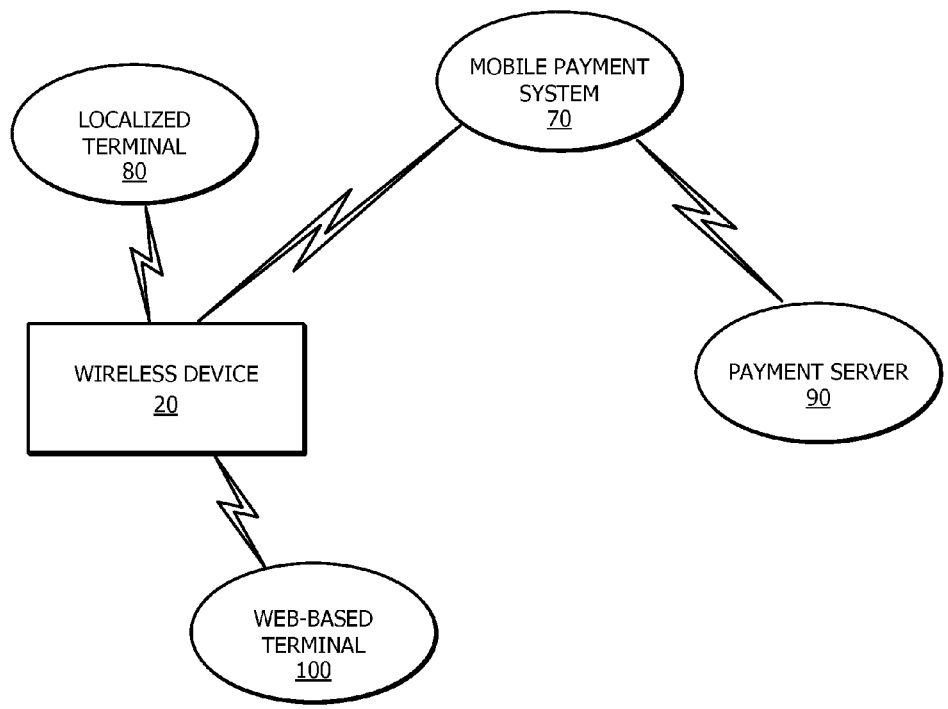
FIG. 28 depicts a payment system in one embodiment.

FIG. 28 depicts a payment system in one embodiment. As shown in FIG. 28, the wireless device 20 is in operative communication with a mobile payment system 70 and a localized terminal 80 wherein the localized terminal 80 is in the general vicinity of the wireless device 20. As used herein, general vicinity means the wireless device 20 can send and receive information to the localized terminal 80. In this embodiment, the payment server 90 receives either a payment information, authentication message, or payment request containing payment information from the mobile payment system 70 or localized terminal 80, wherein such information is at least partially obtained from the user of the wireless device 20. In return the payment server 90 authorizes a transaction based upon the payment request and provides such a confirmation message to the localized terminal 80 or wireless device 20. The payment server 90 can be used to perform settlement functions associated with the purchase that can include providing transaction details to a bank, vendor, or merchant involved in the transaction. The payment server 90 can also be used to store payment information associated with a purchase made through a mobile payment system 70.

In another embodiment, the localized terminal 80 is in communication with the payment server 90 and after receiving payment information from the wireless device 20, sends at least some payment information to the payment server 90. In this embodiment, the payment server 90 authenticates the payment information received and upon authorization of the transaction, sends a message to either the wireless device 20, a software application, location-based service 10, or the localized terminal 80 authorizing the purchase of an item within general proximity of the wireless device.

Turning to FIG. 28, as depicted, the wireless device 20 is configured to register with a payment server 90 to retrieve or at least have access to payment information associated with the user of the wireless device 20. In this embodiment, the payment server 90 provides payment information to the wireless device 20 upon either receiving a request for payment information from the user or without receiving a request from the user. In this embodiment the wireless device 20 then either communicates with a localized terminal 80 or web-based terminal 100 to provide at least some payment information to the localized or web-based terminal and after providing such information to the terminal, the wireless device 20 receives a payment confirmation that is displayed to the user of the wireless device confirming purchase of an item in the general proximity of the wireless device.

In another embodiment, the wireless device 20 can comprise an adaptive profile that is associated with payment information for the user of the wireless device with a mobile payment system 70 or localized terminal 80. In another embodiment, the adaptive profile is associated with an alias, password, or username and is used to automatically populate payment fields provided on the interface of the wireless device in preparation to purchase an item through either a localized terminal 80, web-based terminal or mobile payment system 70. In another embodiment, the payment information comprises account information associated with a prepaid account In another embodiment, the payment server 90 comprises a virtual interface for accessing payment information associated with a wireless device to be used in making a mobile contactless purchase. In another embodiment, the payment server 90 is associated with a cloud-based architecture and is accessible by the wireless device through the internet, local area network, or wide area network.

Payment information can be hosted by a server that is accessible via a virtual interface, such as a cloud-based interface, for making a mobile purchase. In another embodiment, the localized terminal 80 comprises a near field communication component and/or a barcode component. In one embodiment, the bar code component is configured to receive information associated with a bar code, square bar code, QR code, or other codes. In one embodiment, the user is able to access her payment information through a virtual interface that is hosted by a server, webpage, or database. In this embodiment, the user can view her payment information through the virtual interface while minimizing the number of interactions the user's wireless device has with the server, webpage, or database. In another example, the user may be able to modify her payment information on the virtual interface and when complete the payment information can be stored through or by using the virtual interface. In another embodiment a virtual interface can be a secure virtual interface and used for making mobile payments. In another embodiment, a virtual interface can be used with or to present energy operations data. In another embodiment, the wireless device 20 is associated with a first secure memory that is located on the wireless device 20 and a second secure memory that is either located on the wireless device or in operative communication with the wireless device 20. In this embodiment, the first secure memory is used to store adaptive profile information that is subject to payment preferences associated with the user and is accessible by the wireless device for interaction with a localized terminal 80 or mobile payment system 70. In this embodiment, the second secure memory is used to authenticate, verify, or perform encryption techniques in order to initiate a mobile payment. By having two secure memories in this embodiment, the wireless device 20 can process mobile payments in a more efficient manner. In another embodiment, the wireless device 20 can initiate a mobile payment or opt in to another location-based service by movement of the wireless device 20. In this embodiment, the movement close to a terminal or localized terminal 70 can initiate the interaction with the mobile payment system or other location-based service. In this embodiment, the movement of the wireless device can be ascertained by use of a multi-axis motion sensor associated with the wireless device 20 or through use of any other contactless system located within the near proximity of the wireless device. Upon initiation of the location-based service or mobile payment system the wireless device is configured to receive, modify and store location-based information or payment information received by the wireless device with minimal user interaction. In this embodiment, the wireless device 20 can apply the information received by the wireless device 20 to a user's adaptive profile that is used to interact with a location-based service 10 or mobile payment system 70. In this embodiment, the adaptive profile is used to manage the user's encryption policies or security policies associated and can be modified based upon the information received from the mobile payment system 70 or location-based service. In another embodiment, wireless device is configured store payment information using one or more encryption techniques on secure memory for use with information received from a location-based service 10 and in turn the information from the secure memory and the location-based service is modified to be used with a mobile payment system 70.

In another embodiment, the near field communication component is configured to operatively connect to a wireless device in near proximity to a localized terminal 80 or near-field device based upon a movement of the wireless device 20 or request sent by the wireless device 20. In another embodiment, the wireless device 20 operatively communicates with a payment server 90 to authenticate and authorize a payment from a wireless device without the need to physically access a credit card or other payment card and upon receiving a response from the payment server 90 that comprises authorization information, the authorization information is sent to the localized terminal to complete the purchase. In one embodiment, the user need not have to swipe a card, pull a physical card from a physical wallet, or physically contact a physical card to a localized terminal 80 or payment server 90. This is an example of a contactless payment system.

In another embodiment, the wireless device 20 reviews payment information on a graphical user interface, graphical mapping interface, or any other type of interface used by a wireless device. In yet another embodiment, the wireless device 20 is configured to display payment information associated with a given purchase or request for purchase to the user of a wireless device. The user can also be able to confirm the purchase via voice command, pressing of a touch-screen icon, pressing enter, or any other method to confirm the purchase request or purchase. In another embodiment, the payment information that is displayed to the user is pre-filled by a payment server 90, location-based service 10, software application, secure memory, memory on the wireless device, localized terminal 80, sensor, database, server, or other wireless device upon initiation of a mobile payment session or request to make a mobile purchase. In another embodiment, the wireless device 20 is associated with one or more payment servers 90, mobile payment systems 70, location-based services 10, or localized terminals 80. The wireless device 20 can use a tapping, knocking, or other movement to initiate a payment, payment request, or request for additional information to interact with a localized terminal 80, mobile payment system 70, or payment server 90. In one embodiment, the wireless device can be waved near or tapped against a localized terminal to initiate a contactless payment. In one embodiment, the wireless device can send an initiation message to the localized terminal 80 or the localized terminal 80 can send an initiation message or request. As a result, a mobile payment can then be processed or at least requested in this embodiment, This example, thus illustrates how easy a contactless payment can be initiated in one embodiment of the present inventions. In another embodiment the localized terminal 80 or mobile payment system 70 can use user plane and control plane techniques to authenticate the user of the wireless device 20. In another embodiment, the wireless device 20 is configured to use control plane and user plane techniques to register with a location-based service or to authenticate the user with a localized terminal 80 or mobile payment system 70.

When interacting with a mobile payment system 70, in one embodiment, the wireless device 20 displays available payment accounts and rewards cards to the user on a graphical user interface or graphical mapping interface. The payment accounts and reward cards can also be displayed to the user based upon the preference of the user, the frequency of use of the user, or in another user-selectable format. In another embodiment, the wireless device 20 displays the payment status, account information, and reward card information to the user at the same time. In another embodiment, the user views adaptive profile information, authentication message or authorization information in any combination or at the same time. The wireless device 20 that is associated with an adaptive profile, can use the adaptive profile to store credit card information, reward card information, coupons, account statement, user payment information, purchase history, location history regarding mobile transactions, payment alerts, promotions, user or any other financial information associated with a user of a wireless device to interact with mobile payment systems, and combinations thereof. In one such embodiment, the adaptive profile interacts with either the secure memory of the wireless device 20, location-based service 10, localized terminal 80, web-based terminal 100, or mobile payment system 70 to store certain adaptive profile information. The wireless device can be configured to change security setting associated with a mobile payment system on a the basis of location, time settings, or interaction of the user with the wireless device. An adaptive profile, in one embodiment, is associated with a mobile payment system 70 and is configured to determine which profile information to provide to a localized terminal 80, location-based service 10, or payment service. In one embodiment, the adaptive profile associated with a mobile payment system 70 is stored by a location-based service 10 or other service having a virtual interface accessible by the wireless device 20 and at least some adaptive profile information can be provide to the wireless device upon attempting to make a mobile purchase. An adaptive profile is adaptive because it can be modified by either the user or other system that has access to it.

In one embodiment, a mobile payment system 70 includes a location-based service 10 that is configured to provide location-based information to a wireless device 20. In another embodiment, a mobile payment system 70 is configured to allow for mobile web payments through the internet, a local area network, or wide area network. The mobile payment system 70 can reside on the wireless device, wherein the wireless device comprises a near-field communication chip, wherein the mobile payment system 70 can use near-field communication for receiving payment information from a user of the wireless device. In another embodiment, the wireless device is in communication with a localized terminal 80 that is configured to receive a payment request from the wireless device to purchase an item within the general vicinity of the wireless device. In another embodiment, a software application in communication with a wireless device 20 and location-based service 10, and configured to receive location-based information from the location-based service 10 that includes physical items prioritized by a unique identifier based upon sales of the item or items within the given location and where the software application is configured to provide such information to a wireless device creating a customized list, catalog, electronic circular, or min-catalog of most popular items for sale or lease. In this embodiment the user can decide to purchase an item associated with the location-based information through a mobile payment system 70. In another embodiment, the mobile payment system 70 can be used for person-to-person, person-to-business, or business-to-business transactions.

In yet another embodiment, the mobile purchasing system 70 is operatively connected to a location-based service 10 wherein the location-based service provides location-based information to the mobile purchasing system 70 that is either associated with the user, an item within a general vicinity of the wireless device, or payment information for purchase of an item by the user of the wireless device 20. In another embodiment, the localized terminal 80 is operatively connected to a location-based service 10 that is either within a local vicinity of the localized terminal 80, wireless device 20 or remote to either the wireless device 20 and localized terminal 80 and is configured to provide location-based information to the localized terminal or profile associated with the user of the wireless device for payment authentication or authorization. In another embodiment, the mobile payment system 70 is connected to one or more location-based services 10 where the first location-based service is configured to provide location-based information to the mobile payment system 70 or localized terminal 80 comprising advertisements or offers to sell and the second location-based service is configured to provide payment authentication or authorization information to a mobile payment system 70 or localized terminal 80. In one of such embodiments, the mobile payment system 70 is configured to send an advertisement to a wireless device 20 based upon the location of the wireless device 20 and authorization or authenticate a transaction involving an item that is within the general vicinity of the wireless device 20. In one embodiment, the wireless device 20 is in operative communication with a location-based service 10 wherein the location-based service is configured to provide a user's adaptive profile to the wireless device 20 and comprises payment information associated with the user. In this embodiment, the wireless device 20 is then configured to use the adaptive profile to make a payment to a mobile payment system without a localized terminal 80 or through a localized terminal 80 that is in operative communication with a mobile payment system without the need of swiping a physical card or using a magnetic strip at a localized terminal within near vicinity of the wireless device. Further in this embodiment, the wireless device 20 through the location-based service 10 or software application is operable to provide a confirmation message to the user of the wireless device that is selectable by the user to confirm a purchase of an item within near vicinity of the mobile device.

In another embodiment, the wireless device is associated with a mobile payment system 70 that at least partially comprises a software program that resides on the wireless device 20. In this embodiment, the mobile payment system 70 is configured to store an adaptive profile associated with the user of the wireless device 20 that comprises either an alias or other name or number that represents account identification associated with a user of a wireless device. In one of such embodiments, the mobile payment system 70 uses various authentication methods including but not limited to proximity authentication, account authentication, location-based authentication, communication authentication, NFC-based authentication or other known authentication methods to verify any message received by the wireless device from a localized terminal 80, payment server 90, or location-based service 10 that represents settlement of a certain purchase request made by the mobile payment system 70.

Figure 29:
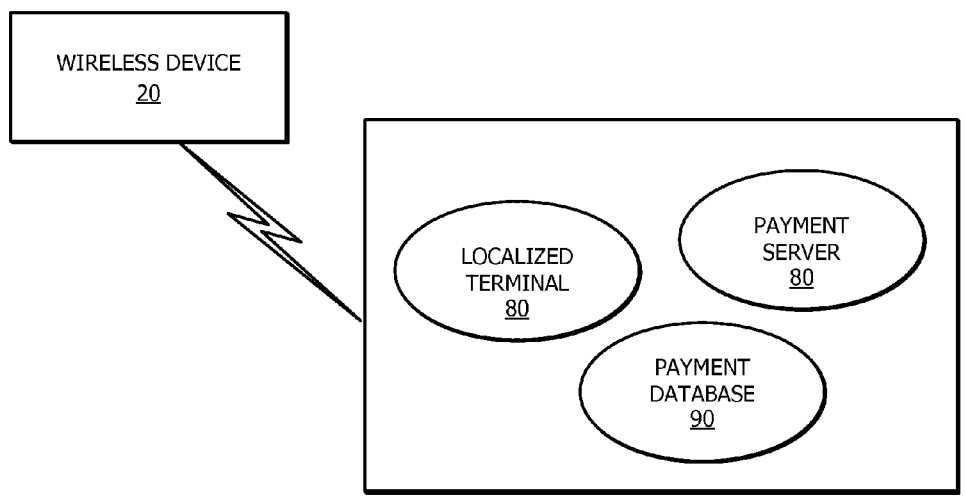
FIG. 29 depicts a payment system in one embodiment.

Turning to one embodiment as referenced in FIG. 29, the wireless device 20 is in communication with a mobile payment system 70 that comprises a localized terminal 80, payment server 90, and payment database 110. In this embodiment, the wireless device 20 is configured to register with a mobile payment system 70, provide payment information to a mobile payment system 70, send an authentication message to the mobile payment system, and receive payment, authorization, authentication, or confirmation messages from the mobile payment system 70. In this embodiment, the localized terminal 80 after recognizing the wireless device 20, is configured to receive information from a payment server 90 regarding encrypted or non-encrypted payment information from the payment server, that in turn at least some of the payment information is provided to the wireless device 20 through either the localized terminal 80 or payment server 90. In this embodiment, it may be useful for a localized terminal to receive payment information associated with a user in communication with a localized terminal 80 from a payment server 90. In this embodiment, the payment information could comprise secure payment information, authorization message, authentication message, or unique identifier to be used to verify the user of a wireless device. In this embodiment, one advantage is to be able to verify a user of a wireless device quickly while minimizing the amount of interaction required between the wireless device 20 and the localized terminal 80.

In one embodiment the wireless device 20 is associated with a software application that is selectable through the interface of the wireless device and wherein the wireless device 20 comprises a multi-axis motion sensor. In one embodiment the multi-axis motion sensor comprises a three axis or six-axis motion sensor. In one such embodiment, the software application is registered to operate with a mobile payment system 70 that is connected to a payment server 90 through either an internet connection or through a localized terminal 80. In this embodiment, the software application is configured to send payment information to a mobile payment system 70, to a localized terminal 80 or payment sever 90 upon request by the user. In another embodiment, the software application employs the user's payment information or adaptive profile to provide secure authentication information to a localized terminal 80, payment server 90, or mobile payment system 70. In one embodiment, a software application is configured to receive and format location-based information associated with a general proximity near the wireless device 20 provided by a multi-axis motion sensor. In this embodiment, some location-based information could be items within a store. The motion sensor is then used to detect the direction of the wireless device and provide the location or information related to items based upon the directional movement of the wireless device 20. In another embodiment, the motion sensor is able to provide near real time location-based information to a management component 30 residing on the wireless device 20. The data management component taking the location-based information received from the motion sensor as a parameter is then configured to present information regarding an item or location based upon the directional movement of the wireless device 20. A data management component 30 can also be used to update an adaptive profile associated with a wireless device 20 based upon data received from a motion sensor located on the wireless device. In another embodiment, the wireless device 20 receives location-based information from a motion sensor and uses at least some of the information received from the motion sensor to initiate, validate, or authenticate a mobile payment using a mobile payment system 70 that may comprise a localized terminal.

In another embodiment, the user through a software application can purchase an item associated with a given location through interactions with a localized terminal 80 that is either in communication with a payment server 90 or mobile payment system 70. Wherein the software application is configured to display payment information at least comprising account information, reward card information, or payment confirmation information to the user of the wireless device upon receiving such information from a localized terminal 80 or payment server 90. A software application in communication with a mobile payment system can also use various authentication methods or encryption techniques to interact with a mobile payment system 70 for making purchases through a mobile payment system 70 in certain embodiments.

In another embodiment, the wireless device 20 is associated with a software application that is operatively connected to a mobile payment system 70 and a location-based service 10 wherein the software application is configured to provide an item identification number, amount of item, or adaptive profile information associated with the user to a mobile payment system 70. In one embodiment, the software application is also configured to receive location-based information from the location-based service 10. In one such embodiment the wireless device 20 comprises either a NFC-enabled computer chip, NFC component, or secure memory used for making mobile contactless payments through the mobile payment system 70. In this embodiment the software application is configured to send an authentication message to a mobile payment system 70, receive an authentication message from the mobile payment system 70, send a payment message to a mobile payment system 70, and receive a confirmation request from the mobile payment system 70. In one such embodiment, the software application is configured to display the confirmation message comprising a confirmation request to a user that is selectable by the user to confirm purchase of an item via the mobile payment system 70, which once the user confirms the purchase by selection, the software application sends a confirmation for purchase to the mobile payment system 70. In one embodiment, a wireless device is configured to register with a location-based service 10, receive location-based information from the location-based service wherein the location-based information comprises at least information related to a physical item for sale within the general vicinity to the wireless device 20, sending payment information to a mobile payment system 70 that comprises at least some location-based information received from the location-based service and which relates to the physical item in the general vicinity of the wireless device, entering into secure communication with the mobile payment system 70, receiving an authorization message from the mobile payment system, receiving a confirmation message from a mobile payment system, confirming the purchase of the physical item within the near vicinity of the wireless device 20 which in turn send the confirmation message to the mobile payment system 70, ending the secure connection to the mobile payment system.

In another embodiment, the wireless device 20 registers with a mobile payment system 70, initiates a secure connection to a localized terminal 80 within general near vicinity of the wireless device, sends payment information associated with an adaptive profile of a user that comprises personal payment information to the localized terminal 80, sends an authentication message to the localized terminal 80 or payment server 90 (not located within the general vicinity of the wireless device), receives an authentication confirmation from the localized terminal, sending a payment message to the localized terminal 80, receiving a confirmation message confirming purchase an item from the localized terminal 70 or payment server 90. In one embodiment, the user of a wireless device is in a store and decides to purchase an item via a mobile payment. In this embodiment, the user can initiate a secure connection with a localized terminal moving his or her wireless device within a certain proximity of a localized terminal 80. Upon this user action either the wireless device 20 sends a message to initiate a secure connection or the localized terminal 80 upon recognizing the wireless device 20 sends a message to create a secure connection with the wireless device 20. The wireless device then sends payment information associated with an adaptive profile as well as an authentication message to either the localized terminal 70 or payment server 90 to authenticate a user, account, or adaptive profile. The wireless device then receives an authentication from the localized terminal 80 or payment server 90. After authentication has occurred, the wireless device can then send a payment request to the localized terminal for purchase of a good or service. The localized terminal 70 will in turn send a payment confirmation to the user confirmation the purchase. In another embodiment, the user can initiate a secure connection by using an application on the phone to create a secure connection with a localized terminal 80 or payment server 90.

In another embodiment a wireless device 20 or software application on a wireless device 20 can transmit payment information or adaptive profile information that is at least partially decoy or false information that is intended to disguise or mask actual payment information. In another embodiment, the wireless device 20 comprises removable memory that is secure and comprises payment information associated with a user of the wireless device. The wireless device 20 in this embodiment is configured to securely communicate with a localized terminal 80 that is associated with a mobile payment system 70, and to make a purchase request that is sent to the localized terminal 80 and/or mobile payment system 70. In another embodiment, the wireless device 20 comprises a dual core processor or quad-core processor and an adaptive profile. In one embodiment the processor is used for NFC communication and/or purchases made through a NFC-based system. In one embodiment, the adaptive profile can comprise payment information, personal identification information (social security number, bank account, PIN number, date of birth, username, alias, password, etc.), medical history information and/or transaction information (previous purchases, locations of purchases, advertisements received from a mobile payment system 70 or location-based service 10, payment amounts, card types, investment account information, merchant identifier numbers) that can be selectively or automatically transmitted to various NFC enabled components including a localized terminal, location-based service, payment server, or any other NFC-enabled component.

In another embodiment, the mobile payment system 70 is able to receive certain profile and/or payment information from the user of a wireless device 20. In this embodiment, the information includes credit card number, debit card number, prepaid card number, merchant identification, location-based information, alias, username, PIN, authorization code, authentication code, demographic information, or adaptive profile information. In this embodiment, the mobile payment system 70 is configured to provide this information to a payment server 90, location-based service 10, or database that is configured to either store the information or provide the information to other computing devices. The mobile payment system 70 can also be used to perform payment or customer analytics based upon the information received from the customer or send the payment or customer information to other computing devices for payment or customer analytics. In one embodiment, payment or customer analytics can be analysis, processes, or other methods performed on data that is used determine customer preferences, customer trends, revenue trends, and other analytics that can help businesses or track user purchase trends. In another embodiment, a payment server 90 is used to perform a similar function of receiving payment or customer information from a mobile payment system 70, location-based service 10, or localized terminal 80 in order to perform payment or customer analytics. In another embodiment, a location-based service 10 is configured to receive payment or customer information from a mobile payment system 70, localized terminal 80, or payment server 90 to perform customer and/or payment analytics on the information. In another embodiment, the payment server decrypts the encrypted payment information, stores at least some payment information from the user, and location-based information associated with the store or business the user is making the purchase from.

In yet another embodiment, the wireless device 20 is associated with a first localized terminal within the near vicinity of the wireless device and the first localized terminal is operatively connected to a second localized terminal within the general vicinity of the first localized terminal. In this embodiment, the first localized terminal is configured to receive adaptive profile information or payment information from a user related to a purchase and provide at least a subset of that information to the second localized terminal, wherein the second localized terminal is configured to either store some adaptive profile or payment information or send such information to a location-based service 10, payment server 90, server, or database.

In another embodiment, the mobile payment system 70 at least partially resides on a wireless device 20 and is configured to display, either through a software application or graphical user interface, graphs or charts related to the spending habits, trends, and history of payments made through the mobile payment system 70, other application, or service. A graphical user interface or graphical map interface can be used to display such historical information such as a graphs, charts, or other listings to a user regarding spending habits, trends, and history made through the mobile payment system other application, or service. In another embodiment, a mobile payment system 70 displays graphical representations of user accounts such as credit cards, bank cards, debit cards, loyalty cards, recent transactions, statement periods, deposits, payment trends, and/or budget information to a user. In another embodiment, a software application generally associated with a wireless device displays graphical representations of user accounts such as credit cards, bank cards, debit cards, loyalty cards, recent transactions, statement periods, deposits, payment trends, and/or budget information to a user.

In another embodiment, the wireless device 20 is configured to provide (either through a display or software application) near real-time reporting information regarding purchases made at a given location to a payment server 90, location-based service 10, or other service that is configured to perform operations or store such information. In another embodiment, the wireless device 20 is configured to display, store, or transmit (either through a display or software application) receipt information that comprises the sales tax, amount of purchase, and other information typically associated with a paper receipt. In another embodiment, the mobile payment system 70 or localized terminal 80 is configured to provide a discount or coupon to a user at the time a purchase request or session is initiated or before such session is initiated without the interaction of the user. In another embodiment the mobile payment system is configured to receive an alias that is associated with an adaptive profile of a wireless device user and is identifying account information associated with the user.

In another embodiment, a wireless device is in communication with a mobile payment system 70 comprising a localized terminal 80 and payment server. In this embodiment, the wireless device is configured to retrieve adaptive profile information from the payment server 90 for use in making a mobile purchase. In this embodiment, once the adaptive profile information is retrieved from the payment server, the wireless device is operable to initiate a purchase request with the localized terminal 80. In this embodiment, the wireless device sends an authentication request to the localized terminal that is a location-based authentication request. In this embodiment, the wireless device can send an authentication request that comprises that is not location-based. Once the localized terminal authenticates the wireless device, the wireless device 20 is operable to send a payment request comprising at least some adaptive profile information to the localized terminal 80. The localized terminal processes the information or sends at least some information to a payment server 90 to confirm the payment request. In this embodiment, upon confirmation by the payment server 90 or localized terminal 80, the wireless device receives a confirmation from the localized terminal 80 and the user selects the confirmation via the interface of the wireless device 20 to confirm the mobile purchase. For example a wireless device, in one embodiment, can receive his or her payment information or an adaptive profile associated with payment information from a payment server to be used in making a mobile payment. One advantage of receiving this information is that the burden on the user is minimized. Once information is received from the payment server 90, the wireless device 20 can send a payment request comprising at least some adaptive profile information such as credit limit, account number, or secure identifier associated with the payment request to a localized terminal 80 that is within the general vicinity or connected to the wireless device. Upon receiving the payment request from the wireless device 20 the localized terminal 80 is configured to send at least some of the adaptive profile information associated with the payment request to a payment server 90 (perhaps for a questionable, unsecure, large payment, or other special event encountered by the localized terminal 80). The payment server 90 confirms, approves, or authorizes the payment request and send a message to the localized terminal 80, which in turn provides a payment confirmation message to the wireless device 20. This message is displayed to the user via the device's graphical interface and the user selects or confirms the purchase by selecting the confirmation icon, message, touch screen icon, or other on screen display representing a confirmation message. The purchase is now complete.

A communication between a wireless device 20 and localized terminal 80 can include the user of the wireless physically tapping the localized terminal to create a communication link. An authentication message received by the wireless device 20 received from a localized terminal 80 that is communicatively coupled to the wireless device 20 via a NFC-based connection can be displayed on the graphical user interface of the wireless device a NFC connection icon. It can be appreciated that a user of the wireless device 20 can decline the transaction either before or after receiving a payment confirmation message. In another embodiment, the wireless device can establish a Bluetooth connection with a localized terminal and the terminal can establish either a NFC-based or Bluetooth connection with a payment server 90 or mobile payment system 70. In another embodiment, the wireless device can send an registration request to a mobile payment system 70, an authentication request to a mobile payment system 70, and a purchase request to a mobile payment system 70 in order to complete a mobile payment that does not require use of a magnetic strip. A payment server 90 can communicate with other servers or databases such as an account server, coupon server, merchant loyalty server, or payment issuer server to authorize a transaction. A graphical user interface that can be associated with a mobile payment system 70 or software application associated with a mobile payment system can display credits cards associated with a user on a tab, table, or other display as well as display the same for reward cards. The graphical user interface can also be configured to display credit card and reward cards at one time to a user. A graphical user interface associated used for presenting payment information can use 3D graphics. A graphical user interface used for presenting payment information or adaptive profile information can be configured to dynamically update information associated payment information or adaptive profile and display the same to the user. In another embodiment, the user of a wireless device 20 can enter an amount to be paid, initiate communication with a NFC-based localized terminal, add gratuity, or confirm a purchase through a voice command. In another embodiment, the wireless device is configured to use encryption techniques to store payment information or adaptive profile information with a secure memory card or secure memory residing on the wireless device. In another embodiment, the wireless device 20 can use encryption techniques to encrypt data to be sent to a localized terminal, which can be the same as the encryption techniques used in storing information on a secure memory card or secure memory or different encryption techniques that those used for storing information on the wireless device. Adaptive profile information that is configured to be displayed to a user of the wireless device 20 can allow the user to enable or disable mobile payments, add voice identification security, set passwords, save passwords, modify display format, change currency, change fields which can be auto-filled, and modify other user preferences. A payment request can be sent from the wireless device via a web page, SMS message, a voice command, NFC-enabled message, web-based application or software application on the phone.

In another embodiment the wireless device can be configured to send a confirmation message to a localized terminal 80 or mobile payment system 70, that is configured to confirm or finalize the purchase without further interaction necessary with the localized terminal 80 and mobile payment system 70, even though further interaction. In another embodiment, the wireless device 20 can register with a payment server, and can register via an online message, registration message, authentication message, or other transmission that can include payment information or an adaptive profile associated with a user and used for making mobile payments. In some embodiments, the user of the wireless device can create an alias associated with a payment account or method. However, a mobile payment system 70 or payment server 90 can create an alias for a user based upon payment information received from the wireless device or other computing devices included a server or a database. A payment server 90 can enroll the user into an alias based upon payment information received from the user, with minimal or no interaction with the user. The localized terminal 80 can be in communication with a mobile payment system 70, payment server 90, other computing device wirelessly or through a wired connection. In one embodiment, the localized terminal once in communication with a mobile device that is requesting to pay via a mobile payment, can send authorization, authentication, or other messages to a mobile payment system to determine whether the wireless device can make a purchase with via a mobile payment or adaptive profile.

In another embodiment, the localized terminal can send payment information associated with a user of a wireless device making a mobile payment to a payment server 90. In this embodiment, the payment server 90 is configured to receive at least some payment information that can be used by financial or other business to analyze a specific mobile payment, either in a larger data set or individually.

In another embodiment, the user of a computing device uses an application to perform the same function of searching based upon physical locations, such as an intersection or other physical locations. Thus in this embodiment, the user of a computing device initializes the application, provides the search terms via data entry or through voice commands such as an address or intersection of streets, initiates the search, and the application returns the results.

In another embodiment, the user of a computing device uses a location-based service 10 to perform the same function of searching based upon physical locations, such as an intersection or other physical locations. Thus in this embodiment, the user of a computing device provides the search terms via data entry or through voice commands such as an address or intersection of streets or a certain the location of the wireless device 20 to the location-based service 10, initiates the search, and the location-based service 10 returns the results.

In yet another embodiment, a user of a computer device can search a geofenced location, by entering specific information to search for within the geofenced location, and receiving such information on the computing device. In another embodiment, the geofenced area 60 can be searched by a wireless device 20, and the results of the search can be displayed on a graphical user interface to the user. This search capability can be associated with an internet site, application, network(s), database(s), server(s), location-based service 10, or a combination of any of these components.

In one embodiment, a wireless device 20 can also be configured to have an adaptive profile. In one embodiment the adaptive profile can used to update, store, manage, or select which information is shared with certain locations, when the information is shared, how much information is shared, how often the information is provided, sets the security of level for the user regarding any data provided to location-based-services, networks, determines whether the user can purchase items associated with a certain location, determines whether the user is qualified (of a certain age for example) to purchase products or visit the location, and also can update privacy settings on the wireless device 20.

In another embodiment, an adaptive profile provides profile information to a location-based service 10 or geofenced area 60 that includes age, gender, demographic information, interests, games, payment information, time-sensitive information, secure information over a secure connection (one non-limiting example Secure Socket Layer or the IPsec protocol) shopping preferences, transaction history, past locations visited, access to user account information using secure protocol or transmission, internet browsing history and/or preferences, other interests, etc., and combinations thereof.

In one embodiment, the adaptive profile is dynamic in that it can send or receive location information that will update the wireless device 20. In another embodiment, the adaptive profile manages security settings for the wireless device 20. In another embodiment, the adaptive profile is used to manage privacy settings for location-based services 10. For example, the adaptive profile can only provide certain information to a location-based service 10 based on the type of the location-based service 10 or type of location. Similarly, in another embodiment the adaptive profile can make the user anonymous in a particular location, location-based service 10 or geofenced area 60. In addition, the adaptive profile can monitor the location-based service 10 or geofenced area 60 for updates to location information associated with a particular location. The adaptive profile can be set by the user but can also be updated without user interaction. In another embodiment, the adaptive profile can be pre-programmed to perform certain functions such as storing certain location information, sending certain information to a location, location-based service 10 or geofenced area 60, receiving certain information, authorizing payments to a certain location, or managing data. In addition and in another embodiment, an adaptive profile can also be used as a sort of identity profile for the user when using location-based services 10. For example in this embodiment, the user can establish a profile that can include personal information, interests, dislikes, preferred location-based services 10, locations, location-based games, payment information, or any other information associated with a user. Still further, in this embodiment the wireless device 20 can transmit or use the profile in association with a location, location-based service 10 or geofenced area 60. This embodiment, allows the user control over which information to share or use with a location, location-based-services or geofenced location. In another embodiment the user can set up the profile and then the wireless device 20 can automatically provide the profile to location-based services 10, networks, or geofenced locations. In another embodiment the adaptive profile can update itself without user interaction in a sort of set it and forget it technique. In this embodiment the user benefits because he/she will not have to constantly manually update or opt-in to certain networks or services, but instead rely on the adaptive profile to automatically interface with the location-based service 10 and/or network.

In another embodiment the adaptive profile is the user's location-based identity and the adaptive profile can perform such functions as purchasing items, receiving advertisements based upon the user's profile, share the profile with other users of a location-based service 10, etc.

In another embodiment, the adaptive profile can deploy one more of the following privacy-enhancing technologies such as on/off switches, techniques related to anonymity, techniques related to k-anonymity, data security techniques, blocking techniques that prevent certain networks, people, or locations from receiving any information about the user, filtering techniques that protect a wireless device 20 user, and any other technology that enhances the user's location-based experience.

In one embodiment the wireless device 20 further comprises a data interface capability. The data interface capability can be any type of message protocol that allows location information to be received by a wireless device 20, computing device, location-based service 10, and/or geofenced location. Similarly, the data interface capability can also be configured to receive information on behalf of a wireless device 20, computing device, location-based service 10 and/or geofenced location. The data interface capability can be able to operate with IEEE 802.x, 802.11, et seq., 802.16, et seq., IPv4, IPv6, Internet Protocol only communications channels, IPsec, Secure Sockets Layer, Transport Layer Security, Secure Shell, OFDM, OFDMA in an uplink or downlink, SC-FDMA, hybrid OFDMA and SC-FDMA, CDMA, self organized network methodologies, SU-MIMO, MIMO, frequency domain equalization schemes, and any other communication protocol that supports location-based services 10 or location-based information. In another embodiment, the data interface capability can provide location information to user in response to a voice command from the user.

The wireless device 20 can have the capability to display location information on a 3D display as well as the capability to serve as a router of location-based information with other wireless devices in a network, location, location-based service 10, and/or geofenced location. The wireless can have a dual processor, multicore-processor, and/or a dual processor architecture. The wireless device 20 can be capable of displaying information dynamically. The wireless device 20 can be a vehicle or bus. The wireless device 20 can be configured to operate with IEEE 802.11, 802.16, IPv4, IPv6, Internet Protocol only communications channels, IPsec, Secure Sockets Layer, Transport Layer Security, Secure Shell, OFDM, OFDMA in an uplink or downlink, SC-FDMA, hybrid OFDMA and SC-FDMA, self organized network methodologies, SU-MIMO, MIMO, frequency domain equalization schemes, and any other communication protocol that supports location-based services 10 or location information. In one embodiment, the wireless device 20 further comprises an accelerometer and/or motion sensor that can be used to ascertain the location of the wireless device 20 (either dynamically or manually).

Figure 30:
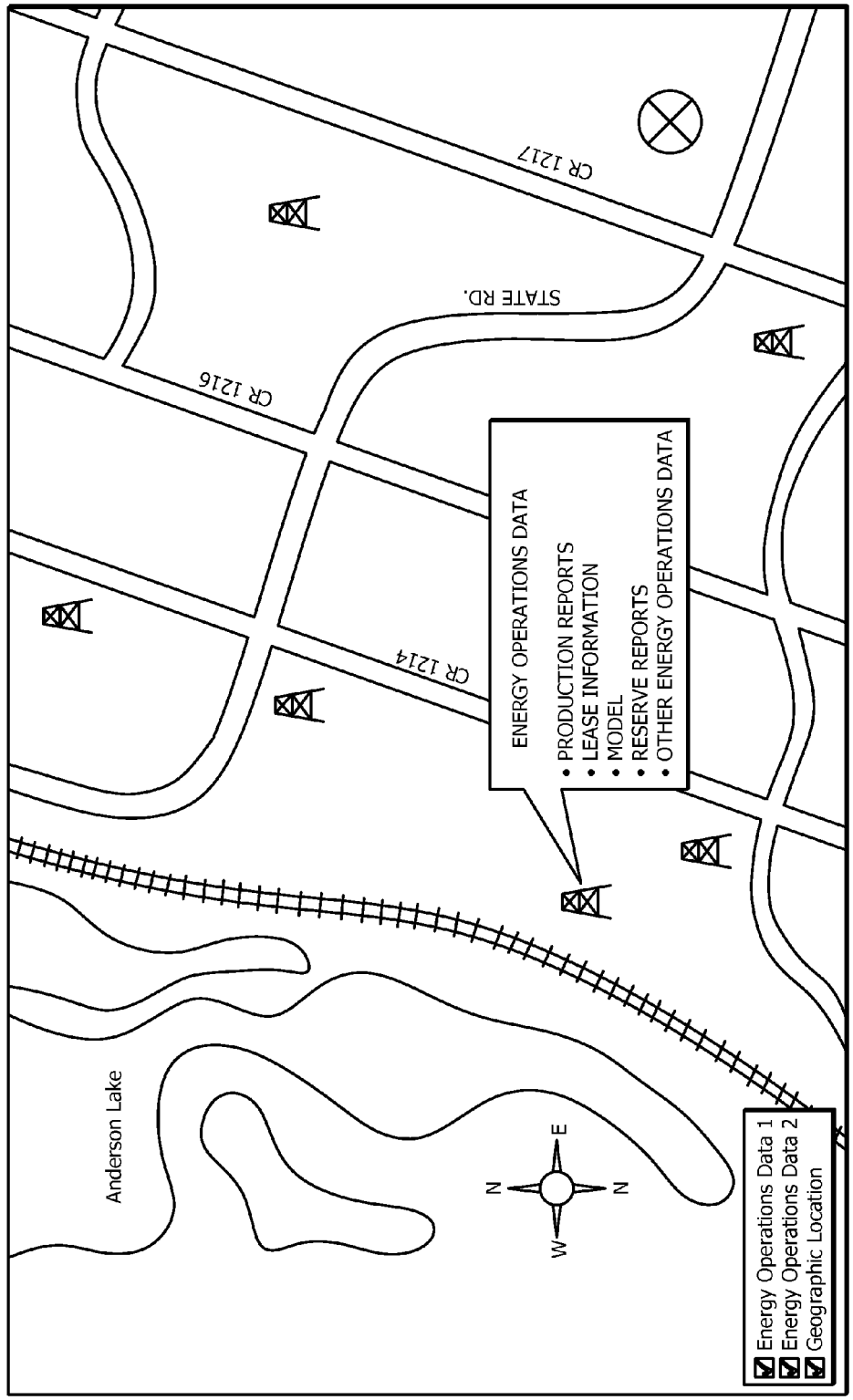
FIG. 30 depicts a graphical map interface in one embodiment.

Now referring to FIG. 30, FIG. 30 depicts a graphical map interface in one embodiment. As depicted, the background is a graphical map interface and the scope of the map is a geographical location or other designated area. The oil derricks represent oil or gas wells that can be active, non-active, orphan, or potential oil and gas wells. The circle represents a water or disposal station. The railroad tracks represent oil or gas pipelines. The callout shows how the map interface, in one embodiment, is configured to display energy operations data related to an object on the map. A user may select an object on the map interface. The selection can be made via any method including touchscreen, hovering over the object, panning the displaying, zooming in, zooming out, clicking the object, or clicking a link to the object. The energy operations data may also be linked to where the energy operations data can be expanded in a pop-up box, other screen, or somewhere else on the page if the link is selected by the user. Alternatively, the energy operations data can be displayed in a pop up box on the screen or be shown on an additional screen. In another embodiment, energy operations data can be stored on memory associated with either the computing device or location-based service.

Figure 31:
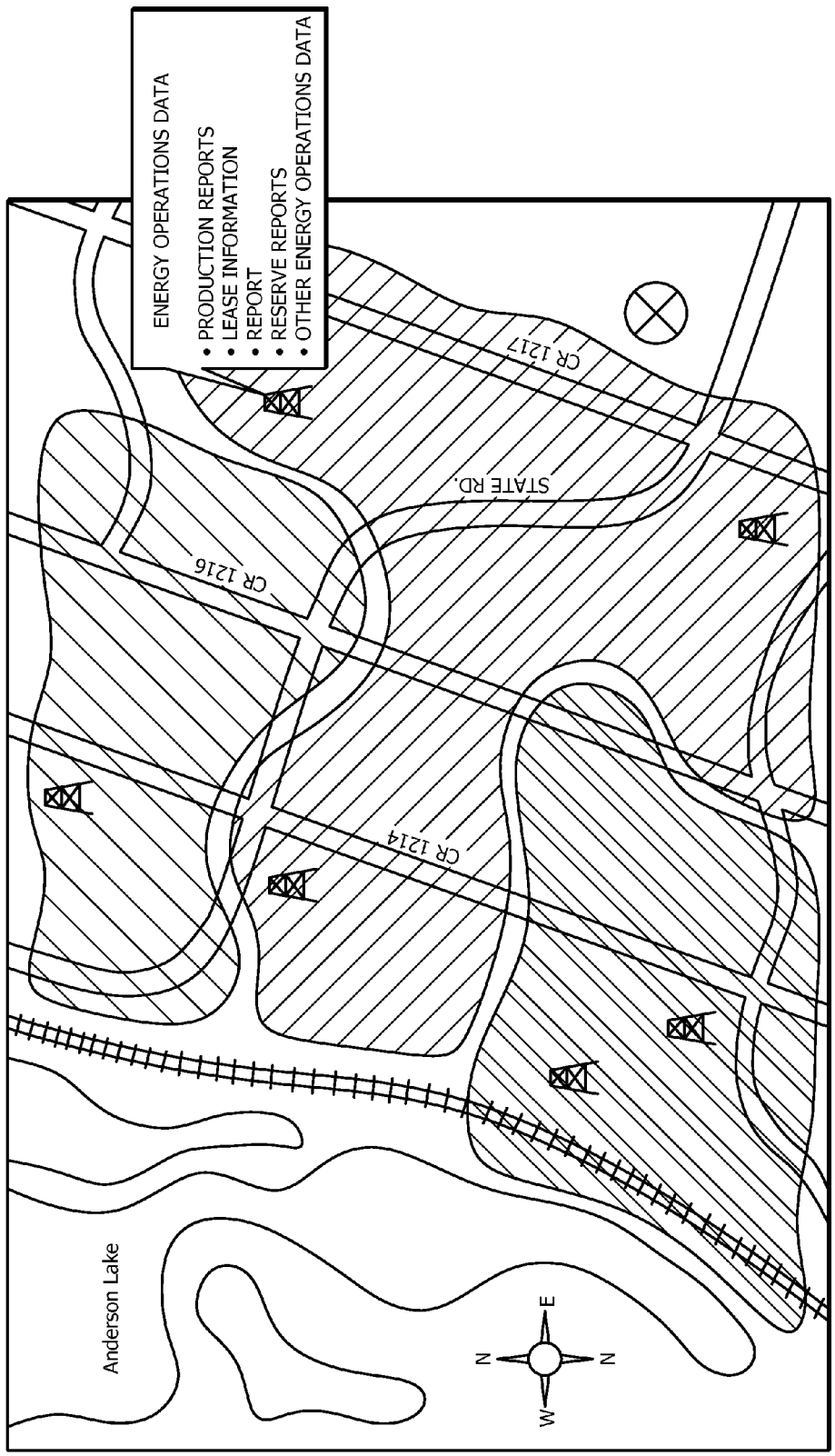
FIG. 31 depicts a graphical map interface in one embodiment.

Now referring to FIG. 31, this figure depicts another graphical map interface in another embodiment. The background is a graphical map interface, similar to that shown in FIG. 30. The map interface shows the geographical location. In the embodiment depicted, the shaded areas represent a heat map related to energy operations data associated with the geographical location. For example, the different shades represent different heat maps. This is for illustrative purposes only as other energy operations data such as well depth, production, etc. can also be shown on the graphical map interface. The map can include objects or icons for energy operations data such as oil or gas locations, pipelines, and other energy operations data. As depicted, this is a map display that can show hot or cold (heat map) areas on the display that show activity such as oil or gas production, permits, pre-permits or other energy operations data. The heat map regions are also selectable by user and upon selection can provide energy operations data to the user via a pop up box, display on different screen, or upon a hover can display additional information associated with the heat map region.

Figure 32:
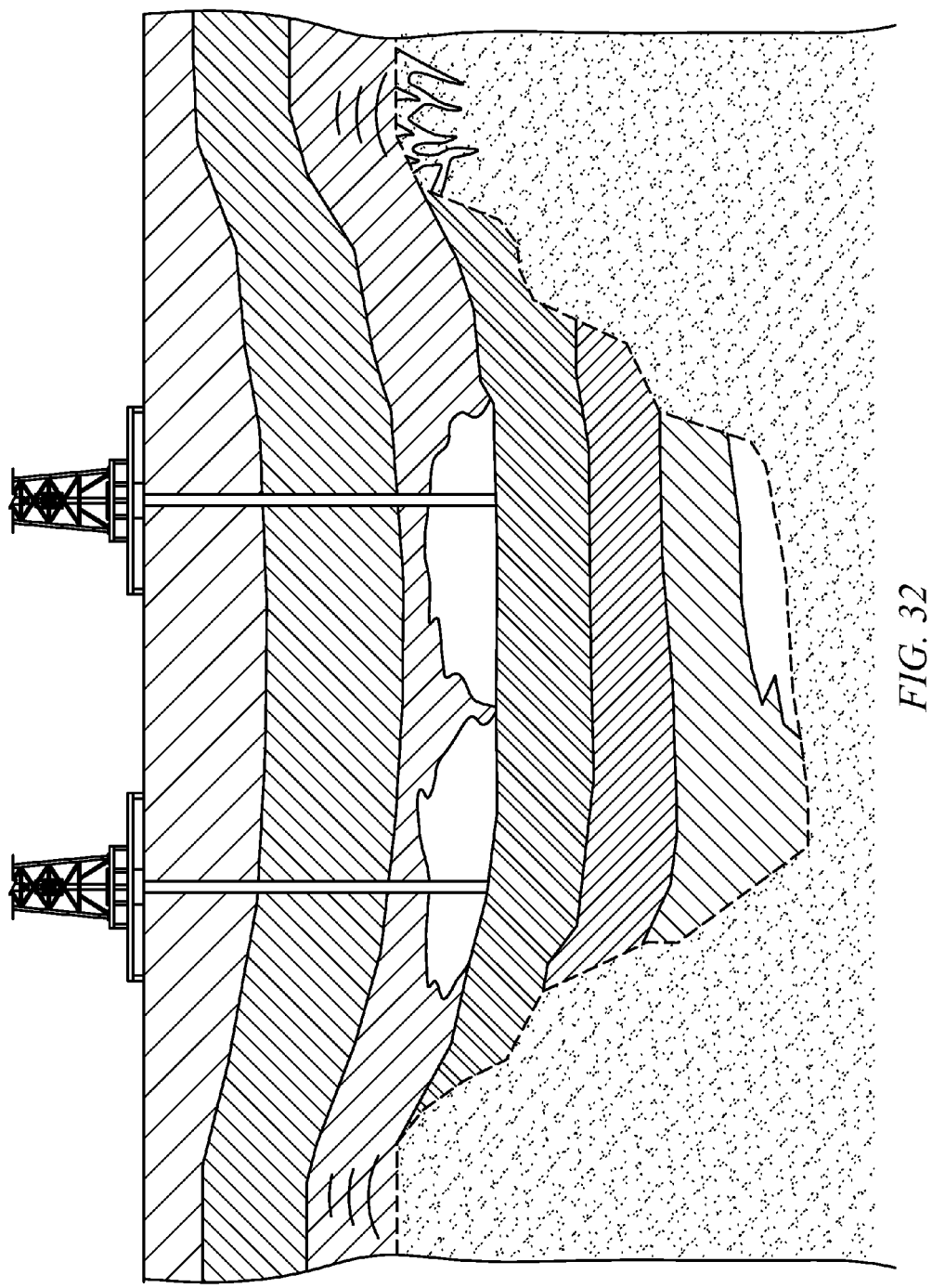
FIG. 32 depicts a graphical map interface in one embodiment.

Referring now to FIG. 32, FIG. 32 is a different graphical map interface in one embodiment. The curvy line represents a two-dimensional or three-dimensional geographic representation of subterranean, seismic, adaptive drilling profile information, or energy operations data. The change in pattern can illustrate changes in energy operations data, in rock formations, etc. As depicted, the figure comprises two oil or gas wells. The graphical map interface can display the drilling angle, drill depth, or any other energy operations data. The mapping interface can also be converted to a report for analysis of production or economic decision analysis. A system of this type can also track drilling operations, head count on the well, accounting, costs associated with the drilling, production, revenue associated with drilling, trends (both financial and production), or any other oil filed metric that can be used for economic or production decision analysis. For example, the large amount of information associated with a drilling, pipeline, or potential drilling location is significant. One potential advantage of this embodiment is that it can reduce the time it takes to present the information to the user or process the data in a more efficient manner based upon the user's needs. In one embodiment, a mapping interface is provided that has a graphical user interface overlay. In this embodiment, the graphical user interface overlay comprises icons or other graphics that display energy operations data comprising either subterranean energy operations data or surface energy operations data.

While the energy operations data in this embodiment can be any type of energy operations data, energy operations data can be production data associated with a drilling operation that includes estimations on production, trend analysis, or graphics that represent a graphical model of the production of a drilling operation. A drilling operation as used in this embodiment can be one or more oil wells, gas wells, or pipelines. In another embodiment, an adaptive drilling profile is created by a data management component 30 that is either partially stored in memory on a computing device or on memory at least partially stored on a server and is used to create a model of energy operations data associated with the drilling operation. The adaptive drilling profile is adaptive in that it can modify or adjust based upon user interactions with the adaptive profile or upon changes to the drilling operation or locations the adaptive drilling profile is associated with. In another embodiment, an adaptive drilling profile is a kind of adaptive profile that can be used for financial decision analysis, pipeline analysis, energy operations data, production decision analysis techniques, invoicing, and costs associated with a drilling operation. In another embodiment, the adaptive drilling profile can incorporate energy operations data associated with the drilling operation that is needed by the user with minimal user interaction.

The adaptive drilling profile can also include costs and expenses associated with the drilling operation and is used for analyzing production versus the economic factors associated with the drilling operation. In another embodiment, an additional adaptive profile is associated with the drilling operation or prospective drilling operation and is used for predictive cost and economic analysis based upon economic factors associated with the operation. In one embodiment, the graphical user interface overlay can also display a geofence that is used to create a custom drilling operation that comprises one or more wells or pipelines. In this embodiment, the geofence is either the well itself or a grouping of wells. The user can create custom models from the adaptive drilling profile for making economic or production analysis. In one embodiment, the data management component can receive energy operations data from multiple servers or databases and upon receipt of this data can graphically represent this information on the mapping interface. In one alternative embodiment, the data management component is configured to create a virtual interface that is configured to be displayed to the user or is configured to provide a remote virtual interface to the user. In another embodiment, the data management component upon receiving energy operations data can schedule tasks to be completed for processing the data using serial or parallel processing. In this embodiment, the data management component is configured to improve energy operations data or adaptive drilling profiles presentation to the user wherein the presentation can be made via a graphical user interface, interactive mapping display, static text-based display or any combination of display techniques. In another embodiment, energy operations data comprises horizontal or directional drilling data. In another embodiment, the computing device or location-based service can store energy operations data or at least one adaptive drilling profile off-line, wherein the adaptive drilling profile is accessible without a connection to the internet.

Various reports can also be created by a data management component based upon the needs of the user. Some example reports that can by dynamically created based upon the specific needs of the user are production reports, economic reports, invoices, manpower projections or costs associated with manpower, prospects, completion reports, and unconventional play reports that are either graphical in nature or text-based. In another embodiment, an economics analyzer is embedded or displayed on the graphical map interface for the user to access when looking at a mapping of energy operations data. In this embodiment, the economics analyzer can analyze decline curves, production rates, or other economic data associated with a drilling operation to display to the user. The economics analyzer can also recalculate an economic analysis based upon changed or modified energy operations data that is adjusted by the user. In another embodiment, the data management component is configured to create one or more adaptive drilling profiles comprising at least some energy operations data that are associated with a given location. The adaptive drilling profile or profiles can be modified by multiple users registered with a location-based service 10 or data management component 30 and where the adaptive drilling profile or profiles are updated through use of the data management component to provide users of the adaptive drilling profile or profiles a more enhanced yet efficient interface experience. In this embodiment, the data management component can be in operative communication with a data interface capability whereby it can receive updated energy operations data and/or location-based information that can be provided on a periodic or near real-time bases. In this embodiment, the data management component can be in operative communication with a plurality of data interface capabilities that comprise an interface for receiving either sensor data, mapping data, adaptive drilling profile, location-based data, energy operations data, or accounting data. In another embodiment, the data management component resides on a server and has operable access to at least one server. The data management component is configured to schedule tasks to be performed or completed by the database based upon an adaptive drilling profile associated with a given location and/or the user's request for additional information that is associated with the adaptive drilling profile. The data management component can be configured to create a customized profile based upon the request from a user. The customized profile can then be used to update the adaptive drilling profile.

In another embodiment, the data management component is configured to modify the graphical user interface and is in operative communication with a location-based service. In this embodiment, the graphical user interface is substantially interactive and is capable of displaying graphical information associated with an adaptive drilling profile (single or multi-user). Further in this embodiment, the data management component is a powerful and highly technical tool that is used to collect data from at least one location-based service, associate the data with an adaptive drilling profile relating to a drilling location or potential drilling location, and modify the data to be displayed on the substantially interactive graphical user display to accomplish predictive analysis related to economic or production decisions. Predictive analysis is a process whereby factors are analyzed to predict a result. In one embodiment, the predictive analysis uses data related to energy operations to predict economic or production results. By allowing a user to modify certain attributes or parameters of the adaptive drilling profile the data management component 30 is configured to provide updated data and an updated display based upon the data in substantially real-time. In another embodiment, the data management component is configured to receive location-based information or energy operations data from a plurality of data sources and integrate the information or data into a substantially customized adaptive drilling profile that is accessible by multiple users that are registered with a location-based service and/or data management component. In this embodiment, it can be appreciated that each user may have a profile associated with him or her that relates to the level of access and rights each user has with respect to the adaptive drilling profile created by the data management component. The data management component can also send data through a data interface capability that is a subset of data from an adaptive profile, which can be displayed to the user through a virtual interface via a graphical map interface. In another embodiment, the data management component can store and manipulate data received from different sources that will be included in an adaptive drilling profile for a given location based upon pre-determined settings of the system or pre-determined user settings whereas at least some of the adaptive drilling profile can be displayed via a virtual interface.

In one embodiment, a virtual interface is a cloud-based solution that allows for offsite data storage or potentially data display. In another embodiment, a location-based service having access to a plurality of databases through a plurality of data interface capabilities is configured to received energy operations data and create an adaptive drilling profile for a given location that is associated with at least some of the energy operations data received from a plurality of database. In this embodiment, the location-based service 10 is also configured to receive mapping data from a database in addition to receiving energy operations data from a plurality of databases. In another embodiment a data management component 30 resides on a server that is associated with a location-based service 10 and is configured to receive energy operations data from a plurality of data sources. In this embodiment, the data management component 30 is configured to modify an adaptive drilling profile based upon at least some energy operations data received from a plurality of data sources. In this embodiment, the data management component 30 is also configured to receive a request to filter the energy operations data provided to a computing device or wireless device by a data management component 30 and in turn, provide a filtered adaptive profile associated with request from the computing device or wireless device 20. In another embodiment, a location-based service 10 is configured to request and receive energy operations data from a plurality of data sources through one or more data interface capabilities. The location-based service is then configured to create an adaptive profile associated with a given location that comprises at least some energy operations data received from the plurality of data sources. In turn, the location-based service is then configured to provide at least part of the adaptive profile to a computing device. In this embodiment, the location-based service 10 is configured to provided updated energy operations data to the computing device wherein some of the updated data relates to the profile created by the location-based service or data management component.

In another embodiment, a location-based service 10 is configured to register a computing device with the service and receive a request for an adaptive drilling profile related to a given location. Wherein the location-based service 10 is configured to receive energy operations data from a plurality of data sources such as a database, mapping server, server, or other data source and is able to associate the data received from the plurality of data sources with an adaptive drilling profile that can be accessible by multiple registered users of mobile computing devices. In another embodiment, the data management component is configured to create an adaptive drilling profile based upon historical and recent energy operations data. In another embodiment, the adaptive drilling profile can include water analysis associated with a given location. In another embodiment, the adaptive drilling profile associated with a certain location can be viewed in various profile formats that a user or system may define for ease of use and increased analysis of a particular drilling operation. In another embodiment, a location-based service comprising a server and a database is configured to store adaptive drilling profiles associated with given locations wherein the adaptive drilling profiles associated with a given location comprise at least some energy operations data. In this embodiment, the server is configured to receive requests from a computing device and determine which information is needed from the database that is in operative communication with the server associated with the location-based service 10. Wherein the database is configured to modify an adaptive drilling profile based upon updated energy operations data received by the database from the server or servers. The database is configured to return a responsive adaptive drilling profile to the server and the server is configured to provide the adaptive drilling profile information to the user. The server can also format the adaptive drilling profile for presentation in a three-dimensional display if necessary. In addition, the location-based service can reside at least partially on the computing device or wireless device and display an adaptive drilling profile in a various formats including three dimensional display or via a report customized for a particular user.

In one embodiment, the graphical map interface is capable is displaying maps and/or icons in at least 1350 by 1000 resolution. In addition, a location-based service is able to modify an adaptive drilling profile based upon the movement of the graphical map interface by the user, wherein the adaptive drilling profile is modified by receiving updated energy operations data associated with the new focus of the graphical map interface. In another embodiment, the user can tag an icon associated with at least a portion of an adaptive drilling profile to receive messages associated with the icon based upon changes to the profile related to the icon. In this embodiment, the user can select an icon that can relate to a specific oil or gas well and receive messages about this well when a predetermined condition is met that is associated with the profile of the oil or gas well. In another embodiment, the user is able to select and work with a specific adaptive drilling profile associated with a given location but upon the user's inputs a location-based system 10 or data management component 30 can retrieve and provide geographically related adaptive drilling profiles to the user that are related in some manner to the adaptive drilling profile displayed to the user based upon user interactions. In one embodiment, geographically related refers to an item or place which is adjacent to or in close proximity with another item or place. In another embodiment, the data management component resides on a database associated with a location-based service and is configured upon receiving a request from the location-based service to identify and provide a profile associated with a user to the location-based service that can identify display preferences, user preferences, energy operations data accessible by the user, the write permissions associated with a user, and past history relating to certain locations accessed by the user, or past adaptive drilling profiles used or modified by the user. In another embodiment, a location-based service 10 that is configured to store on memory associated with a database at least some portion of adaptive drilling profiles associated with a geographical area. In this embodiment, the location-based service 10 is configured to receive a request from a server related to at least some information related to an adaptive drilling profile. The database in turn is configured to provide responsive data to the location-based service 10, which in turn provides the responsive data to the server in one more multiple transmissions. In this embodiment, the location-based service can be configure to format the responsive data to more efficiently provide the data to the requesting server. In this embodiment, the location-based service 10 can receive updated data from the server that can be stored on the database and associated at least partially with an adaptive drilling profile. In another embodiment, an adaptive drilling profile can be associated with a workflow comprising at least some energy operations data. Energy operations data may also be associated with a workflow relating to oil and gas operations. In one embodiment, a location-based service can create adaptive drilling profiles, modify adaptive drilling profiles, format, adaptive drilling profiles, or only provide energy operations data to a user depending on the user's adaptive drilling profile. In another embodiment, a data management component can create a model by grouping energy operations data. In another embodiment, a data management component can create a model based upon location-based information requested by a user. In another embodiment, the data management component creates an adaptive profile based upon the user's access level. In another embodiment, the data management component, creates a model when it displays energy operations data to a user on either graphical user interface, graphical map display, or graphical user overlay. In another embodiment, a data management component creates a model when it associates data with a given location, drilling company, or pipeline. In another embodiment, a data management component can create a model based upon pipeline, wind energy, or solar or other energy operations data that is associated with a given company, location, or energy type. In another embodiment, the data management is configured to create a profile based the information received from location-based service, which is received based upon a user profile.

In another embodiment, a geofence can be created by the user or data management component 30 whereby the geofence is associated with a specific geographic area. In this embodiment, a computing device is configured to receive either location-based information or energy operations data associated with the geofenced area through a data interface capability and is operable to display the location-based information or energy operations data via a graphical map interface. The graphical map interface can also display mapping data whereby the location-based information or energy operations data is display in a substantially overlay fashion on the mapping interface and can be represented by icons. In this embodiment, the graphical map interface can be dynamic to the extent the user can change views or the scope of the information displayed in the map interface. In another embodiment, an adaptive drilling profile can comprise a set of energy operations data associated with multiple geographic locations that are in near proximity or adjacent to one another. In another embodiment, a graphical map display or graphical user interface can display the frequency of event which can be represented as heat map shown with different colors, a bar graph, text, or report that can display the frequency of the event. For example, in one embodiment, a graphical map display or graphical user interface can display in red for example, the number of drilling rigs on a map and in another color, for example, green can show an area that has a lower number of drilling rigs. In another embodiment, an indication of a frequency of an event can be shown on a display by use of a graph or report. The indication of a frequency of an event relates to the number of times an event has occurred and/or an indication of how frequently the event has occurred. In another embodiment, a computing device can modify its display in near real-time by updating the display based upon real-time events such as user inputs, receiving updated energy operations data or location-based data, or changing a model based upon changed circumstances immediately after one of these events occurs. In this embodiment, it can be appreciated that near-real time reflects the knowledge that a display will take time to update when an input or aspect of the model or interface is changed and thus while it is not in real-time, the display or model can modified in near-real time. In another embodiment, a computing device, location-based service, server or database is configured to build an adaptive drilling profile that comprises at least some energy operations data. In one non-limiting embodiment, building an adaptive drilling profile involves collecting a plurality of energy operations data. In another embodiment, building an adaptive drilling profile involves displaying energy operations data received through a data interface capability where the user can view the energy operations data. In another embodiment, building an adaptive drilling profile that comprises at least some energy operations data means receiving energy operations data relating to one company's drilling operations. In another embodiment, building an adaptive drilling profile that comprises at least some energy operations data associated with a location consists of collecting the energy operations data and preparing a model to display on a graphical user interface, graphical map interface, graphical map overlay interface, or any combination of displays. In another embodiment, building an adaptive drilling profile that comprises at least some energy operations data associated with a location entails collecting data that is specific to one location wherein the adaptive profile comprises data items associated with the localized profile that is the adaptive drilling profile. In another embodiment, building an adaptive drilling profile that comprises at least some energy operations comprises associating a general location to energy operations data received. In another embodiment, building an adaptive drilling profile that comprises at least some energy operations data associated with a location comprises associating the energy operations data received into a geofenced area which is then displayed to a user. In one embodiment, a geofence may be created by building an adaptive drilling profile. In another embodiment, a geofence can comprise a grouping of oil wells, gas wells, water stations, windmills, or pipelines where by energy operations data is associated with one or more of the oil wells, gas wells, water stations, windmills, or pipelines. In another embodiment, a geofence is associated with energy operations data relating to a drilling operation. In another embodiment a graphical user display or mapping interface is configured to associate energy operations into a geofence that comprises a user-selected grouping of one or more oil wells, gas wells, water stations, windmills, or pipelines. In one embodiment, a potential advantage of using a geofence to group energy operations data either by a computing device or location-based service is that the user or location-based service can display the data and update the data locally without having to go back and forth requesting data from a server or database. However, it can be appreciated that in another embodiment, the computing device or location-based service sends multiple requests for energy operations data to a server, database, or location-based service.

Figure 33:
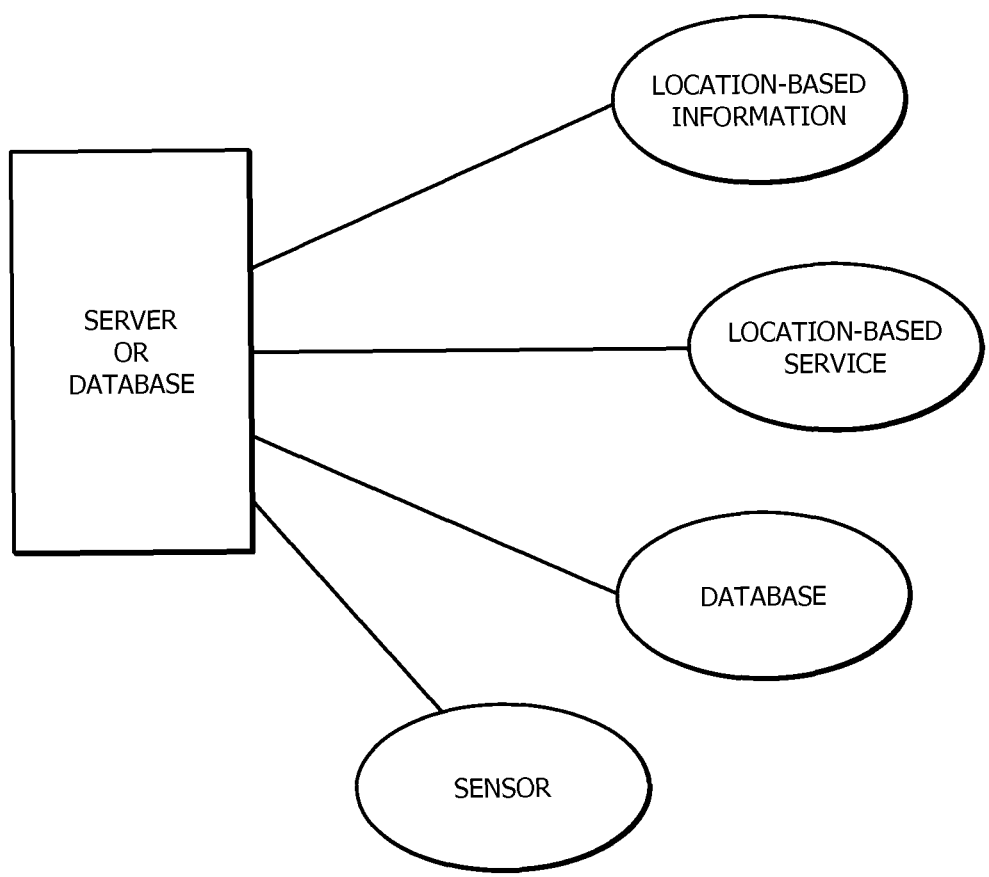
FIG. 33 depicts a server or database in one embodiment.

Referring now to FIG. 33, FIG. 33 depicts a server or database. This embodiment demonstrates the various sources a server or database may receive information from that is related to location-based information or energy operations data. The server or database (in the square) can receive location-based information, information from a database which can include location-based information, mapping data, or energy operations data, etc., energy operations data, or information from another server. The server or database can create a report or message that relates to the request or needs of a user. This report may also be dynamic or set on other predetermined criteria or constraints used by the server. The report may also be generated without a request from a user. In one embodiment, the general goal of the server or database is to efficiently create a report that is substantially dynamic in that it can change as the data from the various sources changes.

The terms "a" "an" or "the" as used herein are defined as one or more than one. The term "plurality" as used herein is defined as two or more than two.

While the invention has been particularly shown and described with reference to a preferred embodiment, it will be understood by those skilled in the art that various changes in form and detail can be made therein without departing from the spirit and scope of the invention.

Additional Description

The following clauses are offered as further description of the disclosed invention.

1. A wireless device comprising: a processor; a computer non-transitory usable medium; wherein said wireless device is operable to send a data request for location-based information to a first computing device; wherein said wireless device is configured to receive location-based information from said first computing device; wherein said wireless device is associated with a data management component, and wherein said data management component is capable of determining the distance between said wireless device and the location of at least some location-based information received from said first computing device; and wherein the wireless device is operable to present said location-based information on the wireless device.

2. The wireless device according to any preceding clause wherein said wireless device comprises a smart phone, laptop, desktop, server, pad computer, vehicle or any other wireless device that can operate on a wireless network.

3. The wireless device according to any preceding clause wherein said first computing device comprises a server or database.

4. The wireless device according to any preceding clause wherein said data request comprise a web request.

5. The wireless device according to any preceding clause wherein said wireless device comprises an updateable graphical user interface for presenting location-based information 6. The wireless device according to any preceding clause wherein said location information comprises latitude and longitude or Cartesian coordinates.

7. The wireless device according to any preceding clause wherein said location information comprises dynamic location information.

8. The wireless device according to any preceding clause wherein said capable of determining comprises a technique for calculation (e.g., look up table, GPS, A-GPS, Bluetooth technologies, GDS, triangulation, or any other location-based distance estimation calculation, etc.).

9. The wireless device according to any preceding clause wherein data management component is located on the first computing device.

10. The wireless device according to any preceding clause wherein data management component is located on the wireless device.

11. The wireless device according to any preceding clause wherein the wireless device is capable of registering with a location-based service.

12. The wireless device according to any preceding clause wherein the data management component is associated with a location-based service configured to provide location-based information to the data management component.

13. The wireless device according to any preceding clause wherein the data management component is created using at least some scripting languages.

14. The wireless device according to any preceding clause wherein the data management component stores at least some location-based history of the user.

15. The wireless device according to any preceding clause wherein said computer non-transitory useable medium comprises computer readable code.

16. A wireless device comprising: a computer non-transitory useable medium; wherein said wireless device is associated with a location-based service; wherein said wireless device is associated with a data interface capability; wherein said wireless device is capable of sending a data request for location-based information through the data interface capability to a location-based service; wherein said data interface capability is operable to receive at least some location-based information from the location-based service wherein said wireless device is configured to calculate at least the distance of the wireless device with the location of a physical item associated with the location information; and wherein said wireless device is operable to present the location of a physical item on a graphical user interface.

17. The wireless device according to clause 16 wherein the data interface capability is operable to receive an executable application consisting of at least some location-based information.

18. The wireless device according to clauses 16-17 wherein the data interface capability is operable to receive network packets consisting of at least some location-based information.

19. The wireless device according to clauses 16-18 wherein the data interface capability is capable receiving packet headers associated with the IPsec framework and the packet payload includes at least some location-based information.

20. The wireless device according to clauses 16-19 wherein the graphical user display can present updated location-based information without user interaction.

21. The wireless device according to clauses 16-20 wherein said computer non-transitory useable medium comprises computer readable code.

22. A wireless device comprising: a computer non-transitory useable medium; wherein said wireless device is associated with a location-based service; wherein said wireless device is capable of sending a data request for location-based information to the location-based service; wherein said wireless device is operable to receive at least some location-based information from the location-based service; wherein said wireless device is configured to display at least the distance of the wireless device with the location of a physical item associated with the location-based information; and wherein said wireless device is operable to present the location of the physical item as well as the location of the wireless device on a graphical user interface.

23. The wireless device according to clause 22 wherein the wireless device further comprises a data management component for managing location-based information received from the location-based service.

24. The wireless device according to clauses 22-23 wherein the wireless device can transmit to the location-based service a profile for associated with a user of the location-based service or services.

25. The wireless device according to clauses 22-24 wherein the wireless device is capable of receiving an application that comprises at least some location-based information.

26. The wireless device according to clauses 22-25 wherein the wireless device is capable of displaying updateable location-based information on a graphical map interface.

27. The wireless device according to clauses 22-26 wherein said computer non-transitory useable medium comprises computer readable code.

28. A wireless device comprising: a data management component associated with a profile wherein said data management component is in communication with a location-based service; wherein said data management component is configured to receive at least some location-based information from the location-based service; wherein based upon said profile the data management component is configured to filter location-based information based upon the characteristics of the profile; wherein said data management component is operable to provide the filtered location-based information to a wireless device.

29. The wireless device according to clause 28 wherein said data management component is capable of updating the wireless device with additional location-based information without user interaction;

30. The wireless device according to clauses 28-29 wherein said profile is an adaptive profile.

31. The wireless device according to clauses 28-30, wherein the profile maintains the history of location-based information received by the wireless device.

32. The wireless device according to clauses 28-31 wherein said computer non-transitory useable medium comprises computer readable code.

33. A system of managing location-based content comprising: a first computing device associated with a location-based service or geofenced location; wherein said first computing device is operable to receive location-based information from a second computing device; wherein said first computing device is operable to receive a search request from the second computing device; wherein said request comprises at least a query for the location of a specific item within a wireless network; wherein the first computing device is configured query a location-based service for data that is responsive to the request; wherein the first computing device is operable to generate a response that comprises at least the location of the specific item upon receiving at least some responsive location-based information from the location-based service; and wherein the first computing device is further configured to store location information received from the second computing device.

34. The system according to clause 33 wherein the query for the location is configured as a IP packet.

35. The system according to clauses 33-34 wherein the query is a text-based search term.

36. The system according to clauses 33-35 wherein the response comprises a link to at least some location information.

37. The system according to clause 33, wherein the system is capable of sending location based information to a wireless device via text message.

38. The system according to clauses 33-37 wherein the response that comprises at least the location of the specific item in a wireless network is a MAC address, SSID, or RF signal.

39. The system according to clauses 33-38 wherein the query is the first computing device queries a server for the requested location-based information.

40. The system according to clauses 33-39 wherein said computer non-transitory useable medium comprises computer readable code, wherein a wireless device is associated with a location-based service, wherein said wireless device is capable of interacting with a software application that comprises at least some location-based information.

41. The system according to clauses 33-40 wherein said first computing device is operable to receive at least some location-based information from a software application, 42. The system according to clauses 33-41 wherein said first computing device is configured to calculate at least the distance between at least one physical item associated with a specific location to another physical item associated with a specific location 43. The system according to clauses 33-42 wherein first computing device is operable to store the location of a physical item for use with other computing devices.

44. The system according to clauses 33-43 wherein said computer non-transitory useable medium comprises computer readable code, wherein said wireless device is associated with a data interface capability wherein said wireless device is operable of receiving at least some location information through the data interface capability, wherein said wireless device receives data through the data interface capability that relates to the location of one tangible item, wherein said wireless device is operable to present the location of the physical item as well as the location of the wireless device on a graphical map interface.

45. The system according to clauses 33-44 wherein the data interface capability receives network packets.

46. The system according to clauses 33-45 wherein the data interface capability interfaces with a location-based service.

47. The system according to clauses 33-46 wherein the data interface capability interfaces with a first computing device to receive location information.

48. The system according to clauses 32-47 wherein the data interface capability interfaces with a data management component.

49. A system of managing location-based content comprising: a first computing device associated with a location-based service or geofenced location; wherein said first computing device is operable to receive location-based information from a second computing device; wherein the first computing device is capable of determining the location of the second computing device; wherein said first computing device is operable to receive a search request from the second computing device; wherein said request comprises at least a request for the location of a specific item within a wireless network; wherein the first computing device is configured to generate a response that comprises at least the location of the specific item; and wherein the first computing device is further configured to provide updated location-based information to the second computing device on a periodic time interval as long as the second computing device is associated with the first computing device.

50. A system for managing location information comprising: a first computing device associated with a location-based service or geofenced location; wherein said first computing device is operable to receive location-based information from a second computing device; wherein said first computing device is operable to send location-based information to the second computing device; wherein the first computing device is operable to receive updated location-based information from the second computing device and the first computing device is configured to send additional location-based information to the second device based upon the updated location-based information from the second computing device; wherein the first computing device is configured to determine if at least one computing device is associated with a location-based service or wireless network; and wherein the first computing device is further configured to store location-based information received from a second computing device.

51. A method of locating items on a wireless device, said method comprising: (a) transmitting a request to a first computing device for a tangible item within near vicinity of the wireless device; (b) determining the location of said tangible item; (c) receiving location-based information regarding the request for said tangible item; (d) calculating the distance between the location of said wireless device and said tangible item; and (e) providing the distance between the location of the wireless device and the tangible items to the user via a display on the wireless device.

52. The method according to clause 51 wherein said providing of step (e) comprises providing a numeric description (actual distance).

53. The method according to clauses 51-52 wherein said providing of step (e) comprises providing a graphical user interface.

54. The method according to clauses 51-53 wherein said transmitting of step (a) comprises transmitting a request from said wireless device.

55. The method according to clauses 51-54 wherein said calculating of step (d) comprises calculating on said wireless device (or said first computing device).

56. The method according to clauses 51-55 wherein said providing of step (e) comprises a dynamic graphical map interface.

57. A method of locating tangible items on a wireless device comprising: (a) determining the location of a tangible item within a location-based service; (b) calculating the distance between the location of the wireless device compared to the location of the tangible item; and (c) presenting the distance between the location of the wireless device and the tangible item to a user of the wireless device on a graphical map interface.

58. A method of displaying location-based content on a wireless device comprising: (a) transmitting location-based information associated with the wireless device to a first computing device; (b) receiving location-based information from the first computing device; (c) calculating the distance between the location of the wireless device compared to the location information received from the first computing device; and (d) providing the location of the wireless device and the location-based information to the user via a web page.

59. A method of presenting location-based content on a wireless device comprising: (a) transmitting a location-based information data request associated with the wireless device to a first computing device; (b) receiving at the wireless device responsive data comprising of at least location-based information from the first computing device; (c) calculating the distance between the location of the wireless device compared to at least the location of an item associated with the location-based information received from the first computing device through use of a data management component; and (d) displaying the location of the wireless device and item on a graphical user display of the wireless device.

60. A method of presenting location-based content on a wireless device comprising: (a) transmitting a location-based information request based upon the pre-set parameters of a wireless device to a first computing device; (b) receiving at the wireless device responsive data comprising of at least location-based information from the first computing device; and (c) a graphical user interface on the wireless device operable to present the location information to the user.

61. A method of purchasing products comprising: (a) transmitting a location-based information request to a first computing device; (b) receiving at the wireless device responsive location-based information from the first computing device; and (c) displaying at least some of the location-based information received from the first computing device to the user; and (d) wherein the user can decide to purchase an item that is associated with the location-based information received from the first computing device; (e) purchasing said item via a mobile payment system associated with the wireless device.

62. A system comprising: a location-based service; wherein the location-based service comprises an online service; wherein said location-based service is operable to receive a web request for location-based information; wherein the location-based service can provide location-based information to a first computing device, wherein the location-based information is stored on at least one database associated with the location-based service.

63. A system comprising: a location-based service that is capable of receiving a request for location-based information; wherein the location-based service is configured to provide location-based information to a first computing device based upon the location of the wireless device; wherein the location-based service is capable of sending additional location-based information to a first computing device based upon a pre-determined time period; wherein the location-based service is configured to provide additional location-based information to a first computing device depending on the location of the first computing device.

64. A system comprising: a location-based service that is capable of receiving a request for location-based information; wherein the location-based service is configured to provide location-based information to a first computing device; wherein the location-based service is capable of sending additional location-based information to a first computing device based upon the location of the computing device; wherein the location-based service is configured to filter certain location-based information received from the first computing device and store only the non-filtered information.

65. A system comprising: a wireless device; wherein said wireless device is capable of registering with a location-based service; wherein the wireless device is configured to receive location-based information based upon the profile of the wireless device, wherein the location-based information comprises at least the location of an item, wherein the computing device is operable to display the location of an item, wherein wireless device can display the item and the item is operable to be selected by the user; upon selection by the user the wireless device is configured receive additional information from the location-bases service related to the item.

66. A system comprising: a wireless device comprising a multi-core processor; wherein said wireless device is capable of registering with a location-based service; wherein the wireless device is configured to receive location-based information from the location-based service based upon the profile of the wireless device, wherein the location-based information comprises at least the location of an item, wherein the computing device is operable to display the location of an item, wherein wireless device can display the item and the item is operable to be selected by the user; wherein the user by selecting the item can purchase the item electronically via the wireless device using a mobile payment system.

67. A system comprising: a wireless device; wherein said wireless device is capable of registering with a location-based service; herein the wireless device is pre-programmed to receive at least some location-based information from the location-based service; wherein at least some location-based information is filtered by the wireless device based upon the location of the wireless device and the wireless device profile; wherein at least some location-based information can be presented to the user.

68. A system comprising: a wireless device; wherein said wireless device is operable to send a web request to a location-based service; wherein the web request registers the wireless device with the location-based service; wherein the location-based service can provide location-based information to the wireless device; wherein the wireless device is operable to send an additional web request to the location-based service to receive additional location-based information, wherein the wireless device is configured to store at least some location-based information, wherein the wireless device is operable to display at least some location-based information to the user; wherein the wireless device is configured to perform operations on the location-based information stored on the wireless device.

69. A system comprising: a wireless device associated with a wireless network, wherein the wireless device can receive location-based information through said wireless network, wherein the wireless device can provide its location to the wireless network, wherein the wireless device can send location-based information over a wireless network; wherein the wireless device can access the location of other wireless devices by sending a request over the wireless network, wherein location-based information can be displayed to the user; wherein the wireless device is operable to store at least some location-based information.

70. The system as described in clause 69, wherein the wireless device is operable to ascertain its location.

71. A system comprising: a wireless device connected to a wireless network, wherein the wireless device can receive location-based information through said wireless network, wherein the wireless device can send location-based information over a wireless network; wherein the wireless device can access the location of other wireless devices by sending a request over the wireless network, wherein location-based information can be displayed to the user; wherein the wireless device is operable to store at least some location-based information, wherein the wireless device is can display location-based information within the wireless network.

72. A system comprising: a wireless device connected to a wireless network; wherein the wireless device can provide its location to said wireless network or a location-based service, wherein the wireless device is operable to receive location-based information over a wireless network; wherein the wireless device can receive the location of a plurality of items located within the wireless network by sending a request over the wireless network, wherein location-based information can be displayed to the user of the wireless device; wherein the wireless device is operable to store at least some location-based information, wherein the wireless device is operable to receive additional location-based information if the wireless devices moves into an area that has additional location-based information.

73. A system for using location-based information comprising: a computing device; wherein the computing device is operable to receive location-based information associated with a certain location within a wireless network, wherein the computing device is operable to filter the location-based information based upon a certain location within a wireless network; wherein the computing device is operable to store at least some of the location-based information associated with the location, wherein the computing device is operable to display the location of at least one tangible item associated within the wireless device to the user.

74. A system comprising: a computing device associated with a location-based service; wherein the computing device can receive location-based information associated with a certain location from the location-based service, wherein the computing device is configured to perform a search on the location-based information, wherein the search results can be displayed to the user of the computing device, wherein the computing device can send a request for location-based information wherein the request is based upon the profile of the computing device to a location-based service; wherein the computing device is operable to receive location-based information based upon profile of the computing device.

75. A system comprising: a computing device associated with a location-based service; wherein the computing device can receive location-based information associated with a certain location from the location-based service, wherein the computing device is configured to perform a search on the location-based information, wherein the search results are displayed to the user of the computing device, wherein the computing device can send a request for location-based information wherein the request is based upon the adaptive profile of the computing device to a location-based service; wherein the computing device is operable to receive location-based information based upon the adaptive profile of the computing device from the location-based service.

76. A system for managing location-based information comprising: a computer non-transitory useable medium; a wireless device with a multi-core processor; wherein said wireless device is capable of registering with a location-based service; wherein said wireless device is associated with a wireless network; wherein said wireless device upon being in near proximity of said wireless network is configured to invoke a software application; wherein the software application is capable of determining the location of the wireless device; wherein the software application is configured to receive updateable location-based information from the location-based service; wherein the wireless device can search for location-based information using the software application, wherein the wireless device is operable to display location-based information to the user through a graphical map interface.

77. A system for managing location-based information comprising: a computer non-transitory useable medium; a wireless device; wherein said wireless device is capable of registering with a location-based service; wherein said wireless device is associated with a wireless network; wherein said wireless device upon being registered with a location-based service is capable of receiving location-based information via the wireless network; wherein the location-based service is configured to provide the wireless device with location-based information based upon the location of the wireless device; wherein the location-based service can provide updated location-based information based upon the movement of the wireless device from one location to another.

78. A system for managing location-based information comprising: a computer non-transitory useable medium; a wireless device; wherein said wireless device is associated with a wireless network; wherein said wireless device upon being in near proximity of said wireless network is configured to send a request through a software application for location-based information that is located within the wireless network; wherein the software application is operable to connect to a location-based service in order to receive location-based information associated with the location of the wireless device: wherein the software application can provide time-stamped location-based information to the wireless device, wherein the wireless device is operable to display location-based information to the user.

79. A system for using location-based information comprising: a computer non-transitory useable medium; a wireless device; wherein said wireless device is associated with a wireless network; a software application associated with the wireless device that is configured to receive location-based information from a location-based service; wherein said wireless device upon being in near proximity of said wireless network is configured receive location-based information from a software application; wherein the wireless device can search for location-based information using the software application, wherein the wireless device is operable to display location-based information to the user through a graphical map interface.

80. A system for accessing location-based information comprising: a computer non-transitory useable medium; wherein a location-based service is capable of registering wireless devices; wherein the location-based service is configured to store certain information associated with a registered wireless device; wherein the location-based service is configured to receive the location of the wireless device; wherein the location-based service is operable to provide location-based information to the wireless device; wherein the location-based service is capable of determining when updated location-based information should be sent to the wireless device based upon pre-determined parameters for the location-based service.

81. A system for using location-based information comprising: a computer non-transitory useable medium; a location-based service operatively connected to the internet; wherein location-based service is capable of securely storing location-based information; wherein the location-based service can update its stored information based upon location-based information received from a wireless device; wherein the location-based service comprises a server and a database; wherein the server of the location-based service is configured to query the database of the location-based service for location-based information; wherein the location-based service can provide a wireless device with location-based information that is responsive of the query sent by the server to the database.

82. A system comprising: a wireless device capable of registering with a location-based service; wherein said location-based service is accessible to the wireless device via a software application that is associated with a wireless device, wherein the software application is configured to access the location-based service through a data interface capability which is in operative communication with the location-based service; wherein the software application is at least partially stored on the wireless device and provides location-based information to the wireless device; wherein the software application is operable to provide certain location-based information to the wireless device based upon the user's internet or location history.

83. A system comprising: a wireless device capable of registering with a location-based service; wherein said location-based service is accessible to the wireless device via a software application that is associated with a wireless device, wherein the software application is at least partially stored on the wireless device and provides location-based information to the wireless device; wherein the software application is operable to filter the location-based information provided to the user based upon the user's adaptive profile.

84. A system comprising: a wireless device capable of registering with a location-based service wherein said location-based service is accessible to the wireless device via a software application, wherein the software application is at least partially stored on the wireless device and provides location-based information to the wireless device; wherein the software application is a temporary application; wherein the software application is operable to provide dynamically generated location-based information to the wireless device.

85. A system comprising: a computer non-transitory useable medium; a software application partially stored on a first computing device; wherein said first computing device is connected to a location-based service; wherein said software application is configured to receive location-based information from the location-based service through a data interface capability; wherein the software application is operable to provide location-based information associated with a certain location to said first computing device; wherein the software application is configured to display the location-based information to the user of the first computing device.

86. A system comprising: a computer non-transitory useable medium; a software application partially stored on a first computing device; wherein said first computing device is connected to a location-based service; wherein said software application is configured to receive location-based information from the location-based service; wherein the software application is operable to provide location-based information associated with a certain location to said first computing device; wherein the software application is configured to display the location-based information to the user of the first computing device based upon a pre-determined radius.

87. A system comprising: a computer non-transitory useable medium; wherein a wireless device is associated with at least one software application; wherein the software application provides location-based information to the wireless device; wherein the software application is operable to provide updateable advertisement information associated with a certain location to the wireless device when the wireless device is within in near proximity of the location; wherein the software application is configured to send a request to a location-based service for location-based information and is operable to receive at least some location-based information from the location-based service that is responsive to the request; wherein at least some location-based information received from the location-based service is presented to the user on the wireless device.

88. A system comprising: a computer non-transitory useable medium; a computing device capable of registering with a first location-based service; wherein the first location-based service is internet-based; wherein the first location-based service is configured to receive a request for location-based information from a computing device; wherein the first location-based service is configured to send at least some location-based information to the computing device; wherein the location-based service is configured to query a second location-based service for additional location-based information; wherein the second location-based service is capable of providing location-based information to the first location-based service to the first computing device; wherein the location-based service is capable of formatting the location-based information received from the second location-based information before sending the location-based information to the computing device.

89. A system comprising: a first computing device and second computing device registered with a location-based service; wherein the location based service comprises a data interface capability; wherein the location-based service is configured to receive a request from a first computing device for location-based information through the data interface capability; wherein the location-based service is configured to access a second computing device to obtain location-based information based upon said request, wherein the location-based service is operable to send location-based information to the first computing device via the data interface capability in response to the request; wherein the location-based information is capable of sending additional dynamically created location-based information to either the first computing device or the second computing device without first receiving a request from either computing devices.

90. A system comprising: a location-based service consisting of a server that is also configured to be associated with a database; wherein said database is configured to store location-based information; wherein the server is operable to receive a request for location-based information from at least one wireless device; wherein the server queries said database for the request location-based information; wherein the database provides the responsive location-based information to the server based upon the location of the wireless device; wherein the server is configured to provide the responsive location-based information to said wireless device.

91. A system comprising: a location-based service that is associated with a database wherein said database is configured to store location-based information; wherein the database is operable to receive a request for said location-based information from the location-based service; wherein the database provides location-based information that is responsive to the request to the location-based service; wherein the location-based service is configured to send the location-based information received from the database to a first wireless device; wherein the location-based service is operable to receive additional location-based information from a second wireless device within near proximity to the first wireless device; wherein the location-based service is configured to provide at least some of the additional location-based information from the second wireless device to the first wireless device.

92. A system comprising: a location-based service associated with a database; wherein said database is configured to store location-based information; wherein a wireless device is capable of registering with the location-based service; wherein the database is operable to provide location-based information to the wireless device without first receiving a request from said wireless device; wherein the location-based service is configured to obtain the location of the wireless device; and wherein the location-based service is configured to send the location of the wireless device to other wireless devices;

93. A system comprising: a location-based service; wherein said location-based service is configured to store location-based information; wherein a first computing device is capable of registering with the location-based-service; wherein the location-based service is associated with an adaptive profile of a wireless device; wherein the location-based service is operable to send location-based information to said first computing device, which is based upon the adaptive profile of the first computing device.

94. A system comprising: a location-based service capable of registering a wireless device with its service; wherein said location-based service is configured to provide location-based information; wherein the location-based service is operable to send location-based information to said wireless device without a request from the wireless and the location-based information sent to the wireless device is filtered by the location of the wireless device; wherein the location-based service can perform operations on the location-based information that is within near proximity of said wireless device; wherein at least once operation performed by the location-based service includes filtering the location-based data to remove at least some data that is personal identifying data.

95. A system comprising: a computer non-transitory useable medium; a wireless device associated with a location-based service; wherein the wireless device can access the location-based service through the internet; wherein the wireless device can send a request to the location-based service for location-based information; wherein the wireless device is operable to receive at least some location-based information from the location-based service; wherein the wireless device is operable to receive updated location-based information from the location-based service based upon the movement of the wireless device or the direction of movement of the wireless device; wherein the wireless device can present said location-based information to the user of the wireless device on a graphical map interface.

96. A system comprising: a computer non-transitory useable medium; a wireless device capable of registering with a location-based service; wherein the wireless device can access the location-based service through the internet; wherein the wireless device is operable to receive at least some location-based information from the location-based service; wherein the wireless device can present said location-based information to the user of the wireless device on a graphical map interface; wherein the graphical map interface includes a layout of a store.

97. A system comprising: a computer non-transitory useable medium; a wireless device associated with a location-based service; wherein the wireless device can access the location-based service through the internet; wherein the wireless device is operable to receive at least some location-based information from the location-based service; wherein the wireless device can present said location-based information to the user of the wireless device on a graphical map interface; wherein the graphical map interface is operable to display a map showing the location of the wireless device as well as the location of at least one tangible item, which was included in at least some of the location-based information received by the wireless device from the location-based service.

98. A system comprising: a computer non-transitory useable medium; a location-based service; wherein the location-based service comprises at data management component; wherein the location-based service is configured to provide location-based information to a wireless device that is registered with the location-based service; wherein the location-based service is configured to receive location-based information from the wireless device which is associated with a profile used by the wireless device for interacting with location-based services; wherein the profiled used by the wireless device for interacting with location-based services comprises electronic coupons associated with certain locations.

99. A system comprising: a computer non-transitory useable medium; a wireless device capable of registering with a location-based service; wherein the wireless device is configured to access the location-based service through a data interface capability; wherein the data interface capability is also associated with the wireless device; wherein the wireless device is operable to receive at least some location-based information from the location-based service via the data interface capability; wherein the wireless device is configured to present said location-based information to the user of the wireless device on a graphical user interface; wherein the graphical user interface is configured display the location of a tangible item associated with a location on a map, wherein the wireless device is configured to received additional location-based information based upon the movement of the wireless device; wherein the graphical map interface is configured to refresh and display said updated location-based information as the information is received from the location-based service.

100. A system comprising: a computer non-transitory useable medium; a wireless device; wherein the wireless device is capable of registering with the location-based service; wherein the wireless device is operable to receive at least some location-based information from the location-based service; wherein the wireless device filters the location-based information received from the location-based service based upon the direction of movement of the wireless device; wherein the wireless device is configured to present said filtered location-based information to the user of the wireless device on a graphical map interface; wherein the graphical map interface is configured to update the display with the location-based information based upon further movement of the wireless device.

101. A system comprising: a computer non-transitory useable medium; a wireless device associated with a location-based service; wherein the wireless device can access the location-based service; wherein the wireless device is operable to receive at least some location-based information from the location-based service; wherein the wireless device can send a request to the location-based service for additional location-based information; wherein the wireless device is operable to receive additional location-based information from the location-based service; wherein the wireless device can present said location-based information and said additional location-based information to the user of the wireless device at the same time on a graphical user interface.

102. A system comprising: a computer non-transitory useable medium; a wireless device associated with a location-based service; wherein the wireless device is capable of registering with the location-based service; wherein the wireless device can send a request to the location-based service for additional location-based information; wherein the wireless device is operable to receive location-based information from the location-based service; wherein the wireless device is configured to receive additional location-based information from the location-based service; wherein the wireless device can present said location-based information and said additional location-based information to the user of the wireless device on a graphical map interface.

103. A system comprising: a computer non-transitory useable medium; a wireless device associated with a location-based service; wherein the wireless device is capable of registering with the location-based service; wherein the wireless device can send a request to the location-based service for location-based information; wherein the wireless device is operable to receive location-based information from the location-based service; wherein the wireless device is configured to receive additional location-based information from the location-based service based upon the movement of the wireless device; wherein the wireless device can present said location-based information and said additional location-based information to the user of the wireless device on a graphical map interface; wherein the graphical map interface can dynamically display the location of the wireless device on the map based upon the movement of the wireless device.

104. A system comprising: a computer non-transitory useable medium; a wireless device associated with a location-based service; wherein the wireless device is capable of registering with the location-based service; wherein the wireless device can send a request to the location-based service for location-based information; wherein the wireless device is operable to receive location-based information from the location-based service; wherein the wireless device can present said location-based information to the user of the wireless device on a graphical map interface; wherein the wireless device additionally comprises a motion sensor or accelerometer that is capable of determining the direction the wireless device is moving; wherein the graphical map interface can dynamically display location-based information based upon the movement of the wireless device derived at least partially from the motion sensor or accelerometer.

105. A method of managing location-based information: (a) monitoring a plurality of geofenced areas; (b) determining the whether a pre-determined condition has been met by a geofenced area or areas; (c) providing an alert to a wireless device that the pre-determined condition has been met and (d) presenting the alert to the user of the wireless device; (e) purchasing an item associated with the alert via a mobile payment system in communication with the wireless device.

106. A method of managing location-based information: (a) monitoring a plurality of geofenced areas; (b) determining whether a pre-determined condition has been met by a geofenced area or areas; (c) providing an alert to a wireless device that the pre-determined condition has been met and (d) presenting the alert to the user of the wireless device.

107. A method of managing location-based information: (a) monitoring a plurality of geofenced areas; (b) determining whether a pre-determined condition has been met by a geofenced area or areas; (c) providing an alert to a wireless device that the pre-determined condition has been met and (d) periodically monitoring the geofenced area or areas for other pre-determined conditions that have been met.

108. A method of managing location-based information: (a) locating a geofenced area; (b) determining the location of a wireless device or devices; (c) determining whether a wireless device is within or in near proximity to a geofenced area; (d) providing at least some location-based information to a wireless device that is within or in near proximity the geofenced location.

109. A method of managing location-based information: (a) monitoring a plurality of geofenced areas; (b) determining whether a pre-determined condition has been met by a geofenced area; (c) providing an alert to a wireless device that the pre-determined condition has been met; (d) presenting the alert to the user of the wireless device; (e) searching for information inside a geofenced location; (f) presenting said information to the user that is responsive to the search.

110. A method of managing location-based information: (a) monitoring a plurality of geofenced areas; (b) searching for at least some location-based information within the plurality of geofenced areas; (c) providing at least some responsive location-based information to a wireless device; (d) periodically providing update location-based information from the geofenced areas to the wireless device.

111. A method of managing location-based information: (a) monitoring a plurality of user-defined geofenced areas; (b) determining whether a pre-determined condition has been met by a geofenced area or areas that is being monitored; (c) providing an alert to a wireless device that at least one pre-determined condition has been met and (d) presenting the alert to the user of the wireless device.

112. A method of managing location-based information: (a) monitoring a plurality of geofenced areas; (b) searching said geofenced areas for location-based information; (c) receiving responsive location-based information based upon said search; and (d) presenting the responsive location-based information to the user.

113. The method of claim 111 wherein: (a) responsive location-based information is one of: a physical item; a report; an advertisement; an alert; emergency information; oil well information; school information; or business information.

114. A method of managing location-based information: (a) monitoring a plurality of geofenced areas; (b) determining whether a pre-determined condition has been met by a certain geofenced area; (c) providing an alert to a wireless device that the pre-determined condition has been met and (d) sharing an alert with other wireless devices within another geofenced area.

115. A method of managing location-based information: (a) monitoring a plurality of geofenced areas; (b) determining whether a pre-determined condition has been met by a certain geofenced area; (c) providing an alert to a wireless device that the pre-determined condition has been met and (d) sharing at least a portion of the alert with other geofenced areas.

116. A method of managing location-based information: (a) monitoring a plurality of geofenced areas; (b) determining whether a pre-determined condition has been met by a certain geofenced area; (c) providing an alert to a wireless device that the pre-determined condition has been met and (d) notifying another wireless device that is either within or in near-proximity to the geofenced area where the alert was created.

117. A method of managing location-based information: (a) monitoring a plurality of wireless devices within a given geofenced area; (b) determining whether a pre-determined condition has been met by a certain geofenced area; (c) providing an alert to wireless devices within the geofenced location that the pre-determined condition has been met and (d) sending information based upon the alert to other wireless device that are either within or in near-proximity to the geofenced area.

118. A method of managing location-based information: (a) associating with a geofenced area; (b) searching for specific location-based information within the geofenced area; (c) providing at least some responsive location-based information to at least one wireless device; (d) displaying said location-based information to the user of the wireless device.

119. A system for using location-based information comprising: (a) a wireless device associated with at least one geofenced area; (b) the wireless device associated with a data management component; (c) wherein the data management component is configured to receive an alert from the geofenced area; (d) wherein the alert is triggered is based upon a pre-determined condition; (e) wherein the data management component is configured to display the alert to the user of the wireless device.

120. A system for using location-based information comprising: (a) a wireless device; (b) the wireless device operatively connected with a data interface capability; (c) wherein the data interface capability is configured to receive an alert from the geofenced area; (d) wherein the alert received by the data interface capability is triggered based upon a pre-determined condition; (e) wherein the wireless device is configured to display the alert to the user of the wireless device.

121. A system for managing geofenced areas comprising: a plurality of geofenced areas that are associated with a physical location; a data management component operatively associated with a location-based service; wherein the location-based service is able to receive through a data interface capability at least some location-based information from a plurality of geofenced areas; wherein said location-based service stores the location-based information received by the data interface capability with said data management component.

122. A system for managing geofenced areas comprising: a plurality of geofenced areas that are associated with a physical location; a first computing device that is operatively connected to the plurality of geofenced areas; wherein the first computing device is configured to search for certain location-based information associated with the geofenced areas; wherein the first computing device is configured to receive through a data interface capability at least some location-based information from a plurality of geofenced areas; wherein said firs computing device is configured to display the received location-based information.

123. A system for managing geofenced areas comprising: a plurality of geofenced areas that are associated with a physical location; a first computing device that is operatively connected to the plurality of geofenced areas; wherein the first computing device is configured to receive for certain location-based information associated with the geofenced areas based upon some predetermined criteria; wherein the first computing device is configured to display the received location-based information; wherein the first computing device is operable to store at least some location-based information.

124. A system for managing geofenced areas comprising: a plurality of geofenced areas that are associated with a physical location; a first computing device that is operatively connected to the plurality of geofenced areas; wherein the first computing device can modify the location of the geofenced areas; wherein the first computing device is configured to receive for certain location-based information associated with the geofenced areas based upon some pre-determined criteria; wherein the first computing device is configured to display the received location-based information; wherein the first computing device is operable to store at least some location-based information.

125. A system for managing geofenced areas comprising: a plurality of geofenced areas; a first computing device that is operatively connected to the plurality of geofenced areas; wherein the first computing device is configured to provide location-based information to wireless device within any of the said geofenced areas based upon the wireless device settings; wherein the first computing device is configured to receive for certain location-based information associated with the geofenced areas based upon some predetermined criteria; wherein the first computing device is operable to store at least some location-based information.

126. A system for managing geofenced areas comprising: a plurality of geofenced areas; a wireless device that is operatively connected to said plurality of geofenced areas through a software application; wherein the software application is to receive location-based information from any of the said geofenced areas based upon the permission settings of the wireless device; wherein the software application is configured to receive for certain location-based information associated with the geofenced through a data interface capability; wherein the wireless device operable to display at least some location-based information.

127. A system for managing geofenced areas comprising: a plurality of geofenced areas; a location-based service that is operatively connected to the plurality of geofenced areas; wherein the location-based service is configured to provide location-based information to a wireless device upon its entry of any of the said geofenced areas based upon permissions configured on the adaptive profile of the wireless device; wherein the location-based service is operable to store at least some location-based information.

128. A system for managing geofenced areas comprising: a plurality of geofenced areas; a wireless device associated with a software application; wherein the software application is operatively connected to said plurality of geofenced areas through use of a data interface capability; wherein the data interface capability is configured to receive and provide location-based information to said software application based upon the location of the wireless device.

129. A system for managing geofenced areas comprising: a plurality of geofenced areas; a location-based service that is operatively connected to the plurality of geofenced areas; wherein the location-based service is configured to provide location-based information to a wireless device that is within any of the said geofenced areas based the settings of an adaptive profile associated with the wireless device; wherein the software application is operable to display at least some location-based information to the user of the wireless device.

130. A system for interacting with a geofenced area comprising: a geofenced area associated with a physical location; a software application associated with a wireless device that is operatively connected to the geofenced area; wherein the software application is configured to monitor the geofenced area for location-based information based upon the pre-determined settings of the software application; wherein the software application is operable to provide data associated with the wireless device to other wireless devices within the geofenced area.

131. A system for interacting with a geofenced area comprising: a geofenced area comprising at least an oil well; a software application associated with a first computing device that is operatively connected to the geofenced area; wherein the software application is configured to request profile information that is directly associated with the characteristics of the oil well within the geofenced area; wherein the software application associated with the first computing device is configured to receive responsive profile information associated with an oil well; wherein the software application is operable to display the responsive profile information associated with an oil well to the user of the first computing device.

132. A system for interacting with a geofenced area comprising: a geofenced area associated with a gas well; a software application associated with a first computing device that is operatively connected to the geofenced area; wherein the software application is configured to request profile information that is directly associated with the characteristics of the gas well within the geofenced area; wherein the software application associated with the wireless is configured to receive responsive profile information associated with an oil well; wherein the software application is operable to display the responsive profile information associated with an oil well to the user of the first computing device.

133. A system for using location-based information comprising: (a) a wireless device associated with at least one geofenced area; (b) wherein the wireless device comprises at least a data management component; (c) wherein the data management component is configured to query the geofenced area for information that is of interest to the user of the wireless device; (d) wherein the data management component is configured to receive responsive information from the geofenced area based upon the query; and (e) wherein the data management component is configured to display the responsive information to the user of the wireless device.

134. A system for interacting with a geofenced area comprising: a plurality of geofenced areas comprising data associated with at least one oil well; a location-based service associated with a computing device that is operatively connected to a database that comprises location-based information associated with a plurality of geofenced areas; wherein the location-based service is configured to request information that is associated with the characteristics of at least one of the oil wells within the a geofenced area stored at the database; wherein the location-based service is configured to receive responsive information and create an oil well profile to be sent to at least one computing device.

135. A system for interacting with a geofenced area comprising: a plurality of geofenced areas each of which comprises at least a gas well; a location-based service associated with a first computing device that is operatively connected to a database that comprises profile information associated with a plurality of geofenced areas; wherein the location-based service is configured to request profile information that is directly associated with the characteristics of at least one of the gas wells within the geofenced areas from the database; wherein the location-based service is configured to receive responsive profile information associated with an oil well based upon the request.

136. A system for interacting with a geofenced area comprising: a geofenced area comprising at least an oil or gas pipeline; a location-based service associated with a first computing device that is operatively connected to a data base comprising location-based information related to a plurality of geofenced areas; wherein the location-based service is configured to request profile information that is directly associated with the characteristics of at least one oil or gas pipeline within at least one geofenced area; wherein the location-based service is configured to receive responsive profile information associated with the oil or gas pipeline.

137. A system for interacting with a geofenced area comprising: a wireless device that has a Wi-Fi connection; wherein the wireless device is associated with a geofenced area; wherein the wireless device serves as the general geographical center of the geo-fence; wherein the geo-fence is configured to move with the movement of the wireless device and maintain a general radius of the geo-fence around the wireless device; wherein the geo-fence is configured to provide at least some location-based information to the wireless device.

138. A system for interacting with a geofenced area comprising: a wireless device that has a Wi-Fi connection; wherein the wireless device is associated with a geofenced area; wherein the wireless device is located within the geofenced area; wherein the geo-fence is configured to move with the movement of the wireless device; wherein the geo-fence is configured to provide at least some location-based information to the wireless device.

139. A system for interacting with a geofenced area comprising: a wireless device; wherein the wireless device is associated with a geofenced area; wherein the wireless device is located within the geofenced area; wherein the geo-fence is configured to adjust itself based upon the movement of the wireless device; wherein the wireless device is configured to receive at least some location-based information that is of interest to the user of the wireless device based upon the settings of the wireless device or settings of the adaptive profile.

140. A system for interacting with a geofenced area comprising: a geofenced area that comprises at least one oil well; a computing device that is operatively connected to a location-based service that is associated with the geofenced area; wherein the computing device is configured to request profile information that is associated with the characteristics of at least one oil well located within the geofenced area from the location-based service; wherein the computing device is configured to receive responsive profile information associated with an oil well.

141. A system for interacting with a geofenced area comprising: a geofenced area that comprises two or more oil wells; a computing device that is operatively connected to a location-based service; wherein the computing device is configured to request profile information that is associated with the characteristics of two or more of the oil wells within the geofenced area from the location-based service; wherein the computing device is configured to receive responsive profile information associated with two or more of the oil wells.

142. A system for interacting with a geofenced area comprising: a geofenced area that comprises two or more gas wells; a computing device that is operatively connected to a location-based service; wherein the computing device is configured to request profile information that is associated with the characteristics of two or more of the gas wells within the geofenced area from the location-based service; wherein the computing device is configured to receive responsive profile information associated with two or more of the gas wells.

143 A system for using location-based information comprising: a location-based service that is associated with a plurality of wireless devices; wherein the location-based service is configured to provide location-based information to wireless devices based upon the profile of the wireless device and the location of the wireless device; wherein the location-based service is configured to receive a request from a wireless device for additional location-based information associated with the location of the wireless device; wherein the location-based service is configured to provide additional location-based information to the wireless device.

144 A system for using location-based information comprising: a location-based service that is associated with a plurality of wireless devices through at least one wireless network; wherein the location-based service is configured to provide location-based information to a wireless device based upon the profile of the wireless device and the location of the wireless device; wherein the location-based service is configured to provide additional location-based information to the wireless device based upon the movement of the wireless device.

145. A system for managing location-based information comprising: a wireless device; wherein the wireless device is configured to allow a user to create a geo-fence; wherein the geo-fence area comprises at least one route; wherein the wireless device is configured to receive certain location-based information based upon the location and movement of the wireless device that is associated with the geo-fence.

146. A system for managing location-based information comprising: a wireless device; wherein the wireless device is associated with a location-based service and where the location-based service is configured to allow a user to create a geo-fence; wherein the location-based service is configured to provide location-based information to the wireless device based upon the location and movement of the wireless device; wherein the location-based service is display the location-based information on the wireless device.

146a. A system for managing location-based information comprising: a wireless device; wherein the wireless device is associated with a data management component and where the data management component is associated with a geo-fence; wherein the data management component is configured to receive location-based information from the geofenced area based upon the location and movement of the wireless device; wherein the wireless device is operable to provide said location-based information to the user.

147. A method of managing location-based information: (a) creating a geofenced area; (b) determining whether a wireless device is within or in near proximity to the geofenced area; (c) providing location-based information to a wireless device that is associated with the geofenced area; (d) determining whether the wireless device is no longer within or in near proximity to the wireless device.

148. A system for managing location-based information within a school campus associated with either a geo-fence area or multiple geofenced area comprising: a wireless device associated with at least one geofenced area; wherein location-based information is associated with the geofenced area; wherein the location-based information is identified as being a part of the geofenced area by any combination of a student, teacher, or school administrator via a computing device; wherein the wireless device is configured to receive said location-based information based upon the location of the wireless device.

149. A system for managing location-based information comprising: a wireless device operatively connected to a location-based service; the wireless device associated with at least one geofenced area; wherein location-based information is associated with the geofenced area; wherein the location-based information is provided by any combination of a student, teacher, or school administrator via a computing device; wherein the wireless device is configured to receive said location-based information.

150. A system for managing location-based information comprising: a wireless device operatively connected to a location-based service; the wireless device associated with at least one geofenced area; wherein location-based information is associated with the geofenced area; wherein the wireless device is configured to receive said location-based information from the location-based service based upon the pre-determined settings of the wireless device.

151. A system for managing location-based information comprising: a wireless device associated with at least one geofenced area; wherein location-based information is associated with the geofenced area; wherein the wireless device is configured to search the geofenced area for location-based information; wherein the wireless device is configured to receive responsive location-based information associated with the search and the geofenced area.

152. A system for using location-based information comprising: a location-based service that is associated with a certain physical location through a wireless network; wherein the location-based service is configured to recognize when a wireless device has entered the wireless network associated with the physical location or is near-proximity to the physical location; wherein the wireless device is capable of registering with the location-based service; wherein the location-based service is operable to send location-based information to the wireless device.

153. A system for using location-based information comprising: a location-based service that is associated with a certain physical location through a wireless network; wherein the location-based service is configured to recognize when a wireless device has entered the wireless network associated with the physical location or is near-proximity to the physical location; wherein the location-based service is capable of registering the wireless device; and wherein the location-based service is operable to send location-based information to the wireless device.

154. A system for using location-based information comprising: a location-based service that is associated with a certain physical location; wherein the location-based service is configured to recognize when a wireless device has entered the wireless network associated with the physical location or is near-proximity to the physical location; wherein the location-based service is capable of receive a search request for location-based information from the wireless device; wherein the location-based service comprises at least one server and one database; wherein the server upon receiving a search request for location-based information queries the database for the responsive location-based information; wherein the database is configured to provide responsive location-based information to the server; wherein the server can provide the wireless device with responsive location-based information.

155. A system for using location-based information comprising: a wireless device that is configured to register with a location-based service; wherein the location-based service without a request from the wireless device can send location-based information to the wireless device that is specific to the location of the wireless device; wherein the location-based service is capable of storing certain location-based information associated with the wireless device without a request from the wireless device.

156. A system for using location-based information comprising: a wireless device that is capable of registering with a location-based service; wherein the wireless device is configured receive indoor location-based information after entering or being in near-proximity with a wireless network; wherein the wireless device is configured display indoor location-based information to the user.

157. A system for using location-based information comprising: a location-based service; wherein a wireless device is configured receive indoor location-based information from the location-based service after entering or being in near-proximity with an indoor location; wherein the wireless device comprises an accelerometer or motion sensor; wherein the wireless device can provide additional location-based information to the location-based service based upon data from its accelerometer or motion sensor; wherein the wireless device is configured display indoor location-based information to the user.

158. A system for using location-based information comprising: a wireless device registered with a location-based service; wherein the wireless device is configured to receive information from a location-based service that is associated with a poll for a certain location; wherein the wireless device is operable to allow a user to vote in the poll for a certain location; wherein the wireless device is configured to view the result of the poll associated with a certain location.

159. A system for using location-based information comprising: a location-based service associated with a wireless device; wherein the location-based service is configured send information to a wireless device that is associated with a poll for a certain location; wherein the location-based service is configured to allow a user of a wireless device to vote in the poll for a certain location and receive the vote from the user; wherein the location-based service is configured to store the result of the poll associated with a certain location.

160. A system for using location-based information comprising: a wireless device associated with a location-based service; wherein the wireless device is configured to receive from a location-based service a poll that is based upon the location of the wireless device; wherein the wireless device can vote in a poll associated with the location of the wireless device; wherein the results of the poll are displayed to the user via a graphical user interface.

161. A system for managing location-based information comprising: a wireless device; the wireless device associated with at least one geofenced area; wherein the geofenced area is created by device user; wherein the user of the wireless device can select and determine certain parameters that are associated with the geofenced area; wherein the wireless device is configured to receive said location-based information based upon the parameters selected for the geofenced area.

162. A method for managing location-based information comprising: creating a geofenced area; selecting certain parameters associated with the geofenced area; modifying certain parameters associated with the geofenced area; receiving location-based information that is within the geofenced area.

163. A system for managing location-based information comprising: a wireless device; the wireless device associated with at least one geofenced area; wherein the user of the wireless device can assign values to certain parameters that are associated with the geofenced area; wherein the wireless device is configured to receive location-based information based upon the parameters selected for the geofenced area.

164. A system for managing location-based information comprising: a wireless device; the wireless device associated with at least one geofenced area; wherein the user of the wireless device can select and modify certain parameters that are associated with the geofenced area; wherein the wireless device is configured to receive an alert associated with the geofenced area when the user-modified parameters have been met; wherein the alert is provided to the user of the wireless device via a graphical user display.

165. A system for managing location-based information comprising: a wireless device; the wireless device associated with at least one geofenced area; wherein the user of the wireless device can modify certain permissions that are associated with the geofenced area; wherein at least one permission that the user can modify is one of the following: access to the geofenced area; which computing device is allowed access to the wireless devices within the geofenced area; security parameters associated with the geofenced area; whether information is sent outside of the geofenced area to a wireless device.

166. A system for managing location-based information comprising: a computing device; the computing device operatively connected with at least one geofenced location; wherein the user of the computing device can modify certain attributes of the geofenced location; wherein the user of the wireless device can modify attributes related to the geofenced location including which information that can be displayed to users that have access to the geofenced area; which users that can join the geofenced area; information displayed to the users of the geofenced area; and information displayed to non-users of the geofenced area.

167. A system for managing location-based information comprising: a computing device; the computing device operatively connected with at least one geofenced area; wherein the user of the computing device can modify certain attributes that are associated with the geofenced area; wherein at least one attribute that the user can modify includes one of following: access to the geofenced area; registered wireless devices that can join the geofenced area; information displayed to the users of the registered wireless devices; information displayed to non-registered wireless devices; whether information available to a registered wireless device outside of the geofenced area; the secure transmission techniques used by the geofenced area.

168. A system for managing location-based information comprising: a computing device; the computing device operatively connected with at least one geofenced area; wherein the user of the computing device can modify certain attributes that are associated with the geofenced area; wherein at least two attributes that the user can modify includes any two of following: permissions associated with a wireless device in the geofenced area; profile information associated with the wireless device in the geofenced area; location history of the wireless device in the geofenced area; internet history of the wireless device in the geofenced area; purchase history of the wireless device in the geofenced area; information displayed to the users of a registered wireless device; information displayed to a non-registered wireless device; whether information available to a registered wireless device outside of the geofenced area; the secure transmission techniques used by the wireless device in the geofenced area.

169. A system for managing location-based information comprising: at least one geofenced area; wherein the geofenced area comprises a store, business, or building; wherein the geo-fence is operatively associated with a store, business, or building; wherein a computing device can recognize when wireless devices are within or in near proximity to the geofenced area; wherein the computing device is configured to send location-based information to a wireless device that is capable of registering with the geofenced area; wherein the computing device is operable to store data associated with a wireless device in near proximity or within the geofenced area.

170. A system for managing location-based information comprising: a location based service that is in periodic communication with a geofenced area; wherein the geofenced area is a physical location; wherein the location-based service is capable through a data interface capability of monitoring the geofenced area; wherein the location-based service is configured to record movements of wireless devices within the geofenced area by receiving said information through a data interface capability; wherein the location-based service comprises a database and where the database is configured to store said information.

171. A system for managing location-based information comprising: a location based service that is in periodic communication with a geofenced area; wherein the geofenced area is a physical location; wherein the location-based service is capable through a data interface capability of monitoring the geofenced area; wherein the location-based service is configured to record movements of wireless devices within the geofenced area by receiving such data through a data interface capability; wherein the data received by the location-based information associated with the movement of wireless devices is at least partially anonymous; wherein the location-based service comprises a database which is configured to store said data.

172. A system for managing location-based information comprising: a computing device in operational communication with at one or more geofenced areas; wherein the computing device is configured to display one or more geo-fence areas wherein the computing device is configured to select two or more geofenced areas and perform a search for information related to physical items associated with the geofenced areas; wherein the computing device receives responsive information associated with physical items it searched for; wherein the computing device is configured to store at least some responsive information from the search; wherein the computing device is operable to select particular items associated with the responsive information from the search and view profile information associated with the particular items on a graphical user interface.

173. A system for managing location-based information comprising: a computing device in operational communication with at one or more geofenced areas; wherein the computing device is configured to display one or more geo-fence areas wherein the computing device is operable to send a request for additional information associated with a geo-fence area; wherein the additional information comprises location information and/or functionality associated with additional information associated with a geofenced area; wherein the computing device is configured to perform operations on the additional information received from the geofenced area.

174. A system for managing location-based information comprising: a computing device in operational communication with at one or more geofenced areas; wherein the computing device is configured to display one or more geo-fence areas wherein the computing device is operable to send a request for additional information associated with a geo-fence area via a data interface capability; wherein the computing device can receive through its data interface capability additional information comprises location information and/or functionality associated with location information; wherein the computing device is configured to display at least some additional information to the user of the computing device.

175. A system for managing location-based information comprising: a wireless device within a geofenced area and in operational communication with the geofenced area through a data interface capability; wherein the wireless device is configured to associate a message, photograph or video with a given location within the geofenced area; wherein other wireless devices in operational communication with the geofenced area are capable of accessing at least some portion of the message, photograph, or video associated with a given location within a geofenced area; wherein the wireless device is operable to view other messages, photographs, or videos associated with a given location within a geofenced area.

176. A system for managing location-based information comprising: a wireless device within a geofenced area and in operational communication with the geofenced area; wherein the wireless device is operable to set electronic boundaries within a geofenced area that are associated with a physical location; wherein the wireless device is configured to receive an alert based upon another wireless device crossing at least one electronic boundary associated with the wireless device; wherein the alert can be received by the wireless device in the form of a SMS message, email, pop up box, instant message, photograph; wherein the alert can be displayed on a wireless device via a graphical map interface.

177. A system for managing location-based information comprising: a wireless device in operational communication with the geofenced area through a data interface capability; wherein the wireless device is configured to associate a message, photograph or video with a given location within the geofenced area; wherein other wireless devices in operational communication with the geofenced area are capable of accessing at least some portion of the message, photograph, or video; wherein the wireless device is configured to receive messages associated with the message, photograph, or video; wherein the wireless device is operable to view other messages, photographs, or videos associated within the geofenced area.

178. A system for managing location-based information comprising: a wireless device associated with a geofenced location; wherein the wireless device comprises a multi-core processor; wherein the user of the wireless device can modify the permissions associated with the geofenced location; wherein the permissions the wireless device can modify includes: permission to access data associated with the geofenced location; permission to associate data that is related to the geofenced location; permission to delete data associated with a geofenced location.

179. A system for managing location-based information comprising: a wireless device associated with a geofenced location; wherein the user of the wireless device can modify the permissions of the wireless device which control the data to be sent from the wireless device to the geofenced location through a data interface capability; wherein at least the permissions associated with the geofenced location that the wireless device can modify includes: permission to send secure data to the geofenced location; permission to send personal data to the geofenced location; permission to send anonymous data to the geofenced location; and permission to block data associated with a geofenced location.

180. A system for managing location-based information comprising: a wireless device associated with a geofenced location; wherein the wireless device can dynamically modify the geo-fence preferences of the wireless device which controls the data to be sent from the wireless device to the geofenced location through a data interface capability; wherein at least two or more permissions associated with the geofenced location the wireless device can dynamically modify includes: permission to send secure data to the geofenced location; permission to send personal data to the geofenced location; permission to send anonymous data to the geofenced location; permission to receive data that is associated with the geofenced location; permission to block data associated with a geofenced location; permission to filter data associated with the geofenced location; permission to share information with specific wireless devices associated with a geofenced location.

181. A system for managing location-based information comprising: a wireless device associated with a geofenced location; wherein the wireless device without user input is configured to modify the permissions of the wireless device which control the data to be sent from the wireless device to the geofenced location; wherein at least two or more permissions associated with the geofenced location the wireless device can modify includes: permission to send secure data to the geofenced location; permission to send personal data to the geofenced location; permission to send anonymous data to the geofenced location; permission to receive data that is associated with the geofenced location; permission to block data associated with a geofenced location; permission to filter data associated with the geofenced location; permission to share information with specific wireless devices associated with a geofenced location.

182. A system for managing location-based information comprising: a computing device associated with a geofenced location; wherein the user of the computing device can modify the permission settings of the geofenced location which controls the data to be sent from the geofenced location to registered users communicatively connected to the geofenced location; wherein at least two or more permissions associated with the geofenced locations the wireless device can modify includes: permission to send secure data to a wireless device; permission to store personal data from a registered users of the geofenced location; permission to store anonymous data from a registered user of the geofenced location; permission to provide data that is associated with the geofenced location to a registered user; permission to block data from a registered user associated with a geofenced location.

183. A system for managing location-based information comprising: a computing device associated with a plurality of geofenced locations; wherein for each geofenced location permissions exist that are associated with the geofenced location; wherein the permissions of the plurality of geofenced locations can be modified globally; wherein the user of the computing device can modify the permission settings of the geofenced locations which controls the data to be sent from the geofenced locations to registered users communicatively connected to the geofenced location; wherein two or more permissions associated with the geofenced locations the wireless device can modify globally includes: permission to send secure data to a wireless device; permission to store personal data from a registered users of the geofenced location; permission to store anonymous data from a registered user of the geofenced location; permission to provide data that is associated with the geofenced location to a registered user; permission to block data from a registered user associated with a geofenced location; permission to modify the content associated with the geofenced location.

184. A system for managing location-based information comprising: a location-based service associated with a geofenced location; wherein the location-based service provides content to users within the geofenced location, in near proximity of the geofenced area, or users registered with the geofenced location; wherein the content associated with the geofenced comprises at least one of the following: inventory associated with the geofenced location; advertisements associated with the geofenced location; marketing data associated with the geofenced location; physical items location within the geofenced location; a video game that is associated with the geofenced location; a voting poll associated with the geofenced location; an item for sale within the geofenced location; a photograph associated with the geofenced location; wherein the location-based service is configured to store at least some location-based content received from other computing devices.

185. A system for managing location-based information comprising: a computing device associated with a geofenced location; wherein the geofenced location provides content to users within the geofenced location, in near proximity of the geofenced area, or to users registered with the geofenced location; wherein the user of the computing device is configured to purchase items physically located within a geofenced location through a mobile payment system.

186. A system for managing location-based information comprising: a computing device associated with a geofenced location; wherein the computing device can search for location-based information associated with a geofenced location; wherein the computing device is associated a graphical map display; wherein the graphical map display is configured to display responsive location-based information from the geofenced location; wherein at least some of the responsive location-based information comprises the location of at least one physical item within the geofenced location.

187. A system for managing location-based information comprising: a wireless device registered with a location-based service; wherein the location-based service is associated with a geofenced location; wherein the computing device can search for location-based information associated with a geofenced location by using the location-based service; wherein the wireless device is configured to receive responsive location-based information from the location-based service; wherein the wireless device comprises a graphical map interface; wherein the graphical map interface is configured to display at least some responsive location-based information associated with the geofenced location; wherein at least some of the responsive location-based information that is displayed on the graphical map interface comprises the location of at least one physical item within the geofenced location.

188. A system for managing location-based information comprising: a wireless device registered with a data management component; wherein the data management component is associated with a geofenced location; wherein the wireless device can search using a voice command for location-based information associated with a geofenced location; wherein the wireless device is configured to receive responsive location-based information from the location-based service; wherein the wireless device comprises a graphical map interface; wherein the graphical map interface is configured to display at least some responsive location-based information associated with the geofenced location; wherein at least some of the responsive location-based information that is displayed on the graphical map interface comprises the location of at least one physical item within the geofenced location.

189. A system for managing location-based information comprising: a wireless device associated with a data management component; wherein the data management component is associated with a geofenced location; wherein the data management component is configured to retrieve location-based information from a location-based service based upon the movement of the wireless device; wherein the data management component receives additional location-based information from the geofenced location; wherein the wireless devise is operable to present the location-based information to the user in two or more of the following formats:

a message; an email; voice response; email; video; text message; a four dimensional representation.

190. A system for managing location-based information comprising: a wireless device associated with a geofenced location which is a security-enabled geofenced location; wherein the wireless device is only able to associated with the geofenced location by sending an authentication request to the geofenced location; wherein the authentication request comprises a secure code; wherein the geofenced location authenticates the secure code; wherein the wireless device once authenticated by the geofenced location is configured to receive data associated with the geofenced location; wherein the data associated with the geofenced location comprises as least some location-based information.

191. A system for managing location-based information comprising: a geofenced location which is a security-enabled geofenced location; wherein a wireless device is only able to be associated with the geofenced location by sending an authentication request to the geofenced location; wherein the authentication request from the wireless device is authenticated by the geofenced location wherein the authentication request is an identifier associated with the wireless device; wherein the wireless device receives authentication to a geofenced location; SSID, MAC address, MAC-48 identifier, EUI-48, EUI-64, IP authentication headers, encapsulating security payloads, security associations using ISAKMP, or IPSec using the Security Parameter Index; after authentication, the geofenced location is configured to send at least some location-based information to the wireless device.

192. A system for managing location-based information comprising: a location-based service which is a security-enabled location-based service; wherein a wireless device is only able to be associated with the location-based service by sending an authentication request to the service; wherein the authentication request from the wireless device is authenticated by the location-based service using at least one of the following: SSID, MAC address, MAC-48 identifier, EUI-48, EUI-64, IP authentication headers, encapsulating security payloads, security associations using ISAKMP, or IPSec using the Security Parameter Index; if authentication is authorized, the location-based service is configured to send at least some location-based information to the wireless device.

193. A system for managing location-based information comprising: a location-based service that is security-enabled; a wireless device operatively connected to the wireless network that is operable to send an authentication request to the location-based service through the wireless network; wherein the authentication request from the wireless device is authenticated by the location-based service using at least one of the following: SSID, MAC address, MAC-48 identifier, EUI-48, EUI-64, IP authentication headers, encapsulating security payloads, security associations using ISAKMP, or IPSec using the Security Parameter Index; once authentication is authorized, the location-based service is configured to send at least some location-based information to the wireless device.

194. A system for managing location-based information comprising: a location-based service that is security-enabled and associated with a data management component; a wireless device associated with the data management component; wherein the data management component is configured to receive an authentication request from a wireless device; wherein the authentication request from the wireless device is authenticated by the data management component using at least one of the following: SSID, MAC address, MAC-48 identifier, EUI-48, EUI-64, IP authentication headers, encapsulating security payloads, security associations using ISAKMP, or IPSec using the Security Parameter Index; wherein once authentication is authorized by the data management component the location-based service is configured to send at least some location-based information to the wireless device.

195. A system for managing location-based information comprising: a location-based service that is security-enabled and associated with a data management component; a wireless device associated with the data management component; wherein the data management component is configured to receive an authentication request from a wireless device; wherein the authentication request from the wireless device is authenticated by the data management component using at least one of the following: SSID, MAC address, MAC-48 identifier, EUI-48, EUI-64, IP authentication headers, encapsulating security payloads, security associations using ISAKMP, or IPSec using the Security Parameter Index; wherein once authentication is authorized by the data management component the location-based service is configured to send at least some location-based information to the wireless device.

196. A system for receiving location-based information comprising: an entity that comprises a physical item; wherein the entity comprises an associated identifier and upon entering a pre-determined location or boundary transmits the associated identifier to a wireless network; wherein the wireless network is operable to provide the associated identifier to a location-based service.

197. A system for managing location-based information comprising: an entity that comprises either a person or physical item; wherein the entity comprises an associated identifier and upon leaving a pre-determined location or boundary transmits the associated identifier to a wireless network; wherein the wireless network is operable to provide the associated identifier to a either another wireless device, a geofenced location, or a location-based service.

198. A system for managing location-based information comprising: a data management component associated with a geofenced location; wherein the data management component is configured to receive location-based information from within the geofenced location; wherein the data management component can perform a plurality of functions on the location-based information from within the geofenced location; wherein at least one function the data management component perform is to encrypt the location-based information using at least one of the following cryptographic techniques: DES-based techniques; CBC-MAC; OMAC; PMAC; or AES-CBC; wherein the data management component is configured to store the location-based data and cryptographic technique used on the location-based data.

199. A system for using location-based information comprising: a data management component associated with a location-based service; wherein the location-based service is operatively connected to a server; wherein the server is operatively connected to a database; wherein the database stores at least some location-based information; wherein the data management component can send a request to the server for location-based information; wherein the server queries the database for responsive location-based information, wherein the database is configured to return said location-based information to the server; wherein the server is operable to provide said location-based information to the data management component; wherein the data management component is configured to provide said location-based information to at least one computing device.

200. A system for using location-based information comprising: a location-based service; wherein the location-based service is operatively connected to a server; wherein the server is operatively connected to a database; wherein the database stores at least some location-based information; wherein the location-based service can send a request to the server for location-based information; wherein the server queries the database for responsive location-based information, wherein the database is configured to return said location-based information to the server; wherein the server is operable to provide said location-based information to the location-based service; wherein the location-based service is operable to provide the responsive location-based information to at least one computing device.

201. A system for managing location-based information comprising: a wireless device; a wireless device associated with a communications link; wherein the wireless device is associated with certain location-based information within or near a given location; wherein the wireless device can encrypt said location-based information via one or more of the following cryptographic techniques: DES-based techniques; CBC-MAC; OMAC; PMAC; or AES-CBC; wherein the wireless device can send the encrypted location-based information over the communications link to other computing devices within or near the location associated with the wireless device; wherein the wireless device is configured to display at least some of the encrypted location-based information on the wireless device via a graphical user interface.

202. A system for managing location-based information comprising: a wireless device; a wireless device associated with a communications link; wherein the wireless device is associated with certain location-based information within or near a given location; wherein the wireless device can encrypt said location-based information via one or more of the following cryptographic techniques: DES-based techniques; CBC-MAC; OMAC; PMAC; or AES-CBC; wherein the wireless device can send the encrypted location-based information over the communications link to other computing devices within or near the location associated with the wireless device; wherein the wireless device is configured to receive location-based information that is encrypted using cryptographic techniques.

203. A system for managing location-based information comprising: a wireless device; a wireless device associated with a communications link; wherein the wireless device is associated with certain location-based information within or near a given location; wherein the wireless device through the communication link can establish a link to another wireless device; wherein the communications link can encrypt said location-based information using one or more of the following encryption techniques: DES-based techniques; CBC-MAC; OMAC; PMAC; or AES-CBC; wherein the communications link selects the encryption technique to use based upon characteristics of the communications link and channel quality of the communications link.

204. A system for managing location-based information comprising: a wireless device; a wireless device associated with a communications link; wherein the wireless device is associated with certain location-based information within or near a given location; wherein the communications link can encrypt said location-based information using one or more of the following encryption techniques: DES-based techniques; CBC-MAC; OMAC; PMAC; or AES-CBC; wherein the communications link determines the encryption technique to use based upon at least one of the following: the characteristics of the communications link; the characteristics of the data to be sent over the communications link; the efficiency of a given encryption technique.

205. A system for managing location-based information comprising: a wireless device; wherein the wireless device is associated with certain location-based information within or near a given location; wherein the wireless device can encrypt said location-based information using one or more of the following encryption techniques: DES-based techniques; CBC-MAC; OMAC; PMAC; or AES-CBC; wherein the wireless device determines the encryption technique to use based upon at least one of the following: the characteristics of the communications link; the characteristics of the data to be sent over the communications link; the efficiency of a given encryption technique; wherein the wireless device is configured to display the location-based information using a graphical use interface.

206. A system for managing location-based information comprising: a location-based service that is associated with certain location-based information within or near a given location; wherein the location-based service can encrypt said location-based information using one or more of the following encryption techniques: DES-based techniques; CBC-MAC; OMAC; PMAC; or AES-CBC; wherein the location-based service determines the encryption technique to use based upon at least two or more of the following: the characteristics of the communications link; the characteristics of the data to be sent over the communications link; the efficiency of a given encryption technique.

207. A system for using location-based information comprising: a wireless device associated with a data management component; wherein the data management component is utilized by the wireless device to store, manage, or modify location-based information received by the wireless device; wherein the data management component resides at least partially on the wireless device: wherein the wireless device comprises a multi-core processor system.

208. A system for using location-based information comprising: a wireless device associated with a data management component; wherein the data management component is utilized by the wireless device to store, manage, or modify location-based information received by the wireless device; wherein the wireless device comprises a multi-core processor system; wherein the wireless device comprises a dual antenna arrangement; wherein the wireless device upon leaving a pre-determined location or proceeding over a boundary transmits an alert to a wireless network.

209. A system for using location-based information comprising: a wireless device associated with a data management component; wherein the data management component is utilized by the wireless device to store, manage, or modify location-based information received by the wireless device; wherein the wireless device comprises a multi-core processor system; wherein the wireless device comprises a dual antenna arrangement; wherein the wireless device upon entering a location is capable of registering with a location-based service.

210. A system for using location-based information comprising: a wireless device associated with a data management component; wherein the data management component is utilized by the wireless device to store, manage, or modify location-based information received by the wireless device; wherein the wireless device comprises a multi-core processor system; wherein the wireless device upon entering a location is capable of registering with a location-based service and transmitting a request through a wireless access point or wireless network for location-based information.

211. A system for using location-based information comprising: a wireless device associated with a data management component; wherein the data management component is utilized by the wireless device to store, manage, or modify temporary location-based information received by the wireless device; wherein the wireless device comprises a multi-core processor; wherein the wireless device upon entering a location is capable of registering with a location-based service; wherein the wireless device is associated with a mobile payment system that is contactless and can purchase an item from the location-based information received by the device.

212. A system for using location-based information comprising: a wireless device associated with a data management component; wherein the data management component is utilized by the wireless device to store, manage, or modify location-based information received by the wireless device; wherein the wireless device comprises a multi-core processor system; wherein the data management component is operatively connected to a cloud-based storage system; wherein the data management component can store at least some location-based information within a cloud-based storage system.

213. A system for using location-based information comprising: a wireless device associated with a data management component; wherein the data management component is configured to access location-based information associated with the wireless device; wherein the data management component serves as a cache for location-based information received by the wireless device; wherein the cache comprises at least some location-based information from previous locations visited by the wireless device.

214. A system for using location-based information comprising: a wireless device associated with a data management component; wherein the data management component is configured to access location-based information associated with the wireless device; wherein the data management component serves as a cache for location-based information encountered by the wireless device; wherein the cache comprises at least a time-stamp of when the wireless device received at least some location-based information from previous locations visited by the wireless device; wherein the wireless device is operable to share at least some information associated with the cache of the wireless device to a location-based service or wireless network.

215. A system for using location-based information comprising: a wireless device associated with a data management component; wherein the data management component is configured to access location-based information associated with the wireless device; wherein the data management component serves as a cache that stores cookies regarding location-based information encountered by the wireless device; wherein the data management component creates an index of the store cookies associated with said location-based information encountered by the wireless device.

216. A system for using location-based information comprising: a location-based service comprising a server and a database; wherein the server is associated with the database and is configured to identify wireless devices associated with a specific location; wherein the location-based service is operable to manage the wireless devices associated with the specific location by monitoring the data that is sent to the wireless device; wherein the location-based service maintains a list of at least some wireless devices within the specific location; wherein the location-based service is configured to remove from the list, wireless devices that are no longer associated with a given location from the list; wherein the database is configured to store information related to the specific location; wherein the server is capable of accessing the information stored on the database regarding the specific location and is configured to provide such information to other location-based service users.

217. A system for using location-based information comprising: a location-based service comprising a server and a database; wherein the server is associated with the database and is configured to receive a request from wireless devices requesting access to a specific location associated with the location-based service or geofenced area; wherein the location-based service is capable of allowing wireless devices to access certain location-based information based upon the location of the wireless device and credentials of the wireless device; wherein the database is configured to maintain a record having the number of wireless devices associated with a location-based service at a given time based upon pre-determined settings.

218. A system for using location-based information comprising: a location-based service comprising a server and a database; wherein the server is associated with the database and is configured to receive data requests from a wireless device that is related to location-based information associated with a given location; wherein the server is configured to query the database for information responsive the data requests; wherein the data requests being associated with the location comprise at least one of the following: inventory associated with the location; advertisements associated with products located within the location; advertisements associated with a business within the location; advertisements associated with other wireless devices within the location; permissions associated with the location; secure transactions associated with the location; a mobile payment system associated with a given location; prices of products located within a given location; attributes of the products located within a given location; sales volume associated with products located within a given location; sales revenue associated with a business located within a given location; discount percentages associated with products at a given location; discount percentages associated with wireless devices users associated with the location.

219. A system for using location-based information comprising: a location-based service comprising a server and a database; wherein the server is associated with the database and is configured to receive data requests from a wireless device that is related to location-based information associated with a given location; wherein the server is configured to query the database for information responsive the data requests; wherein the data requests being associated with the location comprise at least two or more of the following: inventory associated with the location; advertisements associated with products located within the location; advertisements associated with a business within the location; advertisements associated with other wireless devices within the location; permissions associated with the location; secure transactions associated with the location; a mobile payment system associated with a given location; prices of products located within a given location; attributes of the products located within a given location; sales volume associated with products located within a given location; sales revenue associated with a business located within a given location; discount percentages associated with products at a given location; discount percentages associated with wireless devices users associated with the location.

220. A system for using location-based information comprising: a location-based service comprising a server and a database; wherein the server is associated with the database and is configured to receive data requests from a wireless device that is related to location-based information associated with a given location; wherein the server is configured to query the database for information responsive to the data requests; wherein the data requests being associated with the location comprise at least two or more of the following: inventory associated with the location; advertisements associated with products located within the location; advertisements associated with a business within the location; advertisements associated with other wireless devices within the location; permissions associated with the location; secure transactions associated with the location; a mobile payment system associated with a given location; prices of products located within a given location; attributes of the products located within a given location; sales volume associated with products located within a given location; sales revenue associated with a business located within a given location; discount percentages associated with products at a given location; discount percentages associated with wireless devices users associated with the location.

221. A system for using location-based information comprising: a location-based service comprising a server and a database; wherein the server is associated with the database and is configured to receive data requests from a wireless device that is related to location-based information associated with a given location; wherein the server is configured to query the database for information responsive the data requests; wherein the data requests being associated with the location comprise at least two or more of the following: inventory associated with the location; advertisements associated with products located within the location; advertisements associated with a business within the location; advertisements associated with other wireless devices within the location; permissions associated with the location; secure transactions associated with the location; a mobile payment system associated with a given location; prices of products located within a given location; attributes of the products located within a given location; sales volume associated with products located within a given location; sales revenue associated with a business located within a given location; discount percentages associated with products at a given location; discount percentages associated with wireless devices users associated with the location; wherein the location-based service is configured to determine the distance between the wireless device and location-based information associated with the location.

222. A system for using location-based information comprising: a location-based service comprising a first computing device; wherein the location-based service is associated with a database and is configured to receive a data request from a second computing device for location-based information associated with an oil and gas location; wherein the data request comprises a request for information regarding one or more of the following: oil well reserve reports; oil well title information; oil well leasing information; oil well permit information; oil well barrel production information; title information associated with land where an oil well resides; title information associated with the mineral rights where the oil well is located; easement information associated with the oil well; gas well reserve reports; gas well title information; gas well leasing information; gas well permit information; gas well production information; title information associated with the land where the gas well resides; title information associated with the mineral rights that are associated with the gas well; easement information associated with the gas well.

223. A system for using location-based information comprising: a data management component associated with a first computing device; wherein the data management component is associated with a geofenced location; wherein data management component is capable of receiving data associated with the geofenced location comprising at least one of the following: data regarding the number of wireless devices associated with the geofenced location; data requests from users associated with the geofenced location; inventory associated with the geofenced location; advertisements associated with a geofenced location; a payment authorization from the geofenced location; sales prices for items within the geofenced location; revenue figures associated with a geofenced location; discount percentages associated with items located within a geofenced location; location-based information comprising the location of items located within the geofenced location.

224. A system for using location-based information comprising: a data management component associated with a geofenced location; wherein the data management component is at least partially connected to a wireless device; wherein the data management component is located outside of a geofenced location; wherein the data management component is capable receiving location-based information comprising traffic data; wherein the traffic data comprises at least one of the following: a status indicator regarding the flow of traffic on a given route or routes; the location of bus stops; the location of rest stops; the location of an accident; the location of emergency responder vehicles; warnings regarding road conditions; warnings regarding whether conditions; data associated with city municipalities; hospital information; directions to a given location.

225. A system for using location-based information comprising: a wireless device; wherein the wireless device is configured to receive location-based information; wherein the wireless device is capable receiving location-based information comprising traffic data; wherein the traffic data comprises at least one of the following: a status indicator regarding the flow of traffic on a given route or routes; the location of bus stops; the location of rest stops; the location of an accident; the location of emergency responder vehicles; warnings regarding road conditions; warnings regarding whether conditions; data associated with city municipalities; hospital information; directions to a given location; wherein the wireless device is configured to display through graphical user interface traffic data.

226. A system for using location-based information comprising: a wireless device comprising a multi-core processor; wherein the wireless device is associated with a data management component; wherein the data management component is operable to calculate distances between physical items or locations and the wireless device through the use of at least one location determination method; wherein the wireless device is configured to display at least the location of one physical item on a graphical user interface.

227. A system for using location-based information comprising: a wireless device registered with a location-based service; wherein the wireless device is configured to receive location-based information from the location-based service; wherein the wireless device is associated with a data management component; wherein the data management component is operable to dynamically update the wireless device with additional location-based information; wherein the data management component is configured to filter location-based information received by the component based upon either pre-determined settings of the wireless device or the movement of the wireless device; wherein the data management component performs the filtering without interaction from the user; wherein the wireless device is configured to display at least some location-based information to the user.

228. A system for managing location-based information comprising: a wireless device associated with two or more microprocessors; wherein the wireless device is in communication with a geofenced location; wherein the wireless device is configured to retrieve location-based information from the geofenced location via a location-based service based upon the location of the wireless device; wherein the responsive location-based information received by the wireless device is presented to the user of the wireless device through a graphical user interface comprising at least a three dimensional representation.

229. A system for managing location-based information comprising: a computing device; the computing device operatively connected with at least one geofenced location; wherein the wireless device is capable of registering with a geofenced location; wherein the user of the computing device can modify certain attributes that are associated with the geofenced location; wherein the user of the computing device can modify attributes related to the geofenced location including information that is displayed to the users of the geofenced area and information displayed to the non-users of the geofenced area; information displayed to non-users of the geofenced area; whether information available to a user outside of the geofenced area; which information the geofenced area sends to the wireless device.

230. A system for managing location-based information comprising: a computing device; the computing device operatively connected with at least one geofenced location; wherein the wireless device is capable of registering with a geofenced location; wherein the user of the computing device can modify certain attributes that are associated with the geofenced location; wherein the user of the computing device can modify attributes related to the geofenced location including information that is displayed to the registered users of the geofenced area and information displayed to the non-registered users of the geofenced area; information displayed to non-users of the geofenced area; whether information available to a user outside of the geofenced area; which information the geofenced area sends to the wireless device.

231. A system for managing location-based information comprising: a computing device; the computing device operatively connected with at least one geofenced location; wherein the computing device is capable of registering with a geofenced location; wherein the user of the computing device can modify attributes related to the geofenced location including information that is displayed to the registered users of the geofenced area; wherein the user of the computing device can modify an attribute that determines which information to provide to registered users of the geofenced area and which information to withhold from registered users of the geofenced area.

232. A system for managing location-based information comprising: a computing device; wherein the computing device is capable of registering with a geofenced area; the computing device operatively connected with at least one geofenced area; wherein the user of the computing device can modify certain attributes that are associated with the geofenced area; wherein at least one attribute that the user can modify includes the security settings of the geofenced location including permissions for other devices registered with the geofenced location; wherein the user of the computing device can modify whether registered users of the geofenced area can receive updated location-based information from the geofenced area.

233. A system for managing location-based information comprising: a computing device; wherein the computing device is capable of registering with a geofenced location; the computing device operatively connected with at least one geofenced location; wherein the user of the computing device can modify certain attributes that are associated with the geofenced area; wherein at least two attributes that the user can modify includes: security permissions associated with a wireless device in the geofenced location; adaptive profile information associated with a wireless device provided to either users of other wireless devices within the geofenced location or information associated with the wireless device that is provided to the geofenced location; adaptive profile information associated with a wireless device provided to either users of other wireless devices within the geofenced location or information associated with the wireless device that is provided over a wide area network to a location-based service.

234. A system for managing location-based information comprising: a computing device; wherein the computing device is capable of registering with a geofenced location; the computing device operatively connected with at least one geofenced location; wherein the user of the computing device can store certain location-based information received by the computing device from a wireless device within the geofenced location; wherein at least two types of information that the wireless device can store includes: location history of a wireless device that is registered with a geofenced location and within the geofenced location; transactional history of a wireless device that is registered with a geofenced location and within the geofenced location, wherein the information is related to purchases made within the geofenced location using a wireless payment system.

235. A system for using location-based information comprising: a wireless device capable of registering with a location-based service; wherein the wireless device is configured to receive location-based information from the location-based service; wherein the wireless device is associated with a data management component; wherein the data management component is operable to passively or actively monitor the location-based service for additional time sensitive and location sensitive location based information; wherein the data management component is configured to filter location-based information received by the component based upon either pre-determined settings of the wireless device use or the movement of the wireless device; wherein the data management component performs the filtering without interaction from the user; wherein the wireless device is configured to display at least some location-based information to the user.

236. A system for using location-based information comprising: a wireless device capable of registering with a location-based service; wherein the wireless device is configured to receive location-based information from the location-based service; wherein the wireless device is associated with a data management component; wherein the data management component is operable to passively or actively monitor the location-based service for additional location-sensitive location based information; wherein the additional location-sensitive location-based information comprises an advertisement for a product or service that is based upon the location of the wireless device; wherein the wireless device is configured to display the advertisement to the user.

237. A system for using location-based information comprising: a wireless device capable of registering with a location-based service; wherein the wireless device is configured to receive location-based information from the location-based service; wherein the wireless device is associated with a data management component; wherein the data management component is operable to passively or actively monitor the location-based service for additional location-sensitive location-based information that is in generally proximity to the wireless device; wherein the additional location-sensitive location-based information comprises an advertisement for a business that is located in generally proximity to the wireless device; wherein the wireless device is configured to display the advertisement to the user.

238. A system for using location-based information comprising: a wireless device capable of registering with a location-based service; wherein the wireless device is configured to receive location-based information from the location-based service; wherein the wireless device is associated with a data management component; wherein the data management component is operable to passively or actively monitor the location-based service for additional location-sensitive location based information; wherein the additional location-sensitive location-based information comprises an item for sale that is physically located in the generally proximity to the wireless device; wherein the wireless device is configured to display the price of the item for sale to the user.

239. A system for using location-based information comprising: a wireless device capable of registering with a location-based service; wherein the wireless device is configured to receive location-based information from the location-based service; wherein the wireless device is associated with a data management component; wherein the data management component is configured to receive location-based information based upon the movement and location of the wireless device from the location-based service; wherein the data management component is contextually aware because it can filter location-based information received from the location-based service based upon the preferences of the wireless device user or the adaptive profile associated with the user of a wireless device; wherein the wireless device is configured to display at least some location-based information to user.

240. A system for using location-based information comprising: a wireless device capable of registering with a location-based service; wherein the wireless device is configured to receive location-based information from the location-based service; wherein the wireless device is associated with a data management component; wherein the data management component is configured to receive location-based information from the location-based service; wherein the wireless device is associated with two or more wireless networks; wherein the data management component is contextually aware because it can filter location-based information based upon the movement and location of the wireless device; wherein the wireless device is configured to display at least some location-based information to user that was received from the location-based service.

241. A system for managing location-based information comprising: a wireless device associated with a geofenced location; wherein the wireless device is capable of registering with a wireless network; wherein the user of the wireless device can modify the permissions of the wireless device which control the data to be sent from the wireless device to the geofenced location through a data interface capability in communication with the geofenced location and the wireless device; wherein at least the permissions associated with the geofenced location that the wireless device can modify includes: permission to send personal data to the geofenced location; permission to filter data associated with the geofenced location; and permission to share information with specific wireless devices associated with a geofenced location.

242. A method for interacting with location-based information comprising: receiving a request for the location of a wireless device; registering the wireless device with a location-based service; determining the location of the wireless device using control plane techniques; further refining the determination of the location of the wireless device using user plane techniques; providing the location of the wireless device to a wireless device; sending location-based information to the wireless device based upon the location of the device.

243. A method for interacting with location-based information comprising: receiving a request for the location of a wireless device; determining the location of the wireless device by implementing user plane techniques; further refining the determination of the location of the wireless device using control plane techniques; providing the refined location of the wireless device to the wireless device; sending location-based information to the wireless device based upon the location of the device.

244. A method for interacting with location-based information comprising: registering with a location-based service; determining the location of the wireless device by implementing user plane techniques; further refining the determination of the location of the wireless device using control plane techniques; receiving the refined location of the wireless device from the location-based service after determination of the location of the wireless device is made by using user plane techniques; receiving location-based information from the location-based service upon the location of the device.

245. A method for interacting with location-based information comprising: registering with a location-based service; determining the location of the wireless device by implementing control plane techniques; further refining the determination of the location of the wireless device implementing user plane techniques; receiving the refined location of the wireless device from the location-based service; receiving location-based information from the location-based service upon the location of the device.

246. A system for interacting with location-based information comprising: a location-based service operatively connected to a wireless device; wherein the location-based service is capable of using control plane and user plane techniques to ascertain the location of the wireless device; wherein the location-based service is operable to send the location of the wireless device to the wireless device; wherein the location-based service is configured to provide location-based information to the wireless device based upon the location of the wireless device and the pre-selected settings of the wireless device.

247. A system for interacting with location-based information comprising: a location-based service operatively connected to a wireless device; wherein the location-based service is associated with a data management component; wherein the data management component is capable of using control plane techniques to ascertain the location of the wireless device; wherein the data management component is configured to coordinate and schedule resources used to support the location-based service; wherein the data management component is operable to send the location of the wireless device to the wireless device; wherein the data management component is configured to provide location-based information to the wireless device based upon the adaptive profile associated with the user of a wireless device.

248. A system for interacting with location-based information comprising: a location-based service operatively connected to a wireless device; wherein the location-based service is associated with a data management component; wherein the data management component is capable of implementing user plane techniques to ascertain the location of the wireless device; wherein the data management component is configured to coordinate and schedule resources used to support the location-based service; wherein the data management component is operable to send the location of the wireless device to the wireless device.

249. A system for interacting with location-based information comprising: a location-based service operatively connected to a wireless device; wherein the location-based service is associated with a data management component; wherein the data management component is capable of implementing user plane techniques to ascertain the location of the wireless device; wherein the data management component is configured to determine the final location of the wireless device; wherein the data management component is operable to send the final location of the wireless device to the wireless device.

250. A system for interacting with location-based information comprising: a location-based service operatively connected to a wireless device; wherein the location-based service is associated with a data management component; wherein the data management component is capable of implementing control plane techniques to ascertain the location of the wireless device; wherein the data management component is configured to determine the final location of the wireless device; wherein the data management component is operable to send the final location of the wireless device to the wireless device.

251. A system for interacting with location-based information comprising: a location-based service operatively connected to a wireless device; wherein the location-based service is associated with a data management component; wherein the data management component is capable of implementing control plane or user plan techniques to ascertain the location of the wireless device; wherein the data management component is configured to determine the velocity estimate of the wireless device; wherein the data management component is operable to send the location of the wireless device and velocity estimate to the wireless device.

252. A system for interacting with location-based information comprising: a location-based service operatively connected to a wireless device; wherein the location-based service is associated with a data management component; wherein the data management component is capable of implementing control plane or user plan techniques to ascertain the location of the wireless device; wherein the data management component is configured to determine the velocity estimate of the wireless device; wherein the data management component is operable to send the location of the wireless device and velocity estimate to the wireless device.

253. A system for interacting with location-based information comprising: a location-based service operatively connected to a wireless device; wherein the location-based service is associated with a data management component; wherein the data management component is capable of implementing control plane or user plan techniques to ascertain the location of the wireless device; wherein the data management component is configured to determine estimates of achieved accuracy regarding the determination of the location of the wireless device; wherein the data management component is operable to send the location of the wireless device and estimates of achieved accuracy to the wireless device.

254. A system for interacting with location-based information comprising: a location-based service; wherein the location-based service is associated with a first data management component; wherein the first data management component is capable of coordinating functions to be carried out by the location-based service; wherein the location-based service is associated with a second data management component that is configured to determine the location of a wireless device; wherein the second data management component is configured to determine estimates of achieved accuracy regarding the determination of the location of the wireless device; wherein the location-based service is configured to provide location-based information to a wireless device.

255. A system for interacting with location-based information comprising: a wireless device comprising a multi-core processor; wherein the wireless device is capable of registering with a location-based service; wherein the wireless device is configured to determine its location by implementation of a combination of user plane and control plane techniques; wherein the wireless device is operable to send its location to a location-based service and receive location-based information that is associated with the location of the wireless device from the location-based service; wherein the wireless device is configured to provide at some of the location-based data to the user via a graphical user interface.

256. A method for interacting with location-based information comprising: determining the location of a wireless device through the use of user plane techniques and control plane techniques; determining the estimates of achieved accuracy of the location of the wireless device; storing at least some of the estimates of achieved accuracy in the memory of the wireless device; updating the location of the wireless device based upon the movement of the wireless device.

257. A method for interacting with location-based information comprising: determining the location of a wireless device through the use of user plane techniques or control plane techniques; determining the estimates of achieved accuracy of the location of the wireless device; storing at least some of the estimates of achieved accuracy in the memory of the wireless device; updating the location of the wireless device based upon the pre-determined measurements of movement related to the wireless device.

258. A system for interacting with location-based information comprising: a base station; wherein the base station is operatively connected to a data management component; a wireless network configured to provide wireless access points to a wireless device; wherein the wireless network uses control plane and user plane methods to determine the location of the wireless device; wherein the wireless network is configured to send the location of the wireless device to the wireless device based upon a pre-determined schedule.

259. A method for interacting with location-based information comprising: connecting to an eNB; moving a wireless device from one location to another location; performing an inter-eNB handover based upon the movement of the wireless device; connecting to a second eNB based upon the movement of the wireless device and after the inter-eNB handover has occurred; communicating with a data management component to receive control plane signaling; establishing a link to receive user plan data.

260. A system for interacting with location-based information comprising: a wireless device associated with a first eNB; wherein the first eNB is in communication with at least one other eNB; where upon the movement of the wireless device and receiving the associated measurement of movement data, the first eNB sends a handover request to at least one other eNB in the vicinity of the wireless device; wherein after the handover request has occurred, the first eNB begins to forward location-based information to at least one other eNB in the vicinity; wherein the wireless device is then configured to receive updated location-based information after a handover to a new eNB has occurred.

261. A method for interacting with location-based information comprising: connecting to an eNB; moving a wireless device from one location to another location; performing an inter-eNB handover based upon the movement of the wireless device; connecting to a second eNB based upon the movement of the wireless device and after the inter-eNB handover has occurred; communicating with a location-based service comprising a database that is configured to authenticate a user of the wireless device; receiving control plane signaling from a data management component.

262. A method for interacting with location-based information comprising: connecting to an eNB; moving a wireless device from one location to another location; performing an inter-eNB handover based upon the movement of the wireless device; connecting to a second eNB based upon the movement of the wireless device and after the inter-eNB handover has occurred; communicating with a database that is configured to authenticate a user of the wireless device; receiving control plane signaling from a data management component.

263. A system for interacting with location-based information comprising: a wireless device associated with a first eNB; wherein the first eNB is in communication with at least one other eNB; where upon the movement of the wireless device and receiving associated measurement of movement data, the first eNB sends a handover request to at least one other eNB in the vicinity of the wireless device; wherein after the handover request has occurred, the first eNB begins to forward location-based information to at least one other eNB in the vicinity of the wireless device; wherein the wireless device is then configured to receive updated location-based information after a handover to a new eNB has occurred.

264. A system for managing location-based information comprising: a geofenced location which is a security-enabled geofenced location; wherein a wireless device is only able to be associated with the geofenced location by sending an authentication request to the geofenced location; wherein the authentication request from the wireless device is authenticated by the geofenced location wherein the authentication request is an identifier associated with the wireless device; wherein the wireless device receives authentication to a geofenced location; after authentication, the geofenced location is configured to send at least some location-based information to the wireless device.

265. A system according to clauses 190-195 comprising: wherein authentication is accomplished using an SSID, MAC address, MAC-48 identifier, EUI-48, EUI-64, IP authentication headers, encapsulating security payloads, security associations using ISAKMP, or IPSec using the Security Parameter Index.

266. A system according to clause 190 comprising: wherein the secure code is an SSID, MAC address, MAC-48 identifier, EUI-48, EUI-64, IP authentication headers, encapsulating security payloads, security associations using ISAKMP, or IPSec using the Security Parameter Index.

267. A method of managing location-based information: (a) monitoring a plurality of wireless devices that are within or near proximity to a geofenced area; (b) determining whether a pre-determined condition has been met by a wireless device that is associated with the preferences of the wireless device; (c) providing an alert to a wireless device that the pre-determined condition has been met and (d) presenting the location-based information to the user of the wireless device based upon the preferences of the wireless device; (e) purchasing an item associated with the alert via a mobile payment system in communication with the wireless device.

268. A method of interacting with location-based information: (a) monitoring a plurality of wireless devices that are within or near proximity to a geofenced area; (b) determining whether a pre-determined condition has been met by a wireless device based upon the user preferences of the wireless device; (c) providing a message to a wireless device that the pre-determined condition has been met and (d) presenting location-based information to the user of the wireless device based upon the preferences of the wireless device; (e) wherein the location-based information comprises at least some information regarding an item within the geofenced area; (f) purchasing an item associated with the alert via a mobile payment system in communication with the wireless device.

269. A method of interacting with location-based information: (a) monitoring a plurality of wireless devices that are within or near proximity to a geofenced area; (b) determining whether a pre-determined condition has been met by a wireless device based upon the user preferences of the wireless device; (c) providing a message to a wireless device that the pre-determined condition has been met and (d) presenting location-based information to the user of the wireless device based upon the preferences of the wireless device; (e) wherein the location-based information comprises at least some information regarding an item for sale within the geofenced area; (f) purchasing the item associated with the message via a mobile payment system in communication with the wireless device.

270. A method of interacting with location-based information: (a) accessing a location based service; (b) detecting an item located within the location-based service; (c) receiving the price and the location of the item from the location-based service; (d) sending a request to purchase the item to a location-based service comprising the price of the item and payment information from the user; (e) receiving a confirmation request from the location-based service for the item; (f) accepting confirmation to purchase the item from the location-based service.

271. A method of interacting with location-based information: (a) a wireless device communicating with a location based service; (b) detecting an item located within a wireless network; (c) receiving an advertisement related to the item within the wireless network; (d) receiving the price of the item from the location-based service; (e) sending a request to purchase the item to a mobile payment system located within the wireless network that comprises the amount of the item, payment details from the user, and a security identifier; (f) establishing a secure connection to the mobile payment system; (g) receiving a confirmation request from the mobile payment system for the price of the item; (h) accepting confirmation to purchase the item from the mobile payment system.

272. A method of interacting with location-based information: (a) a wireless device configured to use near field communication technology; (b) receiving an advertisement about an item located within the wireless network from a location-based service; (c) receiving the purchase price of the item from a location-based service; (d) sending a request to establish a secure connection with a mobile payment system that utilizes near fear communication technology; (e) establishing a secure connection to the mobile payment system using near field communication technology; (f) sending a request to purchase the item to a mobile payment system using near field communication technology located within the wireless network that comprises the amount of the item, payment details from the user, and a security identifier; (g) receiving a confirmation request from the mobile payment system for the price of the item; (h) purchasing the item from the mobile payment system; (i) terminating the secure connection between the wireless device and the mobile payment system.

273. A method of interacting with location-based information: (a) a wireless device communicating with a wireless network; (b) communicating with a location-based service through the wireless network; (c) sending a request for additional information to the location-based service regarding an item for sale within the wireless network; (d) receiving the purchase price of the item from the location-based service; (e) sending a request to establish a secure connection with a mobile payment system that utilizes near fear communication technology; (f) establishing a secure connection to the mobile payment system using near field communication technology; (g) sending a request to purchase the item to a mobile payment system using near field communication technology located within the wireless network that comprises the amount of the item, payment information from the user, and the quantity of the item to purchase; (h) receiving a confirmation request from the mobile payment system for the price of the item over the secure connection; (i) purchasing the item from the mobile payment system; (j) terminating the secure connection between the wireless device and the mobile payment system.

274. A method of interacting with location-based information: (a) a wireless device accessing a wireless network; (b) registering with a location-based service that is operatively connected to the wireless network; (c) receiving location-based information comprising at least the price of an item for sale within the wireless network from the location-based service; (d) sending a request for additional information concerning the item for sale to the location-based service; (e) sending a request to establish a secure connection with a mobile payment system to the location-based service; (f) establishing a secure connection to the mobile payment system; (g) receiving purchase information for the item from the mobile payment system that is associated with location-based service that comprises the amount of the item; (h) sending a payment request to the mobile payment system associated with the location-based service that comprises an account number and payment information from the user as well as the quantity of the items to purchase; (i) receiving a confirmation request from the mobile payment system for the price of the item over the secure connection; (j) purchasing the item from the mobile payment system; (k) terminating the secure connection between the wireless device and the mobile payment system.

276. A method of interacting with location-based information: (a) a wireless device accessing a wireless network; (b) registering with a location-based service that is operatively connected to the wireless network; (c) receiving indoor location-based information comprising at least information regarding an advertisement related to an item for sale within the wireless network from the location-based service; (d) sending a request for additional information concerning the item for sale from the location-based service; (e) receiving additional information from the location-based service that relates to an item for sale from the location-based service; (f) sending a request to establish a secure connection with a mobile payment system to the location-based service; (g) establishing a secure connection to the mobile payment system; (h) receiving purchase information for the item from the mobile payment system that is associated with location-based service that comprises the amount of the item; (i) displaying at least the purchase information for the item to the user of the wireless on a graphical user interface; (j) selecting the item for sale on the graphical user interface and sending a payment request to the mobile payment system associated with the location-based service that comprises an account number and payment information from the user; (k) receiving a confirmation request from the mobile payment system for the price of the item over the secure connection; (l) displaying to the user of the wireless device an icon that represents acceptance of purchasing the item; (m) purchasing the item from the mobile payment system; (n) terminating the secure connection between the wireless device and the mobile payment system.

277. A method of interacting with location-based information: (a) a wireless device accessing a wireless network; (b) registering with a location-based service that is operatively connected to the wireless network; (c) receiving location-based information comprising at least information regarding an advertisement related to an item for sale within the wireless network from the location-based service; (d) sending a request for additional information concerning the advertisement to a sensor located within the wireless network which comprises at least some indoor location-based information; (e) receiving additional information from the sensor; (f) sending a request to establish a secure connection with a mobile payment system a mobile payment system; (g) establishing a secure connection to the mobile payment system; (h) receiving purchase information for the item from the mobile payment system comprising the amount of the item; (i) displaying at least the purchase information for the item to the user of the wireless on a graphical user interface; (j) selecting the item for sale on the graphical user interface and sending a payment request to the mobile purchasing system associated with the location-based service that comprises an account number and payment information from the user; (k) receiving a confirmation request from the mobile payment system for the price of the item over the secure connection; (l) displaying to the user of the wireless device an icon that represents acceptance of purchasing the item; (m) purchasing the item from the mobile payment system; (n) terminating the secure connection between the wireless device and the mobile payment system.

278. A system for interacting with location-based information comprising: a wireless device comprising a multi-core processor; wherein the wireless device is capable of registering with a location-based service; wherein the wireless device is operatively connected with a data management component; wherein the data management component is capable of receiving location-based information from the location-based service; wherein the data management component is operable to filter location-based information sent to the wireless device based upon the user preferences of the wireless device; wherein the wireless device is configured to display at least some location-based information to the user that was not filtered by the data management component via a graphical user interface.

279. A system for interacting with location-based information comprising: a wireless device comprising a multi-core processor; wherein the wireless device is capable of registering with a location-based service; wherein the wireless device is operatively connected with a data management component; wherein the data management component is capable of receiving location-based information from the location-based service; wherein the data management component is operable to filter location-based information sent to the wireless device based the location history of the wireless device; wherein the location history of the wireless device comprises at least some locations previously visited by the wireless device; wherein the wireless device is configured to display at least some location-based information to the user that was not filtered by the data management component via a graphical user interface.

280. A system for interacting with location-based information comprising: a wireless device comprising a multi-core processor; wherein the wireless device is capable of registering with a location-based service; wherein the wireless device comprises an adaptive profile that is associated with data concerning the user of the wireless device; wherein the wireless device is capable of receiving location-based information from the location-based service; wherein the adaptive profile is operable to dynamically filter location-based information sent to the wireless device based on the location of the wireless device and pre-determined settings of the wireless device; wherein the wireless device is configured to display at least some location-based information to the user that was not filtered by the adaptive profile via a graphical user interface.

281. A system for interacting with location-based information comprising: a wireless device comprising a multi-core processor; wherein the wireless device is capable of registering with a location-based service; wherein the wireless device comprises an adaptive profile; wherein the wireless device is capable of receiving location-based information from the location-based service; wherein the adaptive profile is operable to determine security settings of the wireless device; wherein the adaptive profile is configured to filter location-based information based upon the security settings of the wireless device; wherein the wireless device is configured to display at least some location-based information to the user that was not filtered by the adaptive profile via a graphical user interface.

282. A system for interacting with location-based information comprising: a wireless device comprising a multi-core processor; wherein the wireless device is capable of registering with a location-based service; wherein the wireless device comprises an adaptive profile; wherein the wireless device is capable of receiving location-based information from the location-based service; wherein the adaptive profile is operable to determine security settings of the wireless device; wherein the adaptive profile is configured to filter location-based information based upon the age of the user of the wireless device; wherein the wireless device is configured to display at least some location-based information to the user that was not filtered by the adaptive profile via a graphical user interface.

283. A system for interacting with location-based information comprising: a wireless device comprising a multi-core processor, an accelerometer, and a motion sensor; wherein the wireless device is operable to determine its location using an accelerometer and motion sensor as well location-based information received over a wireless network; wherein the wireless device is operable to determine based upon a pre-determined measurement of movement that the wireless device has moved locations; wherein the wireless device base upon this determination sends a request for location-based information to a location-based service; wherein the wireless device receives location-based information from the location-based service; wherein the wireless device is configured to display the updated location-based information to the user using a graphical user interface; wherein the wireless device is capable of registering with a location-based service; wherein the wireless device comprises an adaptive profile; wherein the wireless device is capable of receiving location-based information from the location-based service; wherein the adaptive profile is operable to determine security settings of the wireless device; wherein the adaptive profile is configured to filter location-based information based upon the age of the user of the wireless device; wherein the wireless device is configured to display at least some location-based information to the user that was not filtered by the adaptive profile via a graphical user interface.

284. A method of interacting with location-based information: (a) accessing a location based service; (b) receiving location-based information from the location-based service; (c) filtering the location-based information based upon the predetermined user settings of a wireless device through the use of an adaptive profile; (d) determining the location of the wireless device; (e) presenting the filtered location-based information to the user via a graphical user interface.

285. A method of interacting with location-based information: (a) accessing a wireless network; (b) receiving location-based information from the wireless network; (c) filtering the location-based information based upon the predetermined user settings of the wireless device through the use of an adaptive profile associated with the wireless device; (d) determining the location of a wireless device in relation to the filtered location-based information; (e) presenting the filtered location-based information to the user via a graphical user interface.

286. A method of interacting with location-based information: (a) accessing a wireless network; (b) receiving location-based information from the wireless network; (c) filtering the location-based information based upon the predetermined user settings of the wireless device through the use of an adaptive profile associated with the wireless device; (d) determining the location of a wireless device by using location measurement units associated with the wireless device; (e) presenting the filtered location-based information to the user via a graphical user interface.

287. A method of interacting with location-based information: (a) accessing a wireless network; (b) receiving location-based information from the wireless network; (c) filtering the location-based information based upon the settings of the wireless device through the use of an adaptive profile associated with the wireless device; (d) storing through a data management component location-based information for use with return visits to a determined location or wireless network; (e) presenting the filtered location-based information to the user via a graphical user interface.

288. A method of interacting with location-based information: (a) accessing a wireless network; (b) receiving location-based information from the a location-based service; (c) filtering the location-based information based upon the settings of the wireless device through the use of an adaptive profile associated with the wireless device; (d)

storing through a data management component location-based information for wherein the location-based information is associated with a business located within the wireless network and to be used on return visits to the wireless network; (e) presenting the filtered location-based information to the user via a graphical user interface.

289. A method of interacting with location-based information: (a) accessing a wireless network; (b) receiving location-based information from the a location-based service; (c) filtering the location-based information based upon the settings of the an adaptive profile associated with the wireless device; (d) storing through a data management component location-based information for wherein the location-based information is associated with a business located within the wireless network and to be used on return visits to the wireless network; (e) determining which location-based information will be used and provided to other computing devices upon a return visit to the business.

290. A system for interacting with location-based information comprising: a wireless device comprising a multi-core processor; wherein the wireless device is capable of registering with a location-based service; wherein the wireless device is associated with a data management component comprising an adaptive profile; wherein the data management component is configured to apply the adaptive profile dynamically to information sent to the wireless device by the location-based service; wherein the adaptive profile is operable to filter location-based information based upon the pre-determined settings of the wireless device.

291. A system for interacting with location-based information comprising: a wireless device; wherein the wireless device is capable of registering with a location-based service; wherein the wireless device is associated with a data management component comprising an adaptive profile; wherein the data management component is configured to apply the adaptive profile to information sent to the wireless device by the location-based service; wherein the adaptive profile is operable to receive location-based information sent to the wireless device and determine location-based information associated with the wireless device to provide to the location-based service based upon the settings of the adaptive profile.

292. A system for interacting with location-based information comprising: a wireless device; wherein the wireless device is capable of registering with a location-based service; wherein the wireless device is associated with a data management component comprising an adaptive profile; wherein the data management component is configured to apply the adaptive profile to information sent to the wireless device by the location-based service; wherein the adaptive profile is location aware and operable to receive location-based information sent to the wireless device; wherein the adaptive profile determines which data associated with the wireless device to provide to the location-based service based upon the settings of the adaptive profile.

293. A system for interacting with location-based information comprising: a wireless device; wherein the wireless device is capable of registering with a location-based service; wherein the wireless device is associated with a data management component comprising an adaptive profile; wherein the data management component is configured to apply the adaptive profile to information sent to the wireless device by the location-based service; wherein the adaptive profile is location aware by being able to dynamically determine the location-based information to provide to the user based upon the location of the wireless device; wherein the adaptive profile determines which data associated with the wireless device to provide to the location-based service based upon the settings of the adaptive profile.

294. A system for interacting with location-based information comprising: a wireless device; wherein the wireless device is capable of registering with a location-based service; wherein the wireless device is associated an adaptive profile; wherein the adaptive profile comprises a profile associated with the user for interacting with the location-based service; wherein the profile comprises settings determined by the user that relate to the information provided to the location-based service; wherein the information provided to the location-based service is only the information that complies with the settings of the profile.

295. A system for interacting with location-based information comprising: a wireless device; wherein the wireless device is capable of registering with a location-based service; wherein the wireless device comprises instructions for configuring a profile to be used when communicated with the location-based service based upon the preferences of the user; wherein the wireless device is configured to receive location-based information from the location-based service; wherein the wireless device is configured to provide information to the location-based service based upon the profile settings; wherein wireless device is operable to display location-based information on a graphical user interface.

296. A system for interacting with location-based information comprising: a wireless device; wherein the wireless device is capable of registering with a location-based service; wherein the wireless device comprises an adaptive profile; wherein the wireless device is configured to receive location-based information; wherein the adaptive profile is operatively associated with a mobile payment system and comprises payment information associated with the user of the wireless device; wherein the wireless device is configured to establish a secure connection with the mobile payment system; wherein the wireless device can send a purchase request that comprises some information from the adaptive profile of the user to a mobile payment system for an item associated with the location-based service; wherein the wireless device can receive a payment authorization from the mobile payment system confirming purchase of the item; wherein the wireless device is configured to display the confirmation to the user of the wireless device.

297. A system for interacting with location-based information comprising: a wireless device; wherein the wireless device is capable of registering with a mobile payment system; wherein the wireless device comprises a data interface capability that is operatively connected to a wireless network; wherein the wireless device is configured to receive location-based information through the data interface capability; wherein wireless device has operative access to an adaptive profile of the user that used for making purchases through mobile payment system that is contactless; wherein the wireless device is configured to establish a secure connection with the mobile payment system through a second data interface capability; wherein the wireless device can send a purchase request comprising at least some information from the adaptive profile of the user to a mobile payment system for an item that is located near the wireless device; wherein the wireless device is configured receive a payment authorization from the mobile payment system confirming purchase of the item; wherein the wireless device is configured to display the confirmation to the user of the wireless device.

298. A system for interacting with location-based information comprising: a wireless device; wherein the wireless device is capable of registering with a point of sale system;

wherein the wireless device comprises a data interface capability that is operatively connected to a wireless network; wherein the point of sale system is located within the general proximity of the wireless device; wherein the wireless device is configured to receive location-based information through the data interface capability; wherein the wireless device is operable to access account information associated with the user of the wireless device that comprises at least an alias that is associated with the user; wherein the wireless device is configured to establish a secure connection with the point of sale system through a second data interface capability; wherein the wireless device can send a purchase request to the point of sale system for an item located in general proximity of the wireless device; wherein the wireless device can receive a payment authorization from the point of sale system confirming purchase of the item; wherein the wireless device is configured to display the confirmation to the user of the wireless device.

299. A system for interacting with location-based information comprising: a wireless device; wherein the wireless device comprises a data interface capability that is configured to receive location-based information; wherein a localized terminal is located within the range of the wireless network; wherein the wireless device is operable to access account information associated with the user of the wireless device; wherein the wireless device is configured to establish a secure connection with the localized terminal component through a second data interface capability; wherein the wireless device can send a purchase request to the localized terminal for an item that is within general proximity of the wireless device; wherein the wireless device can receive a payment authorization from the payment component confirming purchase of the item; wherein the wireless device is configured to display the confirmation to the user of the wireless device.

300. A system for interacting with location-based information comprising: a wireless device; wherein the wireless device is capable of registering with a location-based service; wherein the wireless device is associated with a localized terminal in operative communication with a mobile payment system; wherein the wireless device is operable to receive location-based information from at least one wireless network; wherein the location-based information comprises at least the location of a physical item within a wireless network; wherein the wireless device is operable to send a request to localized terminal to purchase the physical item within the wireless network; wherein the wireless device is configured to establish a secure connection with payment component; wherein the wireless is configured to receive a payment authorization from the payment component related to the physical item within the wireless network.

301. A system for interacting with location-based information comprising: a wireless device; wherein the wireless device is capable of registering with a mobile payment system; wherein the wireless device comprises a data interface capability that is operatively connected to a wireless network; wherein the mobile payment system is located within the range of the wireless network; wherein the wireless device is configured to receive location-based information through the data interface capability; wherein the wireless device is operable to access account information associated with the user of the wireless device; wherein the wireless device is configured to establish a secure connection with the mobile payment system through a second data interface capability; wherein the wireless device can send a purchase request to the mobile payment system for an item located near the wireless device; wherein the wireless device can receive a payment authorization from the payment component confirming purchase of the item; wherein the wireless device is configured to display the confirmation to the user of the wireless device.

302. A system for interacting with location-based information comprising: a wireless device; wherein the wireless device is capable of registering with a location-based service; wherein the wireless device comprises an adaptive profile; wherein the wireless device is configured to receive location-based information from the location-based service; wherein the wireless device is operable to provide at least some adaptive profile information to a localized terminal; wherein the adaptive profile comprises account information associated with the user of the wireless device; wherein the wireless device is configured to establish a secure connection with the localized terminal; wherein the wireless device can send a purchase request to the localized terminal for an item associated with the location-based service; wherein the wireless device can receive a payment authorization from the payment component confirming purchase of the item; wherein the wireless device is configured to display the confirmation to the user of the wireless device.

303. A method of purchasing an item within location-based information: (a) accessing a wireless network; (b) receiving location-based information from the a location-based service; (c) filtering the location-based information based upon the settings of the wireless device through the use of an data management component associated with the wireless device; (d) identifying a physical item for sale within a wireless network; (e) connecting to a mobile payment system to purchase the physical item within the wireless network; (f) establishing a secure connection with the mobile payment system; (g) sending payment information to the mobile payment system; (h) receiving a payment authorization from the mobile payment system that is associated with the payment information from the wireless device and data associated with the physical item; (i) ending the session with the mobile payment system.

304. A method of purchasing an item within location-based information: (a) accessing a wireless network; (b) receiving location-based information from the a location-based service; (c) identifying a physical item for sale within a wireless network that is part of the location-based information received from the location-based service; (d) connecting to a mobile payment system to purchase the physical item within the wireless network; (e) establishing a secure connection with the mobile payment system; (f) sending payment information to the mobile payment system; (g) receiving a payment authorization from the mobile payment system that is associated with the payment information from the wireless device.

305. A system for interacting with location-based information comprising: a location-based service comprising a server and associated with a database; wherein a data management resides on the server; wherein the data management component is configured to received location-based information from a two or more wireless devices; wherein the data management component filters the location-based information based upon a predetermined privacy policy and determines which information to store and which information to not store that is received from two or more wireless devices; wherein the data management component stores the filtered information.

306. A system for interacting with location-based information comprising: a location-based service comprising a server and database; wherein a data management component is associated with the location-based service; wherein the data management component is configured to received location-based information from a two or more wireless devices; wherein the data management component filters the location-based information received based upon a predetermined security policy associated with the location-based service; wherein the predetermined security policy comprises at least two security levels that a wireless device associated with the location-based service can be related to while being operatively in communication with the location-based service.

307. A system for interacting with location-based information comprising: a location-based service; wherein a data management component is associated with the location-based service; wherein the data management component is configured to received location-based information from a two or more wireless devices; wherein the data management component determines whether a wireless device is a preferred wireless device based upon security settings associated with the location-based service.

308. A system for interacting with location-based information comprising: a physical location that is within a wireless network or geofenced location; wherein the physical location is associated with a location-based service; wherein the location is operatively connected with a wireless device in near proximity to the location through the location-based service; wherein the location-based system is configured to determine the types of data received from the wireless device based upon pre-determined settings of the location-based service; wherein the location-based service is configured to provide location-based profile information regarding an item within the location associated with the location-based service.

309. A system for interacting with location-based information comprising: a location-based service operatively connected to a physical location that is within a wireless network or geofenced location; wherein the physical location is associated with a profile; wherein the profile comprises the information the location will share with a wireless device that comes within or in near proximity to the location; wherein the location-based service is configured to modify the profile associated with a location.

309. A method for interacting with location-based information comprising: establishing a profile associated with a physical location; providing the profile associated with the physical location to a wireless device; managing the information associated with the profile of a physical location to be provided to the wireless device; operatively connecting to a location-based service; receiving location-based information from a location-based service; providing location-based information to the wireless device that is operatively connected to the physical location.

310. A method for interacting with location-based information comprising: establishing a profile associated with a physical location; providing the profile associated with the physical location to a wireless device; managing the information associated with the profile of a physical location to be provided to the wireless device; determining based upon location-based information associated with the wireless device whether the wireless device should receive a location-based advertisement; sending the location-based advertisement to the wireless device.

311. A method for interacting with location-based information comprising: establishing a profile associated with a physical location; providing the profile associated with the physical location to a wireless device; managing the information associated with the profile of a physical location to be provided to the wireless device; determining based upon location-based information associated with the wireless device whether the wireless device should receive a location-based advertisement based upon the history of the wireless device; sending the location-based advertisement to the wireless device.

312. A method for interacting with location-based information comprising: establishing a profile associated with a physical location; providing the profile associated with the physical location to a wireless device; managing the information associated with the profile of a physical location to be provided to the wireless device; determining based upon previous locations visited by the wireless device whether the wireless device should receive a location-based advertisement based upon the history of the wireless device; determining based upon the previous locations visited by the wireless device whether to send an advertisement to the wireless device.

313. A system for interacting with location-based information comprising: a data management component capable of registering with a location-based service; wherein the data management component is configured to receive profile information associated with a wireless device; wherein the profile information stored by the data management component comprises a unique wireless device identifier, data that is to be shared with other wireless devices, and previous websites accessed by the wireless device; wherein the data management component is operable to store said profile information.

314. A system for interacting with location-based information comprising: a wireless device comprising a data management component; wherein the data management component is operable to create a profile for use with a location-based service; wherein the data management component is configured to receive profile information associated with a wireless device from the user; wherein the profile information stored by the data management component comprises a unique wireless device identifier, data that is to be shared with other wireless devices, and previous locations visited by the wireless device; wherein the data management component is operable to store said profile information.

315. A system for interacting with location-based information comprising: a wireless device comprising a data management component; wherein the data management component is operable to create a profile; wherein the data management component is configured to receive profile information associated with a wireless device from the user; wherein the profile information stored by the data management component comprises a unique wireless device identifier, data that is to be shared with other wireless devices, and previous locations visited by the wireless device; wherein the data management component is operable to provide said profile information to either a location-based service or wireless device without user interaction.

316. A system for interacting with location-based information comprising: a wireless device comprising a data management component; wherein the data management component is operable to create a profile; wherein the data management component is configured to receive profile information associated with a wireless device from the user; wherein the profile information stored by the data management component comprises a unique wireless device identifier and settings that determine which profile information is shared with certain locations that are associated with a location-based service; wherein the data management component is operable to provide said profile information to either a location-based service or wireless device without user interaction.

317. A system for interacting with location-based information comprising: a wireless device comprising a data management component; wherein the data management component is operable to interact with an adaptive profile; wherein the adaptive profile is operable to determine the type of information to send and the amount of information to be sent to a location-based service or wireless network that is associated with the location of the wireless device; wherein the adaptive profile is at least partially established based upon input or actions of user of the wireless device; wherein the data management component is configured to store the settings of the adaptive profile; wherein the wireless device is configured to display the settings of the adaptive profile to user via a graphical user interface.

318. A system for interacting with location-based information comprising: a wireless device comprising a data management component; wherein the data management component is operable to interact with an adaptive profile; wherein the adaptive profile is operable to determine the type of location-based information to provide to the user of a wireless device and the amount of information to be sent to a location-based service or wireless network; wherein the adaptive profile is at least partially established based upon input from the user; wherein the data management component is configured to store the settings of the adaptive profile; wherein the wireless device is configured to display the settings of the adaptive profile to user via a graphical user interface.

319. A system for interacting with location-based information comprising: a wireless device comprising a data management component; wherein the data management component is operatively connected to an adaptive profile; wherein the adaptive profile is operable to determine the type of location-based information to provide to the user of a wireless device and whether the user of the wireless device may purchase items associated with a certain location with a wireless payment component based upon user information associated with the adaptive profile; wherein the adaptive profile is at least partially established based upon input from the user; wherein the wireless device is configured to display the settings of the adaptive profile to user via a graphical user interface.

320. A system for interacting with location-based information comprising: a wireless device comprising a data management component; wherein the data management component is operatively connected to an adaptive profile that is at least partially stored on the wireless device; wherein the adaptive profile comprises data associated with the user of the wireless device; wherein the wireless device is capable of registering with a location-based service; wherein the data management component is configured to provide at least some portion of the user's adaptive profile to a geofenced area or the location-based service when in near proximity to a geofenced area or location associated with a location-based service.

321. A system for interacting with location-based information comprising: a wireless device comprising a data management component; wherein the data management component is operatively connected to a first data interface capability; wherein the data management component is configured to receive location-based information through a first data interface capability; a second data interface capability associated with the data management component; wherein the data management component is configured to receive additional location-based information through the second data interface capability; wherein the wireless device is configured to display at least some location-based information to the user.

322. A system for interacting with location-based information comprising: a wireless device capable of receiving location-based information; wherein the wireless devise is capable of registering with a location-based service; wherein the wireless device is associated with a plurality of geofenced areas; wherein the wireless device is configured to allow a user to search for specific location-based information with one of more of the geofenced area; wherein the responsive location-based information is displayed to the user through a touch-screen display; wherein the touch-screen display is configured to allow a user of the wireless device to select the location-based information.

323. A method for searching for location-based information on a web page comprising the steps of: displaying a search box on a web page that is selectable by the user; entering text characters into the search box that represent a search request associated with a physical location; sending the search request to a server; receiving responsive information that is location-based information and associated with a physical location; selecting the responsive information that is location-based information and associated with a physical location; displaying the responsive information that is location-based information and associated with a physical location.

324. A method for searching for location-based information on a web page comprising the steps of: displaying a search box to the user; entering text characters into the search box that represent a search request associated with a physical location; sending the search request to a server; receiving responsive information that is location-based information and associated with a physical location from the server; displaying the responsive information that is location-based information and associated with a physical location on a graphical map interface; representing the responsive information that is location-based information and associated with a physical location through use of a graphical icon that also uses text to be displayed on the graphical map interface.

325. A system for interacting with location-based information comprising: a first computing device; wherein the first computing device is operatively connected to a wireless access point that is associated with a wireless network; wherein the first computing device is configured to display a web page; wherein the web page comprises a text box; wherein the text box is operable to have a user of the first computing device enter text into the text box; wherein the text represents an intersection (e.g., first and main street); wherein the first computing device sends a request for location-based information to a sever that comprises at least the intersection entered into the text box; wherein the results returned to the first computing device comprises at least come location-based information associated with the intersection entered into the text box by the user of the first computing device; wherein the first computing device is operable to display the location-based information to the user.

326. A method for interacting with location-based information comprising: a first computing device connecting to a wireless access point that is associated with a wireless network; displaying a web page on the first computing device; displaying a text box to the user of the first computing device; entering text into the text box that represents an intersection (e.g., first and main street); sending a request for location-based information to a sever that comprises at least the intersection entered into the text box; receiving the results from the search wherein the results comprise at least some location-based information associated with the intersection entered into the text box by the user of the first computing device; displaying the location-based information to the user.

327. A method for interacting with location-based information comprising: a first computing device connecting to a wireless access point that is associated with a wireless network; displaying a web page on the first computing device; displaying a text box to the user of the first computing device; entering text into the text box that represents an intersection (e.g., first and main street); sending a request for location-based information to a search engine server that comprises at least the intersection entered into the text box; receiving the results from the search wherein the results comprise at least some location-based information associated with the intersection entered into the text box by the user of the first computing device; displaying the location-based information to the user.

328. A method for interacting with location-based information comprising: a first computing device connecting to a wireless access point that is associated with a wireless network; displaying a web page on the first computing device; displaying a search command line to the user of the first computing device; entering text into the search command line that represents an intersection (e.g., first and main street); sending a request for location-based information to a search engine server that comprises at least the intersection entered into search command line; receiving the results from the search wherein the results comprise at least some location-based information associated with the intersection entered into the search command line by the user of the first computing device; displaying the location-based information to the user.

329. A method for interacting with location-based information comprising: a first computing device connecting to a wireless access point that is associated with a wireless network; displaying a web page on the first computing device; displaying a text box to the user of the first computing device; entering text into the text box that represents coordinates; sending a request for location-based information to a search engine server that comprises at least the coordinates entered into the text box; receiving the results from the search wherein the results comprise at least some location-based information associated with the coordinates entered into the text box by the user of the first computing device; displaying the location-based information to the user.

330. A method for interacting with location-based information comprising: wireless network; displaying a web page on the first computing device; displaying a text box to the user of the first computing device; entering text into the text box that represents a location and a specific geographic circumference that surrounds the location entered into the text box; sending a request for location-based information to a search engine server that comprises at least the location and location-based information that is within the specific geographic circumference that surrounds the location entered into the text box; receiving the results from the search wherein the results comprise at least some location-based information associated with the location and specific geographic circumference that surrounds the location entered into the text box; displaying the at least some of the location-based information within the geographic circumference that surrounds the location to the user.

331. A method for interacting with location-based information comprising: a wireless device connecting to a wireless access point that is associated with a wireless network; initiating a microphone on the wireless device to listen for a voice command from the user; receiving the voice command from the user of the wireless device; processing the voice command and equating it with a string of text wherein the voice command represents a request for location-based information; wherein the wireless device limits the user request for location-based information to a specific geographic circumference that surrounds the location of the wireless device; sending a request for location-based information to a server that comprises at least the location and the specific geographic circumference that surrounds the location of the wireless device; receiving the results from the search wherein the results comprise at least some location-based information from within a specific geographic circumference that surrounds the location of the wireless device; displaying the at least some of the location-based information within the geographic circumference that surrounds the location of the wireless device to the user.

332. A method for interacting with location-based information comprising: a wireless device connecting to a wireless access point that is associated with a wireless network; initiating a microphone on the wireless device to listen for a voice command from the user; receiving the voice command from the user of the wireless device that comprises a request for location-based information; wherein the wireless device limits the user request for location-based information to a specific geographic circumference that surrounds the location of the wireless device; sending a request for location-based information to a server that comprises at least the location and the specific geographic circumference that surrounds the location of the wireless device; receiving the results from the search wherein the results comprise at least some location-based information from within a specific geographic circumference that surrounds the location of the wireless device through a computerized voice response associated with the wireless device; displaying the at least some of the location-based information within the geographic circumference that surrounds the location of the wireless device to the user.

333. A method for interacting with location-based information comprising: connecting a location-based service to at least one wireless device through a data interface capability; registering the wireless device with the location-based service; receiving a search request to the location-based service for location-based information that is within relative near proximity to the user of the wireless device; sending a query to a database for location-based information that is within relative near proximity to the user of the wireless device; limiting the results of the search which are sent back to the wireless device to a specific geographic circumference that surrounds the location of the wireless device; sending the results of the request for location-based information to the wireless device that comprises at least location-based information that is within the specific geographic circumference that surrounds the location of the wireless device.

334. A method for interacting with location-based information comprising: connecting a location-based service to at least one wireless device through a data interface capability; registering the wireless device with the location-based service; receiving a search request for location-based information from a wireless device that is associated with the location-based service; sending a query to a database for location-based information that is within close proximity to the wireless device; receiving the results of the search which from the database wherein the results comprise at least some location-based information that is within a near geographical range to the wireless device; sending the results of the request for location-based information to the wireless device that comprises at least location-based information that is within the geographical range that is near the location of the wireless device.

335. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to determine whether certain locations receive information associated with the wireless device; wherein the adaptive profile is operable to determine which location-based information to display to the user of the wireless device that is received from the location-based service.

336. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to determine the security levels for the user regarding the data provided to the location-based service that is associated with the wireless device; wherein the adaptive profile is operable to determine which location-based information to display to the user of the wireless device that is received from the location-based service.

337. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to determine whether the user can purchase an item through a mobile payment system based upon the settings of the profile.

338. A system for interacting with location-based information comprising: a wireless device capable of registering with a location-based service; wherein the wireless device is associated with an adaptive profile for interacting with location-based information; wherein the wireless device is configured to receive location-based information from a location-based service comprising at least profile information for a given location; wherein the adaptive profile is configured to determine whether the user can receive location-based information associated with a given location based upon the profile information associated with the user and the profile information associated with the location.

339. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to access the location-based information received by the wireless device; wherein the adaptive profile is configured to update the privacy settings of the wireless device based upon the location of the wireless device without user interaction.

340. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to access the location-based information received by the wireless device; wherein the adaptive profile is configured to update the privacy settings of the wireless device based upon the movement of the wireless device without user interaction.

341. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to access the location-based information received by the wireless device; wherein the adaptive profile is configured to update the privacy settings of the wireless device based upon the profile data of the user and the location of the wireless device.

342. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to provide profile information associated with the user to the wireless device based upon the settings of the wireless device; wherein the profile data sent to the location-based service is a subset of the user's profile information associated with the wireless device.

343. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to interact with a location-based service and provide only anonymous profile information associated with the wireless device to the location-based service; wherein the user is able to select when the adaptive profile should provide anonymous profile information to the location-based service or another wireless device.

344. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to interact with a location-based service and provide only anonymous profile information associated with the wireless device to the location-based service; wherein the adaptive profile provides the anonymous profile information to the location-based service or wireless device without user interaction.

345. A system for interacting with location-based information comprising: a location-based service comprising a memory and operatively connected to a server; wherein the location-based service is configured to receive location-based information from at least one physical location associated with the location-based service; wherein the location-based service comprises an adaptive profile; wherein the adaptive profile configures and manages the security settings associated with the location-based service; wherein the adaptive profile determines which information to send to a wireless device that is within the general proximity to the physical location; wherein the location-based service is configured to provide location-based information to the wireless device.

346. A system for interacting with location-based information comprising: a wireless device capable of registering with a location-based service; wherein the wireless device is associated with an adaptive profile for interacting with location-based information; wherein the wireless device is configured to receive location-based information from a location-based service; wherein the adaptive profile is configured to interact with a location-based service; upon the wireless device entering a location the adaptive profile can be set to only provide anonymous information the location or wireless network associated with the wireless device.

347. A system for interacting with location-based information comprising: a wireless device capable of registering with a location-based service; wherein the wireless device is associated with an adaptive profile; wherein the wireless device is configured to receive location-based information from a location-based service; wherein the user of the wireless device is pre-programmed the settings of the adaptive profile; wherein the adaptive profile is associated with location-based information; wherein the adaptive profile is provided to locations associated with a location-based service based upon the pro-programmed settings of the profile.

348. A system comprising: a computer non-transitory useable medium; a wireless device associated with a location-based service; wherein the wireless device can access the location-based service through the internet; wherein the wireless device is operable to receive at least some location-based information from the location-based service; wherein the wireless device can present said location-based information to the user of the wireless device on a graphical map interface; wherein the graphical map interface is operable to display a map showing the location of the wireless device as well as the location of at least one tangible item, which was included in at least some of the location-based information received by the wireless device from the location-based service.

349. A system comprising: a computer non-transitory useable medium; a location-based service; wherein the location-based service comprises at data management component; wherein the location-based service is configured to provide location-based information to a wireless device that is registered with the location-based service; wherein the location-based service is configured to receive location-based information from the wireless device which is associated with a profile used by the wireless device for interacting with location-based services; wherein the profiled used by the wireless device for interacting with location-based services comprises electronic coupons associated with certain locations.

350. A system comprising: a computer non-transitory useable medium; a location-based service; wherein the location-based service comprises at data management component; wherein the location-based service is configured to provide location-based information to a wireless device that is registered with the location-based service; wherein the location-based service is configured to receive location-based information from the wireless device which is associated with a profile used by the wireless device for interacting with location-based services; wherein the profiled used by the wireless device for interacting with location-based services comprises electronic customer loyalty cards associated with certain locations.

351. A system comprising: a computer non-transitory useable medium; a location-based service; wherein the location-based service comprises at data management component; wherein the location-based service is configured to provide location-based information to a wireless device that is registered with the location-based service; wherein the location-based service is configured to receive location-based information from the wireless device which is associated with a profile used by the wireless device for interacting with location-based services; wherein the profiled used by the wireless device for interacting with location-based services comprises electronic credit card information that is associated with the user of the wireless device and used with a mobile payment system that is contactless.

352. A system for managing geofenced areas comprising: a plurality of geofenced areas; a first computing device that is operatively connected to the plurality of geofenced areas; wherein the first computing device is configured to provide location-based information to a wireless device within one of the said geofenced areas based upon the wireless device settings; wherein the first computing device is configured to receive for certain location-based information associated with the wireless device located within one of the geofenced areas; wherein the first computing device is configured to provide at least some location-based information from a wireless device located within one of the geofenced areas to another wireless device located within one of the geofenced areas.

353. A method of managing location-based information: (a) accessing a plurality of wireless devices within a given geofenced area; (b) determining whether a pre-determined condition has been met by a certain geofenced area; (c) providing an alert to wireless devices within the geofenced location that the pre-determined condition has been met and (d) sending information based upon the alert to another wireless device that are either within or in near-proximity to the geofenced area.

354. A method of managing location-based information: (a) creating a plurality of geofenced areas; (b) setting certain conditions associated with the plurality of geofenced areas wherein at least one condition is configured to initiate a function associated with the condition being met; (c) providing an alert to a wireless device within or in near-proximity to the geofenced location that the pre-determined condition has been met and (d) sending information based upon the alert to another wireless device that is either within or in near-proximity to the geofenced area.

355. A method of managing location-based information: (a) creating a geofenced area that is associated with a wireless device; (b) creating a second geofenced area that is associated with another wireless device; (b) setting certain pre-determined conditions associated with the each geofenced area wherein at least one condition is configured to initiate a function upon the condition being met; (c) providing an alert to a wireless device within or in near-proximity to the geofenced locations that the pre-determined condition has been met and (d) sending information based upon the alert to another wireless device that is either within or in near-proximity to the geofenced area.

356. A system for managing location-based information comprising: a computing device associated with a geofenced location; wherein the computing device can receive location-based information associated with a geofenced location; wherein the computing device is associated a graphical map display; wherein the graphical map display is configured to display location-based information received from the geofenced location; wherein the graphical map display is configured to display patterns associated with the frequency of an event occurring within the geofenced area; wherein the frequency of an event occurring is displayed through use of a color distinct from the background color of the graphical map display.

357. A system for managing location-based information comprising: a computing device associated with a location-based service; wherein the computing device can receive location-based information associated with the location-based service; wherein the computing device is associated a graphical map display; wherein the graphical map display is configured to display location-based information received from the location-based service; wherein the graphical map display is configured to display the frequency of an event; wherein the frequency of an event is displayed on the graphical map display through use of a color distinct from the background color of the graphical map display and which represents a certain frequency of occurrence for the given event.

358. A system for managing location-based information comprising: a computing device; the computing device operatively connected with at least one geofenced location; wherein the wireless device is capable of registering with a geofenced location; wherein the user of the computing device can modify certain attributes that are associated with the geofenced location; wherein the user of the computing device can modify attributes related to the geofenced location including information that is displayed to the users of the geofenced area and information displayed to the non-users of the geofenced area.

359. A system for managing location-based information comprising: a computing device; the computing device operatively connected with at least one geofenced location; wherein the user of the computing device can modify certain attributes that are associated with the geofenced location; wherein the user of the computing device can modify attributes related to the geofenced location including whether information is made available to a wireless device outside of the geofenced area and whether the wireless device outside of the geofenced location can provide location-based information to the geofenced location.

360. A system comprising: a computer non-transitory useable medium; a wireless device associated with a location-based service; wherein the wireless device can access the location-based service through the internet; wherein the wireless device can send a request to the location-based service for location-based information; wherein the wireless device is operable to receive at least some location-based information from the location-based service; wherein the wireless device is operable to receive updated location-based information from the location-based service based upon the directional movement of the wireless device; wherein the wireless device is configured to present said location-based information to the user of the wireless device.

361. A system comprising: a computer non-transitory useable medium; a wireless device that is capable of registering with a location-based service through a data interface capability; wherein the wireless device can send a request to the location-based service for location-based information through the data interface capability based upon the directional movement of the wireless device; wherein the wireless device is operable to receive at least some location-based information from the location-based service based upon the directional movement of the wireless device; wherein at least some location-based information received from the location-based service that is based upon the directional movement of the wireless device comprises a coupon or advertisement that is associated with the general directional movement of the wireless device.

362. A system comprising: a computer non-transitory useable medium; a wireless device that comprises a directional component; wherein the directional component is configured to ascertain the directional movement of the wireless device; wherein the directional component is configured to ascertain the directional movement of the wireless device based upon a predetermined time interval; wherein the wireless device is configured to provide its directional movement to a location-based service upon registering with the location-based service; wherein the location-based service is operable to send location-based information to the wireless device that is tailored based upon the directional movement of the wireless device.

363. A system comprising: a computer non-transitory useable medium; a wireless device that comprises a directional component and a multi-core processor; wherein the directional component is configured to ascertain the directional movement of the wireless device; wherein the directional component is configured to ascertain the directional movement of the wireless device based upon a time interval; wherein the wireless device is configured to provide its directional movement to a server; wherein the server is configured to send location-based information to the wireless device that is based upon the directional movement of the wireless device.

364. A system comprising: a computer non-transitory useable medium; a wireless device that comprises a directional component and a multi-core processor; wherein the directional component is configured to ascertain the directional movement of the wireless device using at least some resources from the multi-core processor; wherein the directional component is configured to ascertain the directional movement of the wireless device based upon a time interval; wherein the wireless device is configured to provide its directional movement to a server; wherein the wireless device is configured to receive location-based information from the server that is based upon the directional movement of the wireless device; wherein at least some of the location-based information received is displayed to the user of the wireless device;

365. A method for receiving location-based information on a wireless device that is based upon the directional movement of the wireless device comprising the steps of: ascertaining the directional movement of the wireless device at a predetermined time interval; registering with a location-based service; providing said directional movement of the wireless device to the location-based service; receiving location-based information from the location-based service that is based upon the directional movement of the wireless device; displaying at least some location-based information that is based upon the directional movement of the wireless device to the user.

366. A method for receiving location-based information on a wireless device that is based upon the directional movement of the wireless device comprising the steps of: ascertaining the directional movement of the wireless device at a predetermined time interval; communicating with a server that is not in the near vicinity of the wireless device: providing said directional movement of the wireless device to the server; receiving location-based information from the server that is based upon the directional movement of the wireless device; displaying at least some location-based information that is based upon the directional movement of the wireless device to the user of the wireless device.

367. A method for receiving location-based information on a wireless device that is based upon the directional movement of the wireless device comprising the steps of: ascertaining the directional movement of the wireless device at a predetermined time interval; receiving a first set of location-based information from a geofenced location associated with a location-based service; providing said directional movement of the wireless device to the location-based service; receiving a second set of location-based information from the location-based service that is based upon the directional movement of the wireless device and is associated with the geofenced location; displaying at least some location-based information that is based upon the directional movement of the wireless device to the user of the wireless device.

368. A method for displaying location-based information on a wireless device that is based upon the directional movement of the wireless device comprising the steps of: ascertaining the directional movement of the wireless device at a predetermined time interval; displaying at least some location-based information that is based upon the directional movement of the wireless device to the user of the wireless device; dynamically updating the location-based information displayed to the user based upon a predetermined time interval and without user interaction.

369. A method for displaying location-based information on a wireless device that is based upon the directional movement of the wireless device comprising the steps of: ascertaining the directional movement of the wireless device at a predetermined time interval; displaying at least some location-based information that is based upon the directional movement of the wireless device to the user of the wireless device on a graphical map interface; dynamically updating the location-based information displayed to the user on a graphical map interface based upon a predetermined time interval and without user interaction.

370. A method for displaying location-based information on a wireless device that is based upon the directional movement of the wireless device comprising the steps of: ascertaining the directional movement of the wireless device that comprises a touch screen display; maintaining a list of directional movements made by the wireless device; providing the directional movement of the wireless device to a location-based service; receiving location-based information from the location-based service that is based upon the directional movement of the wireless device; displaying at least some location-based information that is based upon the directional movement of the wireless device to the user of the wireless device.

371. A system comprising: a computer non-transitory useable medium; a wireless device that comprises a directional component and a multi-core processor; wherein the directional component is configured to ascertain the directional movement of the wireless device; wherein the wireless device is associated with a software application and the software application is configured to receive the directional movement of the wireless device from the directional component; wherein the software application is configured to provide the user of a wireless device location-based information from a server that is based upon the directional movement of the wireless device; wherein the software application is configured to dynamically display at least some of the location-based information received to the user of the wireless device.

372. A system comprising: a computer non-transitory useable medium; a wireless device that comprises a directional component and a multi-core processor; wherein the directional component is configured to ascertain the directional movement of the wireless device; wherein the wireless device is in operative communication with a localized terminal and where the wireless device is configured to provide the directional movement of the wireless device ascertained by the directional component to the localized terminal; wherein the wireless device is configured to receive location-based information from localized server that is based upon the directional movement of the wireless device; wherein the wireless device is configured to display at least some of the location-based information received to the user of the wireless device.

373. A system comprising: a computer non-transitory useable medium; a wireless device that comprises a directional component and a multi-core processor; wherein the directional component is configured to ascertain the directional movement of the wireless device using as an input the at least the GPS position of the wireless device; wherein the wireless device is in operative communication with a location-based service and where the wireless device is configured to provide the directional movement of the wireless device ascertained by the directional component to the location-based service; wherein the wireless device is configured to receive location-based information from the location-based service that is based upon the directional movement of the wireless device; wherein the wireless device is configured to display at least some of the location-based information received to the user of the wireless device.

374. A system comprising: a computer non-transitory useable medium; a wireless device that can execute at least a portion of a software application that is configured to at least provide some location-based information to the user of the wireless device; wherein the wireless device is configured to ascertain the directional movement of the wireless device; wherein the wireless device is in operative communication the software application and where the wireless device is configured to provide the directional movement of the wireless device to the software application; wherein the wireless device is configured to receive location-based information from the location-based service that is based upon the directional movement of the wireless device; wherein the wireless device is configured to display at least some of the location-based information received to the user of the wireless device.

375. A method for displaying location-based information on a wireless device that is based upon the directional movement of the wireless device comprising the steps of: ascertaining the directional movement of the wireless device at a predetermined time interval; executing a least a portion of a software application on a wireless device that is used to provide location-based information to the user of a wireless device; displaying at least some location-based information that is based upon the directional movement of the wireless device to the user of the wireless device; dynamically updating the location-based information displayed to the user based upon a predetermined time interval and without user interaction.

376. A method for displaying location-based information on a wireless device that is based upon the directional movement of the wireless device comprising the steps of: ascertaining the directional movement of the wireless device at a predetermined time interval; sending the directional movement of the wireless device to a location-based service receiving indoor location-based information from the location-based service based upon the directional movement of the wireless device; displaying at least some location-based information that is based upon the directional movement of the wireless device to the user of the wireless device; dynamically updating the location-based information displayed to the user based upon a predetermined time interval.

377. A method for displaying location-based information on a wireless device that is based upon the directional movement of the wireless device comprising the steps of: ascertaining the directional movement of the wireless device at a predetermined time interval; sending the directional movement of the wireless device to a location-based service receiving indoor location-based information from the location-based service based upon the directional movement of the wireless device; displaying at least some indoor location-based information that is based upon the directional movement of the wireless device to the user of the wireless device; updating the indoor location-based information displayed to the user based upon the directional movement of the wireless device.

378. A method for displaying location-based information on a wireless device that is based upon the directional movement of the wireless device comprising the steps of: ascertaining the directional movement of the wireless device at a predetermined time interval; registering with a location-based service that is configured to provide indoor location-based information to a wireless device; sending the directional movement of the wireless device to the location-based service receiving indoor location-based information from the location-based service based upon the directional movement of the wireless device; displaying at least some indoor location-based information that is based upon the directional movement of the wireless device to the user of the wireless device; updating the indoor location-based information displayed to the user based upon the directional movement of the wireless device.

379. A system comprising: a computer non-transitory useable medium; a wireless device that comprises a directional component and a multi-core processor; Wherein the directional component is configured to ascertain the directional movement of the wireless device; wherein the wireless device is in operative communication with a location-based service and where the wireless device is configured to provide the directional movement of the wireless device ascertained by the directional component to the location-based service; wherein the wireless device is configured to receive indoor location-based information from the location-based service that is based upon the directional movement of the wireless device; wherein the wireless device is configured to display at least some of the indoor location-based information received to the user of the wireless device.

380. A system comprising: a computer non-transitory useable medium; a wireless device that comprises a directional component and a multi-core processor; wherein the directional component is configured to ascertain the directional movement of the wireless device; wherein the wireless device is in operative communication with a mobile payment system and where the wireless device is configured to provide the directional movement of the wireless device ascertained by the directional component to a mobile payment service; wherein the wireless device is configured to receive location-based information from the mobile payment system that is based upon the directional movement of the wireless device; wherein the wireless device is configured to display at least some of the indoor location-based information received to the user of the wireless device.

381. A method for displaying location-based information on a wireless device that is based upon the directional movement of the wireless device comprising the steps of: ascertaining the directional movement of the wireless device; creating a secure connection with a mobile payment system that is operable to receive adaptive profile information associated with the user of the wireless device; sending the directional movement of the wireless device to the mobile payment system; receiving location-based information from the mobile payment system based upon the directional movement of the wireless device; displaying at least some location-based information that is based upon the directional movement of the wireless device to the user of the wireless device.

382. A method for displaying location-based information on a wireless device that is based upon the directional movement of the wireless device comprising the steps of: ascertaining the directional movement of the wireless device; creating a connection with a mobile payment system that is operable to receive payment information from a wireless device; sending the directional movement of the wireless device to the mobile payment system; receiving payment information from the mobile payment system based upon the directional movement of the wireless device; displaying at least some location-based information that is based upon the directional movement of the wireless device to the user of the wireless device.

383. A method for displaying location-based information on a wireless device that is based upon the directional movement of the wireless device comprising the steps of: ascertaining the directional movement of the wireless device; registering with a location-based service; sending the directional movement of the wireless device to the location-based service; receiving location-based information from the location-based service and filtering at least some of the received location-based information based upon the directional movement of the wireless device; displaying at least some location-based information that is based upon the directional movement of the wireless device to the user of the wireless device.

384. A method for displaying location-based information on a wireless device that is based upon the directional movement of the wireless device comprising the steps of: ascertaining the directional movement of the wireless device; registering with a location-based service that is a software application capable of executing at least partially on a wireless device; sending the directional movement of the wireless device to the location-based service; receiving location-based information from the location-based service and filtering at least some of the received location-based information based upon the directional movement of the wireless device; displaying at least some location-based information that is based upon the directional movement of the wireless device to the user of the wireless device.

385. A method for displaying location-based information on a wireless device that is based upon the directional movement of the wireless device comprising the steps of: ascertaining the directional movement of the wireless device; establishing a communications link with a location-based service that comprises a software application capable of executing at least partially on a wireless device; sending the directional movement of the wireless device to the location-based service; receiving location-based information from the location-based service and filtering at least some of the received location-based information based upon the directional movement of the wireless device; displaying at least some location-based information that is based upon the directional movement of the wireless device to the user of the wireless device.

386. A method for displaying location-based information on a wireless device that is based upon the directional movement of the wireless device comprising the steps of: ascertaining the directional movement of the wireless device; establishing a communications link with a software application that is in operative communication with a location-based service and the application is capable of executing at least partially on a wireless device; sending the directional movement of the wireless device to the software application; locating location-based information based on the directional movement of the wireless device and filtering at least some of the location-based information based upon the directional movement of the wireless device; displaying at least some location-based information that is based upon the directional movement of the wireless device to the user of the wireless device.

387. A method for analyzing the movements of wireless devices comprising the steps of: establishing a communications link with a wireless device; receiving a plurality of location-based information from the wireless device that is at least partially based upon the directional movement of the wireless device; storing at least some of the location-based information for use in further analysis to determine movement analytics associated with a wireless device.

388. A method for analyzing the movements of wireless devices comprising the steps of: establishing a communications link with a wireless device; receiving a plurality of location-based information from the wireless device that is at least partially based upon the directional movement of the wireless device; storing at least some of the location-based information for use in further analysis to determine movement analytics associated with a given location visited by the wireless device.

389. A method for analyzing the movements of wireless devices comprising the steps of: establishing a communications link with a wireless device; receiving a plurality of location-based information from wireless devices that is at least partially based upon the directional movement of the wireless devices; storing at least some of the location-based information associated with the directional movement of wireless devices; preparing location-based information associated with the directional movement of wireless devices to be available for use in analyzing movement characteristics of a wireless device.

390. A method for analyzing the movements of wireless devices comprising the steps of: receiving a plurality of location-based information from wireless devices that is at least partially based upon the directional movement of the wireless devices; storing at least some of the location-based information associated with the directional movement of wireless devices; preparing location-based information associated with the directional movement of wireless devices to be available for use in analyzing movement characteristics of a wireless device; providing movement characteristics information based upon a received request.

391. A method for analyzing the movements of wireless devices comprising the steps of: receiving a plurality of location-based information from wireless devices that is at least partially based upon the directional movement of the wireless devices; storing at least some of the location-based information associated with the directional movement of wireless devices; preparing location-based information associated with the directional movement of wireless devices to be available for use in analyzing movement characteristics of a wireless device; providing movement characteristics information based upon a received request from a vendor or customer.

392. A system comprising: a computer non-transitory useable medium; a location-based service comprising a server and a database; wherein the location-based service is configured to receive through the sever directional movement information from one or more wireless devices; wherein the server upon receiving such information sends at least some directional movement information from one or more wireless devices to the database; wherein the database is configured to store at least some directional movement information; wherein the location-based service is configured to provide stored directional movement information to a computing device.

393. A system comprising: a computer non-transitory useable medium; a location-based service comprising a server and a database; wherein the location-based service is configured to receive through the sever directional movement information from one or more wireless devices; wherein the server upon receiving such information sends at least some directional movement information from one or more wireless devices to the database; wherein the database is configured to store at least some directional movement information received from the server; wherein the location-based service is configured to provide stored directional movement information to a computing device upon receiving a request from the computing device.

394. A system comprising: a computer non-transitory useable medium; a location-based service comprising a server and a database; wherein the location-based service is configured to receive through the sever directional movement information from one or more wireless devices; wherein the server upon receiving such information sends at least some directional movement information from one or more wireless devices to the database; wherein the database is configured to store at least some directional movement information received from the server; wherein the location-based service is configured to provide stored directional movement information in the form of a report to a computing device upon receiving a request from the computing device.

395. A system comprising: a computer non-transitory useable medium; a location-based service comprising a server and a database; wherein the location-based service is configured to receive through the sever directional movement information from one or more wireless devices; wherein the server upon receiving such information sends at least some directional movement information from one or more wireless devices to the database; wherein the database is configured to store at least some directional movement information received from the server; wherein the location-based service is configured to provide stored directional movement information in the form of a summary to a computing device upon receiving a request from the computing device.

396. A system comprising: a computer non-transitory useable medium; a location-based service comprising a server and a database; wherein the location-based service is configured to receive through the sever directional movement information from one or more wireless devices; wherein the server upon receiving such information sends at least some directional movement information from one or more wireless devices to the database; wherein the database is configured to store at least some directional movement information received from the server; wherein the location-based service is configured to provide stored directional movement information trends to a computing device upon receiving a request from the computing device.

397. A system comprising: a computer non-transitory useable medium; a location-based service comprising a server and a database; wherein the location-based service is configured to receive through the sever directional movement information from one or more wireless devices; wherein the server upon receiving such information sends at least some directional movement information from one or more wireless devices to the database; wherein the database is configured to store at least some directional movement information received from the server; wherein the location-based service is configured to provide stored directional movement information that is time-stamped to a computing device upon receiving a request from the computing device.

398. A system comprising: a computer non-transitory useable medium; a location-based service comprising a server and a database; wherein the location-based service is configured to be in operative communication with a wireless device; wherein the location-based service through its server is configured to receive directional movement information from one or more wireless devices; wherein the server upon receiving such information sends at least some directional movement information from one or more wireless devices to the database; wherein the database is configured to store at least some directional movement information received from the server; wherein the location-based service is configured to provide location-based advertisements to a wireless device based upon the directional movement of the wireless device.

399. A system comprising: a computer non-transitory useable medium; a location-based service comprising a software application; wherein the location-based service is configured to be in operative communication with a wireless device; wherein the location-based service is configured to receive directional movement information from one or more wireless devices; wherein the location-based service is configured to store at least some directional movement information received from the wireless device; wherein the location-based service is configured to provide location-based advertisements to a wireless device based upon the directional movement of the wireless device; wherein the advertisements received are displayed on the wireless device.

400. A method for providing advertisements to a wireless device based upon the movements of a wireless device comprising the steps of: receiving directional movement information from a wireless device; retrieving location-based information that at least includes an advertisement at least partially based upon the directional movement of the wireless device; sending location-based information associated with the directional movement of wireless devices that includes an advertisement at least partially based upon the directional movement of the wireless device to the wireless device; displaying the advertisement to the user of the wireless device.

401. A method for providing advertisements to a wireless device based upon the movements of a wireless device comprising the steps of: registering a wireless device with a location-based service; receiving directional movement information from a wireless device; retrieving location-based information that at least includes an advertisement at least partially based upon the directional movement of the wireless device; sending location-based information associated with the directional movement of wireless devices that includes an advertisement at least partially based upon the directional movement of the wireless device to the wireless device; displaying the advertisement to the user of the wireless device on a graphical user interface.

402. A method for providing information associated with the oil and gas industry comprising the steps of: registering a wireless device with a location-based service; sending a request for location-based information that is associated with an oil well to a location-based service; receiving location-based information that is associated with an oil well from a location-based service; displaying location-based information that is associated with an oil well from a location-based service on a graphical map display; displaying overlay information on a graphical map display.

403. A system comprising: a computer non-transitory useable medium; a wireless device that comprises a multi-core microprocessor; wherein the wireless device is configured to be in operative communication with a software application that is in communication with a location-based service; wherein the software application is configured to send a request to the location-based service for location-based information associated with an oil and gas location; wherein the location-based service is configured to provide responsive location-based information associated with an oil and gas location to the software application; wherein the software application upon receiving such information sends at least some location-based information associated with an oil and gas location to the wireless device; Wherein the software application is configured to display said responsive information to the user either in a substantially textual display or through a graphical map display.

404. A system comprising: a computer non-transitory useable medium; a wireless device that comprises a multi-core microprocessor; wherein the wireless device is configured to be in operative communication with a software application that is in communication with a location-based service; wherein the wireless device is configured to send a request to the software application for location-based information associated with a gas well; wherein the software application is configured to send the request to the location-based service; wherein the location-based service is configured to provide responsive location-based information associated with a gas well to the software application; wherein the software application upon receiving such information sends at least some location-based information associated with a gas well to a wireless device; wherein the software application is configured to display said responsive information to the user.

405. A system comprising: a computer non-transitory useable medium; a wireless device that comprises a multi-core microprocessor; wherein the wireless device is configured to be in operative communication with a software application that is in communication with a location-based service; wherein the wireless device is configured to send a request to the software application for location-based information associated with an oil and gas water station; wherein the software application is configured to send the request to the location-based service; wherein the location-based service is configured to provide responsive location-based information associated with an oil and gas water station to the software application; wherein the software application upon receiving such information sends at least some location-based information associated with an oil and gas water station to a wireless device; Wherein the software application is configured to display said responsive information to the user.

406. A system comprising: a computer non-transitory useable medium; a wireless device that comprises a multi-core microprocessor; wherein the wireless device is configured to be in operative communication with a software application that is in communication with a location-based service; wherein the wireless device is configured to send a request to the software application for location-based information associated with an oil or gas pipeline; wherein the software application is configured to send the request to the location-based service; wherein the location-based service is configured to provide responsive location-based information associated with an oil or gas pipeline to the software application; wherein the software application upon receiving such information sends at least some location-based information associated with an oil or gas pipeline to a wireless device; wherein the software application is configured to display said responsive information to the user.

407. A system comprising: a computer non-transitory useable medium; a wireless device that comprises a multi-core microprocessor; wherein the wireless device is configured to be in operative communication with a location-based service; wherein the wireless device is configured to send a request to the location-based service for location-based information associated with an oil or gas location; wherein the location-based service is configured to provide responsive location-based information associated with an oil or gas pipeline to the wireless device; wherein the wireless device is configured to display said responsive information to the user.

408. A system comprising: a computer non-transitory useable medium; a wireless device that comprises a multi-core microprocessor; wherein the wireless device is configured to be in operative communication with a location-based service; wherein the wireless device is configured to send a request to the location-based service for location-based information associated with an oil well; wherein the location-based service is configured to provide responsive location-based information associated with an oil well to the wireless device; wherein the wireless device is configured to display said responsive information to the user.

409. A system comprising: a computer non-transitory useable medium; a wireless device that comprises a multi-core microprocessor; wherein the wireless device is configured to be in operative communication with a location-based service; wherein the wireless device is configured to send a request to the location-based service for location-based information associated with a gas well; wherein the location-based service is configured to provide responsive location-based information associated with a gas well to the wireless device; wherein the wireless device is configured to display said responsive information to the user.

410. A system comprising: a computer non-transitory useable medium; a wireless device that comprises a multi-core microprocessor; wherein the wireless device is configured to be in operative communication with a location-based service; wherein the wireless device is configured to send a request to the location-based service for location-based information associated with an oil and gas water station; wherein the location-based service is configured to provide responsive location-based information associated with an oil and gas water station to the wireless device; wherein the wireless device is configured to display said responsive information to the user.

411. A system comprising: a computer non-transitory useable medium; a wireless device that comprises a multi-core microprocessor; wherein the wireless device is configured to be in operative communication with a location-based service; wherein the wireless device is configured to send a request to the location-based service for oilfield data; wherein the location-based service is configured to provide responsive oilfield data to the wireless device; wherein the wireless device is configured to display said responsive information to the user.

412. A system comprising: a computer non-transitory useable medium; a wireless device that comprises a multi-core microprocessor; wherein the wireless device is configured to be in operative communication with a location-based service; wherein the wireless device is configured to send a request to the location-based service for oilfield data comprising oil or gas well production information; wherein the location-based service is configured to provide responsive oilfield data to the wireless device; wherein the wireless device is configured to display said responsive information to the user.

413. A system comprising: a computer non-transitory useable medium; a wireless device that comprises a multi-core microprocessor; wherein the wireless device is configured to be in operative communication with a location-based service; wherein the wireless device is configured to send a request to the location-based service for oilfield data; wherein the location-based service is configured to provide responsive oilfield data to the wireless device; wherein the wireless device is configured to display said responsive information to the user.

414. A system comprising: a computer non-transitory useable medium; a wireless device that comprises a multi-core microprocessor; wherein the wireless device is configured to be in operative communication with a location-based service; wherein the wireless device is configured to send a request to the location-based service for at least oil or gas well location and title information associated with an oil or gas well; wherein the location-based service is configured to provide responsive oil or gas well location as well at least some oilfield data to the wireless device; wherein the wireless device is configured to display said responsive information to the user.

415. A system comprising: a computer non-transitory useable medium; a wireless device that comprises a multi-core microprocessor;

wherein the wireless device is configured to be in operative communication with a location-based service; wherein the wireless device is configured to send a request to the location-based service for at least an oil or gas well lease identification number wherein the location-based service is configured to provide responsive oil or gas well lease identification number to the wireless device; wherein the wireless device is configured to display said responsive information to the user.

416. A system comprising: a computer non-transitory useable medium; a wireless device that comprises a multi-core microprocessor; wherein the wireless device is configured to be in operative communication with a location-based service; wherein the wireless device is configured to send a request to the location-based service for at least an oil or gas well survey number wherein the location-based service is configured to provide responsive oil or gas well survey number to the wireless device; wherein the wireless device is configured to display said responsive information to the user.

417. A system comprising: a computer non-transitory useable medium; a wireless device that comprises a multi-core microprocessor; wherein the wireless device is configured to be in operative communication with a location-based service; wherein the wireless device is configured to send a request to the location-based service for at least the operator name for an oil or gas well wherein the location-based service is configured to provide responsive oil or gas operator name to the wireless device; wherein the wireless device is configured to display said responsive information to the user.

418. A system comprising: a computer non-transitory useable medium; a wireless device that comprises a multi-core microprocessor; wherein the wireless device is configured to be in operative communication with a location-based service; wherein the wireless device is configured to send a request to the location-based service for drilling permits within a given geographic area wherein the location-based service is configured to provide responsive drilling permits to the wireless device; wherein the wireless device is configured to display said responsive information to the user.

419. A system comprising: a computer non-transitory useable medium; a computing device that comprises a multi-core microprocessor; wherein the computing device is configured to be in operative communication with a location-based service; wherein the computing device is configured to send a request to the location-based service for drilling permits within a given geographic area wherein the location-based service is configured to provide responsive drilling permits to the computing device; wherein the computing device is configured to display said responsive information to the user.

420. A system comprising: a computer non-transitory useable medium; a computing device that comprises a multi-core microprocessor; wherein the computing device is configured to be in operative communication with a location-based service; wherein the computing device is configured to send a request to the location-based service for drilling permits associated with one or more oil or gas wells wherein the location-based service is configured to provide responsive information to the computing device comprising at least a permit associated with an oil or gas well; wherein the computing device is configured to display said responsive information to the user.

421. A system comprising: a computer non-transitory useable medium; a computing device that comprises a multi-core microprocessor; wherein the computing device is configured to be in operative communication with a location-based service; wherein the computing device is configured to send a request to the location-based service for permits related to oil or gas drilling operations associated with one or more oil or gas wells wherein the location-based service is configured to provide responsive information to the computing device comprising at least a permit associated with an oil or gas well; wherein the computing device is configured to display said responsive information to the user.

422. A system comprising: a computer non-transitory useable medium; a computing device that comprises a multi-core microprocessor; wherein the computing device is configured to be in operative communication with a location-based service; wherein the computing device is configured to send a request to the location-based service for well logs associated with one or more oil or gas wells wherein the location-based service is configured to provide responsive information to the computing device comprising at least a well log associated with an oil or gas well; wherein the computing device is configured to display said responsive information to the user.

423. A system comprising: a computer non-transitory useable medium; a computing device that comprises a multi-core microprocessor; wherein the computing device is configured to be in operative communication with a location-based service; wherein the computing device is configured to send a request to the location-based service for tight sands designations associated with one or more oil or gas wells; wherein the location-based service is configured to provide responsive information to the computing device comprising at least a tight sand designation associated with an oil or gas well; wherein the computing device is configured to display said responsive information to the user.

424. A system comprising: a computer non-transitory useable medium; a computing device that comprises a multi-core microprocessor; wherein the computing device is configured to be in operative communication with a location-based service; wherein the computing device is configured to send a request to the location-based service for permitted commercial disposals associated with one or more oil or gas development areas; wherein the location-based service is configured to provide responsive information to the computing device comprising at least a permitted commercial disposal associated with an oil or gas development area; wherein the computing device is configured to display said responsive information to the user.

425. A system comprising: a computer non-transitory useable medium; a computing device that comprises a multi-core microprocessor; wherein the computing device is configured to be in operative communication with a location-based service; wherein the computing device is configured to send a request to the location-based service for orphan well data associated with one or more oil or gas development areas; wherein the location-based service is configured to provide responsive information to the computing device comprising at least orphan well data associated with an oil or gas development area; wherein the computing device is configured to display said responsive information to the user.

426. A system comprising: a computer non-transitory useable medium; a computing device that comprises a multi-core microprocessor; wherein the computing device is configured to be in operative communication with a location-based service; wherein the computing device is configured to send a request to the location-based service for profile information associated with an oil or gas well; wherein the location-based service is configured to provide responsive information to the computing device comprising profile information associated with an oil or gas development area; wherein the computing device is configured to display at least some responsive profile information to the user.

427. A method for providing information associated with the oil and gas industry comprising the steps of: registering a wireless device with a location-based service; sending a request for information related to a profile of an oil or gas well to a location-based service; receiving location-based information that is associated with the profile of an oil or gas well from a location-based service; displaying location-based profile information that is associated with an oil or gas well received from a location-based service on a graphical map display;

428. A method for providing information associated with the oil and gas industry comprising the steps of: registering with a software application; sending a request for information related to a profile of an oil or gas well to the software application; receiving location-based information that is associated with the profile of an oil or gas well from the software application; displaying location-based profile information that is associated with an oil or gas well received from the software application on a graphical map display.

429. A method for providing information associated with the oil and gas industry comprising the steps of: registering a wireless device with a location-based service; sending a request for information related to a profile of an oil or gas well to a location-based service; receiving location-based information that is associated with the profile of an oil or gas well from a location-based service; displaying location-based profile information that is associated with an oil or gas well received from a location-based service on a graphical map display; displaying map overlay information on the graphical map display that is associated with a geographic area.

430. A system comprising: a computer non-transitory useable medium; a computing device that comprises a multi-core microprocessor; wherein the computing device is configured to be in operative communication with a location-based service; wherein the computing device is configured to send a request to the location-based service for profile information associated with a plurality of oil or gas wells; wherein the location-based service is configured to provide responsive information to the computing device comprising profile information associated with oil or gas wells in a certain geographic location; wherein the computing device is configured to display said responsive information to the user.

431. A system comprising: a computer non-transitory useable medium; a computing device that comprises a multi-core microprocessor; wherein the computing device is configured to be in operative communication with a location-based service; wherein the computing device once registered with a location-based service is configured to receive an alert from the location-based service that comprise at least an alert related to an oil or gas well; wherein the computing device is configured to display said alert information to the user.

432. A system comprising: a computer non-transitory useable medium; a computing device that comprises a multi-core microprocessor; wherein the computing device is configured to be in operative communication with a location-based service; wherein the computing device once registered with a location-based service is configured to receive an alert from the location-based service that comprises at least an alert associated with an oil and gas drilling area; wherein the computing device is configured to display said alert information to the user.

433. A system comprising: a computer non-transitory useable medium; a computing device that comprises a multi-core microprocessor; wherein the computing device is configured to be in operative communication with a location-based service; wherein the computing device once registered with a location-based service is configured to send a request for an oil and gas report regarding a certain geographic area that comprises at least the location of oil or gas wells in the geographic area to the location-based service; wherein the computing device once registered with a location-based service is configured to receive an oil and gas report regarding a certain geographic area that comprises at least the locations and well identification numbers of oil or gas wells in the geographic area; wherein the computing device is configured to display said information to the user.

434. A method of interacting with location-based information: (a) monitoring a plurality of wireless devices that are within or near proximity to a geofenced area; (b) determining whether a pre-determined condition has been met by a wireless device based upon the user preferences of the wireless device; (c) providing a message that comprises at least an advertisement related to the location of the wireless device based upon a predetermined condition being met; (d) presenting the message that comprises the advertisement to the user of the wireless device based upon the preferences of the wireless device; (e) providing location-based information to the wireless device wherein the location-based information comprises at least some additional information regarding an item associated with the advertisement and within the geofenced area; (f) purchasing an item associated with the alert via a mobile payment system in communication with the wireless device.

435. A system for using location-based information comprising: a wireless device associated with a data management component; wherein the data management component is utilized by the wireless device to store, manage, or modify temporary location-based information received by the wireless device; wherein the wireless device comprises a multi-core processor; wherein the wireless device is associated with a mobile payment system that is a contactless payment system and can purchase an item from the location-based information received by the device using the mobile payment system.

436. A system for using location-based information comprising: a wireless device associated with a data management component; wherein the data management component is utilized by the wireless device to store, manage, or modify temporary location-based information received by the wireless device; wherein the wireless device comprises a multi-core processor; wherein the wireless device is associated with a mobile payment system that is contactless payment system and can purchase an item from the location-based information received by the device through the mobile payment system.

437. A system for using location-based information comprising: a wireless device associated with a data management component; wherein the wireless device is configured to receive location-based information from a location-based service; wherein the data management component is utilized by the wireless device to store, manage, or modify at least some location-based information received by the wireless device; wherein the wireless device comprises a multi-core processor; wherein the wireless device is associated with a mobile payment system that is a contactless payment system and is configured to interact with the mobile payment system to purchase an item based upon the location-based information received by the device from the location-based service.

438. A system for using location-based information comprising: a wireless device comprises a multi-core processor associated with a location-based service wherein the wireless device is configured to receive location-based information from a location-based service that comprises a coupon or in-store advertisement; wherein a data management component is utilized by the wireless device to store, manage, or modify location-based information received by the wireless device; wherein the wireless device is configured to initiate communication with a localized terminal that is in communication with a mobile payment system; wherein the wireless device after initiation of communication with a localized terminal is configured make a wireless purchase of an item through communications with the localized terminal.

439. A system for using location-based information comprising: a wireless device comprises a multi-core processor associated with a location-based service wherein the wireless device is configured to receive location-based information from a location-based service that comprises a coupon or product advertisement; wherein a data management component that comprises secure memory is utilized by the wireless device to store, manage, or modify payment information associated with the user of the wireless device; wherein the wireless device is configured to initiate communication with a localized terminal that is operative connected to a mobile payment system; wherein the wireless device after initiation of communication with a localized terminal is configured provide at least some payment information stored on the data management component to the localized terminal and to make a wireless purchase of an item through communications with the localized terminal;

440. A system for using location-based information comprising: a wireless device comprising a multi-core processor that is configured to receive location-based information comprising an advertisement for a product in the general vicinity of the wireless device; wherein a data management component that comprises secure memory is utilized by the wireless device to store, manage, or modify payment information associated with the user of the wireless device; wherein the wireless device is configured to initiate communication with a localized terminal that is operatively connected to a mobile payment system; wherein the wireless device after initiation of communication with a localized terminal is configured provide at least some payment information stored by the data management component to the localized terminal and to make a wireless purchase of an item through communications with the localized terminal that is at least partially associated with the advertisement.

441. A method for purchasing an item using a wireless device that is in communication with a mobile payment system that does not require the use of a magnetic strip comprising the steps of: receiving location-based information that relates to a coupon or advertisement that relates to a physical item in the general vicinity of a wireless device; initiating communication with a localized terminal; creating a connection between the localized terminal and wireless device; sending payment information to the localized terminal that is at least partially stored by a data management component comprising secure memory; receiving a confirmation message from the localized terminal regarding the authorization of the user's purchase of a physical item located in the general vicinity of the wireless device.

442. A system for using location-based information comprising: a wireless device comprising a multi-core processor that is configured to display graphical representations of payment accounts associated with a user of the wireless device; wherein the payment accounts of the user are displayed based upon the frequency of use of the account; wherein a data management component that comprises secure memory is utilized by the wireless device to store, manage, or modify at least some payment information associated with the user of the wireless device; wherein the wireless device is configured to initiate communication with a localized terminal that is operatively connected to a mobile payment system; wherein the wireless device after initiation of communication with a localized terminal is configured provide at least some payment information stored by the data management component to the localized terminal and to make a wireless purchase of an item through communications with the localized terminal.

443. A system for using location-based information comprising: a wireless device comprising a multi-core processor that is configured to display graphical representations of payment accounts associated with a user of the wireless device; wherein the payment accounts of the user are displayed based upon the frequency of use of the account; wherein a data management component that comprises secure memory is utilized by the wireless device to store, manage, or modify payment information associated with the user of the wireless device; wherein the wireless device is configured to initiate communication with a localized terminal that is operative connected to a mobile payment system; wherein the wireless device after initiation of communication with a localized terminal is configured provide at least some payment information stored by the data management component to the localized terminal and to make a wireless purchase of an item through communications with the localized terminal by receiving a confirmation to purchase message from the localized terminal.

444. A system for accepting payment requests from mobile devices for purposes of making a mobile payment that does not require use of a magnetic strip comprising: a localized terminal that is in the general vicinity of a wireless device that is configured to create a communication link with a wireless device upon receiving an initiation request from the wireless device; receiving an initiation request from a mobile device; upon receiving an initiation request, receiving additional payment information from the wireless device; wherein the localized terminal is configured to provide at least some payment information received by the wireless device to a payment server; wherein the payment server is configured to authenticate and approve a transaction based upon the payment information received from the localized terminal; wherein the localized terminal is configured to receive a message from the payment comprising a payment confirmation to a localized terminal and upon receipt the localized terminal is configured to provide the payment confirmation to the user that comprises at least some of the payment confirmation information received by the localized terminal from the payment server.

445. A system for accepting payment requests from mobile devices for purposes of making a mobile payment that does not require use of a magnetic strip comprising: a localized terminal that is in the general vicinity of a wireless device that is configured to create a near field communication link with a wireless device upon receiving an initiation request from the wireless device; receiving an initiation request from a mobile device; upon receiving an initiation request, receiving additional payment information from the wireless device; wherein the localized terminal is configured to provide at least some payment information received by the wireless device to a payment server; wherein the payment server is configured to authenticate and approve a transaction based upon the payment information received from the localized terminal; wherein the localized terminal receives a message from the payment server comprising a payment confirmation and upon receipt the localized terminal is configured to provide the payment confirmation to the user that comprises at least some of the payment confirmation information sent by the payment server to the localized terminal.

446. A system for accepting payment requests from mobile devices for purposes of making a mobile payment that does not require use of a magnetic strip comprising: a mobile payment system comprising a point of sale system and payment server; wherein the point of sale system is configured to create a secure connection with a wireless device in near proximity to the point of sale system; wherein upon creating a secure connection with a wireless device, the point of sale system is configured to authenticate the wireless device with the mobile payment system by an identification number associated with the wireless device and the location of the wireless device; wherein the point of sale system is configured to authenticate the wireless device only after sending at least some authentication information to the payment server and receiving such confirmation from a payment server that is in communication with the point of sale system; upon receiving authentication of the wireless, device the point-of sale system is configured to receive payment information from the wireless device that comprises at least a request to purchase an item; wherein the point of sale system sends the payment request to the payment server and the payment server is configured to authorize the payment request received from the point of sale terminal; wherein the payment server sends a payment confirmation message to the point of sale system and the point of sale system is operable to send at some a portion of the payment confirmation message received from the payment server to the wireless device.

447. A system for purchasing an item using a mobile device through a mobile payment system comprising: a wireless device comprising a quad-core processor; wherein the wireless device comprises a data management component having access to secure memory on the wireless device for mobile purchases; wherein the data management component is configured to provide payment information residing on the secure memory to a mobile payment system; wherein the user is capable of selecting an item to purchase and identifying which account to purchase the item with using a graphical user interface associated with the wireless device; wherein once the user selects the item and account to be used, the wireless device sends payment information to a mobile payment system for purchase of the item selected; wherein the mobile payment system authorizes the purchase of the item and wherein the wireless device receives a confirmation message from the mobile payment system; wherein the wireless device is configured to end communication with the mobile payment system.

448. A system for purchasing an item using a mobile device through a mobile payment system comprising: a wireless device comprising a multi-core processor; wherein the wireless device is associated with a data management component that comprises a secure memory to store an adaptive profile of the user of the wireless device which is used for making mobile purchases; wherein the wireless device is configured to receive at least some adaptive profile information from the data management component; wherein at least some of the information provided by the data management component for use by the wireless device can be displayed to the user and the user is able to select which adaptive profile information to use for a mobile payment; wherein the wireless device is operable to purchase an item through a mobile payment system using at least some of the adaptive profile information from the data management component and selected by the user.

448. A system for accepting payment requests from mobile devices for purposes of making a mobile payment that does not require use of a magnetic strip comprising: a localized terminal that is in the general vicinity of a wireless device that is allows a wireless device to register with the localized terminal; receiving a request from a mobile device to register with the localized terminal upon receiving the request and registering the wireless device, receiving additional payment information from the wireless device; wherein the localized terminal is configured to provide at least some payment information received by the wireless device to a payment server; wherein the payment server is configured to authenticate and approve a transaction based upon the payment information received from the localized terminal; wherein the payment server is configured to send a message comprising a payment confirmation to the localized terminal and upon receipt the localized terminal is configured to provide the payment confirmation to the user that comprises at least some of the payment confirmation information sent by the payment server to the localized terminal.

449. A system for accepting payment requests from mobile devices for purposes of making a mobile payment that does not require use of a magnetic strip comprising: a mobile payment system that allows a wireless device to register with a mobile payment system receiving a request from a mobile device to register with the mobile payment system and upon receiving said registration request, the mobile payment system is operable to create a secure connection with the wireless device using cryptographic techniques; upon creating a secure connection the wireless device, the mobile payment system registers the wireless device and is configured to receive payment information from the wireless device; wherein the mobile payment system is configured to provide at least some payment information received by the wireless device to a payment server through a secure data interface capability linking the mobile payment system to the payment server; wherein the payment server is configured to authenticate and approve a transaction based upon the payment information received from the mobile payment system; wherein the payment server is configured to send a message comprising a payment confirmation to the mobile payment system and upon receipt the mobile payment system is configured to provide the payment confirmation to the user.

450. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information at least comprises an account identifier, account number, and payment history associated with the user; wherein the graphical user interface is configured to display at least some adaptive profile information to the user and wherein the adaptive profile information is configured to be selected by the user to be sent to a mobile payment system; wherein the graphical user interface is configured to display a confirmation message received from a mobile payment system for purchase of an item in the general vicinity of the wireless device.

451. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card at least comprises a plurality of account identifiers and account numbers that are associated with multiple payment accounts of the user wherein the graphical user interface is configured to display adaptive profile information to the user and wherein the adaptive profile information is sent to a mobile payment system to purchase an item within the general vicinity of the wireless device upon initiating a payment request with the mobile payment system; wherein the graphical user interface is configured to display a confirmation message received by the wireless device from a mobile payment system for purchase of an item in the general vicinity of the wireless device.

452. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a plurality of account identifiers and account numbers that are associated with multiple payment accounts as well as user aliases, passwords, or PIN numbers; wherein the graphical user interface is configured to display adaptive profile information to the user and wherein the adaptive profile information is configured to be sent to a mobile payment system to purchase an item within the general vicinity of the wireless device upon the user initiating a communications link with the mobile payment system; wherein the graphical user interface is configured to display a confirmation message received by the wireless device from a mobile payment system for purchase of an item in the general vicinity of the wireless device.

453. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a user alias, password, and account identifier; wherein the graphical user interface is configured to display adaptive profile information to the user and wherein the adaptive profile information is configured to be sent to a mobile payment system to purchase an item within the general vicinity of the wireless device; wherein the graphical user interface is configured to display a confirmation message received by the wireless device from a mobile payment system for purchase of the item in the general vicinity of the wireless device.

454. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a user card identifier, account number, and authentication information; wherein the graphical user interface is configured to display adaptive profile information to the user and wherein the adaptive profile information is configured to be sent to a mobile payment system to purchase an item within the general vicinity of the wireless device; wherein the graphical user interface is configured to display a confirmation message received by the wireless device from a mobile payment system for purchase of the item in the general vicinity of the wireless device.

455. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a user card identifier, account number, and account balance; wherein the graphical user interface is configured to display adaptive profile information to the user and wherein the adaptive profile information is configured to be sent to a mobile payment system to purchase an item within the general vicinity of the wireless device upon the user initiating communication with the mobile payment system; wherein the graphical user interface is configured to display a confirmation message received by the wireless device from a mobile payment system for purchase of the item in the general vicinity of the wireless device.

456. A system for purchasing items through a mobile device that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a user card type, account number, and account identifier; wherein the graphical user interface is configured to display adaptive profile information to the user and wherein the adaptive profile information is configured to be sent to a mobile payment system to purchase an item within the general vicinity of the wireless device upon selection by the user; wherein the graphical user interface is configured to display a confirmation message received by the wireless device from a mobile payment system for purchase of an item in the general vicinity of the wireless device.

457. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a user payment account identifier and expiration date associated with the account identifier; wherein the graphical user interface is configured to display adaptive profile information to the user and wherein the adaptive profile information is configured to be sent to a mobile payment system to purchase an item within the general vicinity of the wireless device; wherein the graphical user interface is configured to display a confirmation message received by the wireless device from a mobile payment system for purchase of an item in the general vicinity of the wireless device upon the user connecting to the mobile payment system.

458. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at a user alias, password, and account identifier; wherein the graphical user interface is configured to display adaptive profile information to the user and wherein the adaptive profile information is configured to be sent to a mobile payment system to purchase an item within the general vicinity of the wireless device; wherein the graphical user interface is configured to display a confirmation message received by the wireless device from a mobile payment system for purchase of the item in the general vicinity of the wireless device upon the user connecting to the mobile payment system.

459. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at a PIN, payment history, and account balance; wherein the graphical user interface is configured to display adaptive profile information to the user and wherein the adaptive profile information is configured to be sent to a mobile payment system to purchase an item within the general vicinity of the wireless device; wherein the graphical user interface is configured to display a confirmation message received by the wireless device from a mobile payment system for purchase of an item in the general vicinity of the wireless device upon the user connecting to the mobile payment system.

460. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at a reward account identifier, transaction history information, and eligible remaining reward account balance; wherein the graphical user interface is configured to display adaptive profile information to the user and wherein at least some adaptive profile information is configured to be sent to a mobile payment system for purchase an item within the general vicinity of the wireless device upon the user connecting to the mobile payment system; wherein the graphical user interface is configured to display a confirmation message received by the wireless device from a mobile payment system for purchase of the item in the general vicinity of the wireless device.

461. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least location-based information, payment account identifier, and payment account number; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

462. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least location-based authentication information, payment account identifier, and payment account number; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

463. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a phone number associated with a payment account, a payment account identifier, and payment account number; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

464. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least an account balance, transaction amounts, and transaction history; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

465. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least a reward card identifier, reward card balance, and reward card transaction history; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

466. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least an alias associated with an account, account balance, and transaction history; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

466. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least payment tokens, transactions associated with said tokens, and a token identifier; wherein the graphical user interface is configured to display adaptive profile information to the user and wherein at least some adaptive profile information is configured to be sent to a mobile payment system to purchase an item within the general vicinity of the wireless device upon the user connecting to the mobile payment system.

467. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least coupons associated with the user and coupon identifiers; wherein the graphical user interface is configured to display adaptive profile information to the user and wherein at least some adaptive profile information is configured to be sent to a mobile payment system for purchase of an item within the general vicinity of the wireless device upon the user connecting to the mobile payment system.

468. A system for purchasing items through a mobile device for purposes of making a mobile payment that does not require use of a magnetic strip comprising: a wireless device that comprises a touch-screen graphical user interface and a secure memory card; wherein the wireless device is operable to store a user's adaptive profile information on the secure memory card; wherein the adaptive profile information stored on the secure memory card comprises at least cryptographic technique information and secure payment information; wherein the graphical user interface is configured to display adaptive profile information to the user and wherein at least some adaptive profile information is configured to be sent to a mobile payment system upon the user connecting to the mobile payment system.

469. A system for purchasing items through a mobile device for purposes of making a mobile payment that does not require use of a magnetic strip comprising: a wireless device that comprising a touch-screen graphical user interface and proximity antenna; wherein wireless device also comprises a data management component that is contactless; wherein the wireless device is operable to store a user's adaptive profile information that is used for making mobile purchases using the data management component; wherein the data management component is configured to send at least some of the user's adaptive profile information to a NFC-based localized terminal for purposed of registering with the localized terminal; wherein the graphical user interface of the wireless device is configured to display adaptive profile information to the user and wherein at least some additional adaptive profile information to the localized terminal for purchase of an item within the general vicinity of the wireless device after registration of the wireless device with the localized terminal is complete.

470. A system for purchasing an item using a mobile device through a mobile payment system comprising: a wireless device comprising a quad-core processor and proximity antenna for interacting with a contactless localized terminal; wherein the wireless device is associated with a data management component that comprises secure memory for mobile purchases; wherein the user is capable of selecting an item to purchase and identifying which account to use in purchasing the item; wherein once the user selects the item and account to be used, the data management component using at least the proximity antenna sends additional payment information to the localized server for purchase of the item selected; wherein the wireless device is configured to receive a confirmation message from the localized terminal; wherein the wireless device is configured end communication with the localized terminal upon the movement of the wireless device or lapse or a predetermined amount of time.

471. A system for purchasing an item using a mobile device through a mobile payment system comprising: a wireless device comprising a quad-core processor and proximity antenna; wherein the wireless device is configured to operate with both a contactless localized server and a contact localized server; wherein the wireless device is associated with a data management component having access to a user's adaptive profile used for making mobile payments; wherein the wireless device is configured to provide payment information associated with the data management component to either a contactless or contact localized terminal wherein the user is capable of selecting an item to purchase and identifying which account to use in purchasing the item; wherein once the user selects the item and account to be used, the wireless device sends payment information to the localized server for purchase of the item selected; wherein the wireless device is configured to receive a confirmation message from the localized terminal; wherein the wireless device is configured end communication with the localized terminal upon the movement of the wireless device or lapse or a predetermined amount of time.

472. A system for providing payment information to a system for making a mobile purchase comprising: a wireless device comprising a dual-core processor and proximity antenna wherein the wireless device is configured to register with a payment server to access payment information associated with the user of the wireless device; wherein the wireless device is configured to receive payment information upon registering with the payment server; wherein at least some of the payment information is displayed to the user through payment fields that are at least partially auto-populated; wherein the wireless device is configured to provide said payment information to a mobile payment system for the purchase of an item in near proximity to the wireless device upon the user connecting to the mobile payment system where the mobile payment system is a contactless mobile payment system; wherein the wireless device is configured to display a purchase confirmation to the user confirming purchase of the item.

473. A system for providing payment information to a system for making a mobile purchase comprising: a wireless device comprising a dual-core processor and proximity antenna wherein the wireless device is configured to register with a payment server to access payment information associated with the user of the wireless device; wherein the wireless device is configured to receive payment information upon registering with the payment server; wherein at least some of the payment information is displayed to the user through payment fields that are at least partially auto-populated; wherein the wireless device is configured to provide said payment information to a localized terminal for the purchase of an item in near proximity to the wireless device; wherein the localized terminal is a contactless localized terminal; wherein the wireless device is configured to display a purchase confirmation to the user confirming purchase of the item.

474. A system for providing payment information to a system for making a mobile purchase comprising: a wireless device comprising a dual-core processor and proximity antenna wherein the wireless device is configured to register with a location-based service; wherein the location-based service is configured to store an adaptive profile associated with the user of the wireless device that is used for making contactless purchases and comprises at least a mobile identifier and account number associated with the mobile identifier; wherein the wireless device is operable to request and receive the adaptive profile from the location-based service; wherein at least some of the adaptive profile information is displayed to the user of the wireless device; wherein the wireless device is configured to provide said adaptive profile information to a localized terminal for the purchase of an item in near proximity to the wireless device; wherein the localized terminal is a contactless localized terminal; wherein the wireless device is configured to display a purchase confirmation to the user confirming purchase of the item received from the localized terminal.

475. A system for providing payment information to a system for making a mobile purchase comprising: a wireless device comprising a dual-core processor; wherein the wireless device is associated with a software application that is at least partially executed by the dual-core processor; wherein the software application is configured to provide location-based information that comprises items for sale within a given business or geographic location; wherein the software application is configured to display at least a subset of items for sale within a business or geographic location where the items selected to be displayed are based upon the popularity of the items; wherein the software application is configured to interact with a mobile payment system to allow the user to purchase an item displayed to the user through the mobile payment system that is associated with the software application; wherein the software application is configured to display a payment confirmation to the user of the wireless device for selection by the user to confirm the purchase of the item.

476. A system for providing payment information to a system for making a mobile purchase comprising: a wireless device comprising a dual-core processor; wherein the wireless device is in operative communication with a first location-based service that is configured to provide location-based advertisements to the wireless device; wherein the wireless device is in operative communication with a second location-based service comprises a contactless mobile payment system; wherein the user of the wireless device can select an item to purchase based upon the location-based advertisement and send a payment request to the second location-based service to purchase the item wherein the wireless device is configured to display a purchase confirmation received from the second location-based service to the user.

477. A system for collection contactless mobile payment information a location-based service in operable communication with a database; wherein the database is configured to store payment information associated with a plurality of contactless mobile transactions made by mobile devices through a mobile payment system; wherein the location-based service is configured to subsets of mobile payment or mobile commerce data upon request regarding the mobile purchase activity of a certain location or business to a computing device upon request.

478. A method for making mobile payments through a contactless payment system comprising the steps of: initiating communication with a localized terminal; sending a registration message to the localized terminal; creating a secure connection between a wireless device and localized terminal; sending a authentication message to the localized terminal; sending a payment request to the localized terminal comprising an item to purchase that is in the general vicinity of the wireless device and adaptive profile information of the user; receiving a payment authorization message from the localized terminal and displaying at least a portion of the payment authorization message on the wireless device; sending a confirmation message to the localized terminal; storing at least some receipt information associated with the purchase of the item.

479. A method for making mobile payments through a contactless payment system comprising the steps of: initiating communication with a localized terminal; sending a registration message to the localized terminal; creating a secure connection between a wireless device and localized terminal; sending a authentication message to the localized terminal; sending a payment request to the localized terminal comprising an amount to be paid for a good or service that is in the general vicinity of the wireless device and adaptive profile information of the user; receiving a payment authorization message from the localized terminal and displaying at least a portion of the payment authorization message on the wireless device; adding gratuity to the amount to be paid for an item or a service; sending a confirmation message to the localized terminal; storing at least some receipt information associated with the purchase of the item.

480. A method for making mobile payments through a contactless payment system comprising the steps of: initiating communication with a localized terminal that is a NFC-based terminal; sending a registration message to the localized terminal; creating a secure NFC-based connection between a wireless device and localized terminal; sending a authentication message to the localized terminal; receiving an authentication confirmation message from the localized terminal; sending a payment request to the localized terminal comprising an amount to be paid for a good or service that is in the general vicinity of the wireless device, gratuity, and adaptive profile information of the user; receiving a payment authorization message from the localized terminal and displaying at least a portion of the payment authorization message on the wireless device; sending a confirmation message to the localized terminal; storing at least some receipt information associated with the purchase of the item or service on the wireless device.

481. A method for providing location-based coupons or advertisements to a wireless device user comprising the steps of: registering with a location-based service to receive location-based information; providing at least some adaptive profile information associated with transactions made by a user of the wireless device to the location-based service; receiving a coupon or advertisement based upon the location of the wireless device and the adaptive profile information sent to the location-based service; displaying the coupon or advertisement on the wireless device; storing at least some information associated with the coupon or advertisement on the wireless device.

482. A method for providing location-based coupons or advertisements to a wireless device user comprising the steps of: receiving a registration request from a wireless device; registering the wireless device with a location-based service; receiving from the wireless device at least some adaptive profile information associated with transactions made by a user of the wireless device to the location-based service; determining the general location of the wireless device and providing a coupon or advertisement to the wireless device based upon the adaptive profile and location of the wireless device.

483. A system for providing location-based information to a computing device comprising: a location-based service in operative communication with two databases; wherein the location-based information is configured to receive a request for location-based information associated with a profile of an oil and gas well that comprises at least some oilfield data; wherein the location-based service is configured to receive at least some location-based information from a first database; wherein the location-based service is additional configured to receive oilfield data associated with the request from a second database; wherein the location-based service is operable to provide at least some location-based information and at least some oilfield data to the wireless device that is responsive to the request from the computing device.

484. A system for providing location-based information to a wireless device comprising: a location-based service in operative communication with two databases that store oilfield data; wherein the location-based information is configured to receive a request for oilfield data associated an oil or gas well; wherein the location-based service is configured to send a request for oilfield data to the first database; wherein the location-based service is operable to receive at least some oilfield data from the first database that comprises a first set of oilfield data; wherein the location-based service is additionally configured to send a request to a second database for an additional set of oilfield data; wherein the location-based service is operable to receive responsive oilfield data associated with the request from the location-based service; wherein the location-based service is operable to provide at least some oilfield data from the first database and some oilfield data from the second database to the computing device that is responsive to the request from the computing device.

485. A system for providing location-based information to a wireless device comprising: a location-based service in operative communication with two databases that store oilfield data; wherein the location-based information is configured to receive a request for oilfield data associated an oil or gas well; wherein the location-based service is configured to receive at least some location-based information from a database that comprises mapping data; wherein the location-based service is additional configured to receive oilfield data associated with the request from a second database; wherein the location-based service is operable to provide at least some location-based information and at least some oilfield data to the wireless device that is responsive to the request from the wireless device.

485. A system for providing location-based information to a wireless device comprising: a location-based service in operative communication with a database that comprises mapping data related to a specific geographic location and a second database that comprises oilfield data; wherein the location-based service is configured to receive a request for oilfield data associated an oil or gas well; wherein the location-based service is configured to receive at least some mapping data from the first database; wherein the location-based service is additionally configured to receive oilfield data associated with the request from a second database; wherein the location-based service is operable to provide at least some mapping data and at least some oilfield data to the computing device that is responsive to the request from the wireless device and capable of being displayed to the user.

485. A system for providing location-based information to a wireless device comprising: a location-based service in operative communication with two databases that store oilfield data; wherein the location-based service is configured to receive location-base information comprising location data from the first database; wherein the location-based service is operable to receive oil field data associated with a profile of a given geographic location from the second database; wherein the location-based service is operable to provide at least some location-based information and at least some oilfield data to the wireless device that is responsive to the request from the wireless device.

486. A system for providing information for contactless gift cards for use with mobile payment systems and wireless devices comprising: a payment server in communication with at an offer server that comprises contactless gift cards available for purchase by customers; wherein the payment server is configured to request data concerning at least some contactless gift cards that are available for purchase from the offer server; wherein the payment server is configured to provide the data concerning at least some contactless gift cards that are available for purchase to a wireless device; wherein the location-based service comprises at least some code that is configured to display at least some of the data associated with contactless gift cards that are available to purchase and which the location-based service can be at least partially executed on the wireless device.

487. A system for making mobile payment systems through wireless devices comprising: a wireless device in operative communication to an offer server that comprises contactless gift cards available for purchase by customers; wherein the wireless device is configured to receive information regarding a contactless gift card from the offer server; wherein the information regarding a contactless gift card is based upon the location and transaction history associated with the wireless device; wherein the wireless device comprises a graphical user interface that is configured to display an interface comprising at least some information regarding contactless gift card received from the offer server as well other payment information associated with the user's adaptive profile for making contactless payments; wherein upon selection by the user, the graphical user interface can display additional information to the user regarding a contactless gift card.

488. A system for providing payment information for use with mobile payment systems to wireless devices comprising: a wireless device associated with a software application that is at least partially executable by the wireless device; wherein the software application is configured to have access to a secure memory card that is substantially connected physically to the wireless device and associated with a localized terminal; wherein the software application is configured to access the secure memory card to retrieve adaptive profile information comprising payment information associated with a user of the wireless device; wherein the software application is also configured to operatively communicate with a localized terminal if necessary; wherein the software application comprises a graphical user interface that is configured to display payment information associated with a user comprising at least of credit card payment information, gift card payment information, and reward card information to the user of the wireless device for use in making contactless wireless purchases through a contactless mobile payment system;

489. A system for providing payment information for use with mobile payment systems to wireless devices comprising: a wireless device associated with a software application that is at least partially executable by the wireless device; wherein the software application is configured to have access to a secure memory card that is substantially connected physically to the wireless device and associated with a localized terminal; wherein the software application is configured to access the secure memory card to retrieve adaptive profile information comprising payment information associated with a user of the wireless device; wherein the software application is also configured to operatively communicate with a localized terminal if necessary; wherein the software application comprises a graphical user interface that is configured to display payment information associated with a user comprising at least of credit card payment information, gift card payment information, and reward card information to the user of the wireless device for use in making contactless wireless purchases through a contactless mobile payment system.

490. A system for providing payment information for use with mobile payment systems to wireless devices comprising: a wireless device associated with a software application that is at least partially executable by the wireless device; wherein the software application is configured to have access to a secure memory card that is substantially connected physically to the wireless device and associated with a payment server; wherein the software application is configured to access the secure memory card to retrieve adaptive profile information comprising payment information associated with a user of the wireless device; wherein the software application is also configured to operatively communicate with the payment server if necessary; wherein the software application comprises a graphical user interface that is configured to display payment information associated with a user comprising at least of credit card payment information, gift card payment information, and reward card information to the user of the wireless device for use in making contactless wireless purchases through a contactless mobile payment system.

491. A system for providing payment information for use with mobile payment systems to wireless devices comprising: a wireless device associated with a software application that is at least partially executable by the wireless device; wherein the software application is configured to have access to a secure memory card that is substantially connected physically to the wireless device and associated with a payment server; wherein the software application is configured to access the secure memory card to retrieve adaptive profile information comprising payment information associated with a user of the wireless device; wherein the software application is also configured to operatively communicate with the mobile payment system; wherein the software application comprises a graphical user interface that is configured to display payment information associated with a user comprising at least of credit card payment information, gift card payment information, and reward card information to the user of the wireless device for use in making contactless wireless purchases through a contactless mobile payment system.

492. A system for providing payment information analytics data to a computing or wireless device comprising: an analytics server in communication with a database that is configured to receive at least some payment information associated with a specific contactless transaction, user payment information associated with a specific contactless transaction, and authorization information associated with a specific contactless transaction received from a plurality of localized terminals wherein the analytics server is configured to store at least some information received from the plurality of localized terminals with the database; wherein the analytics server is configured to provide the analytics data to a computing or wireless device that is derived from the payment information associated with a specific contactless transaction, user payment information associated with a specific contactless transaction, and authorization information associated with a specific contactless transaction from a plurality of localized terminals.

493. A system for providing payment information analytics data to a computing or wireless device comprising: an analytics server in communication with a database that is configured to receive at least some payment information associated with a specific contactless transaction, user payment information associated with a specific contactless transaction, and authorization information associated with a specific contactless transaction received from a plurality of payment servers; wherein the analytics server is configured to store at least some information received from the plurality of payment servers with the database; wherein the analytics server is configured to provide the analytics data to a computing or wireless device that is derived from the payment information associated with a specific contactless transaction, user payment information associated with a specific contactless transaction, and authorization information associated with a specific contactless transaction from a plurality of payment servers.

494. A system for providing payment information analytics data to a computing or wireless device comprising: an analytics server in communication with a database that is configured to receive at least some payment information associated with a specific contactless transaction, user payment information associated with a specific contactless transaction, and authorization information associated with a specific contactless transaction received from a plurality of mobile payment systems; wherein the analytics server is configured to store at least some information received from the plurality of mobile payment systems with the database; wherein the analytics server is configured to provide the analytics data to a computing or wireless device that is derived from the payment information associated with a specific contactless transaction, user payment information associated with a specific contactless transaction, and authorization information associated with a specific contactless transaction from a plurality of mobile payment systems.

495. A system for providing analytics data to a computing or wireless device comprising: an analytics server in communication with a database that is configured to receive at least some location-based information associated with a specific geographic location that comprises mobile user data associated with the geographic location; wherein the analytics server is configured to store at least some information received from the plurality of mobile devices associated with the geographic location; wherein the analytics server is configured to provide analytics data to a computing or wireless device that is derived from the location-based information associated with a specific geographic location that comprises mobile traffic within the geographic location and location-based information associated with the mobile devices associated with the geographic location.

496. A system for providing analytics data to a computing or wireless device comprising: an analytics server in communication with a database that is configured to receive at least some location-based information associated with a specific geographic location that comprises mobile user data associated with the geographic location; wherein the analytics server is configured to store at least some information received from the plurality of mobile devices associated with the geographic location; wherein the analytics server is configured to provide analytics data to a computing or wireless device that is derived from the location-based information associated with a specific geographic location that comprises mobile traffic within the geographic location and location-based information associated with the mobile devices associated with the geographic location.

497. A system for providing location-based information and payment information to a localized terminal comprising: a wireless device comprising secure memory and non-secure memory; wherein at least some location-based information is stored in the non-secure memory of the wireless device; wherein at least some payment information associated with the user of the wireless device is stored with the secure memory; wherein a data management component is configured to operatively communicate with a localized terminal, access and provide both location-based information stored on the non-secure memory of the wireless device and payment information associated with the secure memory to the localized terminal in one or more transmissions.

498. A system for dynamically displaying location-based information and payment information associated with a user of a wireless device comprising: a wireless device comprising secure memory and non-secure memory; wherein at least some location-based information is stored in the non-secure memory of the wireless device; wherein at least some payment information associated with the user of the wireless device is stored with the secure memory; wherein a graphical user interface is configured to dynamically display information associated with a user's adaptive profile comprising both location-based information and payment information associated with making use of a mobile payment system; wherein the location-based information is displayed at the same or near same time as the payment information on the graphical user interface wherein both types of information are associated with the user's adaptive profile.

499. A system for dynamically displaying location-based information and payment information associated with a user of a wireless device comprising: a wireless device comprising secure memory and non-secure memory; wherein at least some location-based information is stored in the non-secure memory of the wireless device; wherein at least some payment information associated with the user of the wireless device is stored with the secure memory; wherein a graphical user interface is configured to dynamically display information associated with a user's adaptive profile comprising both location-based information and payment information associated with making use of a mobile payment system; wherein the location-based information is displayed at the same or near same time as the payment information on the graphical user interface wherein both types of information are associated with the user's adaptive profile.

500. A system for dynamically displaying location-based information and payment information associated with a user of a wireless device comprising: a wireless device comprising secure memory and non-secure memory; wherein at least some location-based information is stored in the non-secure memory of the wireless device; wherein at least some payment information associated with the user of the wireless device is stored with the secure memory; wherein a graphical user interface is configured to dynamically display information associated with a user's adaptive profile comprising both location-based information and payment information associated with making use of a mobile payment system; wherein the location-based information is displayed at the same or near same time as the payment information on the graphical user interface wherein both types of information are associated with the user's adaptive profile.

501. A system for dynamically displaying location-based information and payment information associated with a user of a wireless device comprising: a wireless device comprising a first secure memory and a second secure memory; wherein at least some location-based information is stored in the first secure memory of the wireless device; wherein at least some payment information associated with the user of the wireless device is stored with the second secure memory; wherein a graphical user interface is configured to dynamically display both location-based information and payment information associated with making use of a mobile payment system that are stored on the first and second secured memories; wherein the location-based information is displayed at the same or near same time as the payment information on the graphical user interface wherein both types of information are associated a first or second secure memory.

502. A system for displaying a plurality of payment information associated with a user of a wireless device comprising: a wireless device associated with a first secure memory and a second secure memory; wherein payment information comprising transaction history of a user is stored in the first secure memory that is operatively connected to the wireless device; wherein at least some additional payment information associated with the user of the wireless device is stored with the second secure memory located within the wireless device; wherein a graphical user interface is configured to dynamically display both types of payment information that is stored on the first and second secured memories to the user of the mobile device; wherein both types of payment information are configured to be provided to a mobile payment system or localized terminal.

503. A system for displaying a plurality of payment information associated with a user of a wireless device comprising: a wireless device associated with a first secure memory and a second secure memory; wherein payment information comprising transaction details for a mobile payment associated with the user that is stored in the first secure memory that is operatively connected to the wireless device; wherein at least some additional payment information associated with the user of the wireless device is stored with the second secure memory located within the wireless device; wherein a graphical user interface is configured to dynamically display both types of payment information that is stored on the first and second secured memories to the user of the mobile device; wherein both types of payment information are configured to be provided to a mobile payment system or localized terminal.

504. A system for displaying a plurality of payment information associated with a user of a wireless device comprising: a wireless device associated with a first secure memory and a second secure memory; wherein payment information comprising a transaction authorization for a mobile payment associated with the user that is stored in the first secure memory; wherein at least some additional payment information associated with the user of the wireless device is stored with the second secure memory located within the wireless device; wherein a graphical user interface is configured to dynamically display both types of payment information that is stored on the first and second secured memories to the user of the mobile device; wherein both types of payment information are configured to be provided to a mobile payment system or localized terminal.

505. A system for displaying payment information and adaptive profile information associated with a user of a wireless device comprising: a wireless device associated with a first secure memory and a second secure memory; wherein payment information comprising transaction authorization for a mobile payment associated with the user that is stored in the first secure memory; wherein at least some adaptive profile information associated with the user of the wireless device and associated with a mobile payment is stored with the second secure memory; wherein a graphical user interface is configured to dynamically display adaptive profile information and payment information that is stored on the first and second secured memories to the user of the mobile device;

506. A system for displaying payment information to a user of a wireless device comprising: a wireless device associated with a first secure memory and a second secure memory; wherein payment information comprising transaction authorization for a mobile payment associated with the user that is stored in the first secure memory; wherein at least some adaptive profile information associated with the user of the wireless device and associated with a mobile payment is stored with the second secure memory that is not physically located on the wireless device; wherein a graphical user interface is configured to dynamically display both types of payment information that is stored on the first and second secured memories to the user of the mobile device.

507. A system for displaying a plurality of payment information associated with a user of a wireless device comprising: a wireless device associated with a first secure memory; wherein payment information comprising user payment accounts is stored in the first secure memory; wherein the wireless device is configured to connect to a data management component and receive adaptive profile motion associated with a user's mobile transactions; wherein a graphical user interface is configured to dynamically display payment information and adaptive profile information to the user.

508. A system comprising: a computer non-transitory useable medium; a first location-based service configured to register a computing device with the first location-based service; wherein the first location-based service is configured to receive a request for location-based information from the computing device; wherein the first location-based service is configured to send a first set of location-based information to the computing device; wherein the first location-based service is configured to query a second location-based service for location-based information; wherein the first location-based service is capable of receiving a second set of location-based information from the second location-based service; wherein the first location-based service is capable of associating the location-based information received from the second location-based service with an adaptive profile and sending at least part of the adaptive profile to the computing device.

509. The system according to clause 508, wherein: the first set of location-based information sent to the computing device comprises mapping data, and wherein the second set of location-based information sent to the computing device comprises user-specific data associated with the computing device.

510. The system according to clauses 508-509, wherein the second location-based service comprises a server that has access to a plurality of adaptive profiles and upon request can provide one of said plurality of adaptive profiles to the first location-based service.

511. The system according to clauses 508-510, wherein the first set of location-based information comprises locations of physical locations in near proximity to a specific geographic location and the second set of location-based information comprises location-based information that is descriptive of the first set of location-based information.

512. The system according to clauses 508-511, wherein capable of associating the location-based information received from the second location-based service with an adaptive profile comprises associating the second set of location-based information with the first set of location-based information.

513. The system according to clauses 508-512, wherein: the first set of location-based information sent to the computing device comprises location-based information, and wherein the second set of location-based information associated with an adaptive profile and sent to the computing device comprises energy operations data that is associated with an adaptive drilling profile.

514. A system comprising: a data management component associated with a location-based service; wherein the location-based service is operatively connected to a server; wherein the server is operatively connected to a database; wherein the database stores location-based information, and wherein said location-based information comprises energy operations data; wherein the data management component can send a request to the server, wherein said request is for location-based information comprising energy operations data; wherein the server queries the database for responsive location-based information, wherein the database is configured to return said location-based information to the server; wherein the server is operable to provide the responsive location-based information to the data management component; wherein the data management component is configured to provide said location-based information to at least one computing device.

515. The system according to clause 514, wherein the data management component resides at least partially on the computing device.

516. The system according to clauses 514-515, wherein said database associates at least some data with an adaptive drilling profile in response to a request for location-based information, and wherein said database returns at least some adaptive drilling profile information to the server.

517. The system according to clauses 514-516, wherein the data management component is configured to provide a report to the computing device based on the location-based information received from the server.

518. The system according to clauses 514-517, wherein the data management component is configured to model at least some of the energy operations data received into a drilling operations data set, wherein said drilling operations data set is capable of being displayed on a graphical user interface.

519. The system according to clauses 514-518, wherein the energy operations data relates to predictive analysis data.

520. The system according to clauses 514-519, wherein the data management component is configured to receive multiple sets of location-based information.

521. The system according to clause 520 wherein the data management component associates one of said multiple sets of location-based information with an adaptive drilling profile for at least one geographical location, wherein the adaptive drilling profile relates to the production of at least one well; wherein at least part of the adaptive drilling profile is viewable by the user of the computing device.

522. The system according to clause 520 wherein the location-based information received by the data management component is associated with a geofenced area.

523. A system comprising: a location-based service in operative communication with a first database and a second database, wherein said first and second databases store energy operations data; wherein the location-based service is configured to receive a request for energy operations data associated with a drilling operation; wherein the location-based service is configured to send a request for energy operations data to the first database; wherein the location-based service is operable to receive energy operations data from the first database, wherein said energy operations data comprises a first set of energy operations data; wherein the location-based service is additionally configured to send a request to said second database for a second set of energy operations data; wherein the location-based service is operable to receive responsive energy operations data associated with the request from the second database; wherein the location-based service is operable to provide energy operations data from the first database and energy operations data from the second database to a computing device that is responsive to the request from the computing device.

524. The system according to clause 523 further comprising a data management component associated with a location-based service, wherein said data management component is programmed to create an adaptive drilling profile from the first set of energy operations data and second set of energy operations data.

525. The system according to clauses 523-524, wherein the location-based service comprises a server, and wherein said server is configured to manage sets of energy operations data and provide at least one of said sets of energy operations data upon request to a user.

526. The system according to clauses 523-525, wherein the first set of operations data comprises subterranean data, and wherein the second set of energy operations comprises economic data associated with the drilling operation.

527. The system according to clauses 523-526 further comprising a data management component programmed to create an adaptive drilling profile from the first set of energy operations data and from the second set of energy operations data, wherein the first set of energy operations data comprises well production data and wherein said second set of energy operations data comprises mapping data associated with a given location.

528. The system according to clauses 523-527 further comprising a data interface capability configured to receive a request for energy operations data from said computing device and provide said energy operations data to the location-based service.

529. A method for creating adaptive drilling profiles to send to a computing device upon request, said method comprising the steps of: receiving location-based information from a database, wherein said location-based information comprises energy operations data, and wherein said location-based information is associated with the oil and gas industry; receiving mapping data from the database, wherein said mapping data is associated with a geographic location; creating an adaptive drilling profile comprising energy operations data and mapping data; displaying at least a portion of the adaptive profile on a graphical map interface.

530. The method according to clause 529 further comprising: updating the display of the adaptive profile based upon user interaction with the graphical map interface.

531. The method according to clauses 529-530, wherein the location-based information is associated with a specific drilling operation, and wherein the adaptive drilling profile is displayed to a user in three dimensions.

532. The method according to clauses 529-531, wherein the adaptive profile is associated with a geofenced area.

533. The method according to clauses 529-532, wherein the location-based information comprises subterranean data and surface data associated with a drilling operation.

534. The method according to clause 530, wherein the step of updating the display of the adaptive profile based upon user interaction includes the user modifying data associated with the adaptive profile to analyze how the data that is modified impacts the drilling operation.

535. The method according to clauses 529-534, wherein the mapping data is associated with a geofenced area.

536. The method according to clauses 529-535, further comprising the step of: creating a model of the adaptive drilling profile before displaying at least some of the adaptive drilling profile to the user wherein the profile comprises seismic data.

537. The method according to clauses 529-536, further comprising the step of: displaying icons on the graphical map interface through a graphical user interface overlay, wherein said graphical user interface overlay represents the location of physical structures associated with the drilling operation.

538. A system for managing location-based information associated with the oil and gas industry, said system comprising: a computing device operatively connected to a location-based service; wherein the computing device can receive location-based information from the location-based service, wherein said location-based information is associated with the frequency of an event related to a specific geographical location; wherein the location-based information further comprises energy operations data that is associated with the specific geographical location; wherein the computing device is associated with a graphical map interface; wherein the graphical map interface is configured to display at least some location-based information; wherein the graphical map interface is configured to display an indication of the frequency of an event; wherein the frequency of an event is displayed on the graphical map interface, and wherein said system manages location-based information associated with the oil and gas industry.

539. The system according to clause 538 wherein the graphical map display is capable of displaying location-based information in three dimensions.

540. The system according to clauses 538-539 wherein the location-based information is displayed through a graphical user interface overlay that is used in conjunction with a graphical map display.

541. The system according to clauses 538-540 wherein the location-based information received by the computing device is associated with a geofence.

542. The system according to clauses 538-541 wherein the frequency of an event relates to a drilling operation.

543. The system according to clauses 538-542 wherein the energy operations data displayed to the user comprises subterranean data that is associated with the geographical location.

544. The system according to clauses 538-543, wherein displaying an indication of the frequency of an event comprises a heat map overlayed on the graphical map interface.

545. A method comprising the steps of: sending a request through a data interface capability for location-based information wherein said location-based information comprises energy operations data that is associated with a given location; receiving through the data interface capability responsive location-based information; building an adaptive drilling profile comprising at least some of the energy operations data received through the data interface that is associated with the location; displaying at least some of the adaptive drilling profile that comprises energy operations data on a graphical user interface; modifying the graphical user interface based upon user input.

546. The method according to clause 545, further comprising the steps of: receiving a plurality of adaptive drilling profiles associated generally with a given location based upon user interactions with the graphical user interface; and updating the display of the adaptive drilling profile based upon data received from the plurality of adaptive profiles associated generally with the location.

547. The method according to clauses 545-546, further comprising the steps of: creating a geofence on the graphical user interface and displaying at least some energy operations data within the geofenced area on the graphical map interface.

548. The method according to clauses 545-547, further comprising the step of providing the adaptive drilling profile to one or more users that are registered with a location-based service.

549. The method according to clauses 545-548, wherein the step of modifying the graphical user interface based upon user input related to the energy operations data displayed originally to the user further comprises modifying the user interface in near real-time based upon user selections.

550. The method according to clauses 546, further including the steps: storing the adaptive drilling profile on memory when modifications are made by a user; providing the saved adaptive drilling profile upon request from a user.

551. A system comprising: a computer non-transitory useable medium; a computing device; wherein the computing device is configured to be in operative communication with a data management component, wherein said data management component is in communication with a location-based service; wherein the data management component is configured to send a request to the location-based service for location-based information, wherein said location-based information is associated with an oil and gas location; wherein the data management component is configured to receive location-based information from the location-based service; wherein said data management component is configured to create a model based upon information received from the location-based service; wherein the data management component is configured to display at least some of the model comprising location-based information received from the location-based service through a graphical user interface, wherein the data management component is configured to modify the display based upon parameters associated with an adaptive drilling profile created by the data management component that comprises location-based information.

552. The system according to clause 551 wherein the adaptive drilling profile is associated with a geofenced area.

553. The system according to clauses 551-552 wherein the location-based information comprises expenses associated the adaptive drilling profile.

554. The system according to clauses 551-553 wherein the data management component is configured to receive a plurality of geographically related adaptive drilling profiles that are generally geographically associated with the adaptive drilling profile displayed to the user, wherein at least some of the plurality of geographically related drilling profiles can be displayed to the user of the computing device.

555. The system according to clauses 551-554 wherein the graphical user interface can display a report based upon at least some of location-based information associated with the oil or gas location to the user of the computing device.

556. The system according to clauses 551-555, wherein the adaptive drilling profile displayed to the user of the computing device can be displayed on other computing devices that are registered with the location-based service.

557. The system according to clauses 551-556, wherein the location-based information comprises mapping data and energy operations data that is related to the adaptive drilling profile.

558. The system according to clauses 551-557, wherein the location-based information comprises data associated with a pipeline that is operatively connected to one or more oil or gas wells.

559. The system according to clauses 551-558, wherein the data management component is further programmed to modify the display on the computing device based upon a selection made by the user.

560. A system comprising: a computer non-transitory useable medium; a computing device; wherein the computing device is configured to be in operative communication with a location-based service; wherein the computing device is further configured to send a request to the location-based service for energy operations data; wherein the computing device is operable to receive energy operations data from the location-based service that is responsive to the request, and wherein said energy operations data comprises data associated with a drilling operation; wherein the computing device is associated with a data management component that is configured to model the energy operations data using pre-existing data and energy operations data received from the location-based service; wherein the computing device is programmed to display the data modeled by said data management component via a graphical user interface to a user.

561. The system according to clause 560, wherein the data management component is configured to display additional energy operations data received from the location-based service and include at least some of the additional location-based information in the model of the previous location-based information.

562. The system according to clauses 560-561, wherein the additional energy operations data received from the location-based service comprises information associated with an adaptive drilling profile.

563. The system according to clauses 560-562, wherein the model created by the data management component comprises a report relating to a specific geographic location.

564. The system according to clauses 560-563, wherein the model created by the data management component comprises a user-defined model based upon energy operations data requested by the user.

565. The system according to clauses 560-564, wherein the model created by the data management component is accessible by other computing devices registered with the location-based service.

566. The system according to clauses 560-565, wherein the energy operations data received by the computing device includes production data from a well.

567. The system according to clauses 560-566, wherein the energy operations data received by the computing device comprises profile data associated with a plurality of wells.

We claim:

1. A system comprising:
a computing device comprising at least a dual-core processor, the computing device being operable to connect to a location-based service;
wherein the computing device is operable to receive a pre-determined profile of location-based information from the location-based service associated with a geofenced location, wherein said location-based information is associated with a frequency of an event related to the geofenced location and wherein the location-based information also comprises drilling angle of two or more wells, drill depths of two or more wells, rock formation types, pipeline data, sensor data from within the geofenced location, and data related to production decision analysis;

wherein the pre-determined profile comprises two or more predetermined parameters associated with the geofenced location relating to the oil and gas industry, which is populated with the location-based information from the location-based service;

wherein the location-based information contained in the pre-determined profile further comprises energy operations data that is associated with the geofenced location;

wherein the computing device is associated with a graphical map interface;

wherein the graphical map interface is configured to display at least some of the location-based information;

wherein the graphical map interface is configured to display an indication of the frequency of an event;

wherein the indication of the frequency of an event is associated with a drilling operation within the geofenced location and is displayed on the graphical map interface; and wherein said system manages the location-based information associated with the oil and gas industry that is associated with the geofenced location.

2. The system of claim 1 wherein the graphical map interface display is capable of displaying the location-based information in three dimensions.

3. The system of claim 1 wherein the graphical map interface is further configured to display the location-based information through a graphical user interface overlay.

4. The system of claim 1 wherein the pre-determined profile received by the computing device also comprises a drilling profile that includes a profile identifier.

5. The system of claim 1 wherein the energy operations data displayed to the user comprises subterranean data that is associated with the geographical location.

6. The system of claim 1, wherein displaying the indication of the frequency of an event comprises a heat map overlaid on the graphical map interface.

7. A method for receiving oil and gas data associated with the oil and gas industry and related to a certain location comprising:
   sending a request through a data interface capability for location-based information, wherein said location-based information comprises energy operations data that is associated with a given location;
   creating a pre-determined drilling profile at a server at a location-based service after receiving the request for location-based information for transmission through the data interface capability, which is associated with a geofenced location, wherein said location-based information is associated with a frequency of an event related to the geofenced location, and wherein the location-based information is associated with the pre-determined drilling profile, wherein the pre-determined drilling profile comprises drilling angles of two or more wells, drill depths of two or more wells, rock formation types, pipeline data, sensor data from within the given location, and data related to production decision analysis;
   receiving through the data interface capability the pre-determined drilling profile comprising two or more pre-determined parameters;
   building, through use of a parallel processing technique with a multi-core processor of a wireless device, an adaptive drilling profile based upon the geofenced location comprising at least part of the pre-determined drilling profile received through the data interface capability that is associated with the given location;
   displaying at least some of the adaptive drilling profile by a graphical user interface; and
   modifying the adaptive drilling profile based upon user input.

8. The method of claim 7, further comprising:
   receiving a plurality of adaptive drilling profiles associated generally with the given location based upon user interactions with the graphical user interface; and
   updating the display of the adaptive drilling profile based upon data received from the plurality of adaptive profiles associated generally with the given location.

9. The method of claim 7, further comprising:
   creating a geofenced area on the graphical user interface and displaying at least some energy operations data within the geofenced area as well as rock formation data on the graphical user interface.

10. The method of claim 7, further comprising providing the adaptive drilling profile to one or more users that are registered with the location-based service.

11. The method of claim 7, wherein modifying the adaptive drilling profile based upon user input further comprises modifying the graphical user interface in near real-time based upon user selections.

12. The method of claim 7, further including:
   storing the adaptive drilling profile on memory when modifications are made by a user; and
   providing the stored adaptive drilling profile upon request from a user.

13. A system for the energy industry comprising:
   a non-transitory computer-readable medium; and
   a computing device comprising at least a multi-core processor;
   wherein the computing device is configured to be in operative communication with a data management component which is at least partially stored in the computing device, wherein said data management component is in communication with a location-based service;
   wherein the data management component is configured to send a request to the location-based service for location-based information, wherein said location-based information is associated with an oil and gas location which is associated with a geofenced location, wherein said location-based information is associated with a frequency of an event related to the geofenced location, and wherein the location-based information also comprises drilling angles of two or more wells, drill depths of two or more wells, rock formation types, pipeline data, sensor data from within the oil and gas location, and data related to production decision analysis;
   wherein the location-based service creates a geofenced drilling operation profile comprising multiple predetermined parameters related to the oil and gas location, and wherein the location-based service sends said geofenced drilling operation profile to the data management component;
   wherein the data management component can receive the geofenced drilling operation profile from the location-based service through a data interface capability;
   wherein said data management component upon receiving the geofenced drilling operation profile through the data interface capability is configured to create a model based upon the geofenced drilling operation profile received from the location-based service that is associated with a geofenced drilling operation;

wherein the data management component is configured to display at least some of the model comprising location-based information received from the location-based service that is associated with the geofenced drilling operation through a graphical user interface; and wherein the data management component is configured to modify the display based upon parameters associated with an adaptive drilling profile created by the location-based service.

14. The system of claim 13 wherein the adaptive drilling profile is associated with a geofenced area.

15. The system of claim 13 wherein the location-based information comprises expenses associated the adaptive drilling profile, wherein said expenses are selected from the group consisting of costs associated with oil production, costs associated with gas production, invoicing, oil prospects, gas prospects, completion reports, and unconventional play reports.

16. The system of claim 13 wherein the data management component is configured to receive a plurality of geographically related adaptive drilling profiles that are generally geographically associated with the adaptive drilling profile displayed to the user, wherein at least some of the plurality of geographically related drilling profiles can be displayed to the user of the computing device.

17. The system of claim 13 wherein the graphical user interface can display a report based upon at least some of location-based information associated with the oil and gas location to the user of the computing device.

18. The system of claim 13, wherein the adaptive drilling profile displayed to the user of the computing device can be displayed on other computing devices that are registered with the location-based service.

19. The system of claim 13, wherein the location-based information comprises a profile of predetermined completion report data associated with the geofenced drilling operation.

20. The system of claim 13, wherein the pipeline data comprises data associated with a pipeline that is operatively connected to one or more oil or gas wells.

21. The system of claim 13, wherein the data management component is further programmed to modify the display on the computing device based upon a selection made by the user.

22. A system related to the oil and gas industry comprising:
a non-transitory computer-readable medium; and
a computing device comprising at least a multi-core processor;
wherein the computing device is in operative communication with a first location-based service comprising at least one application programming interface;
wherein the computing device is further operable to send a request to the first location-based service for energy operations data that is associated with a geofenced drilling operation through a data interface capability;
wherein the computing device is operable to receive, though the data interface capability, the energy operations data which is associated with a geofenced location and is further associated with a frequency of an event related to the geofenced drilling operation that comprises three or more predetermined parameters populated by the first location-based service that are responsive to the request, and wherein said energy operations data comprises data associated with the geofenced drilling operation, and wherein the energy operations data also comprises drilling angle of two or more wells, drill depths of two or more wells, rock formation types, pipeline data, sensor data from within the geofenced location, and data related to production decision analysis;

wherein the computing device is configured to receive, from a second location-based service, a link to additional energy operations data associated with the geofenced drilling operation;

wherein the computing device is configured to model using at least a multi-core processor the energy operations data using preexisting data and the energy operations data received from the first location-based service that is associated with the geofenced drilling operation and the second location-based service; and wherein the computing device is programmed to display the data modeled by using parallel processing techniques via at least a dual-core processor via a graphical user interface to a user.

23. The system of claim 22, wherein the additional energy operations data received from the second location-based service comprises information associated with an adaptive drilling profile.

24. The system of claim 22, wherein the model created by the computing device comprises a report relating to a specific geographic location; wherein the computing device comprises a smart phone or tablet computer; and wherein at least some energy operations data can further be displayed via a pop-up box on the graphical user interface which comprises a mapping interface.

25. The system of claim 22, wherein the model created by the computing device comprises a user-defined model based upon energy operations data requested by the user; wherein the computing device is configured to receive mapping data from a mapping server, wherein the graphical user interface comprises a graphical mapping interface; wherein the graphical mapping interface is configured to store in memory on the computing device and display one or more geofenced drilling operations; and wherein the computing device is a tablet computer or smart phone that comprises a touch screen.

26. The system of claim 22, wherein the model created by the computing device is accessible by other computing devices registered with the first location-based service via a connection between the computing devices and without requesting additional location-based information from the location-based service.

27. The system of claim 22, wherein the energy operations data received by the computing device includes production data from a grouping of wells that are within the geofenced drilling operation; and wherein at least two or more of the wells are unconventional horizontal wells drilled from the same drilling location.

28. The system of claim 22, wherein the energy operations data received by the computing device comprises profile data associated with a plurality of wells; wherein the graphical user interface comprises a graphical mapping interface that is configured to display two or more wells from the same drilling location and wherein the wells are unconventional horizontal wells; and wherein the computing device is a smart phone configured to access the location-based information wirelessly through a data interface capability comprising multiple in multiple out antenna arrangement located on the smart phone.

* * * * *